US012726202B2

(12) United States Patent
Lin et al.

(10) Patent No.: US 12,726,202 B2
(45) Date of Patent: Sep. 1, 2026

(54) LOGIC DRIVE USING STANDARD COMMODITY PROGRAMMABLE LOGIC IC CHIPS COMPRISING NON-VOLATILE RANDOM ACCESS MEMORY CELLS

(71) Applicant: iCometrue Company Ltd., Zhubei (TW)

(72) Inventors: Mou-Shiung Lin, Hsinchu (TW); Jin-Yuan Lee, Hsinchu (TW)

(73) Assignee: iCometrue Company Ltd., Hsinchu County (TW)

( * ) Notice: Subject to any disclaimer, the term of this patent is extended or adjusted under 35 U.S.C. 154(b) by 326 days.

(21) Appl. No.: 18/202,915

(22) Filed: May 27, 2023

(65) Prior Publication Data

US 2023/0299774 A1 Sep. 21, 2023

Related U.S. Application Data

(63) Continuation of application No. 17/497,968, filed on Oct. 10, 2021, now Pat. No. 11,711,082, which is a (Continued)

(51) Int. Cl.
*H03K 19/1776* (2020.01)
*G11C 11/16* (2006.01)
(Continued)

(52) U.S. Cl.
CPC ...... *H03K 19/1776* (2013.01); *G11C 11/1673* (2013.01); *G11C 11/412* (2013.01); (Continued)

(58) Field of Classification Search
CPC ........... H01L 23/49811; H01L 23/5386; H01L 24/13; H01L 24/16; H01L 25/18
See application file for complete search history.

(56) References Cited

U.S. PATENT DOCUMENTS

| | | | |
|---|---|---|---|
| 4,870,302 | A | 9/1989 | Freeman |
| 5,272,368 | A | 12/1993 | Turner et al. |

(Continued)

FOREIGN PATENT DOCUMENTS

| | | |
|---|---|---|
| CN | 103681367 | 3/2014 |
| CN | 104078453 | 10/2014 |

(Continued)

*Primary Examiner* — Trang Q Tran
(74) *Attorney, Agent, or Firm* — Min-Lee Teng

(57) ABSTRACT

A multi-chip package includes a field-programmable-gate-array (FPGA) integrated-circuit (IC) chip configured to perform a logic function based on a truth table, wherein the field-programmable-gate-array (FPGA) integrated-circuit (IC) chip comprises multiple non-volatile memory cells therein configured to store multiple resulting values of the truth table, and a programmable logic block therein configured to select, in accordance with one of the combinations of its inputs, one from the resulting values into its output; and a memory chip coupling to the field-programmable-gate-array (FPGA) integrated-circuit (IC) chip, wherein a data bit width between the field-programmable-gate-array (FPGA) integrated-circuit (IC) chip and the memory chip is greater than or equal to 64.

24 Claims, 43 Drawing Sheets

Related U.S. Application Data continuation of application No. 16/597,810, filed on Oct. 9, 2019, now Pat. No. 11,159,165, which is a continuation of application No. 16/262,875, filed on Jan. 30, 2019, now Pat. No. 10,523,210.

(60) Provisional application No. 62/755,415, filed on Nov. 2, 2018, provisional application No. 62/729,527, filed on Sep. 11, 2018, provisional application No. 62/675,785, filed on May 24, 2018, provisional application No. 62/630,369, filed on Feb. 14, 2018, provisional application No. 62/624,825, filed on Feb. 1, 2018.

(51) Int. Cl.

| | |
|---|---|
| ***G11C 11/412*** | (2006.01) |
| ***G11C 11/419*** | (2006.01) |
| ***G11C 13/00*** | (2006.01) |
| ***G11C 14/00*** | (2006.01) |
| ***H03K 19/0948*** | (2006.01) |
| ***H03K 19/173*** | (2006.01) |
| ***H03K 19/17728*** | (2020.01) |
| ***H03K 19/20*** | (2006.01) |
| ***H10B 10/00*** | (2023.01) |
| ***H10B 61/00*** | (2023.01) |
| ***H10B 63/00*** | (2023.01) |
| ***H10N 70/00*** | (2023.01) |
| ***H10W 70/60*** | (2026.01) |
| ***H10W 70/65*** | (2026.01) |
| ***H10W 90/00*** | (2026.01) |
| *H03K 19/21* | (2006.01) |
| *H10W 72/00* | (2026.01) |
| *H10W 72/20* | (2026.01) |
| *H10W 74/15* | (2026.01) |

(52) U.S. Cl.

CPC ........ *G11C 11/419* (2013.01); *G11C 13/0007* (2013.01); *G11C 13/0038* (2013.01); *G11C 13/004* (2013.01); *G11C 14/0081* (2013.01); *G11C 14/009* (2013.01); *H03K 19/0948* (2013.01); *H03K 19/1737* (2013.01); *H03K 19/17728* (2013.01); *H03K 19/20* (2013.01); *H10B 10/00* (2023.02); *H10B 10/15* (2023.02); *H10B 61/00* (2023.02); *H10B 61/10* (2023.02); *H10B 63/00* (2023.02); *H10B 63/20* (2023.02); *H10B 63/30* (2023.02); *H10B 63/80* (2023.02); *H10N 70/826* (2023.02); *H10N 70/841* (2023.02); *H10N 70/8833* (2023.02); *H10W 70/611* (2026.01); *H10W 70/65* (2026.01); *H10W 90/00* (2026.01); *H10W 90/701* (2026.01); *G11C 2213/15* (2013.01); *H03K 19/21* (2013.01); *H10W 72/0198* (2026.01); *H10W 72/072* (2026.01); *H10W 72/07207* (2026.01); *H10W 72/073* (2026.01); *H10W 72/222* (2026.01); *H10W 72/241* (2026.01); *H10W 72/242* (2026.01); *H10W 72/244* (2026.01); *H10W 72/252* (2026.01); *H10W 74/15* (2026.01); *H10W 90/724* (2026.01)

(56) References Cited

U.S. PATENT DOCUMENTS

| | | | |
|---|---|---|---|
| 5,587,603 | A | 12/1996 | Kowshik |
| 5,592,102 | A | 1/1997 | Lane et al. |
| 5,689,195 | A | 11/1997 | Cliff et al. |
| 5,796,662 | A | 8/1998 | Kalter et al. |
| 6,020,633 | A | 2/2000 | Erikson |
| 6,034,542 | A | 3/2000 | Ridgeway |
| 6,167,558 | A | 12/2000 | Trimberger |
| 6,356,478 | B1 | 3/2002 | McCollum |
| 6,388,466 | B1 | 5/2002 | Wittig et al. |
| 6,404,226 | B1 | 6/2002 | Schadt |
| 6,687,167 | B2 | 2/2004 | Guaitini et al. |
| 6,798,240 | B1 | 9/2004 | Pedersen |
| 6,812,086 | B2 | 11/2004 | Murthy et al. |
| 6,828,823 | B1 | 12/2004 | Tsui |
| 6,943,580 | B2 | 9/2005 | Lewis et al. |
| 6,952,114 | B2 | 10/2005 | Turner |
| 6,998,872 | B1 | 2/2006 | Chirania et al. |
| 7,030,652 | B1 | 4/2006 | Lewis et al. |
| 7,061,271 | B1 | 6/2006 | Young et al. |
| 7,126,214 | B2 | 10/2006 | Huppenthal et al. |
| 7,190,190 | B1 | 3/2007 | Camarota et al. |
| 7,193,433 | B1 | 3/2007 | Young |
| 7,219,237 | B1 | 5/2007 | Trimberger |
| 7,366,306 | B1 | 4/2008 | Trimberger |
| 7,385,417 | B1 | 6/2008 | Agrawal et al. |
| 7,420,390 | B1 | 9/2008 | Hutton et al. |
| 7,477,073 | B1 | 1/2009 | Tuan |
| 7,511,299 | B1 | 3/2009 | Alexander et al. |
| 7,550,994 | B1 | 6/2009 | Camarota |
| 7,579,681 | B2 | 8/2009 | Chia et al. |
| 7,598,555 | B1 | 10/2009 | Papworth Parkin |
| 7,653,891 | B1 | 1/2010 | Anderson et al. |
| 7,747,025 | B1 | 6/2010 | Trimberger |
| 7,853,799 | B1 | 12/2010 | Trimberger |
| 7,933,140 | B2 | 4/2011 | Wang et al. |
| 7,944,231 | B2 | 5/2011 | Javerliac |
| 7,948,266 | B2 | 5/2011 | Schmit et al. |
| 7,973,556 | B1 | 7/2011 | Noguera Serra et al. |
| 7,977,783 | B1 | 7/2011 | Park et al. |
| 8,064,224 | B2 | 11/2011 | Mahajan et al. |
| 8,081,079 | B1 | 12/2011 | Camarota |
| 8,159,268 | B1 | 4/2012 | Madurawe |
| 8,243,527 | B2 | 8/2012 | Hung et al. |
| 8,354,297 | B2 | 1/2013 | Pagaila et al. |
| 8,378,407 | B2 | 2/2013 | Audzeyeu et al. |
| 8,531,032 | B2 | 9/2013 | Yu et al. |
| 8,546,955 | B1 | 10/2013 | Wu |
| 8,592,886 | B2 | 11/2013 | Hsu et al. |
| 8,709,865 | B2 | 4/2014 | Hu et al. |
| 8,742,579 | B2 | 6/2014 | Pagaila et al. |
| 8,786,060 | B2 | 7/2014 | Yen et al. |
| 8,796,137 | B2 | 8/2014 | Pagaila et al. |
| 8,855,452 | B2 | 10/2014 | Andry et al. |
| 8,866,292 | B2 | 10/2014 | Beer et al. |
| 8,872,349 | B2 | 10/2014 | Chiu et al. |
| 8,878,360 | B2 | 11/2014 | Meyer et al. |
| 8,883,561 | B2 | 11/2014 | Park et al. |
| 8,885,334 | B1 | 11/2014 | Baxter |
| 8,895,440 | B2 | 11/2014 | Choi et al. |
| 8,912,822 | B2 | 12/2014 | Yasuda |
| 8,916,421 | B2 | 12/2014 | Gong et al. |
| 8,941,230 | B2 | 1/2015 | Kyozuka et al. |
| 8,952,489 | B2 | 2/2015 | Elian et al. |
| 8,952,521 | B2 | 2/2015 | Wojnowski et al. |
| 8,987,918 | B2 | 3/2015 | Razdan et al. |
| 8,993,377 | B2 | 3/2015 | Koo et al. |
| 9,003,221 | B1 | 4/2015 | Abugharbieh et al. |
| 9,082,806 | B2 | 7/2015 | Lin et al. |
| 9,106,229 | B1 | 8/2015 | Hutton |
| 9,135,185 | B2 | 9/2015 | Loh et al. |
| 9,147,638 | B2 | 9/2015 | Liu et al. |
| 9,224,647 | B2 | 12/2015 | Koo et al. |
| 9,225,512 | B1 | 12/2015 | Trimberger |
| 9,252,127 | B1 | 2/2016 | Shen et al. |
| 9,263,370 | B2 | 2/2016 | Shenoy et al. |
| 9,281,254 | B2 | 3/2016 | Yu et al. |
| 9,281,292 | B2 | 3/2016 | Hu et al. |
| 9,324,672 | B2 | 4/2016 | Pagaila et al. |
| 9,331,060 | B2 | 5/2016 | Otremba et al. |
| 9,331,062 | B1 | 5/2016 | Lane et al. |
| 9,343,442 | B2 | 5/2016 | Chen et al. |
| 9,349,703 | B2 | 5/2016 | Chiu et al. |

(56) References Cited

U.S. PATENT DOCUMENTS

| | | | |
|---|---|---|---|
| 9,349,713 | B2 | 5/2016 | Kim et al. |
| 9,362,187 | B2 | 6/2016 | Ossimitz |
| 9,368,458 | B2 | 6/2016 | Wu et al. |
| 9,385,006 | B2 | 7/2016 | Lin |
| 9,385,009 | B2 | 7/2016 | Lin et al. |
| 9,385,105 | B2 | 7/2016 | Meyer et al. |
| 9,396,998 | B2 | 7/2016 | Kurita et al. |
| 9,397,050 | B2 | 7/2016 | Shin et al. |
| 9,406,619 | B2 | 8/2016 | Pagaila et al. |
| 9,406,658 | B2 | 8/2016 | Lee et al. |
| 9,437,260 | B2 | 9/2016 | Prenat et al. |
| 9,449,930 | B2 | 9/2016 | Kim et al. |
| 9,455,218 | B2 | 9/2016 | Ooi et al. |
| 9,508,626 | B2 | 11/2016 | Pagaila et al. |
| 9,524,955 | B2 | 12/2016 | Huang et al. |
| 9,543,276 | B2 | 1/2017 | Jee et al. |
| 9,583,431 | B1 | 2/2017 | Rahman |
| 9,593,009 | B2 | 3/2017 | Fuergut et al. |
| 9,601,471 | B2 | 3/2017 | Zhai et al. |
| 9,607,967 | B1 | 3/2017 | Shih |
| 9,612,615 | B2 | 4/2017 | Lin et al. |
| 9,615,453 | B2 | 4/2017 | Yang |
| 9,627,365 | B1 | 4/2017 | Yu et al. |
| 9,640,259 | B2 | 5/2017 | Li et al. |
| 9,679,863 | B2 | 6/2017 | Lin et al. |
| 9,704,843 | B2 | 7/2017 | Kilger et al. |
| 9,722,584 | B1 | 8/2017 | Chang et al. |
| 9,735,113 | B2 | 8/2017 | Chi et al. |
| 9,763,329 | B1 | 9/2017 | Mason |
| 9,768,145 | B2 | 9/2017 | Yu et al. |
| 9,773,757 | B2 | 9/2017 | Yu et al. |
| 9,806,058 | B2 | 10/2017 | Wei et al. |
| 9,812,337 | B2 | 11/2017 | Chen et al. |
| 9,818,720 | B2 | 11/2017 | Wei et al. |
| 9,831,148 | B2 | 11/2017 | Yu et al. |
| 9,859,896 | B1 | 1/2018 | Gaide et al. |
| 9,881,850 | B2 | 1/2018 | Yu et al. |
| 9,887,206 | B2 | 2/2018 | Su et al. |
| 9,893,732 | B1 | 2/2018 | Lewis |
| 9,899,248 | B2 | 2/2018 | Yu et al. |
| 9,899,355 | B2 | 2/2018 | Yuan et al. |
| 9,935,113 | B2 | 4/2018 | Wu et al. |
| 9,966,325 | B2 | 5/2018 | Beyne |
| 9,985,006 | B2 | 5/2018 | Jeng et al. |
| 9,997,464 | B2 | 6/2018 | Hsieh et al. |
| 10,015,916 | B1 | 7/2018 | Karp |
| 10,026,681 | B2 | 7/2018 | Ko et al. |
| 10,033,383 | B1 | 7/2018 | Richter et al. |
| 10,037,963 | B2 | 7/2018 | Chen et al. |
| 10,038,647 | B1 | 7/2018 | Lesea |
| 10,043,768 | B2 | 8/2018 | Meyer et al. |
| 10,056,351 | B2 | 8/2018 | Yu et al. |
| 10,056,907 | B1 | 8/2018 | Asnaashari |
| 10,062,648 | B2 | 8/2018 | Hsieh et al. |
| 10,062,651 | B2 | 8/2018 | Liang et al. |
| 10,079,243 | B2 | 9/2018 | Ramkumar |
| 10,109,559 | B2 | 10/2018 | Lin et al. |
| 10,109,588 | B2 | 10/2018 | Jeong et al. |
| 10,109,617 | B2 | 10/2018 | Lee et al. |
| 10,153,222 | B2 | 12/2018 | Yu et al. |
| 10,153,239 | B2 | 12/2018 | Wang et al. |
| 10,157,828 | B2 | 12/2018 | Hsu et al. |
| 10,157,849 | B2 | 12/2018 | Huang et al. |
| 10,162,139 | B1 | 12/2018 | Wang et al. |
| 10,163,798 | B1 | 12/2018 | Alur et al. |
| 10,163,802 | B2 | 12/2018 | Lin et al. |
| 10,177,188 | B2 | 1/2019 | Kang et al. |
| 10,204,684 | B2 | 2/2019 | Widjaja |
| 10,211,070 | B2 | 2/2019 | Lee et al. |
| 10,211,182 | B2 | 2/2019 | Meyer et al. |
| 10,256,219 | B2 | 4/2019 | Chew |
| 10,262,974 | B2 | 4/2019 | Yeh et al. |
| 10,276,382 | B2 | 4/2019 | Hunt et al. |
| 10,290,611 | B2 | 5/2019 | Yu et al. |
| 10,325,882 | B2 | 6/2019 | Kang et al. |
| 10,333,623 | B1 | 6/2019 | Liao et al. |
| 10,340,249 | B1 | 7/2019 | Yu et al. |
| 10,347,606 | B2 | 7/2019 | Yu et al. |
| 10,373,885 | B2 | 8/2019 | Yu et al. |
| 10,419,001 | B2 | 9/2019 | Jo et al. |
| 10,431,536 | B2 | 10/2019 | Kim et al. |
| 10,447,274 | B2 | 10/2019 | Lee et al. |
| 10,476,505 | B2 | 11/2019 | Ngai |
| 10,490,521 | B2 | 11/2019 | Hu et al. |
| 10,490,540 | B2 | 11/2019 | Yu et al. |
| 10,504,835 | B1 | 12/2019 | Wang et al. |
| 10,510,634 | B2 | 12/2019 | Lin et al. |
| 10,510,647 | B2 | 12/2019 | Heo et al. |
| 10,510,650 | B2 | 12/2019 | Yu et al. |
| 10,510,721 | B2 | 12/2019 | Bhagavat et al. |
| 10,522,449 | B2 | 12/2019 | Chen et al. |
| 10,529,666 | B2 | 1/2020 | Yu et al. |
| 10,535,638 | B2 | 1/2020 | Yeh et al. |
| 10,541,227 | B2 | 1/2020 | Yeh et al. |
| 10,541,228 | B2 | 1/2020 | Chen et al. |
| 10,622,310 | B2 | 4/2020 | Yang |
| 10,622,321 | B2 | 4/2020 | Yu et al. |
| 10,741,537 | B2 | 8/2020 | Lu et al. |
| 10,784,248 | B2 | 9/2020 | Yu et al. |
| 10,797,031 | B2 | 10/2020 | Liao et al. |
| 10,867,965 | B2 | 12/2020 | Shih et al. |
| 10,867,978 | B2 | 12/2020 | Bhagavat et al. |
| 10,892,011 | B2 | 1/2021 | Lin et al. |
| 10,892,291 | B2 | 1/2021 | Chhun et al. |
| 10,943,869 | B2 | 3/2021 | Zhai et al. |
| 11,056,463 | B2 | 7/2021 | Takahashi et al. |
| 11,114,408 | B2 | 9/2021 | Shen et al. |
| 11,133,254 | B2 | 9/2021 | Lai et al. |
| 11,158,580 | B2 | 10/2021 | Sio et al. |
| 11,211,334 | B2 | 12/2021 | Lin et al. |
| 11,217,368 | B2 | 1/2022 | Choa et al. |
| 11,276,661 | B2 | 3/2022 | Fang |
| 11,545,438 | B2 | 1/2023 | Hsieh et al. |
| 11,587,894 | B2 | 2/2023 | Chen et al. |
| 11,728,254 | B2 | 8/2023 | Hou et al. |
| 12,051,692 | B2 | 7/2024 | Shi et al. |
| 12,369,365 | B2 | 7/2025 | Yu et al. |
| 2001/0045844 | A1 | 11/2001 | Wang et al. |
| 2001/0051426 | A1 | 12/2001 | Pozder et al. |
| 2002/0092307 | A1 | 7/2002 | Ghoshal |
| 2003/0122578 | A1 | 7/2003 | Masui et al. |
| 2004/0041584 | A1 | 3/2004 | Sunaga et al. |
| 2004/0145850 | A1 | 7/2004 | Fukumoto et al. |
| 2004/0222817 | A1 | 11/2004 | Madurawe |
| 2005/0046002 | A1 | 3/2005 | Lee et al. |
| 2005/0185457 | A1 | 8/2005 | Kim et al. |
| 2005/0218929 | A1 | 10/2005 | Wang et al. |
| 2006/0138509 | A1 | 6/2006 | Lee et al. |
| 2007/0037379 | A1 | 2/2007 | Enquist et al. |
| 2007/0164279 | A1 | 7/2007 | Lin et al. |
| 2007/0166912 | A1 | 7/2007 | Fenigstein et al. |
| 2007/0279987 | A1 | 12/2007 | Fang et al. |
| 2009/0114971 | A1 | 5/2009 | Cai et al. |
| 2009/0243650 | A1 | 10/2009 | Madurawe |
| 2009/0243652 | A1 | 10/2009 | Dorairaj et al. |
| 2009/0267238 | A1 | 10/2009 | Joseph |
| 2010/0039136 | A1 | 2/2010 | Chua-Eoan et al. |
| 2010/0133704 | A1 | 6/2010 | Marimuthu et al. |
| 2010/0157669 | A1 | 6/2010 | Audzeyeu |
| 2010/0283085 | A1 | 11/2010 | Bemanian |
| 2011/0026232 | A1 | 2/2011 | Lin et al. |
| 2011/0221470 | A1 | 9/2011 | Javerliac et al. |
| 2012/0193785 | A1 | 8/2012 | Lin et al. |
| 2012/0217549 | A1 | 8/2012 | Widjaja |
| 2013/0037802 | A1 | 2/2013 | England et al. |
| 2013/0082399 | A1 | 4/2013 | Kim et al. |
| 2013/0257477 | A1 | 10/2013 | Yasuda et al. |
| 2013/0285253 | A1 | 10/2013 | Aoki et al. |
| 2014/0017882 | A1 | 1/2014 | Lei |
| 2014/0070380 | A1 | 3/2014 | Chiu et al. |
| 2014/0070403 | A1 | 3/2014 | Pan et al. |
| 2014/0112066 | A1 | 4/2014 | Chow et al. |
| 2014/0131858 | A1 | 5/2014 | Pan et al. |
| 2014/0183731 | A1 | 7/2014 | Lin et al. |

(56) References Cited

U.S. PATENT DOCUMENTS

| | | | |
|---|---|---|---|
| 2014/0185264 A1 | 7/2014 | Chen et al. | |
| 2014/0203412 A1 | 7/2014 | Wang et al. | |
| 2014/0210097 A1 | 7/2014 | Chen | |
| 2014/0254232 A1 | 9/2014 | Wu | |
| 2014/0302659 A1 | 10/2014 | Phatak | |
| 2014/0339692 A1 | 11/2014 | Kim et al. | |
| 2015/0008957 A1 | 1/2015 | Olgiati et al. | |
| 2015/0014844 A1 | 1/2015 | Wu et al. | |
| 2015/0085560 A1 | 3/2015 | Candelier et al. | |
| 2015/0116965 A1 | 4/2015 | Kim et al. | |
| 2015/0227662 A1 | 8/2015 | Lepercq | |
| 2015/0287672 A1 | 10/2015 | Yazdani | |
| 2015/0327367 A1 | 11/2015 | Shen | |
| 2016/0079205 A1 | 3/2016 | Lin et al. | |
| 2016/0093572 A1 | 3/2016 | Chen | |
| 2016/0118390 A1 | 4/2016 | Liaw | |
| 2016/0133571 A1 | 5/2016 | Lee et al. | |
| 2016/0141228 A1 | 5/2016 | Leobandung | |
| 2016/0173101 A1 | 6/2016 | Gao et al. | |
| 2016/0190113 A1 | 6/2016 | Sharan et al. | |
| 2016/0217835 A1 | 7/2016 | Blott et al. | |
| 2016/0351626 A1 | 12/2016 | McCollum | |
| 2016/0372449 A1 | 12/2016 | Rusu et al. | |
| 2017/0071552 A1 | 3/2017 | Harpe et al. | |
| 2017/0117263 A1 | 4/2017 | Yeh et al. | |
| 2017/0271248 A1 | 9/2017 | Chen et al. | |
| 2017/0301650 A1 | 10/2017 | Yu | |
| 2017/0358557 A1 | 12/2017 | Chen et al. | |
| 2018/0053730 A1 | 2/2018 | Shao | |
| 2018/0061742 A1 | 3/2018 | Ananiev | |
| 2018/0068937 A1 | 3/2018 | Marimuthu et al. | |
| 2018/0076179 A1 | 3/2018 | Hsu et al. | |
| 2018/0102776 A1 | 4/2018 | Chandrasekar et al. | |
| 2018/0138101 A1 | 5/2018 | Yu et al. | |
| 2018/0138116 A1* | 5/2018 | Lin | H01L 23/49816 |
| 2018/0150667 A1 | 5/2018 | Yu et al. | |
| 2018/0151477 A1 | 5/2018 | Yu et al. | |
| 2018/0151501 A1 | 5/2018 | Yu et al. | |
| 2018/0158746 A1 | 6/2018 | Lin | |
| 2018/0165396 A1 | 6/2018 | Lin et al. | |
| 2018/0174865 A1 | 6/2018 | Yu et al. | |
| 2018/0204810 A1 | 7/2018 | Yu et al. | |
| 2018/0204828 A1 | 7/2018 | Yu et al. | |
| 2018/0210799 A1 | 7/2018 | Gao et al. | |
| 2018/0226349 A1 | 8/2018 | Yu et al. | |
| 2018/0226371 A1 | 8/2018 | Enquist | |
| 2018/0247905 A1 | 8/2018 | Yu et al. | |
| 2018/0254260 A1 | 9/2018 | Wei et al. | |
| 2018/0269188 A1 | 9/2018 | Yu et al. | |
| 2018/0275193 A1 | 9/2018 | Rouge et al. | |
| 2018/0284186 A1 | 10/2018 | Chadha | |
| 2018/0286776 A1 | 10/2018 | Yu et al. | |
| 2018/0301351 A1 | 10/2018 | Yu et al. | |
| 2018/0301376 A1 | 10/2018 | Shih et al. | |
| 2018/0350629 A1 | 12/2018 | Liu et al. | |
| 2018/0350763 A1 | 12/2018 | Yu et al. | |
| 2018/0358312 A1 | 12/2018 | Yu et al. | |
| 2018/0374824 A1 | 12/2018 | Yu et al. | |
| 2019/0013276 A1 | 1/2019 | Lee et al. | |
| 2019/0019756 A1 | 1/2019 | Yu et al. | |
| 2019/0020343 A1 | 1/2019 | Lin et al. | |
| 2019/0051641 A1 | 2/2019 | Lin et al. | |
| 2019/0057931 A1 | 2/2019 | Hsu et al. | |
| 2019/0057932 A1 | 2/2019 | Wu et al. | |
| 2019/0067152 A1 | 2/2019 | Wuu et al. | |
| 2019/0097304 A1 | 3/2019 | Hsiao et al. | |
| 2019/0129817 A1 | 5/2019 | Zhuo et al. | |
| 2019/0131273 A1 | 5/2019 | Chen et al. | |
| 2019/0139896 A1* | 5/2019 | Hsu | H01L 23/5384 |
| 2019/0164834 A1 | 5/2019 | Or-Bach et al. | |
| 2019/0221547 A1 | 7/2019 | Drab et al. | |
| 2019/0238134 A1 | 8/2019 | Lin et al. | |
| 2019/0238135 A1 | 8/2019 | Lin et al. | |
| 2019/0245543 A1 | 8/2019 | Lin et al. | |
| 2019/0253056 A1 | 8/2019 | Lin et al. | |
| 2019/0304803 A1 | 10/2019 | Hu et al. | |
| 2019/0333871 A1 | 10/2019 | Chen et al. | |
| 2019/0347790 A1 | 11/2019 | Lin et al. | |
| 2019/0363715 A1 | 11/2019 | Lin et al. | |
| 2019/0371763 A1 | 12/2019 | Agarwal et al. | |
| 2019/0372574 A1 | 12/2019 | Lin et al. | |
| 2019/0393153 A1 | 12/2019 | Wang et al. | |
| 2020/0006274 A1 | 1/2020 | Chiang et al. | |
| 2020/0035604 A1 | 1/2020 | Rubin et al. | |
| 2020/0043853 A1 | 2/2020 | Kim et al. | |
| 2020/0058617 A1 | 2/2020 | Wu et al. | |
| 2020/0058626 A1 | 2/2020 | Tai et al. | |
| 2020/0058627 A1 | 2/2020 | Chen et al. | |
| 2020/0082885 A1 | 3/2020 | Lin et al. | |
| 2020/0111734 A1 | 4/2020 | Lin et al. | |
| 2020/0144224 A1 | 5/2020 | Lin et al. | |
| 2020/0161242 A1 | 5/2020 | Lin et al. | |
| 2020/0211922 A1 | 7/2020 | Chun et al. | |
| 2020/0243422 A1 | 7/2020 | Kim et al. | |
| 2020/0294923 A1 | 9/2020 | Bhagavat et al. | |
| 2020/0373215 A1 | 11/2020 | Wu et al. | |
| 2020/0395350 A1 | 12/2020 | Wu et al. | |
| 2020/0411443 A1 | 12/2020 | Guo et al. | |
| 2021/0005592 A1 | 1/2021 | Lin et al. | |
| 2021/0043557 A1 | 2/2021 | Lee et al. | |
| 2021/0050300 A1 | 2/2021 | Lin et al. | |
| 2021/0057332 A1 | 2/2021 | Chen et al. | |
| 2021/0090983 A1 | 3/2021 | Lin et al. | |
| 2021/0104551 A1 | 4/2021 | Lin et al. | |
| 2021/0159180 A1 | 5/2021 | Zhai et al. | |
| 2021/0217702 A1 | 7/2021 | Dabral et al. | |
| 2021/0225708 A1 | 7/2021 | Lee et al. | |
| 2021/0232744 A1 | 7/2021 | Lin et al. | |
| 2021/0265284 A1 | 8/2021 | Yu et al. | |
| 2021/0358901 A1 | 11/2021 | Liu | |
| 2022/0013504 A1 | 1/2022 | Lin et al. | |
| 2022/0020729 A1 | 1/2022 | Gao et al. | |
| 2022/0130823 A1 | 4/2022 | Su et al. | |
| 2022/0223494 A1 | 7/2022 | Lee et al. | |
| 2022/0384326 A1 | 12/2022 | Yang et al. | |
| 2023/0014913 A1 | 1/2023 | Chen et al. | |
| 2023/0095330 A1 | 3/2023 | Lee et al. | |
| 2023/0161120 A1 | 5/2023 | Yu et al. | |
| 2023/0187365 A1 | 6/2023 | Lin et al. | |
| 2023/0352439 A1 | 11/2023 | Chen et al. | |
| 2023/0352471 A1 | 11/2023 | Yu et al. | |
| 2023/0353151 A1 | 11/2023 | Lee et al. | |
| 2023/0363182 A1 | 11/2023 | Lin et al. | |
| 2023/0387038 A1 | 11/2023 | Hsieh et al. | |
| 2024/0014111 A1 | 1/2024 | Han et al. | |
| 2024/0055336 A1 | 2/2024 | Lin et al. | |
| 2024/0056082 A1 | 2/2024 | Lin et al. | |
| 2025/0081600 A1 | 3/2025 | Lee et al. | |
| 2025/0105238 A1 | 3/2025 | Lin et al. | |
| 2025/0125273 A1 | 4/2025 | Lin et al. | |
| 2025/0336907 A1 | 10/2025 | Lin et al. | |

FOREIGN PATENT DOCUMENTS

| | | |
|---|---|---|
| CN | 104282650 | 1/2015 |
| CN | 105745752 | 7/2016 |
| CN | 104064556 | 4/2019 |
| TW | 200623398 | 7/2006 |
| TW | 201413842 | 4/2014 |
| WO | WO00/36748 | 6/2000 |
| WO | WO2005010976 | 2/2005 |
| WO | WO2016160063 | 10/2016 |
| WO | WO2018004092 | 1/2018 |

* cited by examiner

211

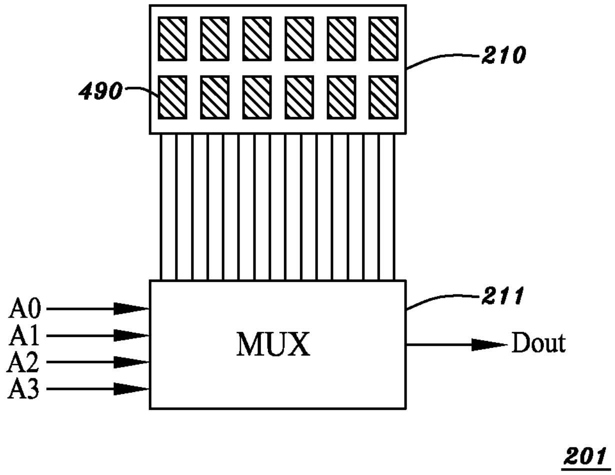
Fig. 4
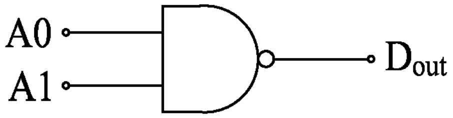
Fig. 5
| A0 | A1 | Dout | |
|---|---|---|---|
| 0 | 0 | 1 | D0 |
| 0 | 1 | 1 | D1 |
| 1 | 0 | 1 | D2 |
| 1 | 1 | 0 | D3 |
Fig. 6

300

Before reconfiguration

| $IU_{(n-1)}$ | $CPM_{(n-1)}$ | $L_{(n-1)}$ | $DIM_{(n-1)}$ |
|---|---|---|---|
| $IU_{(n-1)a}$ | $CPM_{(a,1,1)}$ | $L_{(n-1)a}$ | $DIM_{(a,1,1')}$<br>$DIM_{(a,2,2')}$ |
| $IU_{(n-1)b}$ | $CPM_{(b,2,2)}$<br>$CPM_{(b,3,3)}$ | $L_{(n-1)b}$ | $DIM_{(b,3,3')}$<br>$DIM_{(b,4,4')}$ |
| $IU_{(n-1)c}$ | $CPM_{(c,4,4)}$ | $L_{(n-1)c}$ | $DIM_{(c,5,5')}$<br>$DIM_{(c,6,6')}$<br>$DIM_{(c,7,6')}$ |

After reconfiguration

| $IUC_n$ | $CPMC_n$ | $LC_n$ | $DIMC_n$ |
|---|---|---|---|
| $IUC_{ne}$ | $CPMC_{(e,1,1)}$ | $LC_{ne}$ | $DIMC_{(e,1,1')}$<br>$DIMC_{(e,2,2')}$ |
| $IUC_{nf}$ | $CPMC_{(f,2,4)}$<br>$CPMC_{(f,3,5)}$ | $LC_{nf}$ | $DIMC_{(f,3,8')}$<br>$DIMC_{(f,4,9')}$<br>$DIMC_{(f,5,10')}$ |
| $IUC_{ng}$ | $CPMC_{(g,4,2)}$<br>$CPMC_{(g,5,5)}$ | $LC_{ng}$ | $DIMC_{(g,6,11')}$<br>$DIMC_{(g,8,5')}$ |
| $IUC_{nh}$ | $CPMC_{(h,6,6)}$ | $LC_{nh}$ | $DIMC_{(h,7,7')}$<br>$DIMC_{(h,9,6')}$ |

Fig. 24

LOGIC DRIVE USING STANDARD COMMODITY PROGRAMMABLE LOGIC IC CHIPS COMPRISING NON-VOLATILE RANDOM ACCESS MEMORY CELLS

PRIORITY CLAIM

This application is a continuation of application Ser. No. 17/497,968, filed Oct. 10, 2021, patent Ser. No. 11/711,082, which is a continuation of application Ser. No. 16/597,810, filed Oct. 9, 2019, patent Ser. No. 11/159,165, which is a continuation of application Ser. No. 16/262,875, filed Jan. 30, 2019, patent Ser. No. 10/523,210, which claims priority benefits from U.S. provisional application No. 62/624,825, filed on Feb. 1, 2018 and entitled "LOGIC DRIVE BASED ON STANDARD COMMODITY FPGA IC CHIPS"; U.S. provisional application No. 62/630,369, filed on Feb. 14, 2018 and entitled "LOGIC DRIVE WITH BRAIN-LIKE PLASTICITY AND INTEGRALITY"; U.S. provisional application No. 62/675,785, filed on May 24, 2018 and entitled "LOGIC DRIVE WITH BRAIN-LIKE ELASTICITY AND INTEGRALITY"; U.S. provisional application No. 62/729,527, filed on Sep. 11, 2018 and entitled "LOGIC DRIVE WITH BRAIN-LIKE ELASTICITY AND INTEGRALITY USING STANDARD COMMODITY PROGRAMMABLE LOGIC IC CHIPS"; and U.S. provisional application No. 62/755,415, filed on Nov. 2, 2018 and entitled "LOGIC DRIVE BASED ON STANDARDIZED COMMODITY PROGRAMMABLE LOGIC/MEMORY SEMICONDUCTOR IC CHIP SCALE PACKAGES". The present application incorporates the foregoing disclosures herein by reference.

BACKGROUND OF THE DISCLOSURE

Field of the Disclosure

The present invention relates to a logic package, logic package drive, logic device, logic module, logic drive, logic disk, logic disk drive, logic solid-state disk, logic solid-state drive, Field Programmable Gate Array (FPGA) logic disk, or FPGA logic drive (to be abbreviated as "logic drive" below, that is when "logic drive" is mentioned below, it means and reads as "logic package, logic package drive, logic device, logic module, logic drive, logic disk, logic disk drive, logic solid-state disk, logic solid-state drive, FPGA logic disk, or FPGA logic drive") comprising plural FPGA IC chips for field programming purposes, and more particularly to a standardized commodity logic drive formed by using plural standardized commodity FPGA IC chips comprising non-volatile random access memory cells, and to be used for different specific applications when field programmed or user programmed.

Brief Description of the Related Art

The Field Programmable Gate Array (FPGA) semiconductor integrated circuit (IC) has been used for development of new or innovated applications, or for small volume applications or business demands. When an application or business demand expands to a certain volume and extends to a certain time period, the semiconductor IC supplier may usually implement the application in an Application Specific IC (ASIC) chip, or a Customer-Owned Tooling (COT) IC chip. The switch from the FPGA design to the ASIC or COT design is because the current FPGA IC chip, for a given application and compared with an ASIC or COT chip, (1) has a larger semiconductor chip size, lower fabrication yield, and higher fabrication cost, (2) consumes more power, and (3) gives lower performance. When the semiconductor technology nodes or generations migrate, following the Moore's Law, to advanced nodes or generations (for example below 20 nm), the Non-Recurring Engineering (NRE) cost for designing an ASIC or COT chip increases greatly (more than US $5M or even exceeding US $10M, US $20M, US $50M or US $100M), FIG. 27. The cost of a photo mask set for an ASIC or COT chip at the 16 nm technology node or generation may be over US $1M, US $2M, US $3M, or US $5M. The high NRE cost in implementing the innovation and/or application using the advanced IC technology nodes or generations slows down or even stops the innovation and/or application using advanced and powerful semiconductor technology nodes or generations. A new approach or technology is needed to inspire the continuing innovation and to lower down the barrier for implementing the innovation in the semiconductor IC chips using the advanced and powerful semiconductor technology nodes or generations.

SUMMARY OF THE DISCLOSURE

One aspect of the disclosure provides a standardized commodity logic drive in a multi-chip package comprising plural FPGA IC chips for use in different algorithms, architectures and/or applications requiring logic, computing and/or processing functions by field programming. Uses of the standardized commodity logic drive is analogues to uses of a standardized commodity data storage solid-state disk (drive), data storage hard disk (drive), data storage floppy disk, Universal Serial Bus (USB) flash drive, USB drive, USB stick, flash-disk, or USB memory, and differs in that the latter has memory functions for data storage, while the former has logic functions for processing and/or computing.

Another aspect of the disclosure provides a method to reduce Non-Recurring Engineering (NRE) expenses for implementing (i) an innovation, (ii) an innovation process or application, and/or (iii) accelerating workload processing or application in semiconductor IC chips by using the standardized commodity logic drive, FIG. 27. A person, user, or developer with an innovation and/or an application concept or idea or an aim for accelerating workload processing may purchase the standardized commodity logic drive and develop or write software codes or programs to load into the standardized commodity logic drive to implement his/her innovation and/or application concept or idea; wherein said innovation and/or application (maybe abbreviated as innovation below) comprises (i) innovative algorithms and/or architectures of computing, processing, learning and/or inferencing, and/or (ii) innovative and/or specific applications. The standard commodity logic drive comprises plural FPGA IC chips fabricated by using advanced technology nodes or generations more advanced than 20 nm or 10 nm. The innovation is implemented in the logic drive by changing the hardware of FPGA IC chips by altering the programming interconnection and LUTs therein. Compared to the implementation by developing a logic ASIC or COT IC chip, implementing the same or similar innovation and/or application using the logic drive may reduce the NRE cost down to smaller than US $1M by developing a software and installing it in the purchased or rented standard commodity logic drive. The aspect of the disclosure inspires the innovation and lowers the barrier for implementing the innovation in IC chips designed and fabricated using an advanced IC technology node or generation, for example, a technology node or generation more advanced than or below 20 nm or 10 nm.

Another aspect of the disclosure provides a "public innovation platform" by using logic drives for innovators to easily and cheaply implement or realize their innovation (algorithms, architectures and/or applications) in semiconductor IC chips fabricated using advanced IC technology nodes more advanced than 20 nm or 10 nm, and for example, using a technology node of 16 nm, 10 nm, 7 nm, 5 nm or 3 nm, FIG. 27. In early days, 1990's, innovators could implement their innovation (algorithms, architectures and/or applications) by designing IC chips and fabricate their designed IC chips in a semiconductor foundry fab using technology nodes at 1 μm, 0.8 μm, 0.5 μm, 0.35 μm, 0.18 μm or 0.13 μm, at a cost of about several hundred thousands of US dollars. The IC foundry fab was then the "public innovation platform". However, when IC technology nodes migrate to a technology node more advanced than 20 nm or 10 nm, and for example to the technology node of 16 nm, 10 nm, 7 nm, 5 nm or 3 nm, only a few giant system or IC design companies, not the public innovators, can afford to use the semiconductor IC foundry fab. It costs about or over 5 million US dollars to develop and implement an IC chip using these advanced technology nodes. The semiconductor IC foundry fab is now not "public innovation platform" anymore, they are "club innovation platform" for club innovators only. The concept of the disclosed logic drives, comprising standard commodity FPGA IC chips, provides public innovators "public innovation platform" back to semiconductor IC industry again; just as in 1990's. The innovators can implement or realize their innovation (algorithms, architectures and/or applications) by using logic drives (comprising FPGA IC chips fabricated using advanced than 20 nm or 10 nm technology nodes) and writing software programs in common programing languages, for example, C, Java, C++, C #, Scala, Swift, Matlab, Assembly Language, Pascal, Python, Visual Basic, PL/SQL or JavaScript languages, at a cost of less than 500K or 300K US dollars. The innovators can install their developed software using their own standard commodity logic drives or rented standard commodity logic drives in data centers or clouds through networks.

Another aspect of the disclosure provides a method to change the current logic ASIC or COT IC chip business into a commodity logic IC chip business, like the current commodity DRAM, or commodity NAND flash memory IC chip business, by using the standardized commodity logic drive. Since the performance, power consumption, and engineering and manufacturing costs of the standardized commodity logic drive may be better or equal to that of the ASIC or COT IC chip for a same innovation (algorithms, architectures and/or applications) or an aim for accelerating workload processing, the standardized commodity logic drive may be used as an alternative for designing an ASIC or COT IC chip. The current logic ASIC or COT IC chip design, manufacturing and/or product companies (including fabless IC design and product companies, IC foundry or contracted manufactures (may be product-less), and/or vertically-integrated IC design, manufacturing and product companies) may become companies like the current commodity DRAM, or flash memory IC chip design, manufacturing, and/or product companies; or like the current DRAM module design, manufacturing, and/or product companies; or like the current flash memory module, flash USB stick or drive, or flash solid-state drive or disk drive design, manufacturing, and/or product companies.

Another aspect of the disclosure provides the standardized commodity logic drive, wherein a person, user, customer, or software developer, or algorithm/architecture/application developer may purchase the standardized commodity logic drive and write software codes to program them for his/her desired algorithms, architectures and/or applications, for example, in algorithms, architectures and/or applications of Artificial Intelligence (AI), machine learning, deep learning, big data, Internet Of Things (IOT), Virtual Reality (VR), Augmented Reality (AR), car electronics, Graphic Processing (GP), Digital Signal Processing (DSP), Micro Controlling (MC), and/or Central Processing (CP).

Another aspect of the disclosure provides a method to change the current logic ASIC or COT IC chip hardware business into a software business by using the standardized commodity logic drive. The current ASIC or COT IC chip design companies or suppliers may become software developers or suppliers; they may adapt the following business models: (1) become software companies to develop and sell/rent software for their innovation (algorithms, architectures and/or applications), and let their customers or users to install software in the customers' or users' own standard commodity logic drive. Alternatively, the software may be installed in the clouds or data centers and rented to users or customers; and/or (2) still hardware companies by selling hardware without performing ASIC or COT IC chip design and/or production. They may install their in-house developed software for the innovation (algorithms, architectures and/or applications) in one or plural non-volatile memory IC chip or chips in the purchased standard commodity logic drive, or in the non-volatile Random-Access-Memory cells (NVRAM) of the FPGA chips in the logic drive; and sell the program-installed logic drive to their customers or users. They may write software codes into the standard commodity logic drive (that is, loading the software codes in the non-volatile memory IC chip or chips in or of the standardized commodity logic drive, or in the NVRAM cells of the FPGA chips in the logic drive) for their desired algorithms, architectures and/or applications.

Another aspect of the disclosure provides a standard commodity FPGA IC chip for use in the standard commodity logic drive. The standard commodity FPGA IC chip is designed, implemented and fabricated using an advanced semiconductor technology node or generation, for example more advanced than or equal to, or below or equal to 20 nm or 10 nm, for example using the technology node of 16 nm, 14 nm, 12 nm, 10 nm, 7 nm, 5 nm or 3 nm. The manufacturing cost of the standard commodity FPGA IC chip can be reduced due to: (i) optimized chip size: Since the FPGA functions can be partitioned into several FPGA IC chips packaged in the logic drive, the FPGA chip size can be optimized for maximum manufacturing yield, therefore resulting in a minimum manufacturing cost; (ii) regular circuit arrays: All or most control and/or Input/Output (I/O) circuits or units (for example, the off-logic-drive I/O circuits, i.e., large I/O circuits, communicating with circuits or components external or outside of the logic drive) are outside of, or not included in, the standard commodity FPGA IC chip, but are included in another dedicated control chip or dedicated I/O chip packaged in the same logic drive. All or most area of the standard commodity FPGA IC chip is used for regular circuit arrays comprising logic gate arrays, computing units or operators, Look-Up-Tables (LUTs) and multiplexers, and/or programmable interconnection. For example, greater than 80%, 85%, 90%, 95% or 99% area (not counting the seal ring and the dicing area of the chip; that means, only including area upto the inner boundary of the seal ring) is used for the regular circuit arrays; or, all or most transistors of the standard commodity FPGA IC chip are used for the regular circuit arrays, for example, greater than 85%, 90%, 95% or 99% of the total number of transistors are used for the repetitive circuit arrays. A manufacture process can be tuned for the regular circuit arrays with a high manufacture yield and therefore reducing the manufacture costs.

Another aspect of the disclosure provides a FPGA IC chip comprising MRAM, RRAM or SS RRAM cells for non-volatile storage of data or information; wherein the FPGA IC chip is in the logic drive. The MRAM, RRAM or SS RRAM cells are used as configuration memory cells for storing configuration information or data to program (write into) the 5T or 6T SRAMs in the FPGA IC chip for programmable interconnection and/or LUTs. The MRAM, RRAM or SS RRAM cells form arrays in the FPGA IC chip, with a word line for selecting the MRAM, RRAM or SS RRAM cell for read, and a bit line for data output. The bit data from MRAM, RRAM or SS RRAM cells are coupled to the bit lines and input or coupled to a sense amplifier. The output data of the sense amplifier are then coupled to the 5T or 6T SRAMs for programmable interconnection and/or for the LUTs.

Another aspect of the disclosure provides the standard commodity logic drive in a multi-chip package comprising the standard commodity plural FPGA IC chips, for use in different algorithms, architectures and/or applications requiring logic, computing and/or processing functions by field programming, wherein the standard commodity plural FPGA IC chips, each is in a bare-die format or in a single-chip or multi-chip package. Each of standard commodity plural FPGA IC chips may have standard common features, counts or specifications: (1) logic blocks including (i) system gates with the count greater than or equal to 2M, 10M, 20M, 50M or 100M, (ii) logic cells or elements with the count greater than or equal to 64K, 128K, 512K, 1M, 4M or 8M, (iii) hard macros, for example DSP slices, microcontroller macros, multiplexer macros, fixed-wired adders, and/or fixed-wired multipliers and/or (iv) blocks of memory with the bit count equal to or greater than 1M, 10M, 50M, 100M, 200M or 500M bits; (2) the number of inputs to each of the logic blocks or operators: the number of inputs to each of the logic block or operator may be greater or equal to 4, 8, 16, 32, 64, 128, or 256; (3) the power supply voltage: the voltage may be between 0.1V and 8V, 0.1V and 6V, 0.1V and 2.5V, 0.1V and 2V, 0.1V and 1.5V, or 0.1V and 1V; (4) the I/O pads, in terms of layout, location, number and function. Since the FPGA chips are standard commodity IC chips, the number of FPGA chip designs or products for each technology node is reduced to a small number, therefore, the expensive photo masks or mask sets for fabricating the FPGA chips using advanced semiconductor nodes or generations are reduced to a few mask sets. For example, reduced down to between 3 and 20 mask sets, 3 and 10 mask sets, or 3 and 5 mask sets for a specific technology node or generation. The NRE and production expenses are therefore greatly reduced. With the few designs and products, the manufacturing processes may be tuned or optimized for the few chip designs or products, and resulting in very high manufacturing chip yields. This is similar to the current advanced standard commodity DRAM or NAND flash memory design and production. Furthermore, the chip inventory management becomes easy, efficient and effective; therefore, resulting in a shorter FPGA chip delivery time and becoming very cost-effective.

Another aspect of the disclosure provides the standard commodity logic drive in a multi-chip package comprising the plural standard commodity FPGA IC chips, for use in different algorithms, architectures and/or applications requiring logic, computing and/or processing functions by field programming, wherein the plural standard commodity FPGA IC chips, each is in a bare-die format or in a single-chip or multi-chip package. Each of the plural standard commodity FPGA IC chips may have standard common features or specifications as described and specified above. Similar to the standard DRAM IC chips for use in a DRAM module, the standard commodity FPGA IC chips in the logic drive, each chip may further comprise some additional I/O pins or pads, for example: (1) one chip enable pin, (2) one input enable pin, (3) one output enable pin, (4) two input selection pins and/or (5) two output selection pins. Each of the plural standard commodity FPGA IC chips may comprise, for example, 4 I/O ports, and each I/O port may comprise 64 bi-directional I/O circuits.

Another aspect of the disclosure provides the standard commodity logic drive in a multi-chip package comprising plural standard commodity FPGA IC chips, for use in different algorithms, architectures and/or applications requiring logic, computing and/or processing functions by field programming, wherein the plural standard commodity FPGA IC chips, each is in a bare-die format or in a single-chip or multi-chip package format. The standard commodity logic drive may have standard common features, counts or specifications: (1) logic blocks including (i) system gates with the count greater than or equal to 8M, 40M, 80M, 200M or 400M, (ii) logic cells or elements with the count greater than or equal to 256K, 512K, 2M, 4M, 16M or 32M, (iii) hard macros, for example DSP slices, microcontroller macros, multiplexer macros, fixed-wired adders, and/or fixed-wired multipliers and/or (iv) blocks of memory with the bit count equal to or greater than 4M, 40M, 200M, 400M, 800M or 2G bits; (2) the power supply voltage: the voltage may be between 0.1V and 12V, 0.1V and 7V, 0.1V and 3V, 0.1V and 2V, 0.1V and 1.5V, or 0.1V and 1V; (3) the I/O pads in the multi-chip package of the standard commodity logic drive, in terms of layout, location, number and function; wherein the logic drive may comprise the I/O pads, metal pillars or bumps connecting or coupling to one or multiple (2, 3, 4, or more than 4) Universal Serial Bus (USB) ports, one or more IEEE 1394 ports, one or more Ethernet ports, one or more audio ports or serial ports, for example, RS-232 or COM (communication) ports, wireless transceiver I/Os, and/or Bluetooth transceiver I/Os, and etc. Since the logic drives are standard commodity products, the product inventory management becomes easy, efficient and effective, therefore resulting in a shorter logic drive delivery time and becoming cost-effective.

Another aspect of the disclosure provides the standard commodity logic drive in a multi-chip package comprising plural standard commodity FPGA IC chips, further comprising a dedicated control chip and/or a dedicated I/O chip, designed, implemented and fabricated using varieties of semiconductor technology nodes or generations, including old or matured technology nodes or generations, for example, less advanced than or equal to, or more mature than 20 nm or 30 nm, and for example using the technology node of 22 nm, 28 nm, 40 nm, 90 nm, 130 nm, 180 nm, 250 nm, 350 nm or 500 nm.

Another aspect of the disclosure provides the logic drive in a multi-chip package comprising plural standard commodity FPGA IC chips, further comprising a processing and/or computing IC chip, for example, a Central Processing Unit (CPU) chip, a Graphic Processing Unit (GPU) chip, a Digital Signal Processing (DSP) chip, a Tensor Processing Unit (TPU) chip, and/or an Application Processing Unit (APU) chip.

Another aspect of the disclosure provides the logic drive in a multi-chip package comprising plural standard commodity FPGA IC chips, further comprising high speed, wide bit width, high bandwidth memory (HBM) SRAM or DRAM IC chips. The HBM IC chip may have a data bit width of equal to or greater than 64, 128, 256, 512, 1024, 2048, 4096, 8K, or 16K.

Another aspect of the disclosure provides a Temporary Substrate (T-Sub) with a Fan-Out Interconnection Scheme of the logic Drive (FOISD). The FOISD comprises fan-out interconnection metal lines or traces and micro metal pads, pillars or bumps on or over the T-Sub. The micro metal pads, pillars or bumps are used for flip-chip assembly or packaging in forming the multi-chip package of the logic drive. The IC chips or packages to be flip-chip assembled, bonded or packaged, to the substrate (T-Sub) include the chips or packages: the standard commodity FPGA chips, the dedicated control chip, the dedicated I/O chip, SRAM or DRAM HBM IC chips and/or the processing and/or computing IC chip, for example CPU, GPU, DSP, TPU, or APU chip.

Another aspect of the disclosure provides a method for forming the logic drive in a multi-chip package using a Fan-out Interconnection Technology (FOIT). The FOIT uses the temporary substrate (T-Sub) with the FOISD on or over it, and is based on flip-chip assembled multi-chip packaging technology and process.

Another aspect of the disclosure provides the standard commodity FOIT multi-chip packaged logic drive. The standard commodity FOIT logic drive may be in a shape of square or rectangle, with a certain widths, lengths and thicknesses. An industry standard may be set for the shape and dimensions of the logic drive. Furthermore, the metal bumps or pillars on or under the FOISD in the logic drive may be in a standard footprint, for example, in an area array of M×N with a standard dimension of pitch and space between neighboring two metal bumps or pillars. The location of each metal bumps or pillars is also at a standard location.

Another aspect of the disclosure provides a method for forming a single-layer-packaged logic drive suitable for the stacked POP (Package-On-Package) assembling technology. The single-layer-packaged logic drive comprises a Backside metal Interconnection Scheme (abbreviated as BISD in below) at the backside of the single-layer-packaged logic drive and Through-Package-Vias, or Thought Polymer Vias (TPVs) in the gaps between chips in or of the logic drive, and/or in the peripheral area of the logic drive package and outside the edges of chips in or of the logic drive (the side with transistors of the IC chips are facing down).

Another aspect of the disclosure provides a method for forming a stacked logic driver using the single-layer-packaged logic drive with the BISD and TPVs.

Another aspect of the disclosure provides the logic drive in a multi-chip package format further comprising one or plural dedicated programmable interconnection IC (DPIIC) chip or chips. The DPIIC chip comprises 5T or 6T SRAM cells and cross-point switches, and is used for programming the interconnection between circuits or interconnections of the standard commodity FPGA chips. The programmable interconnections comprise interconnection metal lines or traces of the FOISD between the standard commodity FPGA chips, with cross-point switch circuits in the middle of interconnection metal lines or traces of the FOISD.

Another aspect of the disclosure provides a reconfigurable elastic and/or integral architecture for system/machine computing or processing using integral and alterable memory units and logic units of the logic drive. The data or information stored in the Data or Information Memory (DIM) cells in the logic drive may be used to reconfigure, change or alter the Data or Information in the Configuration Programming Memory (CPM) cells, therefore reconfigure, change or alter the logic blocks in the FPGA IC chips of the logic drive.

These, as well as other components, steps, features, benefits, and advantages of the present application, will now become clear from a review of the following detailed description of illustrative embodiments, the accompanying drawings, and the claims.

BRIEF DESCRIPTION OF THE DRAWINGS

The drawings disclose illustrative embodiments of the present application. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same reference number or reference indicator appears in different drawings, it may refer to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings:

FIG. 4 is a schematic view showing a block diagram of a programmable logic block in accordance with an embodiment of the present application.

FIG. 5 shows a NAND gate in accordance with the present application.

FIG. 6 shows a truth table for a NAND gate in accordance with the present application.

FIG. 24 shows two tables illustrating reconfiguration for a commodity standard logic drive in accordance with an embodiment of the present application.

Figure 1A:
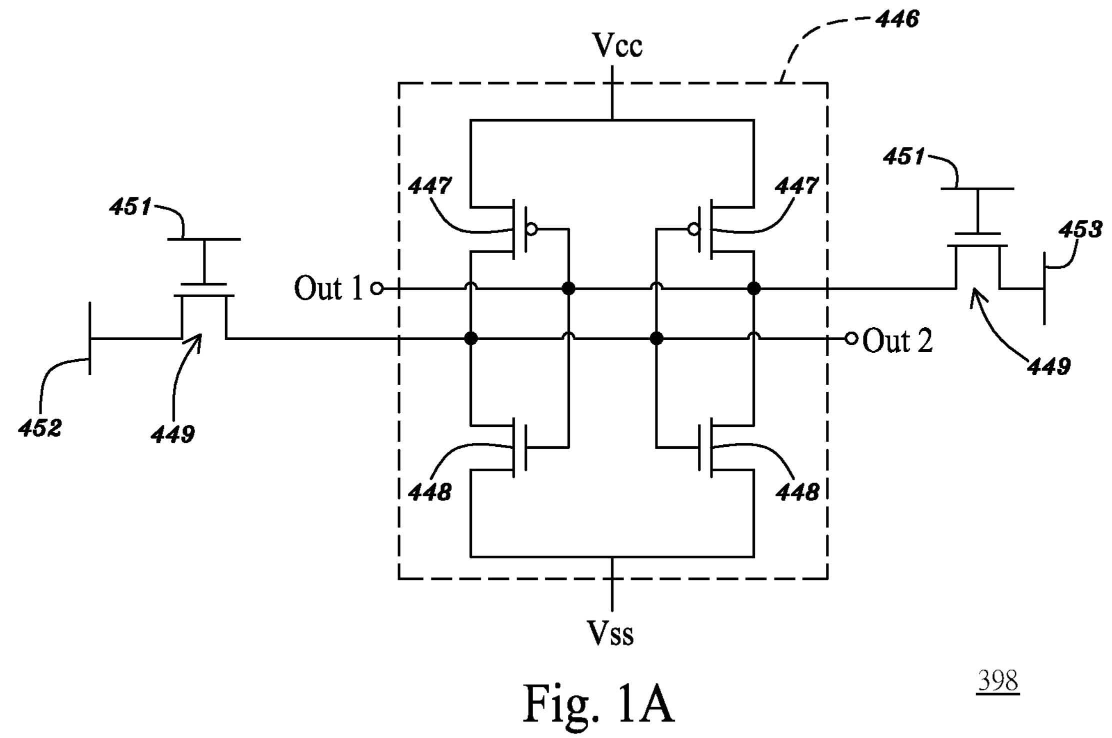
FIGS. 1A and 1B are circuit diagrams illustrating various types of memory cells in accordance with an embodiment of the present application.

While certain embodiments are depicted in the drawings, one skilled in the art will appreciate that the embodiments depicted are illustrative and that variations of those shown, as well as other embodiments described herein, may be envisioned and practiced within the scope of the present application.

DETAILED DESCRIPTION OF THE DISCLOSURE

Illustrative embodiments are now described. Other embodiments may be used in addition or instead. Details that may be apparent or unnecessary may be omitted to save space or for a more effective presentation. Conversely, some embodiments may be practiced without all of the details that are disclosed.

Specification for Static Random-Access Memory (SRAM) cells (1) First Type of SRAM Cell (6T SRAM Cell)

FIG. 1A is a circuit diagram illustrating a 6T SRAM cell in accordance with an embodiment of the present application. Referring to FIG. 1A, a first type of static random-access memory (SRAM) cell 398, i.e., 6T SRAM cell, may have a memory unit 446 composed of 4 data-latch transistors 447 and 448, that is, two pairs of a P-type MOS transistor 447 and N-type MOS transistor 448 both having respective drain terminals coupled to each other, respective gate terminals coupled to each other and respective source terminals coupled to the voltage Vcc of power supply and to the voltage Vss of ground reference. The gate terminals of the P-type and N-type MOS transistors 447 and 448 in the left pair are coupled to the drain terminals of the P-type and N-type MOS transistors 447 and 448 in the right pair, acting as an output Out1 of the memory unit 446. The gate terminals of the P-type and N-type MOS transistors 447 and 448 in the right pair are coupled to the drain terminals of the P-type and N-type MOS transistors 447 and 448 in the left pair, acting as an output Out2 of the memory unit 446.

Referring to FIG. 1A, the first type of SRAM cell 398 may further include two switches or transfer (write) transistor 449, such as N-type or P-type MOS transistors, a first one of which has a gate terminal coupled to a word line 451 and a channel having a terminal coupled to a bit line 452 and another terminal coupled to the drain terminals of the P-type and N-type MOS transistors 447 and 448 in the left pair and the gate terminals of the P-type and N-type MOS transistors 447 and 448 in the right pair, and a second one of which has a gate terminal coupled to the word line 451 and a channel having a terminal coupled to a bit-bar line 453 and another terminal coupled to the drain terminals of the P-type and N-type MOS transistors 447 and 448 in the right pair and the gate terminals of the P-type and N-type MOS transistors 447 and 448 in the left pair. A logic level on the bit line 452 is opposite a logic level on the bit-bar line 453. The switch 449 may be considered as a programming transistor for writing a programing code or data into storage nodes of the 4 data-latch transistors 447 and 448, i.e., at the drains and gates of the 4 data-latch transistors 447 and 448. The switches 449 may be controlled via the word line 451 to turn on connection from the bit line 452 to the drain terminals of the P-type and N-type MOS transistors 447 and 448 in the left pair and the gate terminals of the P-type and N-type MOS transistors 447 and 448 in the right pair via the channel of the first one of the switches 449, and thereby the logic level on the bit line 452 may be reloaded into the conductive line between the gate terminals of the P-type and N-type MOS transistors 447 and 448 in the right pair and the conductive line between the drain terminals of the P-type and N-type MOS transistors 447 and 448 in the left pair. Further, the bit-bar line 453 may be coupled to the drain terminals of the P-type and N-type MOS transistors 447 and 448 in the right pair and the gate terminals of the P-type and N-type MOS transistors 447 and 448 in the left pair via the channel of the second one of the switches 449, and thereby the logic level on the bit line 453 may be reloaded into the conductive line between the gate terminals of the P-type and N-type MOS transistors 447 and 448 in the left pair and the conductive line between the drain terminals of the P-type and N-type MOS transistors 447 and 448 in the right pair. Thus, the logic level on the bit line 452 may be registered or latched in the conductive line between the gate terminals of the P-type and N-type MOS transistors 447 and 448 in the right pair and in the conductive line between the drain terminals of the P-type and N-type MOS transistors 447 and 448 in the left pair; a logic level on the bit line 453 may be registered or latched in the conductive line between the gate terminals of the P-type and N-type MOS transistors 447 and 448 in the left pair and in the conductive line between the drain terminals of the P-type and N-type MOS transistors 447 and 448 in the right pair.

(2) Second Type of SRAM Cell (5T SRAM Cell)

Figure 1B:
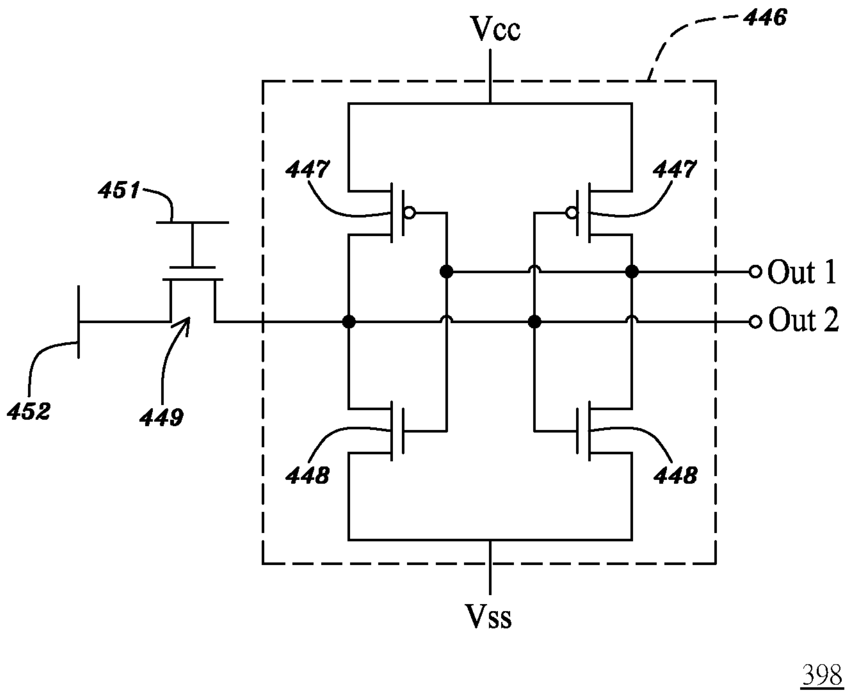

FIG. 1B is a circuit diagram illustrating a 5T SRAM cell in accordance with an embodiment of the present application. Referring to FIG. 1B, a second type of static random-access memory (SRAM) cell 398, i.e., 5T SRAM cell, may have the memory unit 446 as illustrated in FIG. 1A. The second type of static random-access memory (SRAM) cell 398 may further have a switch or transfer (write) transistor 449, such as N-type or P-type MOS transistor, having a gate terminal coupled to a word line 451 and a channel having a terminal coupled to a bit line 452 and another terminal coupled to the drain terminals of the P-type and N-type MOS transistors 447 and 448 in the left pair and the gate terminals of the P-type and N-type MOS transistors 447 and 448 in the right pair. The switch 449 may be considered as a programming transistor for writing a programing code or data into storage nodes of the 4 data-latch transistors 447 and 448, i.e., at the drains and gates of the 4 data-latch transistors 447 and 448. The switch 449 may be controlled via the word line 451 to turn on connection from the bit line 452 to the drain terminals of the P-type and N-type MOS transistors 447 and 448 in the left pair and the gate terminals of the P-type and N-type MOS transistors 447 and 448 in the right pair via the channel of the switch 449, and thereby a logic level on the bit line 452 may be reloaded into the conductive line between the gate terminals of the P-type and N-type MOS transistors 447 and 448 in the right pair and the conductive line between the drain terminals of the P-type and N-type MOS transistors 447 and 448 in the left pair. Thus, the logic level on the bit line 452 may be registered or latched in the conductive line between the gate terminals of the P-type and N-type MOS transistors 447 and 448 in the right pair and in the conductive line between the drain terminals of the P-type and N-type MOS transistors 447 and 448 in the left pair; a logic level, opposite to the logic level on the bit line 452, may be registered or latched in the conductive line between the gate terminals of the P-type and N-type MOS transistors 447 and 448 in the left pair and in the conductive line between the drain terminals of the P-type and N-type MOS transistors 447 and 448 in the right pair.

Specification for Multiplexer (MUXER)

Figure 2:
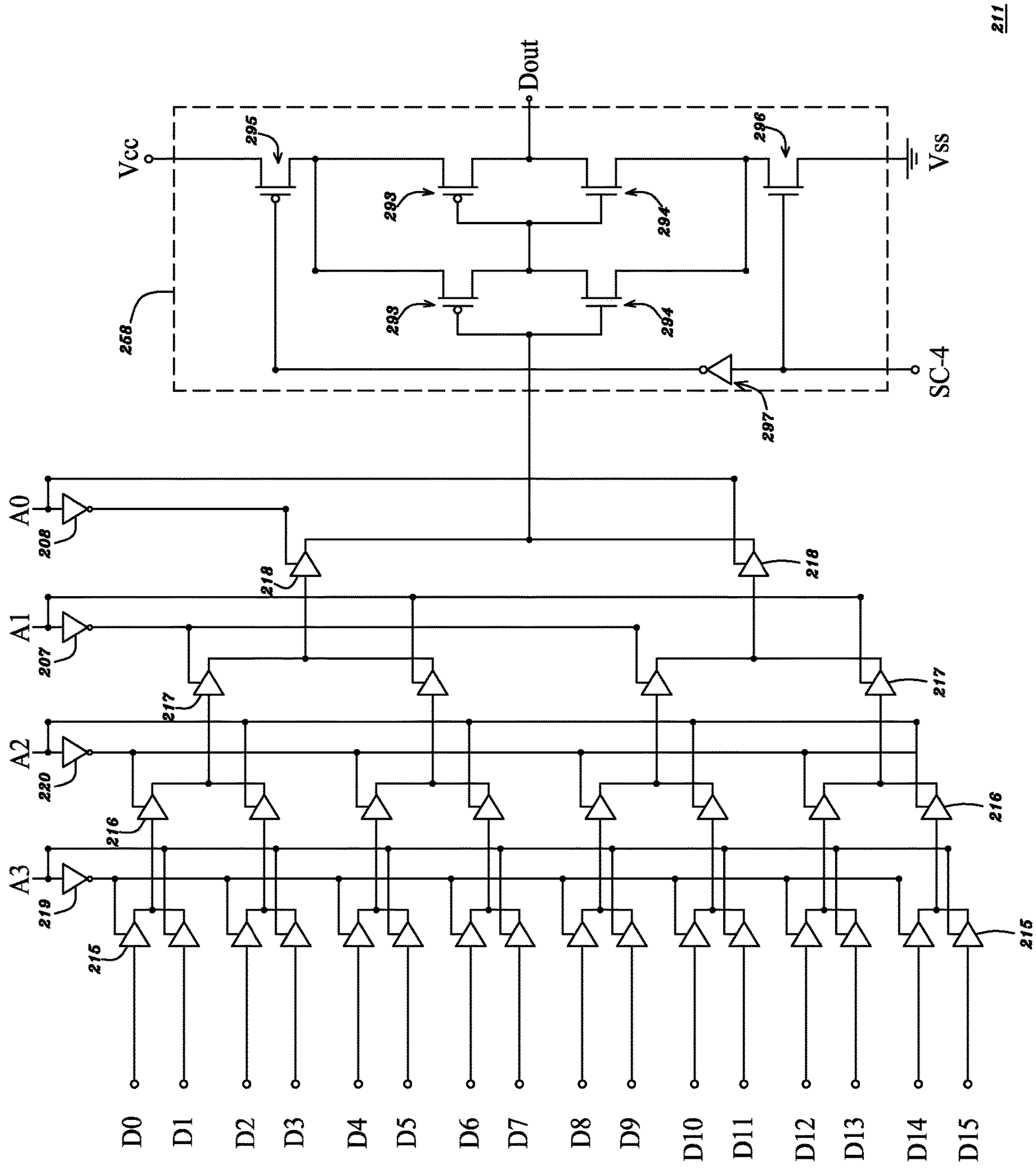
FIG. 2 is a circuit diagram illustrating a type of multiplexers in accordance with an embodiment of the present application.

FIG. 2 is a circuit diagram illustrating a multiplexer in accordance with an embodiment of the present application. Referring to FIG. 2, a multiplexer (MUXER) 211 may select one from its first set of inputs arranged in parallel into its output based on a combination of its second set of inputs arranged in parallel. For example, the multiplexer (MUXER) 211 may have sixteen inputs D0-D15 arranged in parallel to act as its first set of inputs and four inputs A0-A3 arranged in parallel to act as its second set of inputs. The multiplexer (MUXER) 211 may select one from its first set of sixteen inputs D0-D15 into its output Dout based on a combination of its second set of four inputs A0-A3.

Referring to FIG. 2, the multiplexer 211 may include multiple stages of tri-state buffers, e.g., four stages of tri-state buffers 215, 216, 217 and 218, coupling to one another stage by stage. For more elaboration, the multiplexer 211 may include sixteen tri-state buffers 215 in eight pairs in the first stage, arranged in parallel, each having a first input coupling to one of the sixteen inputs D0-D15 in the first set and a second input associated with the input A3 in the second set. Each of the sixteen tri-state buffers 215 in the first stage may be switched on or off to pass or not to pass its first input into its output in accordance with its second input. The multiplexer 211 may include an inverter 219 configured to invert its input coupling to the input A3 in the second set into its output. One of the tri-state buffers 215 in each pair in the first stage may be switched on in accordance with its second input coupling to one of the input and output of the inverter 219 to pass its first input into its output; the other one of the tri-state buffers 215 in said each pair in the first stage may be switched off in accordance with its second input coupling to the other one of the input and output of the inverter 219 not to pass its first input into its output. The outputs of the tri-state buffers 215 in said each pair in the first stage may couple to each other. For example, a top one of the tri-state buffers 215 in a topmost pair in the first stage may have its first input coupling to the input DO in the first set and its second input coupling to the output of the inverter 219; a bottom one of the tri-state buffers 215 in the topmost pair in the first stage may have its first input coupling to the input D1 in the first set and its second input coupling to the input of the inverter 219. The top one of the tri-state buffers 215 in the topmost pair in the first stage may be switched on in accordance with its second input to pass its first input into its output; the bottom one of the tri-state buffers 215 in the topmost pair in the first stage may be switched off in accordance with its second input not to pass its first input into its output. Thereby, each of the eight pairs of tri-state buffers 215 in the first stage may be switched in accordance with its two second inputs coupling to the input and output of the inverter 219 respectively to pass one of its two first inputs into its output coupling to a first input of one of the tri-state buffers 216 in the second stage.

Referring to FIG. 2, the multiplexer 211 may include eight tri-state buffers 216 in four pairs in the second stage, arranged in parallel, each having a first input coupling to the output of one of the eight pairs of tri-state buffers 215 in the first stage and a second input associated with the input A2 in the second set. Each of the eight tri-state buffers 216 in the second stage may be switched on or off to pass or not to pass its first input into its output in accordance with its second input. The multiplexer 211 may include an inverter 220 configured to invert its input coupling to the input A2 in the second set into its output. One of the tri-state buffers 216 in each pair in the second stage may be switched on in accordance with its second input coupling to one of the input and output of the inverter 220 to pass its first input into its output; the other one of the tri-state buffers 216 in said each pair in the second stage may be switched off in accordance with its second input coupling to the other one of the input and output of the inverter 220 not to pass its first input into its output. The outputs of the tri-state buffers 216 in said each pair in the second stage may couple to each other. For example, a top one of the tri-state buffers 216 in a topmost pair in the second stage may have its first input coupling to the output of a topmost one of the eight pairs of tri-state buffers 215 in the first stage and its second input coupling to the output of the inverter 220; a bottom one of the tri-state buffers 216 in the topmost pair in the second stage may have its first input coupling to the output of a second top one of the eight pairs of tri-state buffers 215 in the first stage and its second input coupling to the input of the inverter 220. The top one of the tri-state buffers 216 in the topmost pair in the second stage may be switched on in accordance with its second input to pass its first input into its output; the bottom one of the tri-state buffers 216 in the topmost pair in the second stage may be switched off in accordance with its second input not to pass its first input into its output. Thereby, each of the four pairs of tri-state buffers 216 in the second stage may be switched in accordance with its two second inputs coupling to the input and output of the inverter 220 respectively to pass one of its two first inputs into its output coupling to a first input of one of the tri-state buffers 217 in the third stage.

Referring to FIG. 2, the multiplexer 211 may include four tri-state buffers 217 in two pairs in the third stage, arranged in parallel, each having a first input coupling to the output of one of the four pairs of tri-state buffers 216 in the second stage and a second input associated with the input A1 in the second set. Each of the four tri-state buffers 217 in the third stage may be switched on or off to pass or not to pass its first input into its output in accordance with its second input. The multiplexer 211 may include an inverter 207 configured to invert its input coupling to the input A1 in the second set into its output. One of the tri-state buffers 217 in each pair in the third stage may be switched on in accordance with its second input coupling to one of the input and output of the inverter 207 to pass its first input into its output; the other one of the tri-state buffers 217 in said each pair in the third stage may be switched off in accordance with its second input coupling to the other one of the input and output of the inverter 207 not to pass its first input into its output. The outputs of the tri-state buffers 217 in said each pair in the third stage may couple to each other. For example, a top one of the tri-state buffers 217 in a top pair in the third stage may have its first input coupling to the output of a topmost one of the four pairs of tri-state buffers 216 in the second stage and its second input coupling to the output of the inverter 207; a bottom one of the tri-state buffers 217 in the top pair in the third stage may have its first input coupling to the output of a second top one of the four pairs of tri-state buffers 216 in the second stage and its second input coupling to the input of the inverter 207. The top one of the tri-state buffers 217 in the top pair in the third stage may be switched on in accordance with its second input to pass its first input into its output; the bottom one of the tri-state buffers 217 in the top pair in the third stage may be switched off in accordance with its second input not to pass its first input into its output. Thereby, each of the two pairs of tri-state buffers 217 in the third stage may be switched in accordance with its two second inputs coupling to the input and output of the inverter 207 respectively to pass one of its two first inputs into its output coupling to a first input of one of the tri-state buffers 218 in the fourth stage.

Referring to FIG. 2, the multiplexer 211 may include a pair of two tri-state buffers 218 in the fourth stage, i.e., output stage, arranged in parallel, each having a first input coupling to the output of one of the two pairs of tri-state buffers 217 in the third stage and a second input associated with the input A0 in the second set. Each of the two tri-state buffers 218 in the pair in the fourth stage, i.e., output stage, may be switched on or off to pass or not to pass its first input into its output in accordance with its second input. The multiplexer 211 may include an inverter 208 configured to invert its input coupling to the input A0 in the second set into its output. One of the two tri-state buffers 218 in the pair in the fourth stage, i.e., output stage, may be switched on in accordance with its second input coupling to one of the input and output of the inverter 208 to pass its first input into its output; the other one of the two tri-state buffers 218 in the pair in the fourth stage, i.e., output stage, may be switched off in accordance with its second input coupling to the other one of the input and output of the inverter 208 not to pass its first input into its output. The outputs of the two tri-state buffers 218 in the pair in the fourth stage, i.e., output stage, may couple to each other. For example, a top one of the two tri-state buffers 218 in the pair in the fourth stage, i.e., output stage, may have its first input coupling to the output of a top one of the two pairs of tri-state buffers 217 in the third stage and its second input coupling to the output of the inverter 208; a bottom one of the two tri-state buffers 218 in the pair in the fourth stage, i.e., output stage, may have its first input coupling to the output of a bottom one of the two pairs of tri-state buffers 217 in the third stage and its second input coupling to the input of the inverter 208. The top one of the two tri-state buffers 218 in the pair in the fourth stage, i.e., output stage, may be switched on in accordance with its second input to pass its first input into its output; the bottom one of the two tri-state buffers 218 in the pair in the fourth stage, i.e., output stage, may be switched off in accordance with its second input not to pass its first input into its output.

Referring to FIG. 2, the multiplexer 211 may further include a pass/no-pass switch or switch buffer 292 coupling to the output of the pair of tri-state buffers 218 in the last stage, e.g., in the fourth stage or output stage in this case. The pass/no-pass switch 258 may be a multi-stage tri-state buffer 292, i.e., switch buffer, having a pair of a P-type MOS transistor 293 and N-type MOS transistor 294 in each stage, both having respective drain terminals coupling to each other and respective source terminals configured to couple to the voltage Vcc of power supply and to the voltage Vss of ground reference. In this case, the multi-stage tri-state buffer 292 is two-stage tri-state buffer, i.e., two-stage inverter buffer, having two pairs of the P-type MOS transistor 293 and N-type MOS transistor 294 in the two respective stages, i.e., first and second stages. The gate terminals of the P-type MOS and N-type MOS transistors 293 and 294 in the pair in the first stage may act as an input of the pass/no-pass switch 258 coupling to the output of the pair of tri-state buffers 218 in the last stage, e.g., in the fourth stage or output stage in this case. The drain terminals of the P-type MOS and N-type MOS transistors 293 and 294 in the pair in the first stage may couple to gate terminals of the P-type MOS and N-type MOS transistors 293 and 294 in the pair in the second stage, i.e., output stage. The drain terminals of the P-type MOS and N-type MOS transistors 293 and 294 in the pair in the second stage, i.e., output stage, may act as an output of the pass/no-pass switch 258, i.e., output Dout of the multiplexer 211.

Referring to FIG. 2, the multi-stage tri-state buffer 292 may further include a switching mechanism configured to enable or disable the multi-stage tri-state buffer 292, wherein the switching mechanism may be composed of (1) a control P-type MOS transistor 295 having a source terminal coupling to the voltage Vcc of power supply and a drain terminal coupling to the source terminals of the P-type MOS transistors 293 in the first and second stages, (2) a control N-type MOS transistor 296 having a source terminal coupling to the voltage Vss of ground reference and a drain terminal coupling to the source terminals of the N-type MOS transistors 294 in the first and second stages and (3) an inverter 297 configured to invert its input coupling to a gate terminal of the control N-type MOS transistor 296 and a node SC-4 into its output coupling to a gate terminal of the control P-type MOS transistor 295.

For example, referring to FIG. 2, when a logic level of "1" couples to the node SC-4 to turn on the multi-stage tri-state buffer 292, the pass/no-pass switch 292 may pass the output of the pair of tri-state buffers 218 in the last stage, e.g., in the fourth stage or output stage, to the output Dout of the multiplexer 211. When a logic level of "0" couples to the node SC-4 to turn off the multi-stage tri-state buffer 292, the pass/no-pass switch 292 may not pass the output of the pair of tri-state buffers 218 in the last stage, e.g., in the fourth stage or output stage, to the output Dout of the multiplexer 211. The pass/no-pass switch 292 may amplify its input into its output acting as the output Dout of the multiplexer 211. Thereby, the multiplexer (MUXER) 211 may select one from its first set of sixteen inputs D0-D15 based on a combination of its second set of four inputs A0-A3 and then amplify the selected one into its output Dout.

Specification for Large I/O Circuits

Figure 3A:
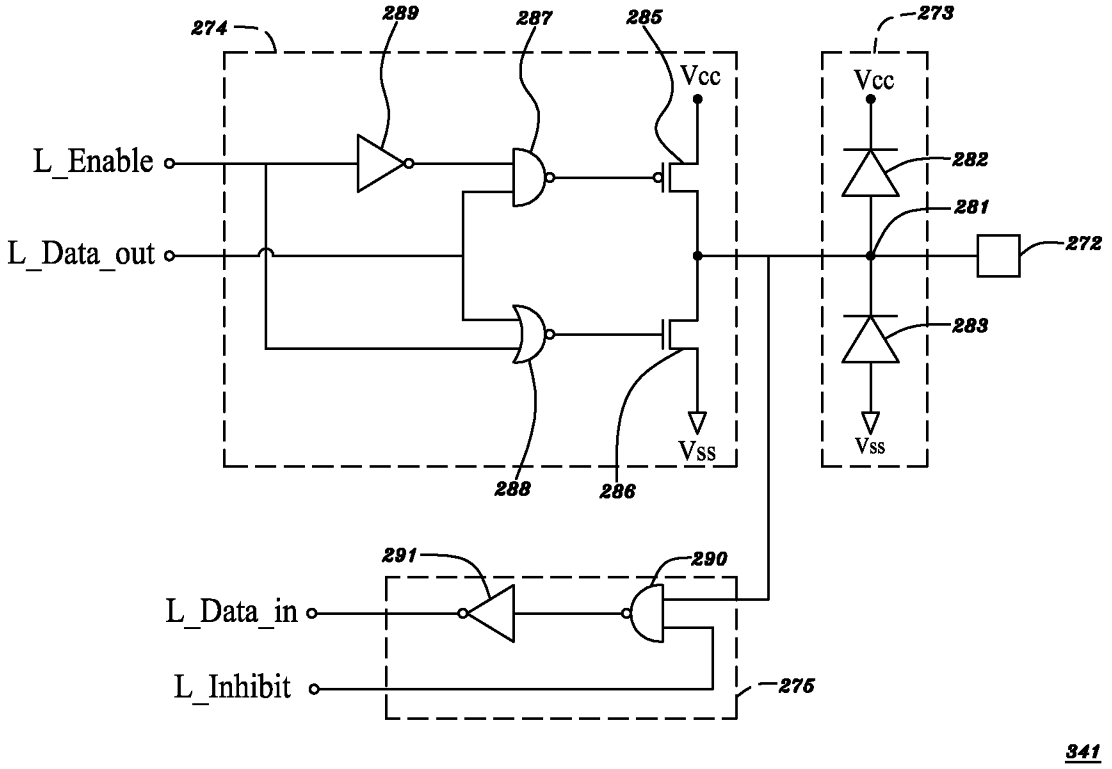
FIG. 3A is a circuit diagram of a large I/O circuit in accordance with an embodiment of the present application.

FIG. 3A is a circuit diagram of a large I/O circuit in accordance with an embodiment of the present application. Referring to FIG. 3A, a semiconductor chip may include multiple I/O pads 272 each coupling to its large electrostatic-discharge (ESD) protection circuit or device 273, its large driver 274 and its large receiver 275. The large driver 274, large receiver 275 and large ESD protection circuit or device 273 may compose a large I/O circuit 341. The large ESD protection circuit or device 273 may include a diode 282 having a cathode coupling to the voltage Vcc of power supply and an anode coupling to a node 281 and a diode 283 having a cathode coupling to the node 281 and an anode coupling to the voltage Vss of ground reference. The node 281 couples to one of the I/O pads 272.

Referring to FIG. 3A, the large driver 274 may have a first input coupling to an L_Enable signal for enabling the large driver 274 and a second input coupling to data of L_Data_out for amplifying or driving the data of L_Data_out into its output at the node 281 to be transmitted to circuits outside the semiconductor chip through said one of the I/O pads 272. The large driver 274 may include a P-type MOS transistor 285 and N-type MOS transistor 286 both having respective drain terminals coupling to each other as its output at the node 281 and respective source terminals coupling to the voltage Vcc of power supply and to the voltage Vss of ground reference. The large driver 274 may have a NAND gate 287 having an output coupling to a gate terminal of the P-type MOS transistor 285 and a NOR gate 288 having an output coupling to a gate terminal of the N-type MOS transistor 286. The large driver 274 may include the NAND gate 287 having a first input coupling to an output of its inverter 289 and a second input coupling to the data of L_Data_out to perform a NAND operation on its first and second inputs into its output coupling to a gate terminal of its P-type MOS transistor 285. The large driver 274 may include the NOR gate 288 having a first input coupling to the data of L_Data_out and a second input coupling to the L_Enable signal to perform a NOR operation on its first and second inputs into its output coupling to a gate terminal of the N-type MOS transistor 286. The inverter 289 may be configured to invert its input coupling to the L_Enable signal into its output coupling to the first input of the NAND gate 287.

Referring to FIG. 3A, when the L_Enable signal is at a logic level of "1", the output of the NAND gate 287 is always at a logic level of "1" to turn off the P-type MOS transistor 285 and the output of the NOR gate 288 is always at a logic level of "0" to turn off the N-type MOS transistor 286. Thereby, the large driver 274 may be disabled by the L_Enable signal and the data of L_Data_out may not be passed to the output of the large driver 274 at the node 281.

Referring to FIG. 3A, the large driver 274 may be enabled when the L_Enable signal is at a logic level of "0". Meanwhile, if the data of L_Data_out is at a logic level of "0", the outputs of the NAND and NOR gates 287 and 288 are at logic level of "1" to turn off the P-type MOS transistor 285 and on the N-type MOS transistor 286, and thereby the output of the large driver 274 at the node 281 is at a logic level of "0" to be passed to said one of the I/O pads 272. If the data of L_Data_out is at a logic level of "1", the outputs of the NAND and NOR gates 287 and 288 are at logic level of "0" to turn on the P-type MOS transistor 285 and off the N-type MOS transistor 286, and thereby the output of the large driver 274 at the node 281 is at a logic level of "1" to be passed to said one of the I/O pads 272. Accordingly, the large driver 274 may be enabled by the L_Enable signal to amplify or drive the data of L_Data_out into its output at the node 281 coupling to one of the I/O pads 272.

Referring to FIG. 3A, the large receiver 275 may have a first input coupling to said one of the I/O pads 272 to be amplified or driven by the large receiver 275 into its output of L_Data_in and a second input coupling to an L_Inhibit signal to inhibit the large receiver 275 from generating its output of L_Data_in associated with data at its first input. The large receiver 275 may include a NAND gate 290 having a first input coupling to said one of the I/O pads 272 and a second input coupling to the L_Inhibit signal to perform a NAND operation on its first and second inputs into its output coupling to its inverter 291. The inverter 291 may be configured to invert its input coupling to the output of the NAND gate 290 into its output acting as the output of L_Data_in of the large receiver 275.

Referring to FIG. 3A, when the L_Inhibit signal is at a logic level of "0", the output of the NAND gate 290 is always at a logic level of "1" and the output L_Data_in of the large receiver 275 is always at a logic level of "0". Thereby, the large receiver 275 is inhibited from generating its output of L_Data_in associated with its first input at said one of the I/O pads 272.

Referring to FIG. 3A, the large receiver 275 may be activated when the L_Inhibit signal is at a logic level of "1". Meanwhile, if data from circuits outside the chip to said one of the I/O pads 272 is at a logic level of "1", the NAND gate 290 has its output at a logic level of "0", and thereby the large receiver 275 may have its output of L_Data_in at a logic level of "1". If data from circuits outside the chip to said one of the I/O pads 272 is at a logic level of "0", the NAND gate 290 has its output at a logic level of "1", and thereby the large receiver 275 may have its output of L_Data_in at a logic level of "0". Accordingly, the large receiver 275 may be activated by the L_Inhibit signal to amplify or drive data from circuits outside the chip to said one of the I/O pads 272 into its output of L_Data_in.

Referring to FIG. 3A, the large driver 274 may have an output capacitance or driving capability or loading, for example, between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF. The output capacitance of the large driver 274 can be used as driving capability of the large driver 274, which is the maximum loading at the output of the large driver 274, measured from said one of the I/O pads 272 to loading circuits external of said one of the I/O pads 272. The size of the large ESD protection circuit or device 273 may be between 0.1 pF and 3 pF or between 0.1 pF and 1 pF, or larger than 0.1 pF. Said one of the I/O pads 272 may have an input capacitance, provided by the large ESD protection circuit or device 273 and large receiver 275 for example, between 0.15 pF and 4 pF or between 0.15 pF and 2 pF, or greater than 0.15 pF. The input capacitance is measured from said one of the I/O pads 272 to circuits internal of said one of the I/O pads 272.

Specification for Small I/O Circuits

Figure 3B:
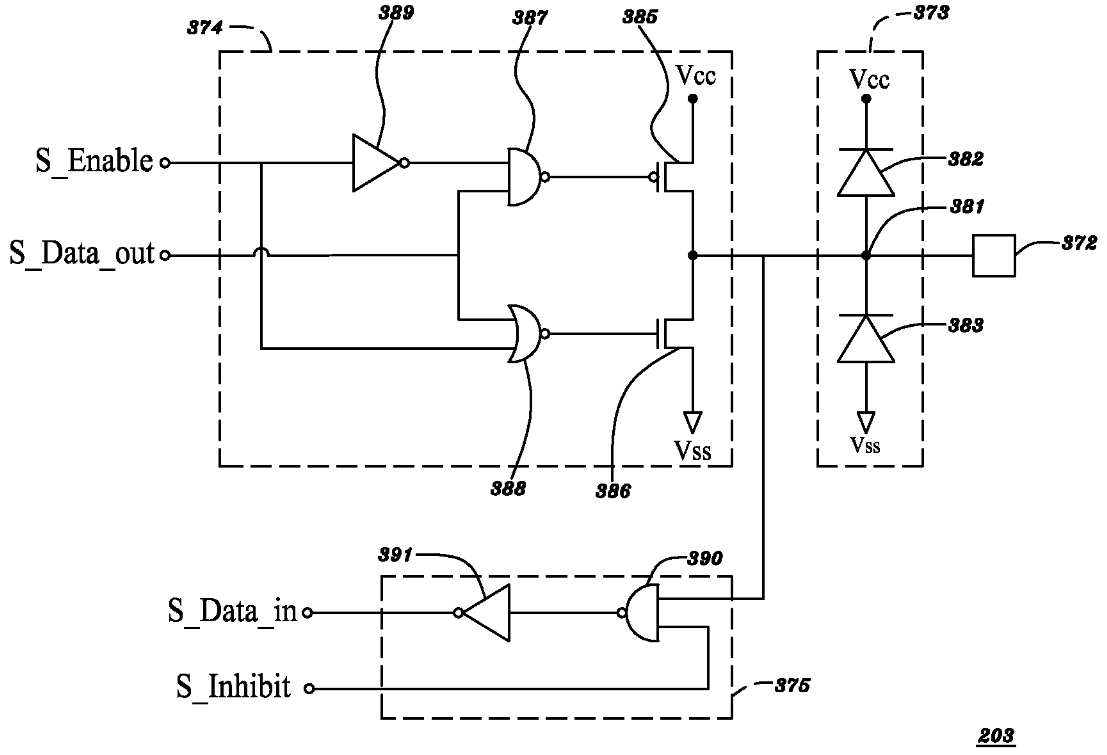
FIG. 3B is a circuit diagram of a small I/O circuit in accordance with an embodiment of the present application.

FIG. 3B is a circuit diagram of a small I/O circuit in accordance with an embodiment of the present application. Referring to FIG. 3B, a semiconductor chip may include multiple I/O pads 372 each coupling to its small electro-static-discharge (ESD) protection circuit or device 373, its small driver 374 and its small receiver 375. The small driver 374, small receiver 375 and small ESD protection circuit or device 373 may compose a small I/O circuit 203. The small ESD protection circuit or device 373 may include a diode 382 having a cathode coupling to the voltage Vcc of power supply and an anode coupling to a node 381 and a diode 383 having a cathode coupling to the node 381 and an anode coupling to the voltage Vss of ground reference. The node 381 couples to one of the I/O pads 372.

Referring to FIG. 3B, the small driver 374 may have a first input coupling to an S_Enable signal for enabling the small driver 374 and a second input coupling to data of S_Data_out for amplifying or driving the data of S_Data_out into its output at the node 381 to be transmitted to circuits outside the semiconductor chip through said one of the I/O pads 372. The small driver 374 may include a P-type MOS transistor 385 and N-type MOS transistor 386 both having respective drain terminals coupling to each other as its output at the node 381 and respective source terminals coupling to the voltage Vcc of power supply and to the voltage Vss of ground reference. The small driver 374 may have a NAND gate 387 having an output coupling to a gate terminal of the P-type MOS transistor 385 and a NOR gate 388 having an output coupling to a gate terminal of the N-type MOS transistor 386. The small driver 374 may include the NAND gate 387 having a first input coupling to an output of its inverter 389 and a second input coupling to the data of S_Data_out to perform a NAND operation on its first and second inputs into its output coupling to a gate terminal of its P-type MOS transistor 385. The small driver 374 may include the NOR gate 388 having a first input coupling to the data of S_Data_out and a second input coupling to the S_Enable signal to perform a NOR operation on its first and second inputs into its output coupling to a gate terminal of the N-type MOS transistor 386. The inverter 389 may be configured to invert its input coupling to the S_Enable signal into its output coupling to the first input of the NAND gate 387.

Referring to FIG. 3B, when the S_Enable signal is at a logic level of "1", the output of the NAND gate 387 is always at a logic level of "1" to turn off the P-type MOS transistor 385 and the output of the NOR gate 388 is always at a logic level of "0" to turn off the N-type MOS transistor 386. Thereby, the small driver 374 may be disabled by the S_Enable signal and the data of S_Data_out may not be passed to the output of the small driver 374 at the node 381.

Referring to FIG. 3B, the small driver 374 may be enabled when the S_Enable signal is at a logic level of "0". Meanwhile, if the data of S_Data_out is at a logic level of "0", the outputs of the NAND and NOR gates 387 and 388 are at logic level of "1" to turn off the P-type MOS transistor 385 and on the N-type MOS transistor 386, and thereby the output of the small driver 374 at the node 381 is at a logic level of "0" to be passed to said one of the I/O pads 372. If the data of S_Data_out is at a logic level of "1", the outputs of the NAND and NOR gates 387 and 388 are at logic level of "0" to turn on the P-type MOS transistor 385 and off the N-type MOS transistor 386, and thereby the output of the small driver 374 at the node 381 is at a logic level of "1" to be passed to said one of the I/O pads 372. Accordingly, the small driver 374 may be enabled by the S_Enable signal to amplify or drive the data of S_Data_out into its output at the node 381 coupling to one of the I/O pads 372.

Referring to FIG. 3B, the small receiver 375 may have a first input coupling to said one of the I/O pads 372 to be amplified or driven by the small receiver 375 into its output of S_Data_in and a second input coupling to an S_Inhibit signal to inhibit the small receiver 375 from generating its output of S_Data_in associated with its first input. The small receiver 375 may include a NAND gate 390 having a first input coupling to said one of the I/O pads 372 and a second input coupling to the S_Inhibit signal to perform a NAND operation on its first and second inputs into its output coupling to its inverter 391. The inverter 391 may be configured to invert its input coupling to the output of the NAND gate 390 into its output acting as the output of S_Data_in of the small receiver 375.

Referring to FIG. 3B, when the S_Inhibit signal is at a logic level of "0", the output of the NAND gate 390 is always at a logic level of "1" and the output S_Data_in of the small receiver 375 is always at a logic level of "0". Thereby, the small receiver 375 is inhibited from generating its output of S_Data_in associated with its first input at said one of the I/O pads 372.

Referring to FIG. 3B, the small receiver 375 may be activated when the S_Inhibit signal is at a logic level of "1". Meanwhile, if data from circuits outside the semiconductor chip to said one of the I/O pads 372 is at a logic level of "1", the NAND gate 390 has its output at a logic level of "0", and thereby the small receiver 375 may have its output of S_Data_in at a logic level of "1". If data from circuits outside the chip to said one of the I/O pads 372 is at a logic level of "0", the NAND gate 390 has its output at a logic level of "1", and thereby the small receiver 375 may have its output of S_Data_in at a logic level of "0". Accordingly, the small receiver 375 may be activated by the S_Inhibit signal to amplify or drive data from circuits outside the chip to said one of the I/O pads 372 into its output of S_Data_in.

Referring to FIG. 3B, the small driver 374 may have an output capacitance or driving capability or loading, for example, between 0.05 pF and 2 pF or between 0.05 pF and 1 pF, or smaller than 2 pF or 1 pF. The output capacitance of the small driver 374 can be used as driving capability of the small driver 374, which is the maximum loading at the output of the small driver 374, measured from said one of the I/O pads 372 to loading circuits external of said one of the I/O pads 372. The size of the small ESD protection circuit or device 373 may be between 0.01 pF and 0.1 pF or smaller than 0.1 pF. In some cases, no small ESD protection circuit or device 373 is provided in the small I/O circuit 203. In some cases, the small driver 374 or receiver 375 of the small I/O circuit 203 in FIG. 5B may be designed just like an internal driver or receiver, having no small ESD protection circuit or device 373 and having the same input and output capacitances as the internal driver or receiver. Said one of the I/O pads 372 may have an input capacitance, provided by the small ESD protection circuit or device 373 and small receiver 375 for example, between 0.15 pF and 4 pF or between 0.15 pF and 2 pF, or greater than 0.15 pF. The input capacitance is measured from said one of the I/O pads 372 to loading circuits internal of said one of the I/O pads 372.

Specification for Programmable Logic Blocks

FIG. 4 is a schematic view showing a block diagram of a programmable logic block in accordance with an embodiment of the present application. Referring to FIG. 4, a programmable logic block (LB) 201 may include a look-up table (LUT) 210 and a multiplexer 211 having its first set of inputs, e.g., D0-D15 as illustrated in FIG. 2, each coupling to one of resulting values or programming codes stored in the look-up table (LUT) 210 and its second set of inputs, e.g., four-digit inputs of A0-A3 as illustrated in FIG. 2, configured to determine one of the inputs in its first set into its output, e.g., Dout as illustrated in FIG. 2, acting as an output of the programmable logic block (LB) 201. The inputs, e.g., A0-A3 as illustrated in FIG. 2, of the second set of the multiplexer 211 may act as inputs of the programmable logic block (LB) 201.

Referring to FIG. 4, the look-up table (LUT) 210 of the programmable logic block (LB) 201 may be composed of multiple memory cells 490 each configured to save or store one of the resulting values, i.e., programming codes. Each of the memory cells 490 may be referred to one 398 as illustrated in FIG. 1A or 1B. Its multiplexer 211 may have its first set of inputs, e.g., D0-D15 as illustrated in FIG. 2, each coupling to one of the outputs of one of the memory cells 490, i.e., one of the outputs Out1 and Out2 of the memory cell 398, for the look-up table (LUT) 210. Thus, each of the resulting values or programming codes stored in the respective memory cells 490 may couple to one of the inputs of the first set of the multiplexer 211 of the programmable logic block (LB) 201.

Furthermore, the programmable logic block (LB) 201 may be composed of another memory cell 490 configured to save or store a programming code, wherein the another memory cell 490 may have an output coupling to the input SC-4 of the multi-stage tri-state buffer 292 as seen in FIG. 2 for the programmable logic block (LB) 201. Each of the another memory cells 490 may be referred to one 398 as illustrated in FIG. 1A or 1B. For the multiplexer 211 as seen in FIG. 2 for the programmable logic block (LB) 201, its multi-stage tri-state buffer 292 may have the input SC-4 coupling to one of the outputs Out1 and Out2 of one of the another memory cells 398 as illustrated in FIG. 1A or 1B configured to save or store a programming code to switch on or off it.

The programmable logic block 201 may include the look-up table 210 that may be programed to store or save the resulting values or programing codes for logic operation or Boolean operation, such as AND, NAND, OR, NOR or EXOR operation or an operation combining the two or more of the above operations. For example, the look-up table 210 may be programed to lead the programmable logic block 201 to achieve the same logic operation as a logic operator, i.e., NAND gate or operator, as shown in FIG. 5 performs. For this case, the programmable logic block 201 may have two inputs, e.g., A0 and A1, and an output, e.g., Dout. FIG. 6 shows a truth table for a NAND operator. Referring to FIG. 6, the look-up table 210 records or stores each of four resulting values or programming codes of the NAND operator as illustrated in FIG. 5 that are generated respectively in accordance with four combinations of its inputs A0 and A1. The look-up table 210 may be programmed with the four resulting values or programming codes respectively stored in the four memory cells 490, each of which may be referred to one 398 as illustrated in FIG. 1A or 1B having its output Out1 or Out2 coupling to one of the four inputs D0-D3 of the first set of the multiplexer 211 for the programmable logic block (LB) 201. The multiplexer 211 may be configured to determine one of its four inputs, e.g., D0-D3, of the first set into its output, e.g., Dout, in accordance with one of the combinations of its inputs A0 and A1 of the second set. The output Dout of the multiplexer 211 as seen in FIG. 4 may act as the output of the programmable logic block (LB) 201.

Specification for Programmable Interconnect

Figure 7:
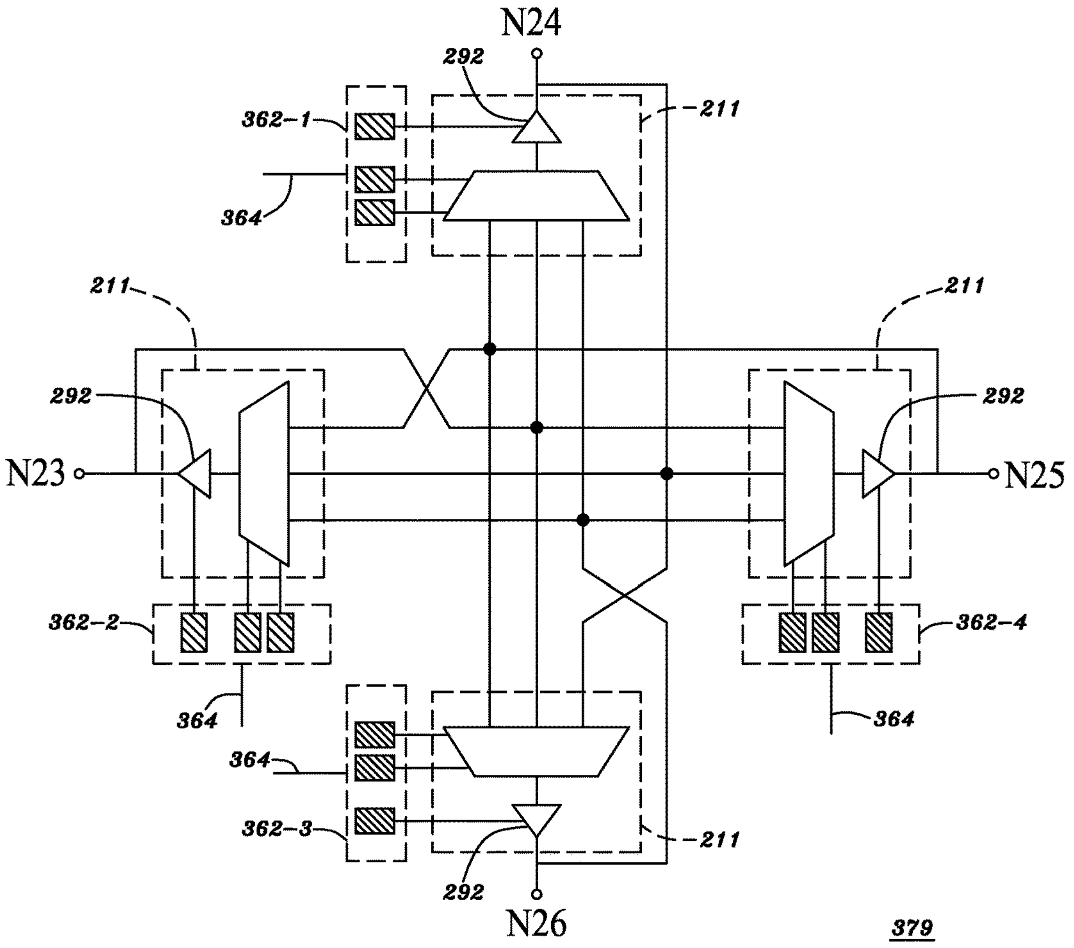
FIG. 7 is a block diagram illustrating programmable interconnects programmed by a cross-point switch in accordance with an embodiment of the present application.

FIG. 7 is a circuit diagram illustrating programmable interconnects programmed by a cross-point switch in accordance with an embodiment of the present application. Referring to FIG. 7, a cross-point switch 379 may include four multiplexers 211 as seen in FIG. 2 each having three inputs in the first set and two inputs in the second set and being configured to pass one of its three inputs in the first set into its output in accordance with a combination of its two inputs in the second set. Each of the three inputs D0-D2 of the first set of one of the four multiplexers 211 may couple to one of the three inputs D0-D2 of the first set of another two of the four multiplexers 211 and to an output Dout of the other one of the four multiplexers 211. Thereby, each of the four multiplexers 211 may pass one of its three inputs D0-D2 in the first set coupling to three respective metal lines extending in three different directions to the three outputs Dout of the other three of the four multiplexers 211 into its output Dout in accordance with a combination of its two inputs A0 and A1 in the second set. Each of the four multiplexers 211 as seen in FIG. 2 may include the pass/no-pass switch or switch buffer 292 configured to be switched on or off in accordance with its input SC-4 to pass or not to pass one of its three inputs D0-D2 in the first set, passed in accordance with the second set of its inputs A0 and A1, into its output Dout. For example, the top one of the four multiplexers 211 may pass one of its three inputs in the first set coupling to the three outputs Dout at nodes N23, N26 and N25 of the left, bottom and right ones of the four multiplexers 211 into its output Dout at a node N24 in accordance with a combination of its two inputs A0 and A1 in the second set. The top one of the four multiplexers 211 may include the pass/no-pass switch or switch buffer 292 configured to be switched on or off in accordance with the second set of its input SC-4 to pass or not to pass one of its three inputs in the first set, passed in accordance with the second set of its inputs A0 and A1, into its output Dout at the node N24.

Referring to FIG. 7, four programmable interconnects 361 as seen in FIG. 12A may couple to the respective four nodes N23-N26 of the cross-point switch 379. Thereby, one of the four programmable interconnects 361 may be switched by the cross-point switch 379 to couple to another one, two or three of the four programmable interconnects 361. Each of the multiplexers 211 may have its second set of two inputs A0 and A1 coupling respectively to the outputs of two of the memory cells 362, each of which may be referred to the output Out1 or Out2 of the memory cell 398, via multiple fixed interconnects 364, i.e., non-programmable interconnects, and its node SC-4 may couple to the output of another of the memory cells 362, which may be referred to the output Out1 or Out2 of the memory cell 398, via another fixed interconnect 364, i.e., non-programmable interconnect. Accordingly, each of the multiplexers 211 may pass its first set of three inputs coupling to three of the four programmable interconnects 361 into its output coupling to the other one of the four programmable interconnects 361 in accordance with its second set of two inputs A0 and A1 and alternatively further in accordance with a logic level at the node SC-4.

For example, referring to FIG. 7, for programming the programmable interconnects 361, the top one of the multiplexers 211 may have its second set of inputs A0, A1 and SC-4 coupling respectively to the outputs of the three memory cells 362-1, each of which may be referred to the output Out1 or Out2 of the memory cell 398, the left one of the multiplexers 211 may have its second set of inputs A0, A1 and SC-4 coupling respectively to the outputs of the three memory cells 362-2, each of which may be referred to the output Out1 or Out2 of the memory cell 398, the bottom one of the multiplexers 211 may have its second set of inputs A0, A1 and SC-4 coupling respectively to the outputs of the three memory cells 362-3, each of which may be referred to the output Out1 or Out2 of the memory cell 398, and the right one of the multiplexers 211 may have its second set of inputs A0, A1 and SC-4 coupling respectively to the outputs of the three memory cells 362-4, each of which may be referred to the output Out1 or Out2 of the memory cell 398. Before the memory cells 362-1, 362-2, 362-3 and 362-4 are programmed or when the memory cells 362-1, 362-2, 362-3 and 362-4 are being programmed, the four programmable interconnects 361 may not be used for signal transmission. The memory cells 362-1, 362-2, 362-3 and 362-4 may be programmed to have each of the multiplexers 211 pass one of its three inputs of the first set into its output such that one of the four programmable interconnects 361 may couple to another, another two or another three of the four programmable interconnects 361 for signal transmission in operation.

Specification for Fixed Interconnect

Before the memory cells 490 for the look-up table (LUT) 210 as seen in FIG. 4 and the memory cells 362 for the programmable interconnects as seen in FIG. 7 are programmed or when the memory cells 490 for the look-up table (LUT) 210 and the memory cells 362 for the programmable interconnects are being programmed, multiple fixed interconnects that are not field programmable may be provided for signal transmission or power/ground delivery to (1) the memory cells 490 of the look-up table (LUT) 210 of the programmable logic block (LB) 201 as seen in FIG. 4 for programming the memory cells 490 and/or (2) the memory cells 362 as seen in FIG. 7 for the programmable interconnects for programming the memory cells 362. After the memory cells 490 for the look-up table (LUT) 210 and the memory cells 362 for the programmable interconnects are programmed, the fixed interconnects may be used for signal transmission or power/ground delivery in operation.

Figure 8A:
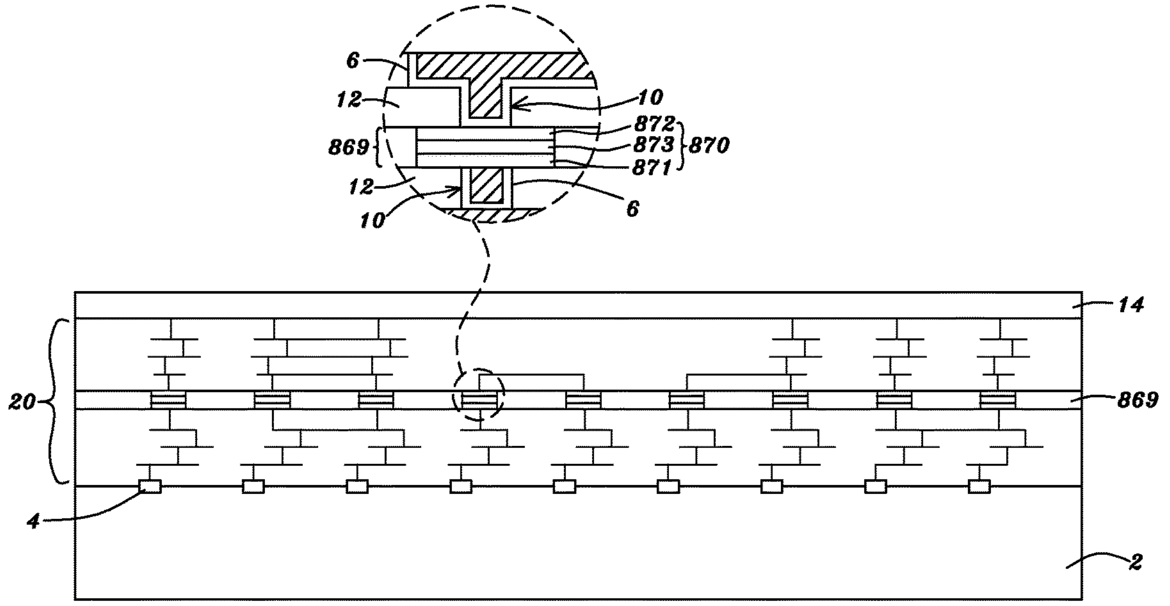
FIGS. 8A-8C are schematically cross-sectional views showing various structures of non-volatile memory cells of a first type for a semiconductor chip in accordance with an embodiment of the present application.
Figure 8B:
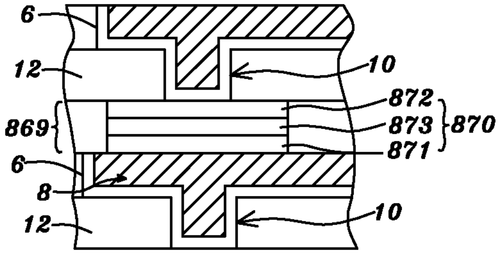
Figure 8C:
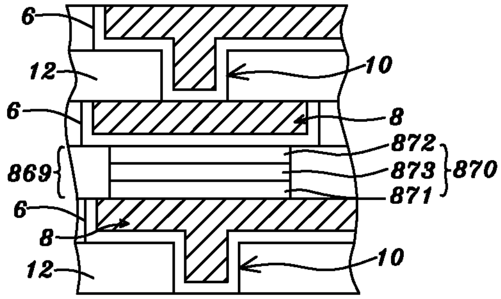

Specification for Non-Volatile Memory (NVM) Cells (1.1) First Type of Non-Volatile Memory Cells for the First Alternative FIGS. 8A-8C are schematically cross-sectional views showing various structures of non-volatile memory cells of a first type for a semiconductor chip in accordance with an embodiment of the present application. The first type of non-volatile memory cells may be resistive random access memories (RRAM), i.e., programmable resistors. Referring to FIG. 8A, a semiconductor chip 100, used for the FPGA IC chip 200 for example, may include multiple resistive random access memories 870 formed in an RRAM layer 869 thereof over a semiconductor substrate 2 thereof, in a first interconnection scheme 20 for the semiconductor chip 100 (FISC) and under a passivation layer 14 thereof. Multiple interconnection metal layers 6 in the FISC 20 and between the RRAM layer 869 and semiconductor substrate 2 may couple the resistive random access memories 870 to multiple semiconductor devices 4 on the semiconductor substrate 2. Multiple interconnection metal layers 6 in the FISC 20 and between the RRAM layer 869 and passivation layer 14 may couple the resistive random access memories 870 to external circuits outside the semiconductor chip 100 and may have a line pitch less than 0.5 micrometers. Each of the interconnection metal layers 6 in the FISC 20 and over the RRAM layer 869 may have a thickness greater than each of the interconnection metal layers 6 in the FISC 20 and under the RRAM layer 869. The details for the semiconductor substrate 2, semiconductor devices, interconnection metal layers 6, FISC 20 and passivation layer 14 may be referred to the illustration in FIG. 17.

Referring to FIG. 8A, each of the resistive random access memories 870 may have (i) a bottom electrode 871 made of a layer of nickel, platinum, titanium, titanium nitride, tantalum nitride, copper or an aluminum alloy having a thickness between 1 and 20 nanometers, (ii) a top electrode 872 made of a layer of platinum, titanium nitride, tantalum nitride, copper or an aluminum alloy having a thickness between 1 and 20 nanometers, and (iii) a resistive layer 873 having a thickness between 1 and 20 nanometers between the bottom and top electrodes 871 and 872, wherein the resistive layer 873 may be composed of composite layers of various materials including a colossal magnetoresistance (CMR) material such as $La_{1-x}Ca_xMnO_3$ (0<x<1), $La_{1-x}Sr_xMnO_3$ (0<x<1) or $Pr_{0.7}Ca_{0.3}MnO_3$, a polymer material such as poly(vinylidene fluoride trifluoroethylene), i.e., P(VDF-TrFE), a conductive-bridging random-access-memory (CBRAM) material such as Ag—GeSe based material, a doped metal oxide such as Nb-doped $SrZrO_3$, or a binary metal oxide such as WOx (0<x<1), NiO, $TiO_2$ or $HfO_2$, or a metal such as titanium.

For example, referring to FIG. 8A, the resistive layer 873 may include an oxide layer on the bottom electrode 871, in which conductive filaments or paths may be formed depending on the applied electric voltages. The oxide layer of the resistive layer 873 may comprise, for example, hafnium dioxide ($HfO_2$) or tantalum oxide $Ta_2O_5$ having a thickness of 5 nm, 10 nm or 15 nm or between 1 nm and 30 nm, 3 nm and 20 nm, or 5 nm and 15 nm. The oxide layer of the resistive layer 873 may be formed by atomic-layer-deposition (ALD) methods. The resistive layer 873 may further include an oxygen reservoir layer, which may capture the oxygen atoms from the oxide layer, on its oxide layer. The oxygen reservoir layer may comprise titanium (Ti) or tantalum (Ta) to capture the oxygen atoms or ions from the oxide layer to form $TiO_x$ or $TaO_x$. The oxygen reservoir layer may have a thickness between 1 nm and 25 nm, or 3 nm and 15 nm, such as 2 nm, 7 nm or 12 nm. The oxygen reservoir layer may be formed by atomic-layer-deposition (ALD) methods. The top electrode 872 is formed on the oxygen reservoir layer of the resistive layer 873.

For example, referring to FIG. 8A, the resistive layer 873 may include a layer of $HfO_2$ having a thickness between 1 and 20 nanometers on the bottom electrode 871, a layer of titanium dioxide having a thickness between 1 and 20 nanometers on the layer of $HfO_2$ and a titanium layer having a thickness between 1 and 20 nanometers on the layer of titanium dioxide. The top electrode 872 is formed on the titanium layer of the resistive layer 873.

Figure 17:
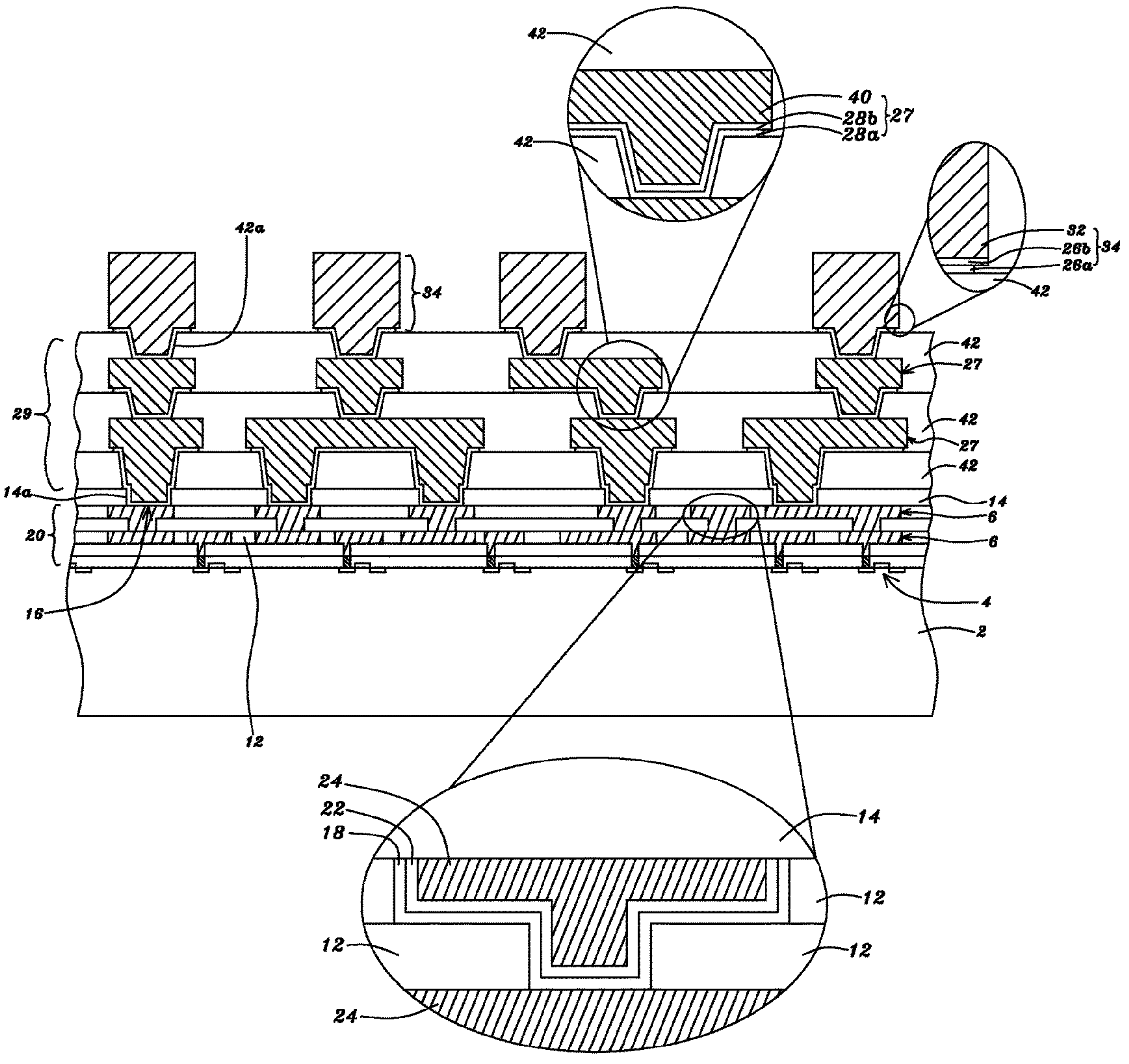
FIG. 17 is a schematically cross-sectional view showing a semiconductor chip in accordance with an embodiment of the present application.

Referring to FIG. 8A, each of the resistive random access memories 870 may have its bottom electrode 871 formed on a top surface of one of the lower metal vias 10 of a lower one of the interconnection metal layers 6 as illustrated in FIG. 17 and on a top surface of a lower one of the dielectric layers 12 as illustrated in FIG. 17. An upper one of the dielectric layers 12 as illustrated in FIG. 17 may be formed on the top electrode 872 of said one of the resistive random access memories 870 and an upper one of the interconnection metal layers 6 as illustrated in FIG. 17 may have the upper metal vias 10 each formed in the upper one of the dielectric layers 12 and on the top electrode 872 of one of the resistive random access memories 870.

Alternatively, referring to FIG. 8B, each of the resistive random access memories 870 may have its bottom electrode 871 formed on a top surface of one of the lower metal pads 8 of a lower one of the interconnection metal layers 6 as illustrated in FIG. 17. An upper one of the dielectric layers 12 as illustrated in FIG. 17 may be formed on the top electrode 872 of said one of the resistive random access memories 870 and an upper one of the interconnection metal layers 6 as illustrated in FIG. 17 may have the upper metal vias 10 each formed in the upper one of the dielectric layers 12 and on the top electrode 872 of one of the resistive random access memories 870.

Alternatively, referring to FIG. 8C, each of the resistive random access memories 870 may have its bottom electrode 871 formed on a top surface of one of the lower metal pads 8 of a lower one of the interconnection metal layers 6 as illustrated in FIG. 17. An upper one of the interconnection metal layers 6 as illustrated in FIG. 17 may have the upper metal pads 8 each formed in an upper one of the dielectric layers 12 and on the top electrode 872 of one of the resistive random access memories 870.

Figure 8D:
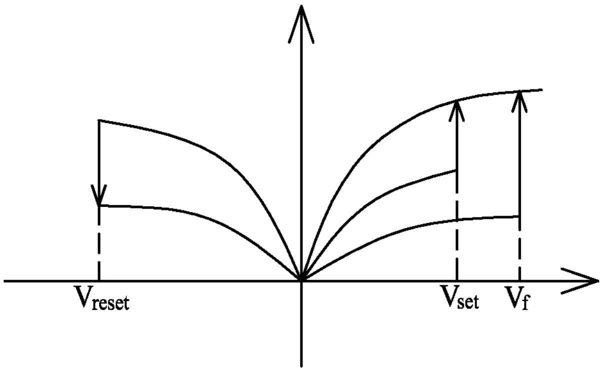
FIG. 8D is a plot showing various states of a resistive random access memory in accordance with an embodiment of the present application, wherein the x-axis indicates a voltage of a resistive random access memory and the y-axis indicates a log value of a current of a resistive random access memory.

FIG. 8D is a plot showing various states of a resistive random access memory in accordance with an embodiment of the present application, wherein the x-axis indicates a voltage of a resistive random access memory and the y-axis indicates a log value of a current of a resistive random access memory. Referring to FIGS. 8A and 8D, when the resistive random access memories 870 start to be first used before a resetting or setting step as illustrated in the following paragraphs, a forming step is performed to each of the resistive random access memories 870 to form vacancies in its resistive layer 873 for electrons capable of moving between its bottom and top electrodes 871 and 872 in a low resistant manner. When each of the resistive random access memories 870 is being formed, a forming voltage $V_f$ ranging from 0.25 to 3.3 volts is applied to its top electrode 872, and a voltage Vss of ground reference is applied to its bottom electrode 871 such that oxygen atoms or ions in the oxide layer, such as hafnium dioxide, of its resistive layer 873 may move toward the oxygen reservoir layer, such as titanium, of its resistive layer 873 by an absorption force from positive charges at its top electrode 872 and a repulsive force against negative charges at its bottom electrode 871 to react with the oxygen reservoir layer of the resistive layer 873 into a transition oxide, such as titanium oxide, at the interface between the oxide layer of the resistive layer 873 and the oxygen reservoir layer of the resistive layer 873. The sites where the oxygen atoms or ions are occupied in the oxide layer of the resistive layer 873 before the forming step become vacancies after the oxygen atoms or ions are left to move toward the oxygen reservoir layer of the resistive layer 873. The vacancies may form conductive filaments or paths in the oxide layer of the resistive layer 873 and thus said each of the resistive random access memories 870 may be formed to a low resistance between 100 and 100,000 ohms.

Referring to FIG. 8D, after the resistive random access memories 870 are formed in the forming step, a resetting step may be performed to one of the resistive random access memories 870. When said one of the resistive random access memories 870 is being reset, a resetting voltage $V_R$ ranging from 0.25 to 3.3 volts may be applied to its bottom electrode 871, and a voltage Vss of ground reference is applied to its top electrode 872 such that the oxygen atoms or ions may move from the transition oxide at the interface between the oxide layer of the resistive layer 873 and the oxygen reservoir layer of the resistive layer 873 to the vacancies in the oxide layer of the resistive layer 873 to fill the vacancies such that the vacancies may be largely reduced in the oxide layer of the resistive layer 873. Also, the conductive filaments or paths may be reduced in the oxide layer of the resistive layer 873, and thereby said one of the resistive random access memories 870 may be reset to a high resistance between 1,000 and 100,000,000,000 ohms, greater than the low resistance. The forming voltage $V_f$ is greater than the resetting voltage $V_R$.

Referring to FIG. 8D, after the resistive random access memories 870 are reset with the high resistance, a setting step may be performed to one of the resistive random access memories 870. When said one of the resistive random access memories 870 is being set, a setting voltage $V_{SE}$ ranging from 0.25 to 3.3 volts may applied to its top electrode 872, and a voltage Vss of ground reference may be applied to its bottom electrode 871 such that oxygen atoms or ions in the oxide layer, such as hafnium dioxide, of its resistive layer 873 may move toward the oxygen reservoir layer, such as titanium, of its resistive layer 873 by an absorption force from positive charges at its top electrode 872 and a repulsive force against negative charges at its bottom electrode 871 to react with the oxygen reservoir layer of the resistive layer 873 into a transition oxide, such as titanium oxide, at the interface between the oxide layer of the resistive layer 873 and the oxygen reservoir layer of the resistive layer 873. The sites where the oxygen atoms or ions are occupied in the oxide layer of the resistive layer 873 before the setting step become vacancies after the oxygen atoms or ions are left to move toward the oxygen reservoir layer of the resistive layer 873. The vacancies may form conductive filaments or paths in the oxide layer of the resistive layer 873 and thus said one of the resistive random access memories 870 may be set to the low resistance between 100 and 100,000 ohms. The forming voltage $V_f$ is greater than the setting voltage $V_{SE}$.

Figure 8E:
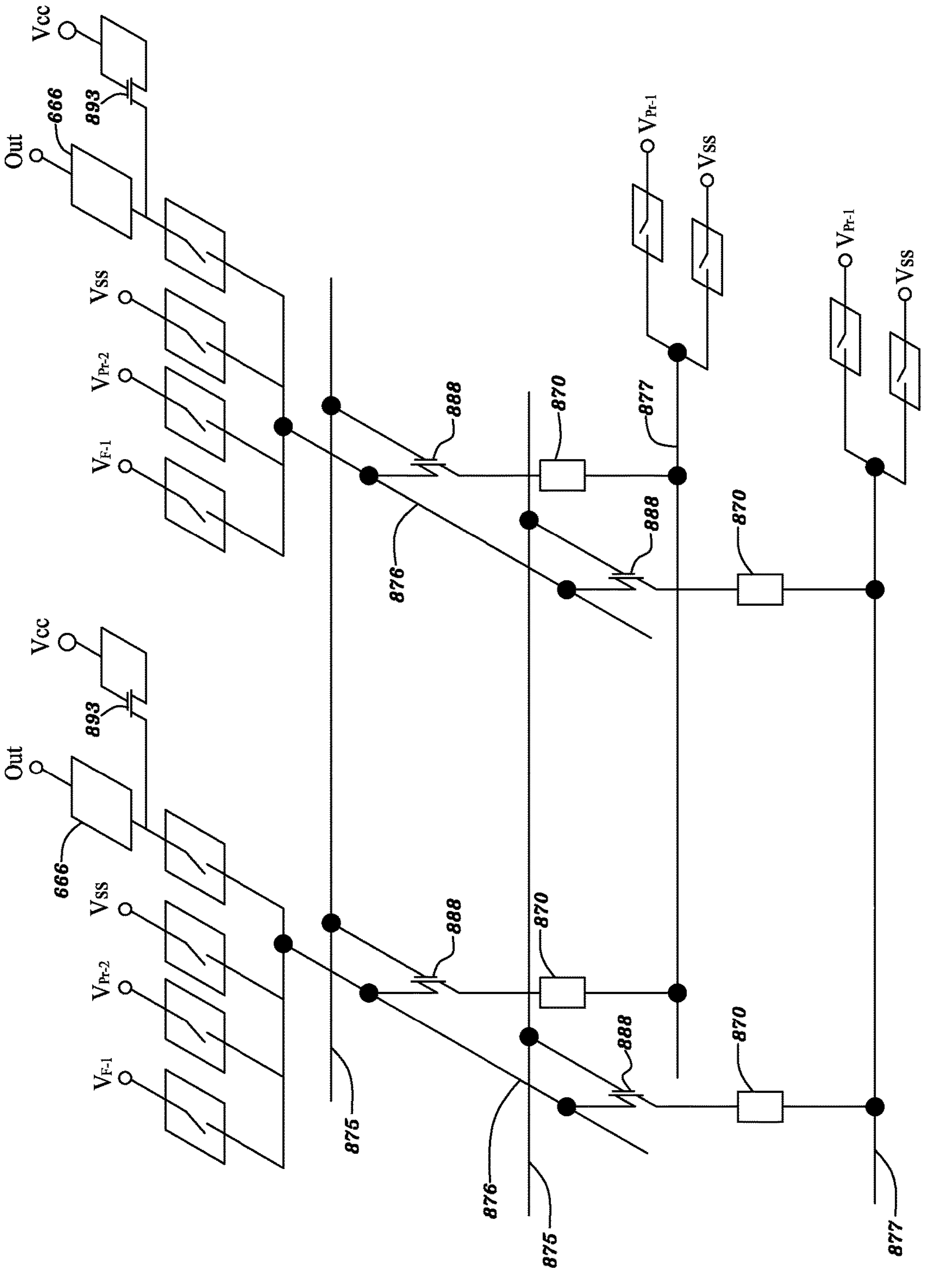
FIG. 8E is a circuit diagram showing a non-volatile memory array in accordance with an embodiment of the present application.

FIG. 8E is a circuit diagram showing a non-volatile memory array in accordance with an embodiment of the present application. Referring to FIG. 8E, multiple of the resistive random access memories 870 are formed in an array in the RRAM layer 869 as seen in FIG. 8A-8C. Multiple of the switches 888, e.g., N-type MOS transistors, are arranged in an array. Alternatively, each of the switches 888 may be a P-type MOS transistor. Each of the N-type MOS transistors 888 is configured to form a channel with two opposite terminals, one of which couples in series to one of the bottom and top electrodes 871 and 872 of one the resistive random access memories 870 and the other of which couples to one of bit lines 876, and has a gate terminal coupling to one of word lines 875. Each of reference lines 877 may couple to the other of the bottom and top electrodes 871 and 872 of each of the resistive random access memories 870 arranged in a row. Each of the word lines 875 may couple to the gate terminals of the N-type MOS transistors 888 arranged in a row that couple in parallel to one another through said each of the word lines 875. Each of the bit lines 876 is configured to couple, one by one and in turn, to one of the bottom and top electrodes 871 and 872 of each of the resistive random access memories 870 in a column through one of the N-type MOS transistors 888 in a column.

In an alternative example, each of the N-type MOS transistors 888 is configured to form a channel with two opposite terminals, one of which couples in series to one of the bottom and top electrodes 871 and 872 of one the resistive random access memories 870 and the other of which couples to one of reference lines 877, and has a gate terminal coupling to one of word lines 875. Each of the reference lines 877 is configured to couple to one of the bottom and top electrodes 871 and 872 of each of the resistive random access memories 870 arranged in a row through one of the N-type MOS transistors 888 in a row.

Referring to FIG. 8E, when the resistive random access memories 870 start to be first used before the resetting or setting step as illustrated in FIG. 8D, the forming step as illustrated in FIG. 8D is performed to each of the resistive random access memories 870 to form vacancies in its resistive layer 873 for electrons capable of moving between its bottom and top electrodes 871 and 872 in the low resistant manner. When each of the resistive random access memories 870 is being formed, (1) all of the bit lines 876 are switched to couple to a first activating voltage $V_{F\text{-}1}$ equal to or greater than the forming voltage $V_f$, wherein the first activating voltage $V_{F\text{-}1}$ may range from 0.25 to 3.3 volts, (2) all of the word lines 875 are switched to couple to the first activating voltage $V_{F\text{-}1}$ to turn on each of the N-type MOS transistors 888 to couple one of the bottom and top electrode 872 of one of the resistive random access memories 870 to one of the bit lines 876 or, in the alternative example, to couple one of the bottom and top electrode 872 of one of the resistive random access memories 870 to one of the reference lines 877 and (3) all of the reference lines 877 are switched to couple to the voltage Vss of ground reference. Alternatively, when each of the switches 888 is a P-type MOS transistor, all of the word lines 875 are switched to couple to the voltage Vss of ground reference to turn on each of the P-type MOS transistors 888 to couple one of the bottom and top electrode 872 of one of the resistive random access memories 870 to one of the bit lines 876 or, in the alternative example, to couple one of the bottom and top electrode 872 of one of the resistive random access memories 870 to one of the reference lines 877. Thereby, when each of the resistive random access memories 870 is being formed, the first activating voltage $V_{F\text{-}1}$ may be applied to said one of its bottom and top electrodes 871 and 872, and the voltage Vss of ground reference may be applied to the other of its bottom and top electrodes 871 and 872 such that said each of the resistive random access memories 870 may be formed to the low resistance between 100 and 100,000 ohms, and thus programmed to a logic level of "0".

Next, referring to FIG. 8E, a resetting step as illustrated in FIG. 8D may be performed, one row by one row and in turn, to a first group of the resistive random access memories 870 but not to a second group of the resistive random access memories 870, in which (1) each of the word lines 875 corresponding to the resistive random access memories 870 in a row may be selected one by one and in turn to be switched to couple to a first programming voltage $V_{Pr\text{-}1}$ to turn on the N-type MOS transistors 888 in a row to couple each of the resistive random access memories 870 in the row to one of the bit lines 876 or, in the alternative example, to couple all of the resistive random access memories 870 in the row to a same one of the reference lines 877, wherein the unselected word lines 875 corresponding to the resistive random access memories 870 in the other rows may be switched to couple to the voltage Vss of ground reference to turn off the N-type MOS transistors 888 in the other rows to decouple each of the resistive random access memories 870 in the other rows from any of the bit lines 876 or, in the alternative example, to decouple each of the resistive random access memories 870 in the other rows from any of the reference lines 877, wherein the first programming voltage $V_{Pr-1}$ may be between 0.25 and 3.3 volts, equal to or greater than the resetting voltage $V_{RE}$ of the resistive random access memories 870, (2) the reference lines 877 may be switched to couple to the first programming voltage $V_{Pr-1}$, (3) the bit lines 876 in a first group each for one of the resistive random access memories 870 in the first group in the row may be switched to couple to the voltage Vss of ground reference, and (4) the bit lines 876 in a second group each for one of the resistive random access memories 870 in the second group in the row may be switched to couple to the first programming voltage $V_{Pr-1}$. Alternatively, when each of the switches 888 is a P-type MOS transistor, each of the word lines 875 corresponding to the resistive random access memories 870 in the row may be selected one by one and in turn to be switched to couple to the voltage Vss of ground reference to turn on the P-type MOS transistors 888 in the row to couple each of the resistive random access memories 870 in the row to one of the bit lines 876 or, in the alternative example, to couple all of the resistive random access memories 870 in the row to the same one of the reference lines 877, wherein the unselected word lines 875 corresponding to the resistive random access memories 870 in the other rows may be switched to couple to the first programming voltage $V_{Pr-1}$ to turn off the P-type MOS transistors 888 in the other rows to decouple each of the resistive random access memories 870 in the other rows from any of the bit lines 876 or, in the alternative example, to decouple each of the resistive random access memories 870 in the other rows from any of the reference lines 877. Thereby, the resistive random access memories 870 in the first group in the row may be reset to the high resistance between 1,000 and 100,000,000,000 ohms in the resetting step, and thus programmed to a logic level of "1". The resistive random access memories 870 in the second group in the row may have been kept in the previous state.

Referring to FIG. 8E, a setting step as illustrated in FIG. 8D may be performed, one row by one row and in turn, to the second group of the resistive random access memories 870 but not to the first group of the resistive random access memories 870, in which (1) each of the word lines 875 corresponding to the resistive random access memories 870 in the row may be selected one by one and in turn to be switched to couple to a second programming voltage $V_{Pr-2}$ to turn on the N-type MOS transistors 888 in the row to couple each of the resistive random access memories 870 in the row to one of the bit lines 876 or, in the alternative example, to couple all of the resistive random access memories 870 in the row to a same one of the reference lines 877, wherein the unselected word lines 875 corresponding to the resistive random access memories 870 in the other rows may be switched to couple to the voltage Vss of ground reference to turn off the N-type MOS transistors 888 in the other rows to decouple each of the resistive random access memories 870 in the other rows from any of the bit lines 876 or, in the alternative example, to decouple each of the resistive random access memories 870 in the other rows from any of the reference lines 877, wherein the second programming voltage $V_{Pr-2}$ may be between 0.25 and 3.3 volts, equal to or greater than the setting voltage $V_{SE}$ of the resistive random access memories 870, (2) the reference lines 877 may be switched to couple to the voltage Vss of ground reference, (3) the bit lines 876 in the first group each for one of the resistive random access memories 870 in the first group in the row may be switched to couple to the voltage Vss of ground reference, and (4) the bit lines 876 in the second group each for one of the resistive random access memories 870 in the second group in the row may be switched to couple to the second programming voltage $V_{Pr-2}$. Alternatively, when each of the switches 888 is a P-type MOS transistor, each of the word lines 875 corresponding to the resistive random access memories 870 in the row may be selected one by one and in turn to be switched to couple to the voltage Vss of ground reference to turn on the P-type MOS transistors 888 in the row to couple each of the resistive random access memories 870 in the row to one of the bit lines 876 or, in the alternative example, to couple all of the resistive random access memories 870 in the row to the same one of the reference lines 877, wherein the unselected word lines 875 corresponding to the resistive random access memories 870 in the other rows may be switched to couple to the second programming voltage $V_{Pr-2}$ to turn off the P-type MOS transistors 888 in the other rows to decouple each of the resistive random access memories 870 in the other rows from any of the bit lines 876 or, in the alternative example, to decouple each of the resistive random access memories 870 in the other rows from any of the reference lines 877. Thereby, the resistive random access memories 870 in the first group in the row may be set to the low resistance between 100 and 100,000 ohms in the setting step, and thus programmed to a logic level of "0". The resistive random access memories 870 in the second group in the row may have been kept in the previous state.

Figure 8G:
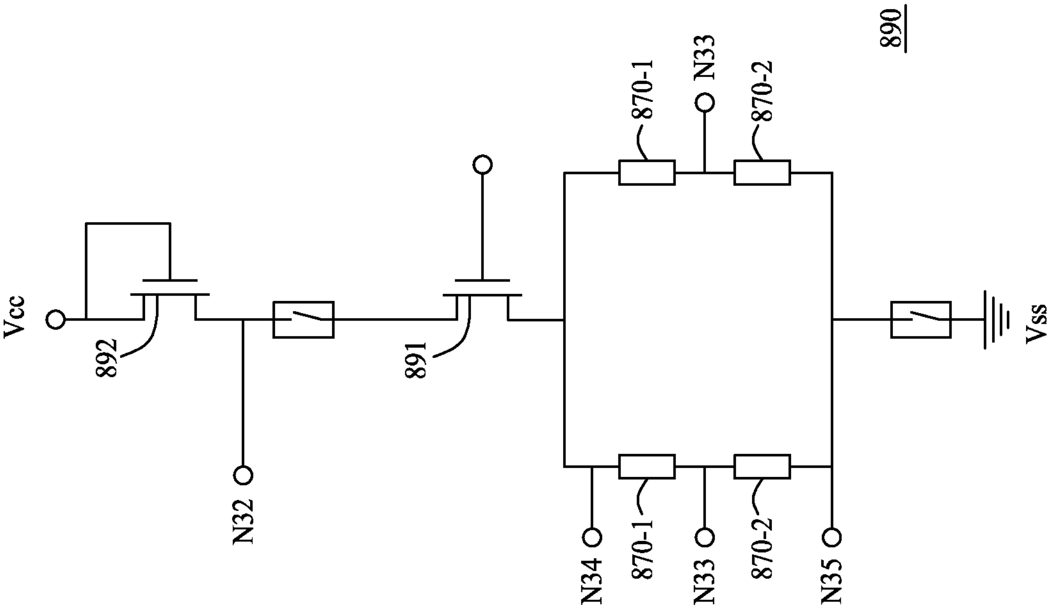
FIG. 8G is a circuit diagram showing a comparison-voltage generating circuit in accordance with an embodiment of the present application.
Figure 8F:
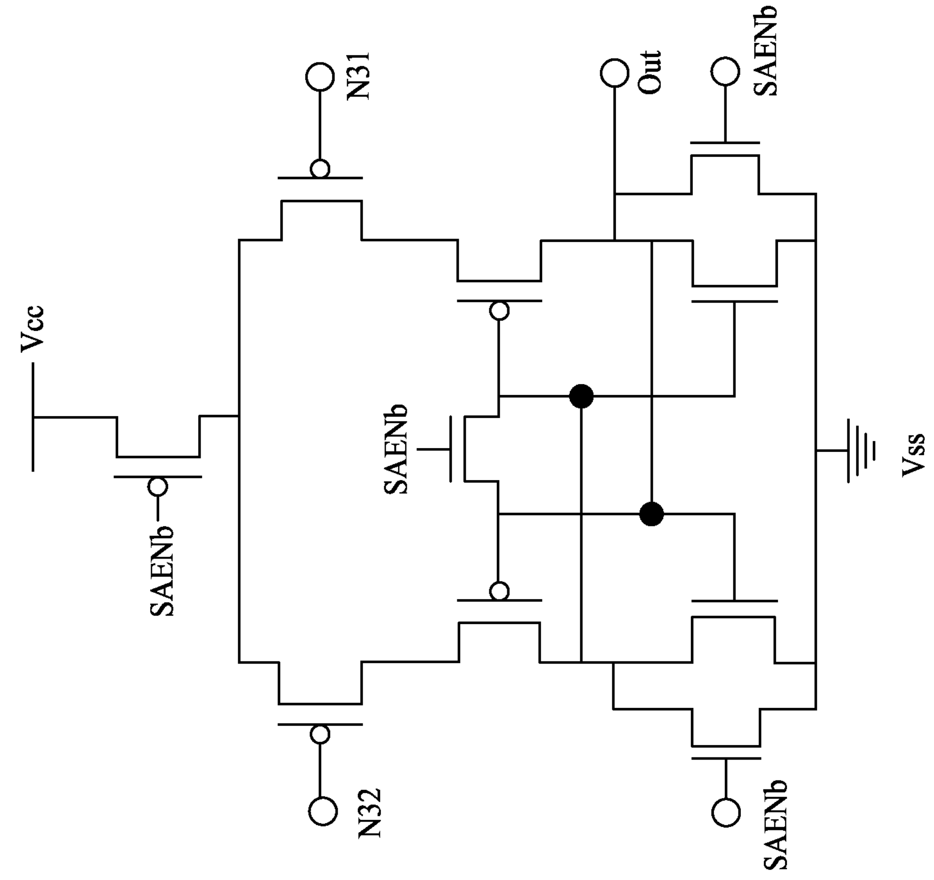
FIG. 8F is a circuit diagram showing a sense amplifier in accordance with an embodiment of the present application.

FIG. 8F is a circuit diagram showing a sense amplifier in accordance with an embodiment of the present application. In operation, referring to FIGS. 8E and 8F, (1) each of the bit lines 876 may be switched to couple to a node N31 of one of multiple sense amplifiers 666 as illustrated in FIG. 8F and to a source terminal of one of multiple N-type MOS transistors 893, (2) each of the reference lines 877 may be switched to couple to the voltage Vss of ground reference, and (3) each of the word lines 875 corresponding to the resistive random access memories 870 in a row may be selected one by one and in turn to be switched to couple to the voltage Vcc of power supply to turn on the N-type MOS transistors 888 in the row to couple each of the resistive random access memories 870 in the row to one of the bit lines 876 or, in the alternative example, to couple all of the resistive random access memories 870 in the row to a same one of the reference lines 877, wherein the unselected word lines 875 corresponding to the resistive random access memories 870 in the other rows may be switched to couple to the voltage Vss of ground reference to turn off the N-type MOS transistors 888 in the other rows to decouple each of the resistive random access memories 870 in the other rows from any of the bit lines 876 or, in the alternative example, to decouple each of the resistive random access memories 870 in the other rows from any of the reference lines 877. The N-type MOS transistor 893 may have a gate terminal coupling to the voltage Vcc of power supply and to a drain terminal of the N-type MOS transistor 893. Alternatively, when each of the switches 888 is a P-type MOS transistor, each of the word lines 875 corresponding to the resistive random access memories 870 in the row may be selected one by one and in turn to be switched to couple to the voltage Vss of ground reference to turn on the P-type MOS transistors 888 in the row to couple each of the resistive random access memories 870 in the row to one of the bit lines 876 or, in the alternative example, to couple all of the resistive random access memories 870 in the row to the same one of the reference lines 877, wherein the unselected word lines 875 corresponding to the resistive random access memories 870 in the other rows may be switched to couple to the voltage Vcc of power supply to turn off the P-type MOS transistors 888 in the other rows to decouple each of the resistive random access memories 870 in the other rows from any of the bit lines 876 or, in the alternative example, to decouple each of the resistive random access memories 870 in the other rows from any of the reference lines 877. Thereby, each of the sense amplifiers 666 may compare a voltage at one of the bit lines 876, i.e., at the node N31 as seen in FIG. 8F, with a comparison voltage at a comparison line, i.e., at the node N32 as seen in FIG. 8F, into a compared data and then generate an output "Out" of one of the resistive random access memories 870 coupling to said one of the bit lines 876 based on the compared data. For example, when the voltage at the node N31 is compared by said each of the sense amplifiers 666 to be smaller than the comparison voltage at the node N32, said each of the sense amplifiers 666 may generate the output "Out" at a logic level of "1" in the case that one of the resistive random access memories 870, which couples to said each of the sense amplifiers 666, has the low resistance. When the voltage at the node N31 is compared by said each of the sense amplifiers 666 to be greater than the comparison voltage at the node N32, said each of the sense amplifiers 666 may generate the output "Out" at a logic level of "0" in the case that one of the resistive random access memories 870, which couples to said each of the sense amplifiers 666, has the high resistance.

FIG. 8G is a circuit diagram showing a comparison-voltage generating circuit in accordance with an embodiment of the present application. Referring to FIGS. 8A-8G, a comparison-voltage generating circuit 890 includes two pairs of resistive random access memories 870-1 and 870-2 connected in serial to each other, wherein the pairs of resistive random access memories 870-1 and 870-2 are connected in parallel to each other. In each of the pairs of resistive random access memories 870-1 and 870-2, the resistive random access memory 870-1 may have its top electrode 872 coupling to the top electrode 872 of the resistive random access memory 870-2 and to a node N33, and the resistive random access memory 870-1 may have its bottom electrode 871 coupling to a node N34. The comparison-voltage generating circuit 890 may further include a N-type MOS transistors 891 having a source terminal, in operation, coupling to the bottom electrodes 871 of the resistive random access memories 870-1 in the pairs and to the node N34. The comparison-voltage generating circuit 890 may further include a N-type MOS transistor 892 having a gate terminal coupling to a drain terminal of the N-type MOS transistor 892 and to the voltage Vcc of power supply and a source terminal coupling to the node N32 of the sense amplifier 666 as seen in FIG. 8F via the comparison line. The bottom electrodes 871 of the resistive random access memories 870-2 in the pairs may couple to a node N35.

Referring to FIGS. 8A-8G, when the pairs of resistive random access memories 870-1 and 870-2 in the pairs are being formed in the forming step as illustrated in FIG. 8D, (1) the node N34 may be switched to couple to the voltage Vss of ground reference, (2) the node N33 may be switched to couple to the first activating voltage $V_{F-1}$, (3) the node N35 may be switched to couple to the voltage Vss of ground reference, and (4) the node N32 may be switched not to couple to the bottom electrodes 871 of the resistive random access memories 870-1 in the pairs. Thereby, the resistive random access memories 870-1 and 870-2 in the pairs may be formed to the low resistance.

Referring to FIGS. 8A-8G, after the resistive random access memories 870-1 and 870-2 in the pairs are formed in the forming step, the resetting step as illustrated in FIG. 8D may be performed to the resistive random access memories 870-1 and 870-2 in the pairs. When the pairs of resistive random access memories 870-1 and 870-2 are being reset in the resetting step, (1) the node N34 may be switched to couple to the first programming voltage $V_{Pr-1}$, (2) the node N33 may be switched to couple to the voltage Vss of ground reference, (3) the node N35 may be switched to couple to the first programming voltage $V_{Pr-1}$, and (4) the node N32 may be switched not to couple to the bottom electrodes 871 of the resistive random access memories 870-1 in the pairs. Thereby, the resistive random access memories 870-1 and 870-2 in the pairs may be reset to the high resistance.

Referring to FIGS. 8A-8G, after the resistive random access memories 870-1 and 870-2 in the pairs are reset in the resetting step, the setting step as illustrated in FIG. 8D may be performed to the resistive random access memories 870-2 in the pairs. When the resistive random access memories 870-2 are being set in the setting step, (1) the node N34 may be switched to couple to the second programming voltage $V_{Pr-2}$, (2) the node N33 may be switched to couple to the second programming voltage $V_{Pr-2}$, (3) the node N35 may be switched to couple to the voltage Vss of ground reference, and (4) the node N32 may be switched not to couple to the bottom electrodes 871 of the resistive random access memories 870-1 in the pairs. Thereby, the resistive random access memories 870-2 in the pairs may be set to the low resistance. Accordingly, the resistive random access memories 870-2 in the pairs may be programmed to the low resistance between 100 and 100,000 ohms, and the resistive random access memories 870-1 in the pairs may be programmed to the high resistance between 1,000 and 100,000,000,000 ohms, greater than the low resistance, for example.

Referring to FIGS. 8A-8G, in operation after the resistive random access memories 870-2 in the pairs may be programmed to the low resistance, and the resistive random access memories 870-1 in the pairs may be programmed to the high resistance, (1) the nodes N33, N34 and N35 may be switched to be floating, (2) the node N32 may be switched to couple to the bottom electrodes 871 of the resistive random access memories 870-1 in the pairs, and (3) the bottom electrodes 871 of the resistive random access memories 870-2 in the pairs may be switched to couple to the voltage Vss of ground reference. Thereby, the comparison line, i.e., node N32, of the sense amplifier 666 as seen in FIG. 8F may be at the comparison voltage between a voltage of the node N31 coupling to one of the resistive random access memories 870 programmed to the low resistance and selected by one of the word lines 875 and a voltage of the node N31 coupling to one of the resistive random access memories 870 programmed to the high resistance and selected by one of the word lines 875.

(1.2) First Type of Non-Volatile Memory Cells for the Second Alternative

Figure 9A:
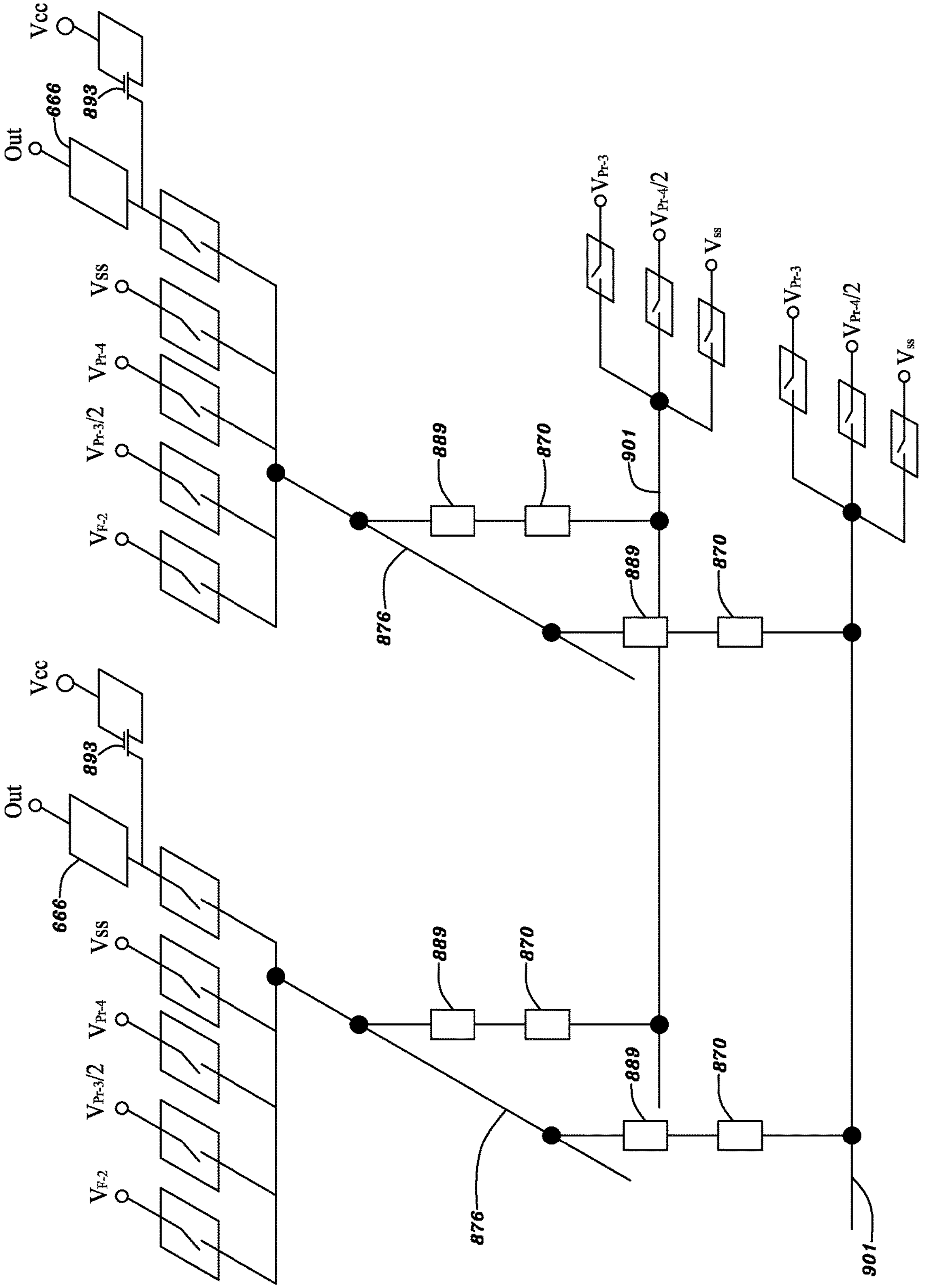
FIG. 9A is a circuit diagram showing another non-volatile memory array in accordance with an embodiment of the present application.

FIG. 9A is a circuit diagram showing another non-volatile memory array in accordance with an embodiment of the present application. The circuits as illustrated in FIG. 8H may be referred to those as illustrated in FIGS. 8A-8G, but the difference therebetween is that the switches 888 arranged in the array as seen in FIG. 8E may be replaced with multiple selectors 889 arranged in the array to couple in series to the resistive random access memories 870 respectively, and the reference lines 877 as illustrated in FIG. 8E are used as word lines 901. Referring to FIG. 9A, multiple of the resistive random access memories 870 may be selected by the selectors 889 in the forming, setting or resetting step and in operation. Each of the selectors 889 may be controlled to be turned on or off in accordance with the voltage bias between two opposite terminals of said each of the selectors 889. For said each of the selectors, the lower bias is applied to its two opposite terminals, the higher resistance it has; the larger bias is applied to its two opposite terminals, the lower resistance it has. Further, its resistance may change with nonlinearity based on the bias applied to its two opposite terminals.

Figure 9D:
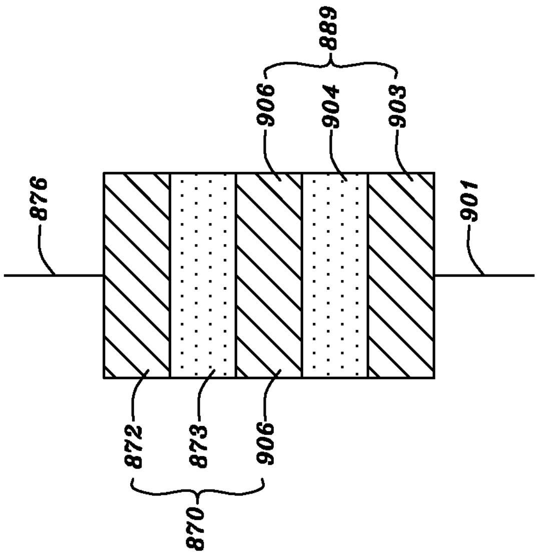
FIGS. 9C and 9D are schematically cross-sectional views showing various structures of a selective resistive random access memory stacked with a selector in accordance with an embodiment of the present application.
Figure 9C:
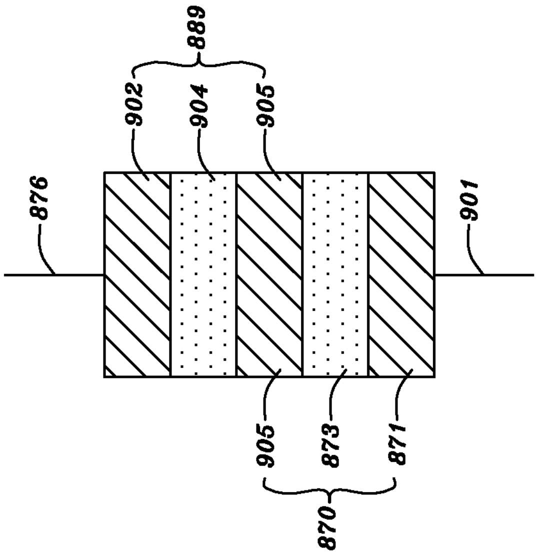
Figure 9B:
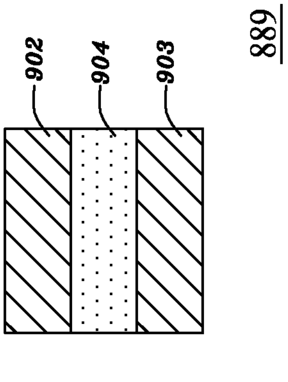
FIG. 9B is a schematically cross-sectional view showing a structure of a selector in accordance with the present application.

FIG. 9B is a schematically cross-sectional view showing a structure of a selector in accordance with the present application. Referring to FIG. 9B, each of the selectors 889 may be a current-tunneling device formed with a metal-insulator-metal (MIM) structure. Each of the selectors 889 may include (1) a top electrode 902, such as a layer of nickel, platinum or titanium, at one of the two opposite terminals thereof, (2) a bottom electrode 903, such as a layer of platinum, at the other of the two opposite terminals thereof and (3) a tunneling oxide layer 904 between its top and bottom electrodes 902 and 903. The tunneling oxide layer 904 may have a layer of $TiO_2$, $A1_2O_3$, or $HfO_2$ with a thickness between 5 nm and 20 nm, which may be formed by an atomic-layer-deposition (ALD) process.

FIGS. 9C and 9D are schematically cross-sectional views showing various structures of a selective resistive random access memory stacked with a selector in accordance with an embodiment of the present application. In an example, as seen in FIGS. 9A and 9C, each of the selectors 889 may be stacked on one of the resistive random access memories 870, and the bottom electrode 903 of said each of the selectors 889 and the top electrode 872 of said one of the resistive random access memories 870 may be made as a signal metal layer 905 such as a layer of platinum having a thickness between 1 and 20 nanometers, wherein said each of the selectors 889 may couple to the bit line 876 via its top electrode 902, and said one of the resistive random access memories 870 may couple to the word line 901 via its bottom electrode 871. In another example, as seen in FIG. 8D, each of the resistive random access memories 870 may be stacked on one of the selectors 889, and the bottom electrode 871 of said each of the resistive random access memories 870 and the top electrode 902 of said one of the selectors 889 may be made as a singal metal layer 906 such as a layer of nickel, platinum or titanium having a thickness between 1 and 20 nanometers, wherein said each of the resistive random access memories 870 may couple to the bit line 876 via its top electrode 872, and said one of the selectors 889 may couple to the word line 901 via its bottom electrode 903.

Referring to FIGS. 9A-9D, each of the selectors 889 may be a bipolar tunneling MIM device. For the bipolar tunneling MIM device, when a positive voltage bias applied to the two opposite terminals thereof increases by one volt, a current flowing through it in a forward direction may increase by $10^5$ times or greater than $10^5$ times, by $10^4$ times or greater than $10^4$ times, by $10^3$ times or greater than $10^3$ times or by $10^2$ times or greater than $10^2$ times; when a negative voltage bias applied to the two opposite terminals thereof increases by one volt, a current flowing through it in a backward direction, opposite to the forward direction, may increase by $10^5$ times or greater than $10^5$ times, by $10^4$ times or greater than $10^4$ times, by $10^3$ times or greater than $10^3$ times or by $10^2$ times or greater than $10^2$ times. The positive threshold-voltage bias to turn on the bipolar tunneling MIM device to allow a current flowing therethrough in the forward direction may range from 0.3 volts to 2.5 volts, 0.5 volts to 2 volts or 0.5 volts to 1.5 volts, and the negative threshold-voltage bias to turn on the bipolar tunneling MIM device to allow a current flowing therethrough in the backward direction may range from 0.3 volts to 2.5 volts, 0.5 volts to 2 volts or 0.5 volts to 1.5 volts.

Alternatively, referring to FIG. 9A, each of the selectors 889 may be composed of two unipolar tunneling MIM devices (not shown) arranged in parallel with two respective terminals coupling in series to one of the resistive random access memories 870. For the two unipolar tunneling MIM devices, when a positive voltage bias applied to the two opposite terminals of each of them increases by one volt, a current flowing through one of them in a forward direction may increase by $10^5$ times or greater than $10^5$ times, by $10^4$ times or greater than $10^4$ times, by $10^3$ times or greater than $10^3$ times or by $10^2$ times or greater than $10^2$ times; when a negative voltage bias applied to the two opposite terminals of each of them increases by one volt, a current flowing through the other of them in a backward direction, opposite to the forward direction, may increase by $10^5$ times or greater than $10^5$ times, by $10^4$ times or greater than $10^4$ times, by $10^3$ times or greater than $10^3$ times or by $10^2$ times or greater than $10^2$ times. The positive threshold-voltage bias to turn on said one of the unipolar tunneling MIM devices to allow a current flowing therethrough in the forward direction and to turn off said the other of the unipolar tunneling MIM devices may range from 0.3 volts to 2.5 volts, 0.5 volts to 2 volts or 0.5 volts to 1.5 volts, and the negative threshold-voltage bias to turn on said the other of the unipolar tunneling MIM devices to allow a current flowing therethrough in the backward direction and to turn off said one of the unipolar tunneling MIM devices may range from 0.3 volts to 2.5 volts, 0.5 volts to 2 volts or 0.5 volts to 1.5 volts.

Referring to FIGS. 9A-9D, when the resistive random access memories 870 start to be first used before the resetting or setting step as illustrated in FIG. 8D, the forming step as illustrated in FIG. 8D is performed to each of the resistive random access memories 870 to form vacancies in its resistive layer 873 for electric charges capable of moving between its bottom and top electrodes 871 and 872 in the low resistant manner. When each of the resistive random access memories 870 is being formed, (1) all of the bit lines 876 are switched to couple to a second activating voltage $VF_{F-2}$ greater than or equal to the forming voltage $V_f$ of the resistive random access memories 870 plus the positive threshold-voltage bias of the selectors 889, wherein the second activating voltage $V_{F-2}$ may range from 0.25 to 3.3 volts, and (2) all of the word lines 901 are switched to couple to the voltage Vss of ground reference. Thereby, for the selective resistive random access memories provided with the stacked structure as seen in FIG. 9C, the second activating voltage $V_{F-2}$ may be applied to the top electrode 902 of each of the selectors 889 and a voltage Vss of ground reference may be applied to the bottom electrode 871 of each of the resistive random access memories 870 such that said each of the selectors 889 may be turned on to couple said each of the resistive random access memories 870 to one of the bit lines 876 and the forming step as illustrated in FIG. 8D may be performed to said each of the resistive random access memories 870 to be formed to the low resistance between 100 and 100,000 ohms, i.e., to a logic level of “0”.

For the selective resistive random access memories provided with the stacked structure as seen in FIG. 9D, the second activating voltage $V_{F-2}$ may be applied to the top electrode 872 of each of the resistive random access memories 870 and the voltage Vss of ground reference may be applied to the bottom electrode 903 of each of the selectors 889 such that said each of the selectors 889 may be turned on to couple said each of the resistive random access memories 870 to one of the word lines 901 and the forming step as illustrated in FIG. 8D may be performed to said each of the resistive random access memories 870 to be formed to the low resistance between 100 and 100,000 ohms, i.e., to a logic level of "0".

Figure 9E:
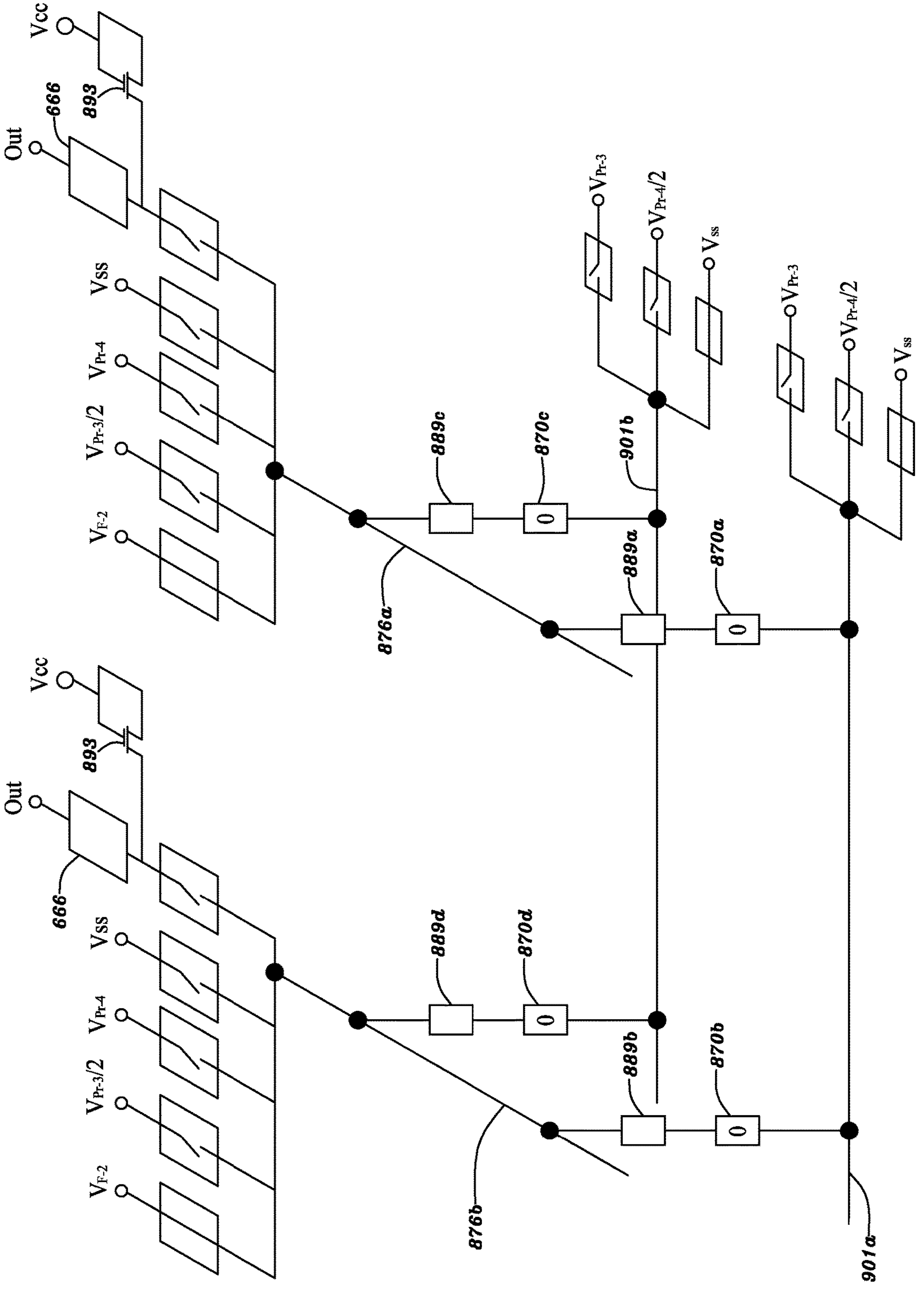
FIG. 9E is a circuit diagram showing selective resistive random access memories in a forming step in accordance with an embodiment of the present application.

For an example, FIG. 9E is a circuit diagram showing selective resistive random access memories in a forming step in accordance with an embodiment of the present application. Referring to FIG. 9E, the selective resistive random access memories may include a first one and second one arranged in a first row (y=y1) and a third one and fourth one arranged in a second row (y=y2). The first selective resistive random access memory at correspondence of (x1, y1) may include a first resistive random access memory 870*a* and a first selector 889*a* stacked as illustrated in FIG. 9C or 9D. The second selective resistive random access memory at correspondence of (x2, y1) may include a second resistive random access memory 870*b* and a second selector 889*b* stacked as illustrated in FIG. 9C or 9D. The third selective resistive random access memory at correspondence of (x1, y2) may include a third resistive random access memory 870*c* and a third selector 889*c* stacked as illustrated in FIG. 9C or 9D. The fourth selective resistive random access memory at correspondence of (x2, y2) may include a fourth resistive random access memory 870*d* and a fourth selector 889*d* stacked as illustrated in FIG. 9C or 9D.

Referring to FIG. 9E, if the first through fourth resistive random access memories (RRAM) 870*a*-870*d* are being formed, in the above forming step, to the low resistance, i.e., to a logic level of "0", (1) a first word line 901*a* corresponding to the first and second RRAMs 870*a* and 870*b* and a second word line 901*b* corresponding to the third and fourth RRAMs 870*c* and 870*d* are switched to couple to the voltage Vss of ground reference, and (2) a first bit line 876*a* for the first and third RRAMs 870*a* and 870*c* and a second bit line 876*b* for the second and fourth RRAMs 870*b* and 870*d* are switched to couple to the second activating voltage $V_{F-2}$.

Next, referring to FIGS. 9A-9D, a resetting step as illustrated in FIG. 8D may be performed, one row by one row and in turn, to a first group of the resistive random access memories 870 but not to a second group of the resistive random access memories 870, in which (1) each of the word lines 901 corresponding to the resistive random access memories 870 in a row may be selected one by one and in turn to be switched to couple to a third programming voltage $V_{Pr-3}$ greater than or equal to the resetting voltage $V_{RE}$ of the resistive random access memories 870 plus the negative threshold-voltage bias of the selectors 889, wherein the third programming voltage $V_{Pr-3}$ may range from 0.25 to 3.3 volts, wherein the unselected word lines 901 corresponding to the resistive random access memories 870 in the other rows may be switched to couple to the voltage Vss of ground reference, (2) the bit lines 876 in a first group each for one of the resistive random access memories 870 in the first group in the row may be switched to couple to the voltage Vss of ground reference, and (3) the bit lines 876 in a second group each for one of the resistive random access memories 870 in the second group in the row may be switched to couple to a voltage between one third and two thirds of the third programming voltage $V_{Pr-3}$, such as an half of the third programming voltage $V_{Pr-3}$. Thereby, for the selective resistive random access memories in the first group in the row provided with the stacked structure as seen in FIG. 9C, the voltage Vss of ground reference may be applied to the top electrode 902 of each of the selectors 889 in a first group in the row and the third programming voltage $V_{Pr-3}$ may be applied to the bottom electrode 871 of each of the resistive random access memories 870 in the first group in the row such that said each of the selectors 889 in the first group in the row may be turned on to couple said each of the resistive random access memories 870 in the first group in the row to one of the bit lines 876 and the resetting step as illustrated in FIG. 8D may be performed to said each of the resistive random access memories 870 in the first group in the row to be reset to the high resistance between 1,000 and 100,000,000,000 ohms, greater than the low resistance, in the resetting step, and thus programmed to a logic level of "1"; for the selective resistive random access memories in the second group in the row provided with the stacked structure as seen in FIG. 9C, between one third and two thirds of the third programming voltage $V_{Pr-3}$, such as an half of the third programming voltage $V_{Pr-3}$, may be applied to the top electrode 902 of each of the selectors 889 in a second group in the row and the third programming voltage $V_{Pr-3}$ may be applied to the bottom electrode 871 of each of the resistive random access memories 870 in the second group in the row such that said each of the selectors 889 in the second group in the row may be turned off to decouple said each of the resistive random access memories 870 in the second group in the row from any of the bit lines 876 and the resistive random access memories 870 in the second group in the row may have been kept in the previous state; the current flowing through said each of the selectors 889 in the first group in the row is greater than that flowing through said each of the selectors 889 in the second group in the row by an order of equal to or greater than 5, 4, 3 or 2. For the selective resistive random access memories in the first group in the row provided with the stacked structure as seen in FIG. 9D, the voltage Vss of ground reference may be applied to the top electrode 872 of each of the resistive random access memories 870 in the first group in the row and the third programming voltage $V_{Pr-3}$ may be applied to the bottom electrode 903 of each of the selectors 889 in a first group in the row such that said each of the selectors 889 in the first group in the row may be turned on to couple said each of the resistive random access memories 870 in the first group in the row to one of the word lines 901 and the resetting step as illustrated in FIG. 8D may be performed to said each of the resistive random access memories 870 in the first group in the row to be reset to the high resistance between 1,000 and 100,000,000,000 ohms in the resetting step, and thus programmed to a logic level of "1"; for the selective resistive random access memories in the second group in the row provided with the stacked structure as seen in FIG. 9D, between one third and two thirds of the third programming voltage $V_{Pr-3}$, such as an half of the third programming voltage $V_{Pr-3}$, may be applied to the top electrode 872 of each of the resistive random access memories 870 in the second group in the row and the third programming voltage $V_{Pr-3}$ may be applied to the bottom electrode 903 of each of the selectors 889 in a second group in the row such that said each of the selectors 889 in the second group in the row may be turned off to decouple said each of the resistive random access memories 870 in the second group in the row from any of the word lines 901 and the resistive random access memories 870 in the second group in the row may have been kept in the previous state; the current flowing through said each of the selectors 889 in the first group in the row is greater than that flowing through said each of the selectors 889 in the second group in the row by an order of equal to or greater than 5, 4, 3 or 2.

Figure 9F:
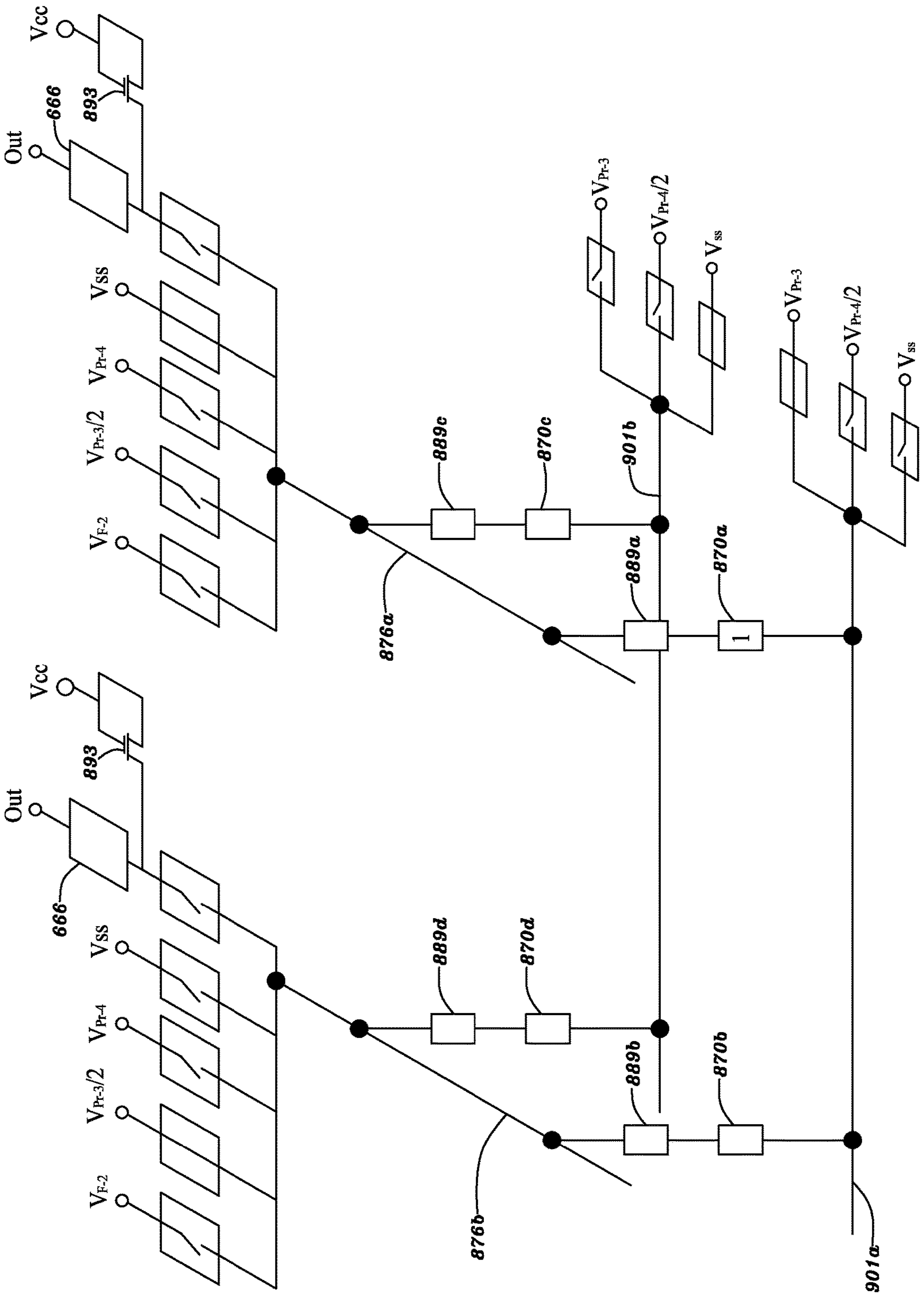
FIG. 9F is a circuit diagram showing selective resistive random access memories in a resetting step in accordance with an embodiment of the present application.

For the example, FIG. 9F is a circuit diagram showing selective resistive random access memories in a resetting step in accordance with an embodiment of the present application. Referring to FIG. 9F, if the first RRAM 870*a* is being reset, in the above resetting step, to a high-resistance (HR) state, i.e., programmed to a logic level of "1", and the second, third and fourth RRAMs 870*b*, 870*c* and 870*d* are kept in the previous state, (1) the first word line 901*a* corresponding to the first and second RRAMs 870*a* and 870*b* is selected and switched to couple to the third programming voltage $V_{Pr\text{-}3}$, (2) the first bit line 876*a* for the first RRAM 870*a* is switched to couple to the voltage Vss of ground reference, (3) the second bit line 876*b* for the second RRAM 870*b* is switched to couple to a voltage between one third and two thirds of the third programming voltage $V_{Pr\text{-}3}$, such as an half of the third programming voltage $V_{Pr\text{-}3}$, and (4) the second word line 901*b* corresponding to the third and fourth RRAMs 870*c* and 870*d* is unselected and switched to couple to the voltage Vss of ground reference.

Referring to FIGS. 9A-9D, a setting step as illustrated in FIG. 8D may be performed, one row by one row and in turn, to the second group of the resistive random access memories 870 but not to the first group of the resistive random access memories 870, in which (1) each of the word lines 901 corresponding to the resistive random access memories 870 in the row may be selected one by one and in turn to be switched to couple to the voltage Vss of ground reference, wherein the unselected word lines 901 corresponding to the resistive random access memories 870 in the other rows may be switched to couple to a voltage between one third and two thirds of a fourth programming voltage $V_{Pr\text{-}4}$, such as an half of the fourth programming voltage $V_{Pr\text{-}4}$, wherein the fourth programming voltage $V_{Pr\text{-}4}$ may be greater than or equal to the setting voltage $V_{SE}$ of the resistive random access memories 870 plus the positive threshold-voltage bias of the selectors 889, wherein the fourth programming voltage $V_{Pr\text{-}4}$ may range from 0.25 to 3.3 volts, (2) the bit lines 876 in the first group each for one of the resistive random access memories 870 in the first group in the row may be switched to couple to the voltage Vss of ground reference, and (3) the bit lines 876 in the second group each for one of the resistive random access memories 870 in the second group in the row may be switched to couple to the fourth programming voltage $V_{Pr\text{-}4}$. Thereby, for the selective resistive random access memories in the second group in the row provided with the stacked structure as seen in FIG. 9C, the fourth programming voltage $V_{Pr\text{-}4}$ may be applied to the top electrode 902 of each of the selectors 889 in the second group in the row and the voltage Vss of ground reference may be applied to the bottom electrode 871 of each of the resistive random access memories 870 in the second group in the row such that said each of the selectors 889 in the second group in the row may be turned on to couple said each of the resistive random access memories 870 in the second group in the row to one of the bit lines 876 and the setting step as illustrated in FIG. 8D may be performed to said each of the resistive random access memories 870 in the second group in the row to be set to the low resistance between 100 and 100,000 ohms in the setting step, and thus programmed to a logic level of "0"; for the selective resistive random access memories in the first group in the row provided with the stacked structure as seen in FIG. 9C, the voltage Vss of ground reference may be applied to the top electrode 902 of each of the selectors 889 in the first group in the row and the voltage Vss of ground reference may be applied to the bottom electrode 871 of each of the resistive random access memories 870 in the first group in the row such that said each of the selectors 889 in the first group in the row may be turned off to decouple said each of the resistive random access memories 870 in the first group in the row from any of the bit lines 876 and the resistive random access memories 870 in the first group in the row may have been kept in the previous state; the current flowing through said each of the selectors 889 in the second group in the row is greater than that flowing through said each of the selectors 889 in the first group in the row by an order of equal to or greater than 5, 4, 3 or 2. For the selective resistive random access memories in the second group in the row provided with the stacked structure as seen in FIG. 9D, the fourth programming voltage $V_{Pr\text{-}4}$ may be applied to the top electrode 872 of each of the resistive random access memories 870 in the second group in the row and the voltage Vss of ground reference may be applied to the bottom electrode 903 of each of the selectors 889 in the second group in the row such that said each of the selectors 889 in the second group in the row may be turned on to couple said each of the resistive random access memories 870 in the second group in the row to one of the word lines 901 and the setting step as illustrated in FIG. 8D may be performed to said each of the resistive random access memories 870 in the second group in the row to be set to the low resistance between 100 and 100,000 ohms in the setting step, and thus programmed to a logic level of "0"; for the selective resistive random access memories in the first group in the row provided with the stacked structure as seen in FIG. 9D, the voltage Vss of ground reference may be applied to the top electrode 872 of each of the resistive random access memories 870 in the first group in the row and the voltage Vss of ground reference may be applied to the bottom electrode 903 of each of the selectors 889 in the first group in the row such that said each of the selectors 889 in the first group in the row may be turned off to decouple said each of the resistive random access memories 870 in the first group in the row from any of the word lines 901 and the resistive random access memories 870 in the first group in the row may have been kept in the previous state; the current flowing through said each of the selectors 889 in the second group in the row is greater than that flowing through said each of the selectors 889 in the first group in the row by an order of equal to or greater than 5, 4, 3 or 2.

Figure 9G:
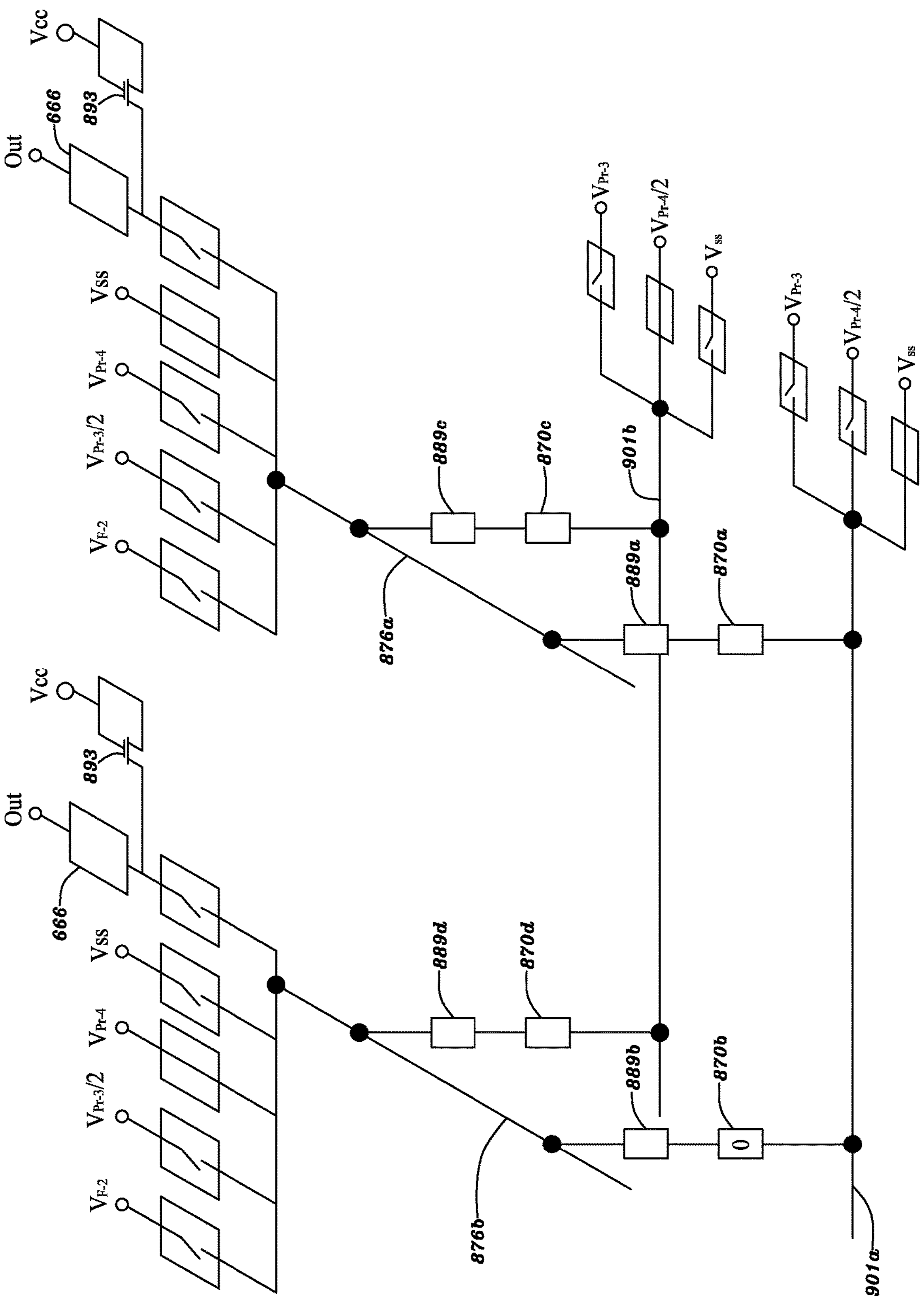
FIG. 9G is a circuit diagram showing selective resistive random access memories in a setting step in accordance with an embodiment of the present application.

For the example, FIG. 9G is a circuit diagram showing selective resistive random access memories in a setting step in accordance with an embodiment of the present application. Referring to FIG. 9G, if the second RRAM 870*b* is being set, in the above setting step, to a low-resistance (LR) state, i.e., programmed to a logic level of "0", and the first, third and fourth RRAMs 870*a*, 870*c* and 870*d* are kept in the previous state, (1) the first word line 901*a* corresponding to the first and second RRAMs 870*a* and 870*b* is selected and switched to couple to the voltage Vss of ground reference, (2) the second bit line 876*b* for the second RRAM 870*b* is switched to couple to the fourth programming voltage $V_{Pr\text{-}4}$, (3) the first bit line 876*a* for the first RRAM 870*a* is switched to couple to the voltage Vss of ground reference, and (4) the second word line 901*b* corresponding to the third and fourth RRAMs 870*c* and 870*d* is unselected and switched to couple to a voltage between one third and two thirds of the fourth programming voltage $V_{Pr\text{-}4}$, such as an half of the fourth programming voltage $V_{Pr\text{-}4}$.

In operation, referring to FIGS. 9A-9D, (1) each of the bit lines 876 may be switched to couple to the node N31 of one of the sense amplifiers 666 as illustrated in FIG. 8F and to the source terminal of one of the N-type MOS transistors 893, and (2) each of the word lines 901 corresponding to the resistive random access memories 870 in a row may be selected one by one and in turn to be switched to couple to the voltage Vss of ground reference to turn on the selectors 889 in a row to couple each of the resistive random access memories 870 in the row to one of the bit lines 876 for the structure of the selective resistive random access memories as illustrated in FIG. 9C or to couple all of the resistive random access memories 870 in the row to a same one of the word lines 901 for the structure of the selective resistive random access memories as illustrated in FIG. 9D, wherein the unselected word lines 901 corresponding to the resistive random access memories 870 in the other rows may be switched to be floating to turn off the selectors 889 in the other rows to decouple each of the resistive random access memories 870 in the other rows from any of the bit lines 876 for the structure of the selective resistive random access memories as illustrated in FIG. 9C or to decouple each of the resistive random access memories 870 in the other rows from any of the word lines 901 for the structure of the selective resistive random access memories as illustrated in FIG. 9D. Thereby, each of the sense amplifiers 666 may compare a voltage at one of the bit lines 876, i.e., at the node N31 as seen in FIG. 8F, with a comparison voltage at a comparison line, i.e., at the node N32 as seen in FIG. 8F, into a compared data and then generate an output "Out" of one of the resistive random access memories 870 coupling to said one of the bit lines 876 based on the compared data. For example, when the voltage at the node N31 is compared by said each of the sense amplifiers 666 to be smaller than the comparison voltage at the node N32, said each of the sense amplifiers 666 may generate the output "Out" at a logic level of "1" in the case that one of the resistive random access memories 870, which couples to said each of the sense amplifiers 666, has the low resistance. When the voltage at the node N31 is compared by said each of the sense amplifiers 666 to be greater than the comparison voltage at the node N32, said each of the sense amplifiers 666 may generate the output "Out" at a logic level of "0" in the case that one of the resistive random access memories 870, which couples to said each of the sense amplifiers 666, has the high resistance.

Figure 9H:
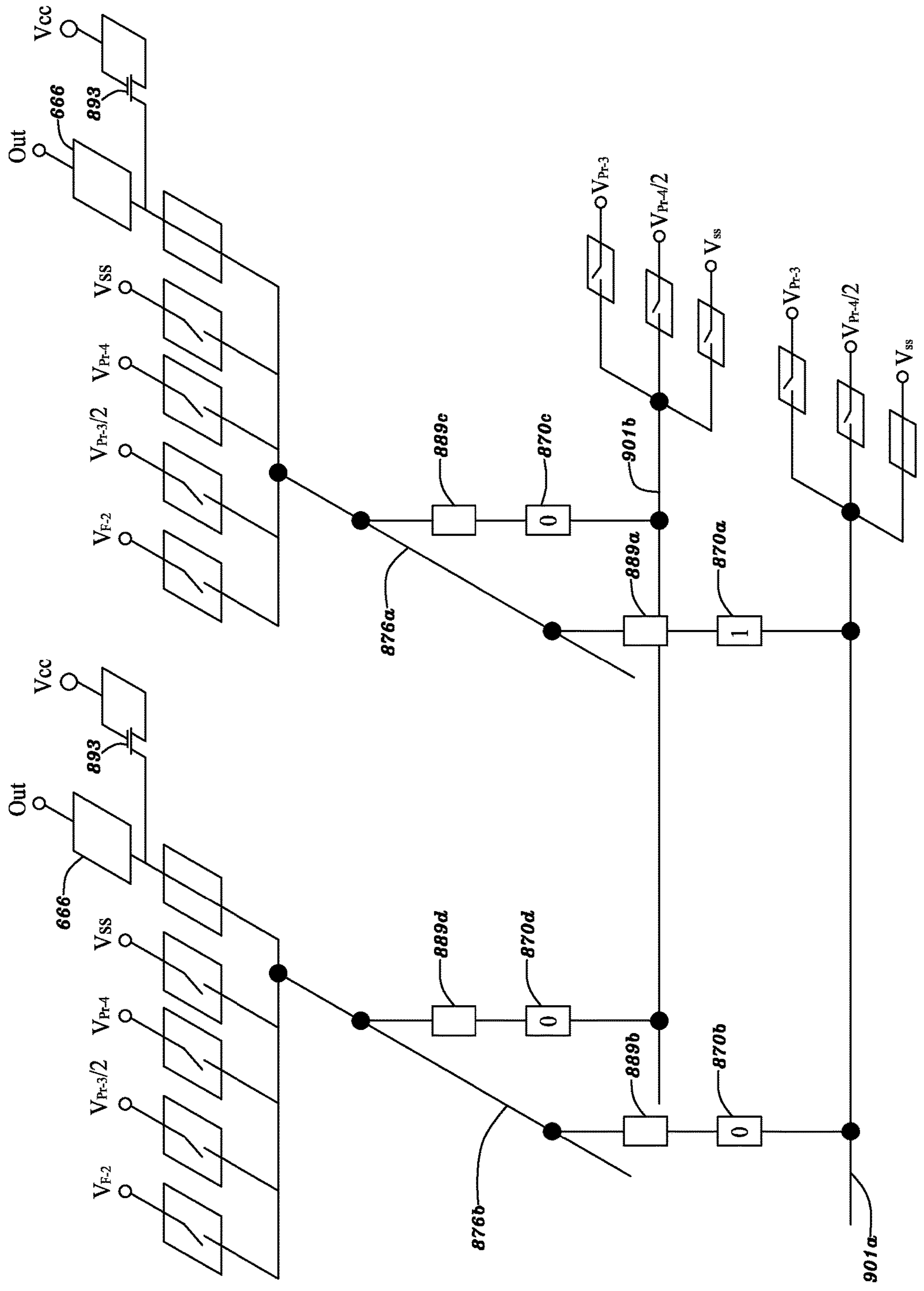
FIG. 9H is a circuit diagram showing selective resistive random access memories in operation in accordance with an embodiment of the present application.

For the example, FIG. 9H is a circuit diagram showing selective resistive random access memories in operation in accordance with an embodiment of the present application. Referring to FIG. 9H, if the first and second RRAMs 870*a* and 870*b* are being read in operation and the third and fourth RRAMs 870*c* and 870*d* are not being read, (1) the first word line 901*a* corresponding to the first and second RRAMs 870*a* and 870*b* is selected and switched to couple to the voltage Vss of ground reference, (2) the first and second bit lines 876*a* and 876*b* for the first and second RRAMs 870*a* and 870*b* are switched to couple to the sense amplifiers 666 respectively, and (3) the second word line 901*b* corresponding to the third and fourth RRAMs 870*c* and 870*d* is unselected and switched to be floating.

Figure 9I:
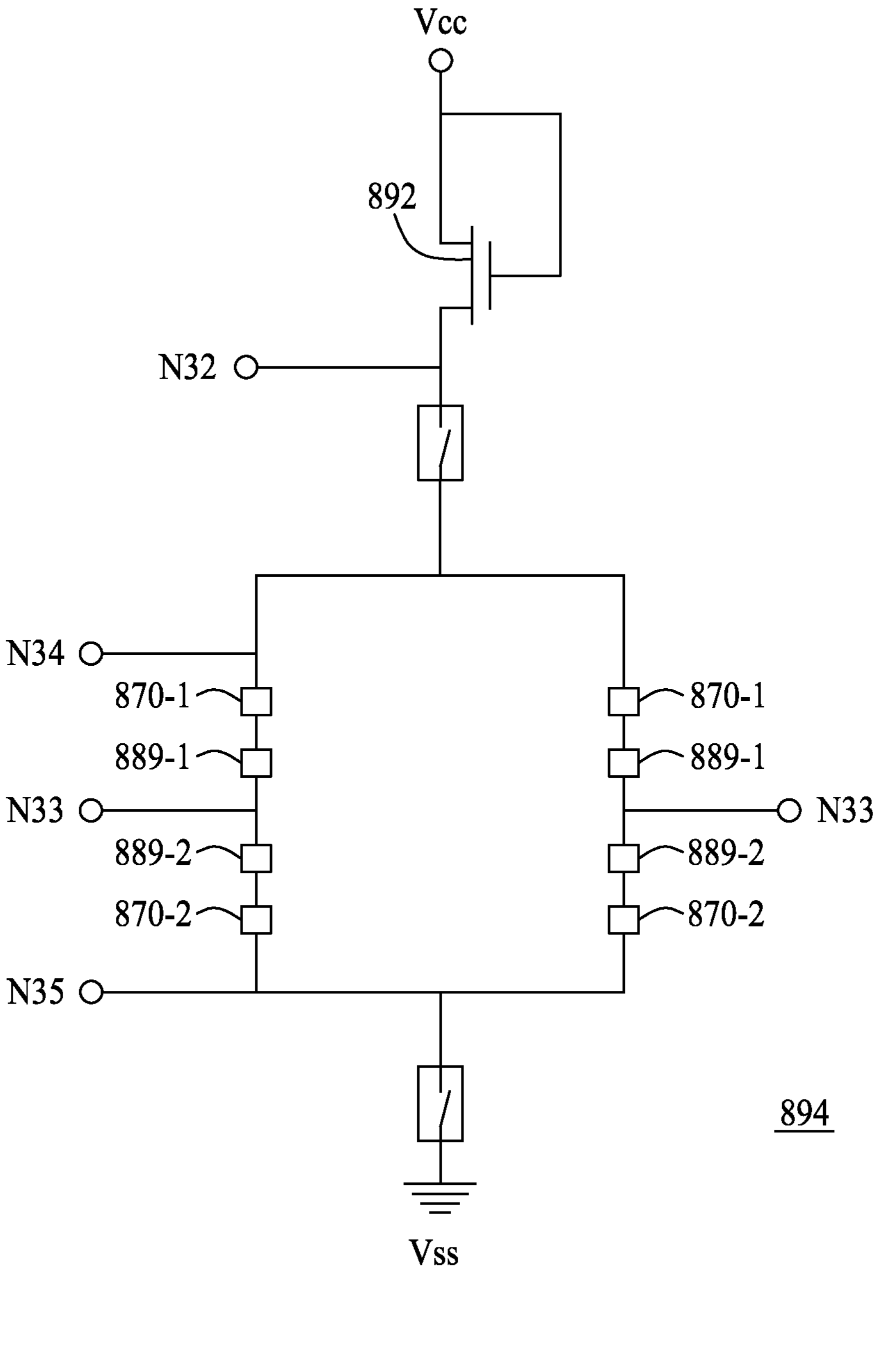
FIG. 9I is a circuit diagram showing a comparison-voltage generating circuit in accordance with an embodiment of the present application.

FIG. 9I is a circuit diagram showing a comparison-voltage generating circuit in accordance with an embodiment of the present application. Referring to FIGS. 9A-9C and 9E-9I, a comparison-voltage generating circuit 894 includes two pairs of a first combination of the resistive random access memory 870-1 and the selector 889-1 connected in serial to each other as seen in FIG. 9C and a second combination of the resistive random access memory 870-2 and the selector 889-2 connected in serial to each other as seen in FIG. 9C, wherein the pairs of the first and second combinations are connected in parallel to each other. In each of the pairs of the first and second combinations, the selector 889-1 may have its top electrode 902 coupling to the top electrode 902 of the selector 889-1 and to a node N33, and the resistive random access memory 870-1 may have its bottom electrode 871 coupling to a node N34. The comparison-voltage generating circuit 894 may include a N-type MOS transistor 892 having a gate terminal coupling to a drain terminal of the N-type MOS transistor 892 and to the voltage Vcc of power supply and a source terminal coupling to the node N32 of the sense amplifier 666 as seen in FIG. 8F via the comparison line. The bottom electrodes 871 of the resistive random access memories 870-2 in the pairs may couple to a node N35.

Referring to FIGS. 9A-9C and 9E-9I, when the resistive random access memories 870-1 and 870-2 in the pairs are being formed in the forming step as illustrated in FIG. 8D, (1) the node N34 may be switched to couple to the voltage Vss of ground reference, (2) the node N33 may be switched to couple to the second activating voltage $V_{F\text{-}2}$, (3) the node N35 may be switched to couple to the voltage Vss of ground reference, and (4) the node N32 may be switched not to couple to the bottom electrodes 871 of the resistive random access memories 870-1 in the pairs. Thereby, the resistive random access memories 870-1 and 870-2 in the pairs may be formed to the low resistance.

Referring to FIGS. 9A-9C and 9E-9I, after the resistive random access memories 870-1 and 870-2 in the pairs are formed in the forming step, the resetting step as illustrated in FIG. 8D may be performed to the resistive random access memories 870-1 and 870-2 in the pairs. When the pairs of resistive random access memories 870-1 and 870-2 are being reset in the resetting step, (1) the node N34 may be switched to couple to the third programming voltage $V_{Pr\text{-}3}$, (2) the node N33 may be switched to couple to the voltage Vss of ground reference, (3) the node N35 may be switched to couple to the third programming voltage $V_{Pr\text{-}3}$, and (4) the node N32 may be switched not to couple to the bottom electrodes 871 of the resistive random access memories 870-1 in the pairs. Thereby, the resistive random access memories 870-1 and 870-2 in the pairs may be reset to the high resistance.

Referring to FIGS. 9A-9C and 9E-9I, after the resistive random access memories 870-1 and 870-2 in the pairs are reset in the resetting step, the setting step as illustrated in FIG. 8D may be performed to the resistive random access memories 870-2 in the pairs. When the resistive random access memories 870-2 are being set in the setting step, (1) the node N34 may be switched to couple to the fourth programming voltage $V_{Pr\text{-}4}$, (2) the node N33 may be switched to couple to the fourth programming voltage $V_{Pr\text{-}4}$, (3) the node N35 may be switched to couple to the voltage Vss of ground reference, and (4) the node N32 may be switched not to couple to the bottom electrodes 871 of the resistive random access memories 870-1 in the pairs. Thereby, the resistive random access memories 870-2 in the pairs may be set to the low resistance. Accordingly, the resistive random access memories 870-2 in the pairs may be programmed to the low resistance between 100 and 100,000 ohms, and the resistive random access memories 870-1 in the pairs may be programmed to the high resistance between 1,000 and 100,000,000,000 ohms, greater than the low resistance, for example.

Referring to FIGS. 9A-9C and 9E-9I, in operation after the resistive random access memories 870-2 in the pairs may be programmed to the low resistance, and the resistive random access memories 870-1 in the pairs may be programmed to the high resistance, (1) the nodes N33, N34 and N35 may be switched to be floating, (2) the node N32 may be switched to couple to the bottom electrodes 871 of the resistive random access memories 870-1 in the pairs, and (3) the bottom electrodes 871 of the resistive random access memories 870-2 in the pairs may be switched to couple to the voltage Vss of ground reference. Thereby, the comparison line, i.e., node N32, of the sense amplifier 666 as seen in FIG. 8F may be at the comparison voltage between a voltage of the node N31 coupling to one of the resistive random access memories 870 programmed to the low resistance and selected by one of the word lines 901 and a voltage of the node N31 coupling to one of the resistive random access memories 870 programmed to the high resistance and selected by one of the word lines 901.

(1.3) First Type of Non-Volatile Memory Cells for the Third Alternative

Figure 10A:
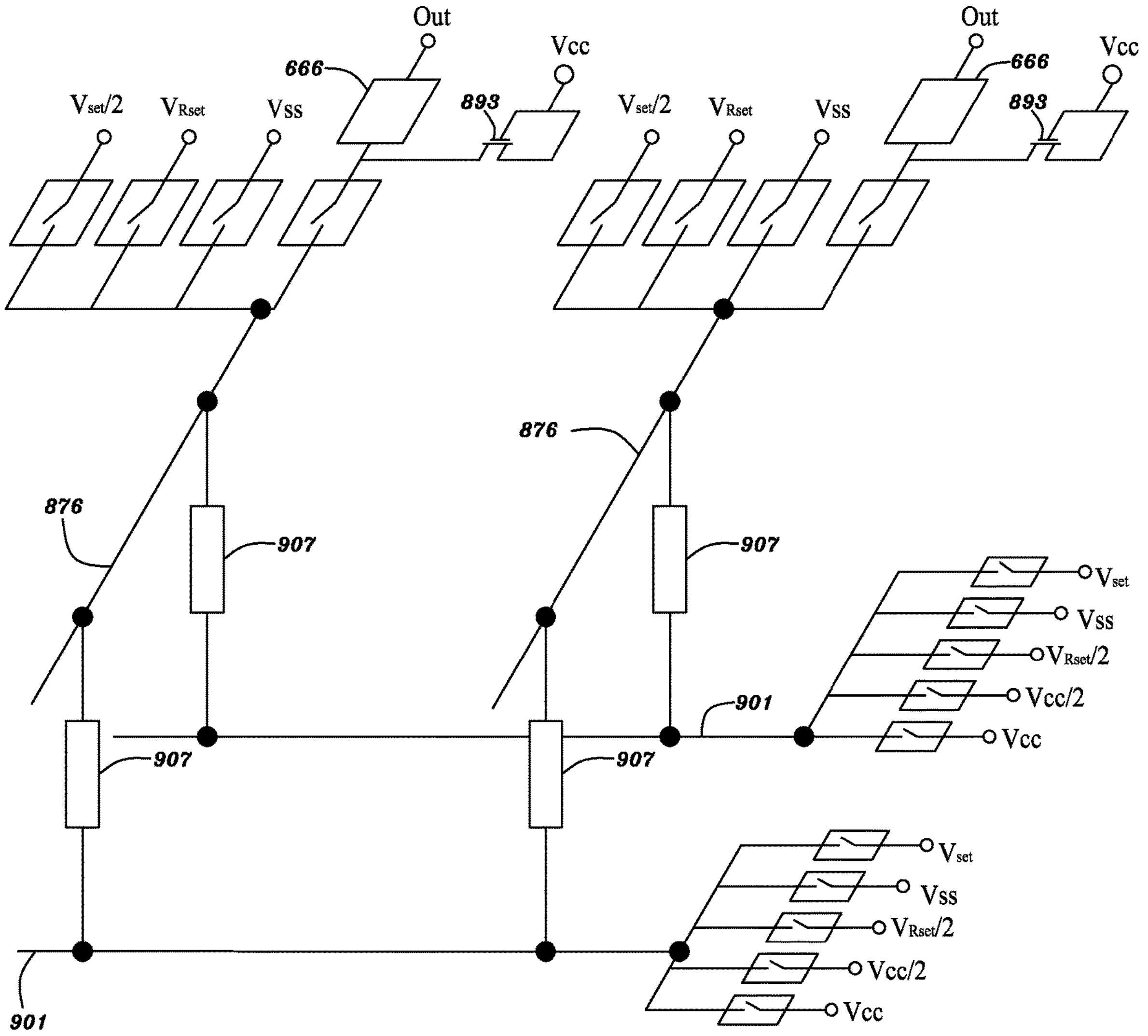
FIG. 10A is a circuit diagram showing another non-volatile memory array in accordance with an embodiment of the present application.
Figure 10B:
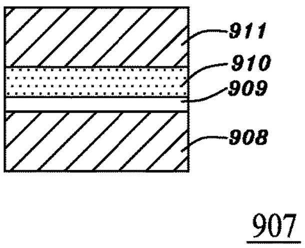
FIG. 10B is a schematically cross-sectional view showing a structure of a self-select (SS) resistive random access memory in accordance with the present application.

FIG. 10A is a circuit diagram showing another non-volatile memory array in accordance with an embodiment of the present application. The circuits as illustrated in FIG. 10A may be referred to those as illustrated in FIG. 9A, but the difference therebetween is that the selectors 889 and resistive random access memories 870 as illustrated in FIG. 9A may be replaced with self-select (SS) resistive random access memory (RRAM) cells 907, i.e., non-volatile memory cells. FIG. 10B is a schematically cross-sectional view showing a structure of a self-select (SS) resistive random access memory in accordance with the present application. Referring to FIGS. 10A and 10B, the self-select (SS) resistive random access memory cell 907 may include (1) a bottom electrode 908, such as a layer of nickel having a thickness between 20 nm and 200 nm, 50 nm and 150 nm, or 80 nm and 120 nm, wherein the layer of nickel may be formed by a sputtering process, (2) an oxide layer 909, such as a layer of hafnium oxide ($HfO_2$) having a thickness greater than 5 nm, 10 nm, or 15 nm or between 1 nm and 30 nm, 3 nm and 20 nm, or 5 nm and 15 nm, on the bottom electrode 908, wherein the layer of hafnium oxide may be formed by an atomic layer deposition (ALD) process or by a reactive magnetron direct-current (DC) sputtering process using hafnium as a target and using oxygen and/or argon as gas flow, (3) an insulting layer 910, such a layer of titanium dioxide having a thickness greater than 40 nm, 60 nm or 80 nm, or between 20 nm and 100 nm, 40 nm and 80 nm, or 50 nm and 70 nm, on the oxide layer 909, wherein the layer of titanium dioxide may be formed by an atomic layer deposition (ALD) process or by a reactive magnetron direct-current (DC) sputtering process using titanium as a target and using oxygen and/or argon as gas flow, and (4) a top electrode 911, such a layer of nickel having a thickness between 20 nm and 200 nm, 50 nm and 150 nm, or 80 nm and 120 nm, wherein the layer of nickel may be formed by a sputtering process. Oxygen vacancies or oxygen vacancy conductive filaments or paths may be formed in the oxide layer 909. The insulating layer 910 may have a conduction energy band energy lower (more positive) than that of the oxide layer 909 such that an energy barrier may be formed at an interface between the insulating layer 910 and oxide layer 909. Each of the self-select (SS) resistive random access memory cells 907 may couple to one of the bit lines 876 via the top electrode 911 thereof and couple to one of the word lines 901 via the bottom electrode 908 thereof.

Figure 10C:
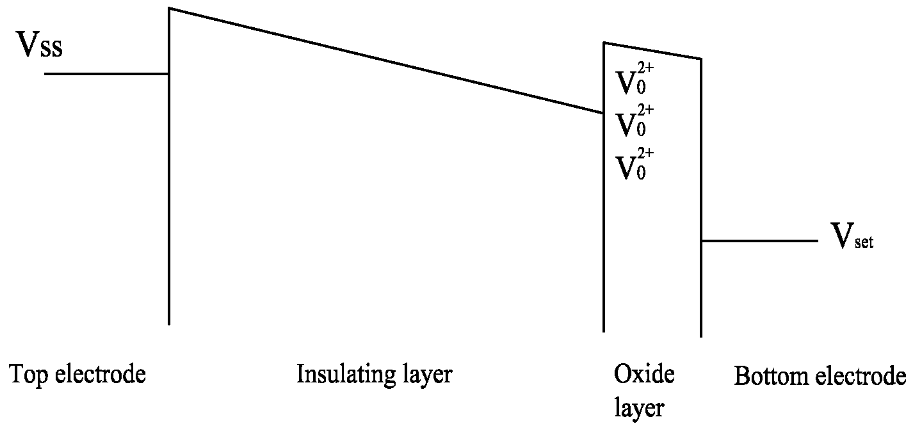
FIG. 10C is a band diagram of a self-select (SS) resistive random access memory (SS RRAM) in a setting step for setting the SS RRAM at a low-resistance (LR) state, i.e., at a logic level of "0", in accordance with an embodiment of the present application.

FIG. 10C is a band diagram of a self-select (SS) resistive random access memory (SS RRAM) in a setting step for setting the SS RRAM at a low-resistance (LR) state, i.e., at a logic level of "0", in accordance with an embodiment of the present application. Referring to FIGS. 10B and 10C, in the setting step, the top electrode 911 is biased at a voltage Vss of ground reference, and the bottom electrode is biased at a setting voltage $V_{set}$. Thereby, oxygen vacancies in the oxide layer 909 may move to and accumulate at the interface between the insulating layer 910 and the oxide layer 909.

Figure 10D:
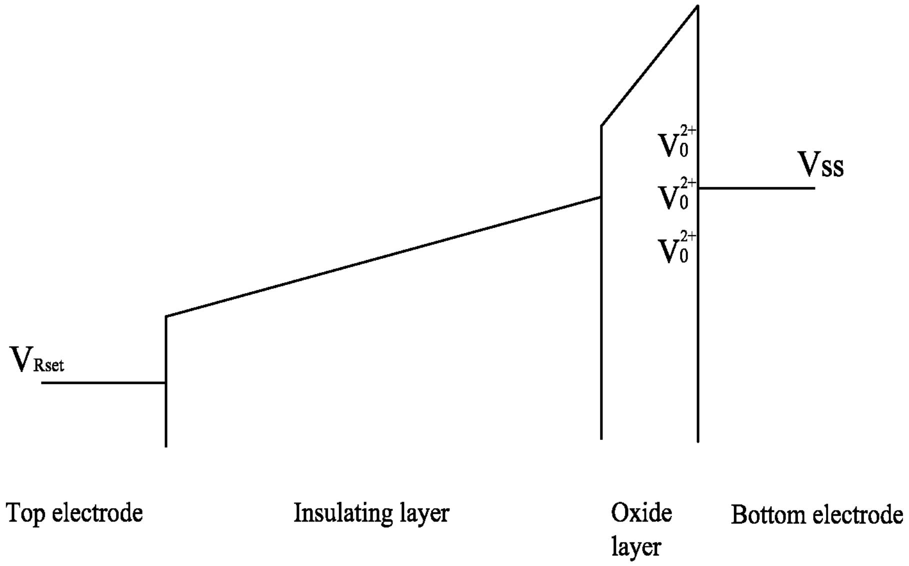
FIG. 10D is a band diagram of a SS RRAM in a resetting step for resetting the SS RRAM at a high-resistance (HR) state, i.e., at a logic level of "1", in accordance with an embodiment of the present application.

FIG. 10D is a band diagram of a SS RRAM in a resetting step for resetting the SS RRAM at a high-resistance (HR) state, i.e., at a logic level of "1", in accordance with an embodiment of the present application. Referring to FIGS. 10B and 10D, in the resetting step, the top electrode 911 is biased at a resetting voltage $V_{Rset}$, and the bottom electrode 908 is biased at the voltage Vss of ground reference. Oxygen vacancies in the oxide layer 909 may move to and accumulate at the interface between the oxide layer 909 and the bottom electrode 908.

Figure 10E:
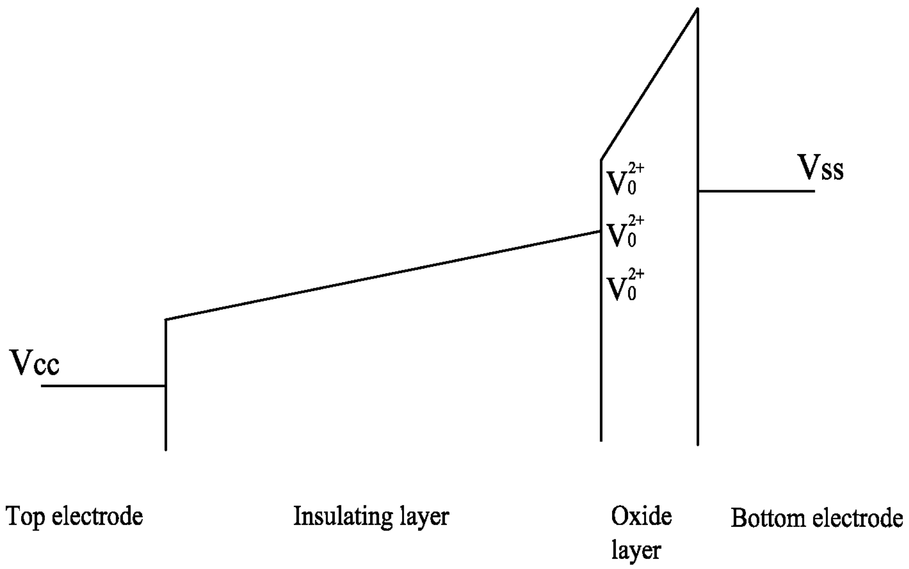
FIGS. 10E and 10F are band diagrams of a SS RRAM having low and high resistances respectively, when being selected for read in operation, in accordance with an embodiment of the present application.
Figure 10F:
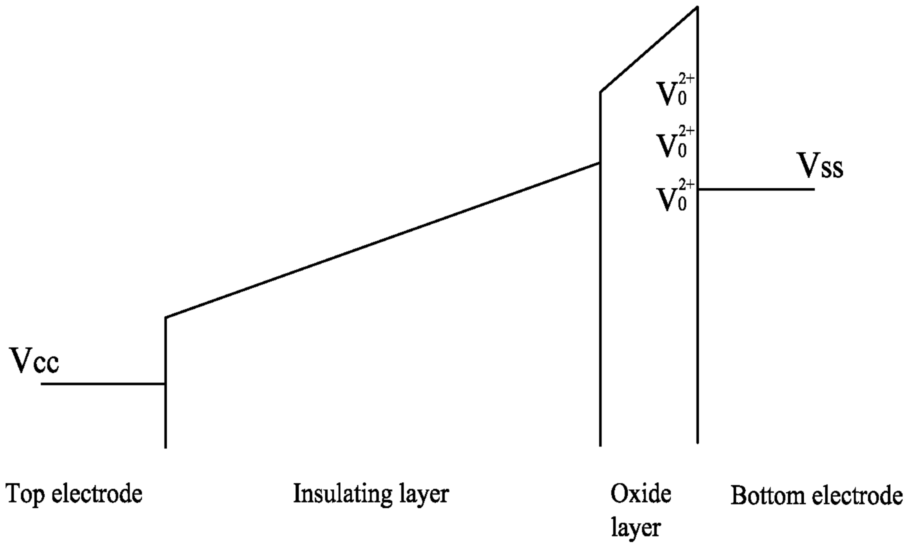

FIGS. 10E and 10F are band diagrams of a SS RRAM having low and high resistances respectively, when being selected for read in operation, in accordance with an embodiment of the present application. In the operation step, the top electrode 911 is biased at a voltage Vcc of power supply, and the bottom electrode is biased at the voltage Vss of ground reference. Based on the band diagram in FIG. 10E, the electrons may flow from the bottom electrode 908 to the top electrode 911 by (i) tunneling through the oxide layer 909 due to relatively large band bending, resulting in a relatively strong electric field, in the oxide layer 909, and then (ii) flowing through the insulating layer 910. Therefore, the SS RRAM 909 is operated at the LR state, i.e., at a logic level of "0".

Based on the band diagram in FIG. 10F, the electrons may not be able to tunnel through the oxide layer 909 due to relatively small band bending, causing a relatively weak electric field, in the oxide layer 909. Therefore, the SS RRAM cells 907 is operated at the HR state, i.e., at a logic level of "1".

For more elaboration, referring to FIGS. 10A, a setting step may be performed, one row by one row and in turn, to a first group of the self-select resistive random access memory cells 907 but not to a second group of the self-select resistive random access memory cells 907. In the setting step for the self-select resistive random access memory cells 907, (1) each of the word lines 901 corresponding to the self-select resistive random access memory cells 907 in a row may be selected one by one and in turn to be switched to couple to a setting voltage Vset between 2 volts and 10 volts, 4 volts and 8 volts, or 6 volts and 8 volts or equal to 8 volts, 7 volts or 6 volts, wherein the unselected word lines 901 may be switched to couple the self-select resistive random access memory cells 907 in the other rows to a voltage Vss of ground reference, (2) the bit lines 876 in a first group each for one of the self-select resistive random access memory cells 907 in the first group in the row may be switched to couple to the voltage Vss of ground reference, and (3) the bit lines 876 in a second group each for one of the self-select resistive random access memory cells 907 in the second group in the row may be switched to couple to a voltage between one third and two thirds of the setting voltage $V_{set}$, such as an half of the setting voltage $V_{set}$. Thereby, as seen in FIGS. 10A-10C, for one of the self-select resistive random access memory cells 907 in the first group in the row, multiple oxygen vacancies in its oxide layer 909 may move to and accumulate at an interface between its oxide layer 909 and its insulating layer 910. Thus, each of the self-select resistive random access memory cells 907 in the first group in the row may be set to a low resistance between 100 and 100,000 ohms in the setting step, and programmed to a logic level of "0".

Figure 10G:
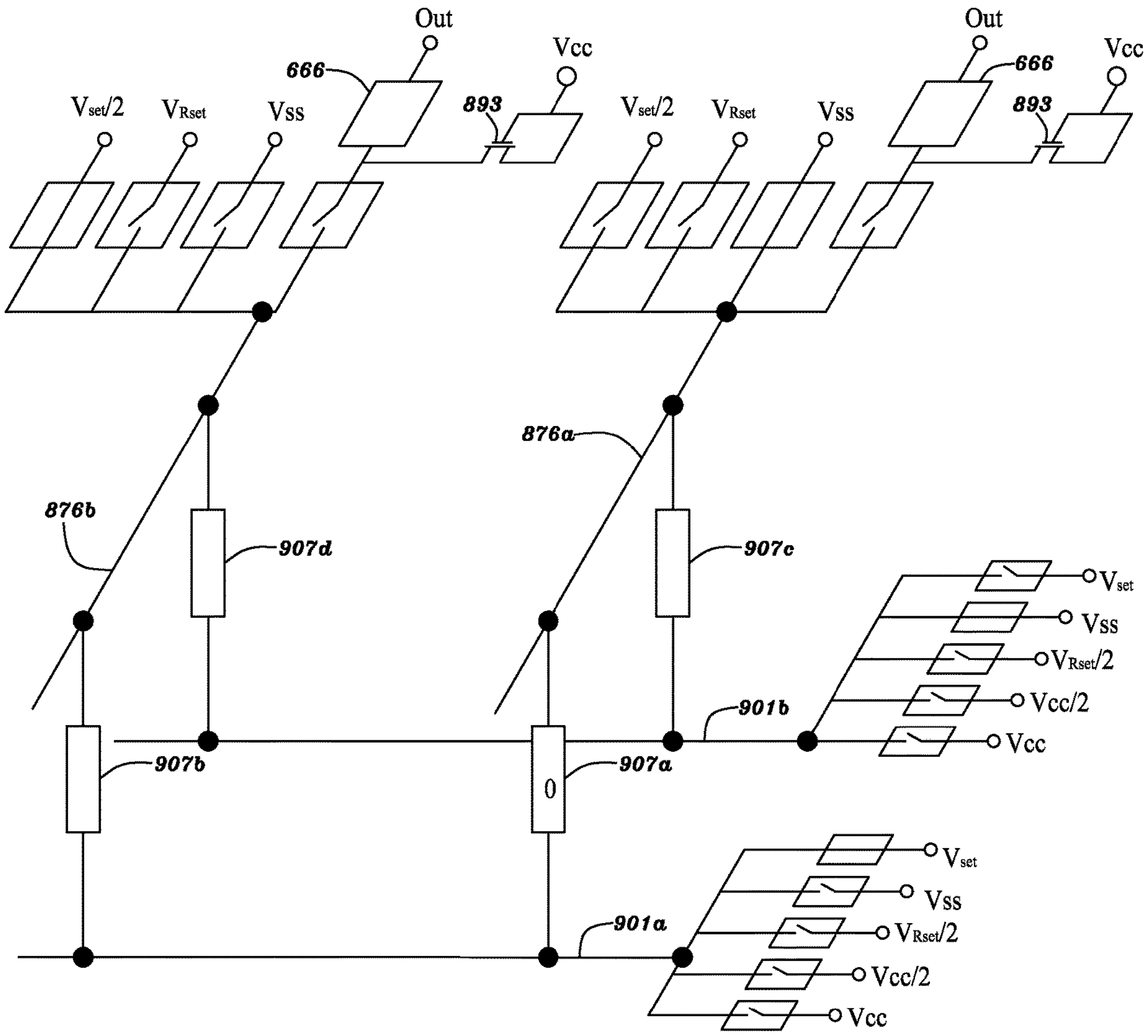
FIG. 10G is a circuit diagram showing SS RRAM in a setting step in accordance with an embodiment of the present application.

For an example, FIG. 10G is a circuit diagram showing SS RRAM in a setting step in accordance with an embodiment of the present application. Referring to FIG. 10G, the self-select resistive random access memory cells 907 may include a first one 907*a* and second one 907*b* arranged in a first row (y=y1) and a third one 907*c* and fourth one 907*d* arranged in a second row (y=y2). For correspondence, the first self-select resistive random access memory cell 907*a* is at a correspondence (x1, y1), the second self-select resistive random access memory cell 907*b* is at a correspondence (x2, y1), the third self-select resistive random access memory cell 907*c* is at a correspondence (x1, y2), and the fourth self-select resistive random access memory cell 907*d* is at a correspondence (x2, y2).

Referring to FIG. 10G, if the first SS RRAM cell 907*a* is being set, in the above setting step, to the low-resistance (LR) state, i.e., programmed to a logic level of "0", and the second, third and fourth SS RRAM cells 907*b*, 907*c* and 907*d* are kept in the previous state, (1) a first word line 901*a* corresponding to the first and second SS RRAM cells 907*a* and 907*b* is selected and switched to couple to the setting voltage $V_{set}$, for example, between 2 volts and 10 volts, 4 volts and 8 volts, or 6 volts and 8 volts, or equal to 8 volts, 7 volts or 6 volts, (2) a first bit line 876*a* for the first SS RRAM cell 907*a* is switched to couple to the voltage Vss of ground reference, (3) a second bit line 876*b* for the second SS RRAM cell 907*b* is switched to couple to a voltage between one third and two thirds of $V_{set}$, such as at an half of $V_{set}$, and (4) a second word line 901*b* corresponding to the third and fourth SS RRAM cells 907*c* and 907*d* is unselected and switched to couple to the voltage Vss of ground reference.

Referring to FIGS. 10A, a resetting step may be performed, one row by one row and in turn, to the second group of the self-select resistive random access memory cells 907 but not to the first group of the self-select resistive random access memory cells 907. In the resetting step for the self-select resistive random access memory cells 907, (1) each of the word lines 901 corresponding to the self-select resistive random access memory cells 907 in the row may be selected one by one and in turn to be switched to couple the self-select resistive random access memory cells 907 in a row to the voltage Vss of ground reference, wherein the unselected word lines 901 may be switched to couple the self-select resistive random access memory cells 907 in the other rows to a voltage between one third and two thirds of a resetting voltage $V_{Rset}$, such as an half of the resetting voltage $V_{Rset}$, wherein the resetting voltage $V_{Rset}$ may be between 2 volts and 8 volts, 4 volts and 8 volts, or 4 volts and 6 volts or equal to 6 volts, 5 volts or 4 volts, (2) the bit lines 876 in the second group each for one of the self-select resistive random access memory cells 907 in the second group in the row may be switched to couple to the resetting voltage $V_{Rset}$, and (3) the bit lines 876 in the first group each for one of the self-select resistive random access memory cells 907 in the first group in the row may be switched to couple to the the voltage Vss of ground reference. Thereby, as seen in FIGS. 10A, 10B and 10D, for one of the self-select resistive random access memory cells 907 in the second group in the row, multiple oxygen vacancies in its oxide layer 909 may move to and accumulate at an interface between its oxide layer 909 and its bottom electrode 908. Thus, each of the self-select resistive random access memory cells 907 in the second group in the row may be reset to a high resistance between 1,000 and 100,000,000,000 ohms, greater than the low resistance, in the resetting step, and programmed to a logic level of "1".

Figure 10H:
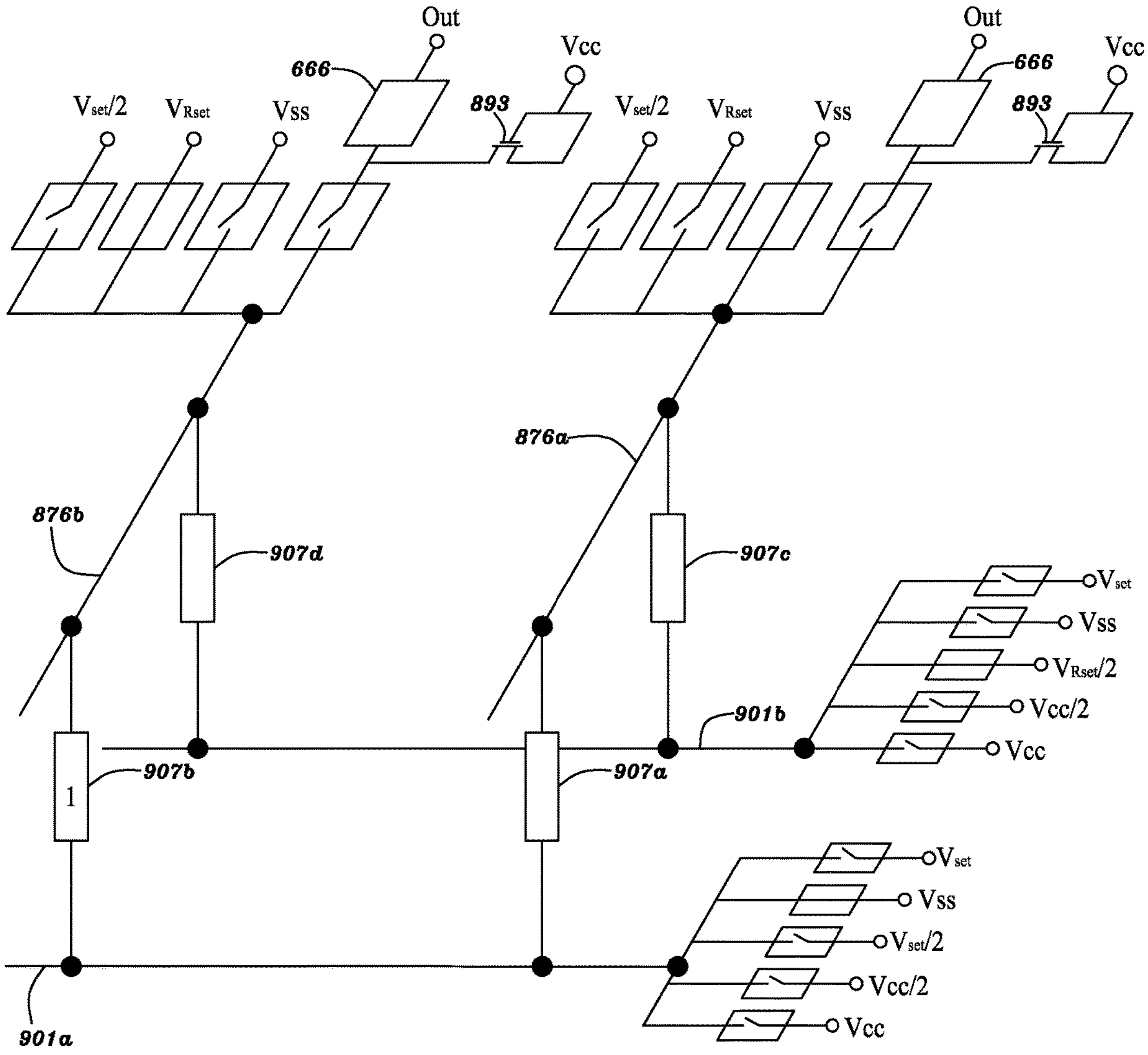
FIG. 10H is a circuit diagram showing SS RRAM in a resetting step in accordance with an embodiment of the present application.

For the example, FIG. 10H is a circuit diagram showing SS RRAM in a resetting step in accordance with an embodiment of the present application. Referring to FIG. 10H, if the second SS RRAM cell 907*b* is being reset, in the above resetting step, to the high-resistance (HR) state, i.e., programmed to a logic level of "1", and the first, third and fourth SS RRAM cells 907*a*, 907*c* and 907*d* are kept in the previous state, (1) the first word line 901*a* corresponding to the first and second SS RRAM cells 907*a* and 907*b* is selected and switched to couple to the voltage Vss of ground reference, (2) the second bit line 876*b* for the second SS RRAM cell 907*b* is switched to couple to the resetting voltage $V_{Rset}$ between 2 volts and 8 volts, 4 volts and 8 volts, or 4 volts and 6 volts or equal to 6 volts, 5 volts or 4 volts, (3) the first bit line 876*a* for the first SS RRAM cell 907*a* is switched to couple to the voltage Vss of ground reference, and (4) the second word line 901*b* corresponding to the third and fourth SS RRAM cells 907*c* and 907*d* is unselected and switched to couple to a voltage between one third and two thirds of the resetting voltage $V_{Rset}$, such as an half of the resetting voltage $V_{Rset}$.In operation, referring to FIGS. 10A, 10B, 10E and 10F, (1) each of the bit lines 876 may be switched to couple to the node N31 of one of the sense amplifiers 666 as illustrated in FIG. 8F and to the source terminal of one of the N-type MOS transistors 893, and (2) each of the word lines 901 corresponding to the self-select resistive random access memory cells 907 in a row may be selected one by one and in turn to be switched to to couple to the voltage Vss of ground reference to allow a tunneling current to pass through the self-select resistive random access memory cells 907 in the row, wherein the unselected word lines 901 corresponding to the self-select resistive random access memory cells 907 in the other rows may be switched to be floating to prevent a tunneling current from passing through the self-select resistive random access memory cells 907 in the other rows. Thereby, each of the sense amplifiers 666 may compare a voltage at one of the bit lines 876, i.e., at the node N31 as seen in FIG. 8F, with a comparison voltage at a comparison line, i.e., at the node N32 as seen in FIG. 8F, into a compared data and then generate an output "Out" of one of the self-select resistive random access memory cells 907 coupling to said one of the bit lines 876 based on the compared data. For example, when the voltage at the node N31 is compared by said each of the sense amplifiers 666 to be smaller than the comparison voltage at the node N32, said each of the sense amplifiers 666 may generate the output "Out" at a logic level of "1" in the case that one of the self-select resistive random access memory cells 907, which couples to said each of the sense amplifiers 666, has the low resistance. When the voltage at the node N31 is compared by said each of the sense amplifiers 666 to be greater than the comparison voltage at the node N32, said each of the sense amplifiers 666 may generate the output "Out" at a logic level of "0" in the case that one of the self-select resistive random access memory cells 907, which couples to said each of the sense amplifiers 666, has the high resistance.

Figure 10I:
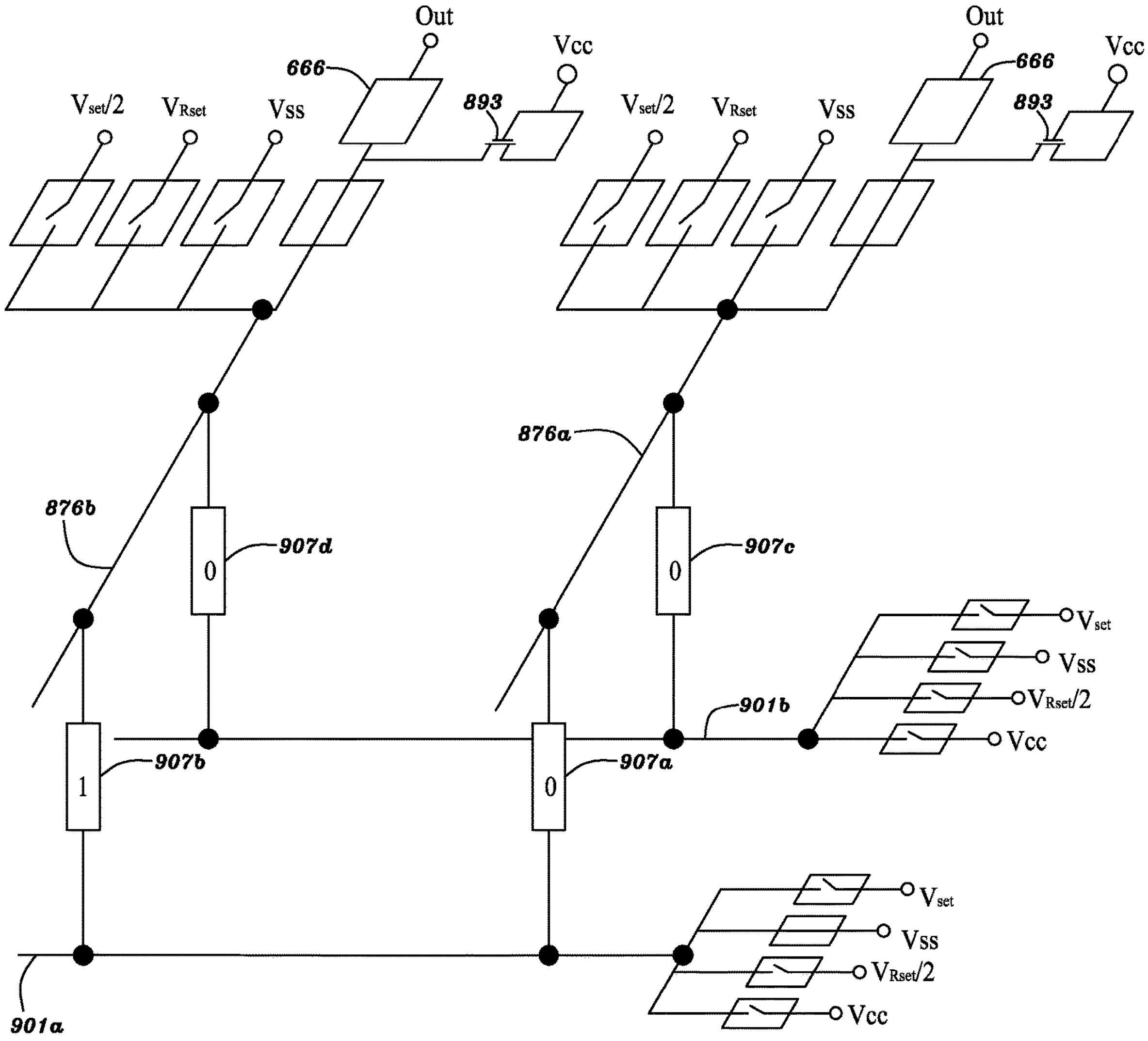
FIG. 10I is a circuit diagram showing SS RRAMs in operation in accordance with an embodiment of the present application.

For the example, FIG. 10I is a circuit diagram showing SS RRAMs in operation in accordance with an embodiment of the present application. Referring to FIG. 10I, if the first and second SS RRAM cells 907*a* and 907*b* are being read in operation and the third and fourth SS RRAM cells 907*c* and

907*d* are not being read, (1) the first word line 901*a* corresponding to the first and second SS RRAM cells 907*a* and 907*b* is selected and switched to couple to the voltage Vss of ground reference, (2) the first and second bit lines 876*a* and 876*b* for the first and second SS RRAM cells 907*a* and 907*b* are switched to couple to the sense amplifiers 666 respectively, and (3) the second word line 901*b* corresponding to the third and fourth SS RRAM cells 907*c* and 907*d* is unselected and switched to be floating.

Figure 10J:
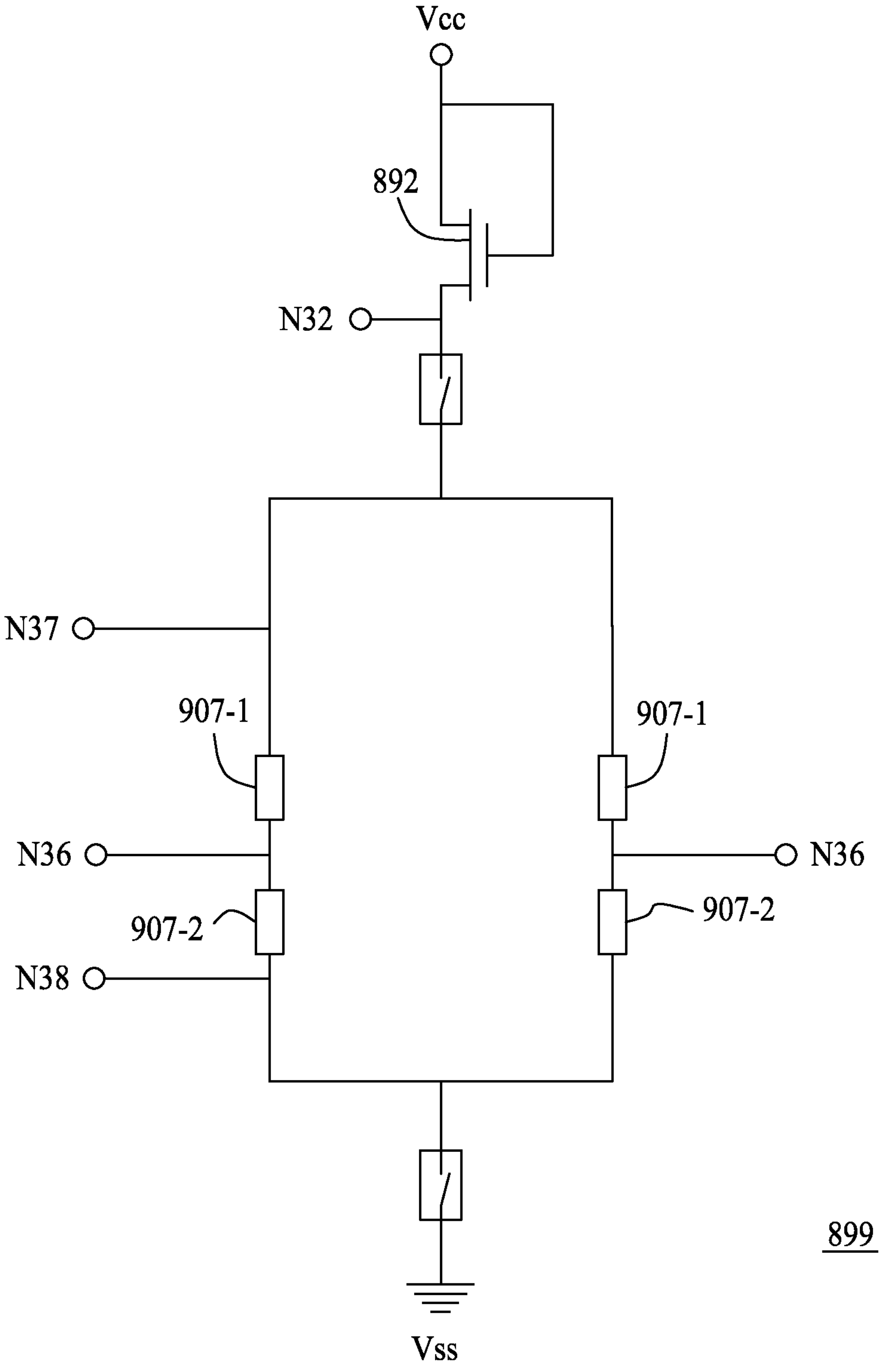
FIG. 10J is a circuit diagram showing a comparison-voltage generating circuit in accordance with an embodiment of the present application.

FIG. 10J is a circuit diagram showing a comparison-voltage generating circuit in accordance with an embodiment of the present application. Referring to FIGS. 10A-10J, a comparison-voltage generating circuit 899 includes two pairs of SS RRAM cells 907-1 and 907-2 connected in serial to each other. In each of the pairs of the SS RRAM cells 907-1 and 907-2, the SS RRAM cell 907-1 may have its top electrode 911 coupling to the top electrode 911 of the SS RRAM cell 907-2 and to a node N36, and the resistive random access memory 870-1 may have its bottom electrode 908 coupling to a node N37. The comparison-voltage generating circuit 899 may include a N-type MOS transistor 892 having a gate terminal coupling to a drain terminal of the N-type MOS transistor 892 and to the voltage Vcc of power supply and a source terminal coupling to the node N32 of the sense amplifier 666 as seen in FIG. 8F via the comparison line. The bottom electrodes 908 of the SS RRAM cells 907-2 in the pairs may couple to a node N38.

Referring to FIGS. 10A-10J, the resetting step may be performed to the SS RRAM cells 907-1 in the pairs. When the SS RRAM cells 907-1 in the pairs are being reset in the resetting step, (1) the node N37 may be switched to couple to the voltage Vss of ground reference, (2) the node N36 may be switched to couple to the resetting voltage $V_{Rset}$, (3) the node N38 may be switched to couple to the resetting voltage $V_{Rset}$, and (4) the node N32 may be switched not to couple to the bottom electrodes 908 of the SS RRAM cells 907-1 in the pairs. Thereby, the SS RRAM cells 907-1 in the pairs may be reset to the high resistance.

Referring to FIGS. 10A-10J, after the SS RRAM cells 907-1 in the pairs are reset in the resetting step, the setting step may be performed to the SS RRAM cells 907-2 in the pairs. When the SS RRAM cells 907-2 are being set in the setting step, (1) the node N37 may be switched to couple to the voltage Vss of ground reference, (2) the node N36 may be switched to couple to the voltage Vss of ground reference, (3) the node N38 may be switched to couple to the setting voltage $V_{set}$, and (4) the node N32 may be switched not to couple to the bottom electrodes 908 of the SS RRAM cells 907-1 in the pairs. Thereby, the SS RRAM cells 907-2 in the pairs may be set to the low resistance. Accordingly, the SS RRAM cells 907-2 in the pairs may be programmed to the low resistance between 100 and 100,000 ohms, and the SS RRAM cells 907-1 in the pairs may be programmed to the high resistance between 1,000 and 100,000,000,000 ohms, greater than the low resistance, for example.

Referring to FIGS. 10A-10J, in operation after the SS RRAM cells 907-2 in the pairs may be programmed to the low resistance, and the SS RRAM cells 907-1 in the pairs may be programmed to the high resistance, (1) the nodes N36, N37 and N38 may be switched to be floating, (2) the node N32 may be switched to couple to the bottom electrodes 908 of the SS RRAM cells 907-1 in the pairs, and (3) the bottom electrodes 908 of the SS RRAM cells 907-2 in the pairs may be switched to couple to the voltage Vss of ground reference. Thereby, the comparison line, i.e., node N32, of the sense amplifier 666 as seen in FIG. 8F may be at the comparison voltage between a voltage of the node N31 coupling to one of the SS RRAM cells 907 programmed to the low resistance and selected by one of the word lines 901 and a voltage of the node N31 coupling to one of the SS RRAM cells 907 programmed to the high resistance and selected by one of the word lines 901.

(2) Second Type of Non-volatile Memory Cells

Figures 11A, 11B, 11C:
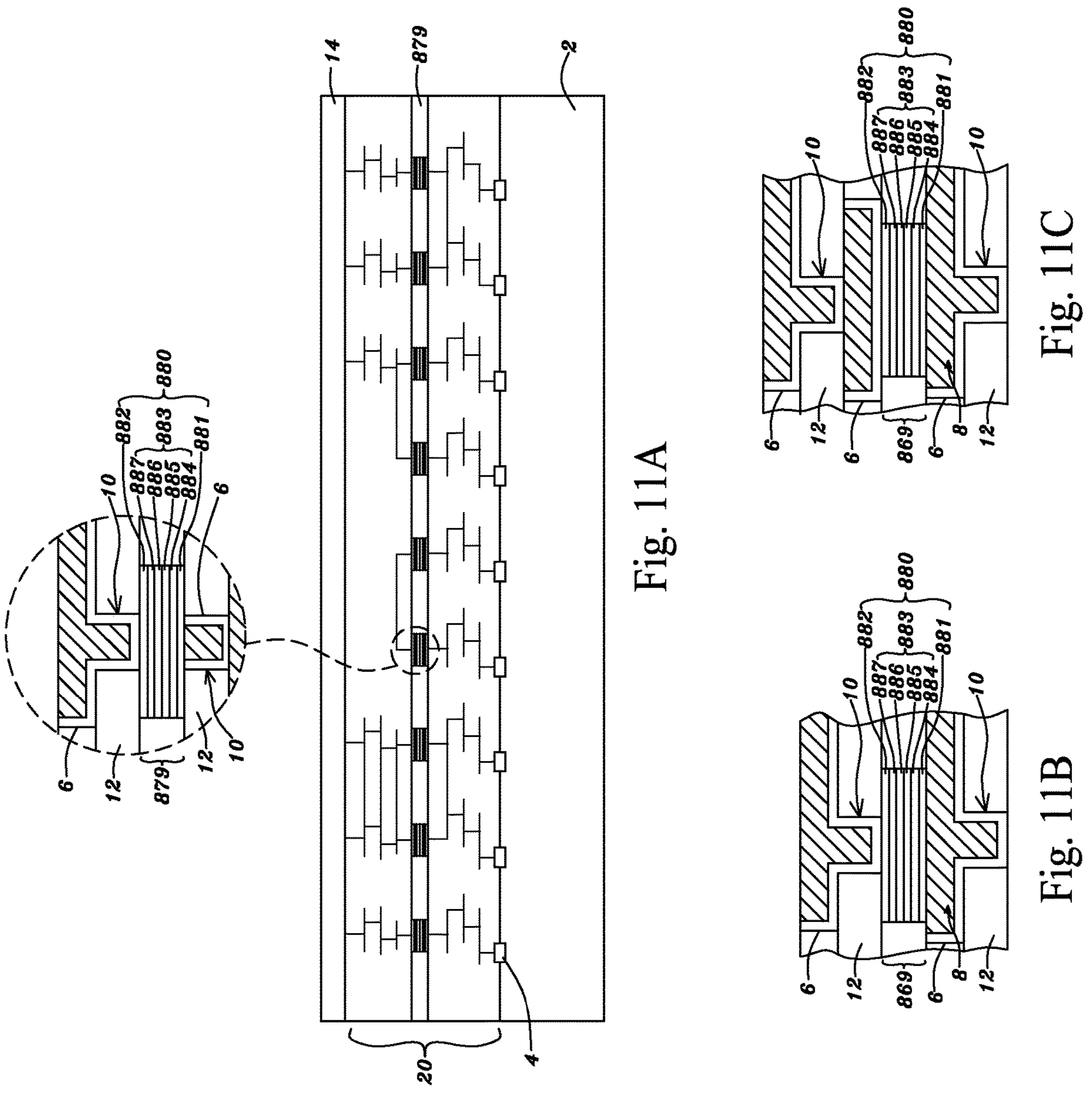
FIGS. 11A-11C are schematically cross-sectional views showing various structures of non-volatile memory cells of a second type for a first alternative for a semiconductor chip in accordance with an embodiment of the present application.

FIGS. 11A-11C are schematically cross-sectional views showing various structures of non-volatile memory cells of a second type for a first alternative for a semiconductor chip in accordance with an embodiment of the present application. The second type of non-volatile memory cells may be magnetoresistive random access memories (MRAM), i.e., programmable resistors. Referring to FIG. 11A, a semiconductor chip 100, used for the FPGA IC chip 200 for example, may include multiple magnetoresistive random access memories 880 formed in an MRAM layer 879 thereof over a semiconductor substrate 2 thereof, in a first interconnection scheme 20 for the semiconductor chip 100 (FISC) and under a passivation layer 14 thereof. Multiple interconnection metal layers 6 in the FISC 20 and between the MRAM layer 879 and semiconductor substrate 2 may couple the magnetoresistive random access memories 880 to multiple semiconductor devices 4 on the semiconductor substrate 2. Multiple interconnection metal layers 6 in the FISC 20 and between the MRAM layer 879 and passivation layer 14 may couple the magnetoresistive random access memories 880 to external circuits outside the semiconductor chip 100 and may have a line pitch less than 0.5 micrometers. Each of the interconnection metal layers 6 in the FISC 20 and over the MRAM layer 879 may have a thickness greater than each of the interconnection metal layers 6 in the FISC 20 and under the MRAM layer 879. The details for the semiconductor substrate 2, semiconductor devices, interconnection metal layers 6, FISC 20 and passivation layer 14 may be referred to the illustration in FIG. 17.

Referring to FIG. 11A, each of the magnetoresistive random access memories 880 may have a bottom electrode 881 made of titanium nitride, copper or an aluminum alloy having a thickness between 1 and 20 nanometers, a top electrode 882 made of titanium nitride, copper or an aluminum alloy having a thickness between 1 and 20 nanometers, and a magnetoresistive layer 883 having a thickness between 1 and 35 nanometers between the bottom and top electrodes 871 and 872. For a first alternative, the magnetoresistive layer 883 may be composed of (1) an antiferromagnetic (AF) layer 884, i.e., pinning layer, such as Cr, Fe—Mn alloy, NiO, FeS, $Co/[CoPt]_4$, having a thickness between 1 and 10 nanometers on the bottom electrode 881, (2) a pinned magnetic layer 885, such as a FeCoB alloy or $Co_2Fe_6B_2$, having a thickness between 1 and 10 nanometers, between 0.5 and 3.5 nanometers, or between 1 and 3 nanometers on the antiferromagnetic layer 884, (3) a tunneling oxide layer 886, i.e., tunneling barrier layer, such as MgO, having a thickness between 0.5 and 5 nanometers, between 0.3 and 2.5 nanometers or between 0.5 and 1.5 nanometers on the pinned magnetic layer 885 and (4) a free magnetic layer 887, such as a FeCoB alloy or $Co_2Fe_6B_2$, having a thickness between 1 and 10 nanometers, between 0.5 and 3.5 nanometers, or between 1 and 3 nanometers on the tunneling oxide layer 886. The top electrode 882 is formed on the free magnetic layer 887 of the magnetoresistive layer 883. The pinned magnetic layer 885 may have the same material as the free magnetic layer 887.

Referring to FIG. 11A, each of the magnetoresistive random access memories 880 may have its bottom electrode 881 formed on a top surface of one of the lower metal vias 10 of a lower one of the interconnection metal layers 6 as illustrated in FIG. 17 and on a top surface of a lower one of the dielectric layers 12 as illustrated in FIG. 17. An upper one of the dielectric layers 12 as illustrated in FIG. 17 may be formed on the top electrode 882 of said one of the magnetoresistive random access memories 880 and an upper one of the interconnection metal layers 6 as illustrated in FIG. 17 may have the upper metal vias 10 each formed in the upper one of the dielectric layers 12 and on the top electrode 882 of one of the magnetoresistive random access memories 880.

Alternatively, referring to FIG. 11B, each of the magnetoresistive random access memories 880 may have its bottom electrode 881 formed on a top surface of one of the lower metal pads 8 of a lower one of the interconnection metal layers 6 as illustrated in FIG. 17. An upper one of the dielectric layers 12 as illustrated in FIG. 17 may be formed on the top electrode 882 of said one of the magnetoresistive random access memories 880 and an upper one of the interconnection metal layers 6 as illustrated in FIG. 17 may have the upper metal vias 10 each formed in the upper one of the dielectric layers 12 and on the top electrode 882 of one of the magnetoresistive random access memories 880.

Alternatively, referring to FIG. 11C, each of the magnetoresistive random access memories 880 may have its bottom electrode 881 formed on a top surface of one of the lower metal pads 8 of a lower one of the interconnection metal layers 6 as illustrated in FIG. 17. An upper one of the interconnection metal layers 6 as illustrated in FIG. 17 may have the upper metal pads 8 each formed in an upper one of the dielectric layers 12 and on the top electrode 882 of one of the magnetoresistive random access memories 880.

Figure 11D:
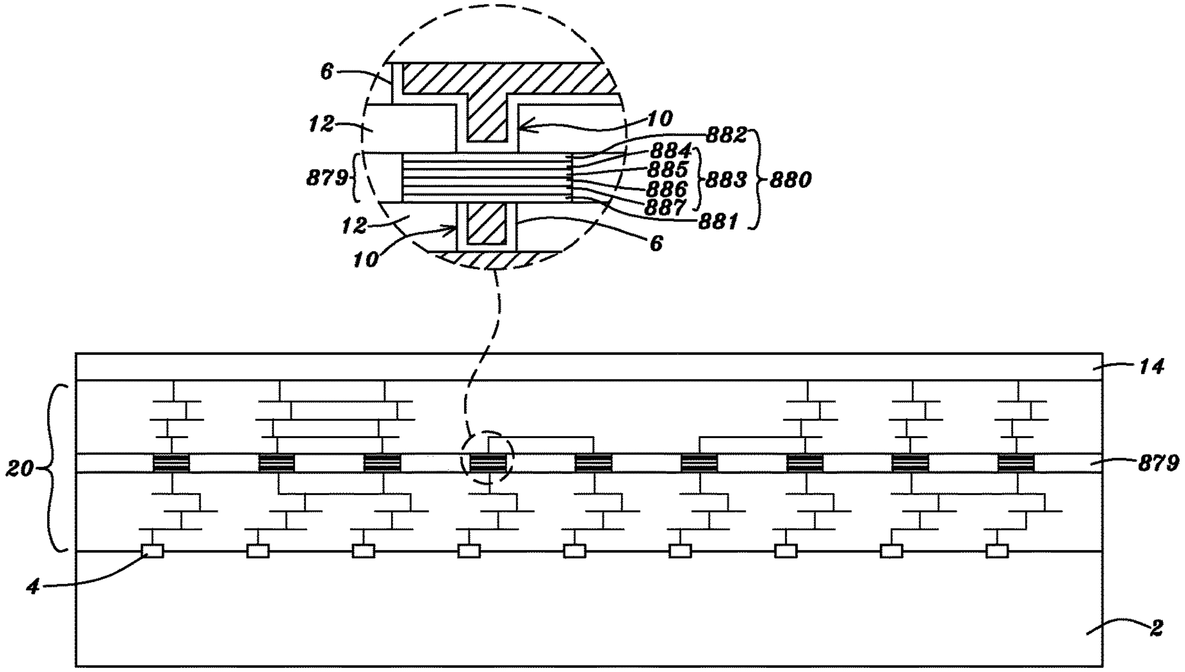
FIG. 11D is a schematically cross-sectional view showing a structure of a non-volatile memory cell of a second type for a second alternative for a semiconductor chip in accordance with an embodiment of the present application.

For a second alternative, FIG. 11D is a schematically cross-sectional view showing a structure of a non-volatile memory cell of a second type for a semiconductor chip in accordance with an embodiment of the present application. The scheme of the semiconductor chip as illustrated in FIG. 11D is similar to that as illustrated in FIG. 11A except for the composition of the magnetoresistive layer 883. Referring to FIG. 11D, the magnetoresistive layer 883 may be composed of the free magnetic layer 887 on the bottom electrode 881, the tunneling oxide layer 886 on the free magnetic layer 887, the pinned magnetic layer 885 on the tunneling oxide layer 886 and the antiferromagnetic layer 884 on the pinned magnetic layer 885. The top electrode 882 is formed on the antiferromagnetic layer 884. The materials and thicknesses of the free magnetic layer 887, tunneling oxide layer 886, pinned magnetic layer 885 and antiferromagnetic layer 884 for the second alternative may be referred to those for the first alternative. The magnetoresistive random access memories 880 for the second alternative may have its bottom electrode 881 formed on a top surface of one of the lower metal vias 10 of a lower one of the interconnection metal layers 6 as illustrated in FIG. 17 and on a top surface of a lower one of the dielectric layers 12 as illustrated in FIG. 17. An upper one of the dielectric layers 12 as illustrated in FIG. 17 may be formed on the top electrode 882 of said one of the magnetoresistive random access memories 880 and an upper one of the interconnection metal layers 6 as illustrated in FIG. 17 may have the upper metal vias 10 each formed in the upper one of the dielectric layers 12 and on the top electrode 882 of one of the magnetoresistive random access memories 880 for the second alternative.

Alternatively, the magnetoresistive random access memories 880 for the second alternative in FIG. 11D may be provided between a lower metal pad 8 and an upper metal via 10 as seen in FIG. 11B. Referring to FIGS. 11B and 11D, each of the magnetoresistive random access memories 880 for the second alternative may have its bottom electrode 881 formed on a top surface of one of the lower metal pads 8 of a lower one of the interconnection metal layers 6 as illustrated in FIG. 17. An upper one of the dielectric layers 12 as illustrated in FIG. 17 may be formed on the top electrode 882 of said one of the magnetoresistive random access memories 880 and an upper one of the interconnection metal layers 6 as illustrated in FIG. 17 may have the upper metal vias 10 each formed in the upper one of the dielectric layers 12 and on the top electrode 882 of one of the magnetoresistive random access memories 880 for the second alternative.

Alternatively, the magnetoresistive random access memories 880 for the second alternative in FIG. 11D may be provided between a lower metal pad 8 and an upper metal pad 8 as seen in FIG. 11C. Referring to FIGS. 11C and 11D, each of the magnetoresistive random access memories 880 for the second alternative may have its bottom electrode 881 formed on a top surface of one of the lower metal pads 8 of a lower one of the interconnection metal layers 6 as illustrated in FIG. 17. An upper one of the interconnection metal layers 6 as illustrated in FIG. 17 may have the upper metal pads 8 each formed in an upper one of the dielectric layers 12 and on the top electrode 882 of one of the magnetoresistive random access memories 880 for the second alternative.

Referring to FIGS. 11A-11D, the pinned magnetic layer 885 may have domains each provided with a magnetic field in a direction pinned by the antiferromagnetic layer 884, that is, hardly changed by a spin-transfer torque induced by an electron flow passing through the pinned magnetic layer 885. The free magnetic layer 887 may have domains each provided with a magnetic field in a direction easily changed by a spin-transfer torque induced by an electron flow passing through the free magnetic layer 887.

Referring to FIGS. 11A-11C, in a setting step for one of the magnetoresistive random access memories 880 for the first alternative, when a setting voltage $V_{MSE}$ ranging from 0.25 to 3.3 volts is applied to its top electrode 882 and a voltage Vss of ground reference is applied to its bottom electrode 881, electrons may flow from its pinned magnetic layer 885 to its free magnetic layer 887 through its tunneling oxide layer 886 such that the direction of the magnetic fields in each of the domains of its free magnetic layer 887 may be set to be the same as that in each of the domains of its pinned magnetic layer 885 by a spin-transfer torque (STT) effect induced by the electrons. Thus, said one of the magnetoresistive random access memories 880 may be set to a low resistance between 10 and 100,000,000,000 ohms. In a resetting step for said one of the magnetoresistive random access memories 880 for the first alternative, when a resetting voltage $V_{MRE}$ ranging from 0.25 to 3.3 volts is applied to its bottom electrode 881 and the voltage Vss of ground reference is applied to its top electrode 882, electrons may flow from its free magnetic layer 887 to its pinned magnetic layer 885 through its tunneling oxide layer 886 such that the direction of the magnetic fields in each of the domains of its free magnetic layer 887 may be reset to be opposite to that in each of the domains of its pinned magnetic layer 885. Thus, said one of the magnetoresistive random access memories 880 may be reset to a high resistance between 15 and 500,000,000,000 ohms greater than the low resistance.

Referring to FIG. 11D, in a setting step for one of the magnetoresistive random access memories 880 for the second alternative, when a setting voltage $V_{MSE}$ ranging from 0.25 to 3.3 volts is applied to its bottom electrode 881 and a voltage Vss of ground reference is applied to its top electrode 882, electrons may flow from its pinned magnetic layer 885 to its free magnetic layer 887 through its tunneling oxide layer 886 such that the direction of the magnetic fields in each of the domains of its free magnetic layer 887 may be set to be the same as that in each of the domains of its pinned magnetic layer 885 by a spin-transfer torque (STT) effect induced by the electrons. Thus, said one of the magnetoresistive random access memories 880 may be set to the low resistance between 10 and 100,000,000,000 ohms. In a resetting step for said one of the magnetoresistive random access memories 880 for the second alternative, when a resetting voltage $V_{MRE}$ ranging from 0.25 to 3.3 volts is applied to its top electrode 882 and the voltage Vss of ground reference is applied to its bottom electrode 881, electrons may flow from its free magnetic layer 887 to its pinned magnetic layer 885 through its tunneling oxide layer 886 such that the direction of the magnetic fields in each of the domains of its free magnetic layer 887 may be reset to be opposite to that in each of the domains of its pinned magnetic layer 885. Thus, said one of the magnetoresistive random access memories 880 may be reset to the high resistance between 15 and 500,000,000,000 ohms.

Figure 11E:
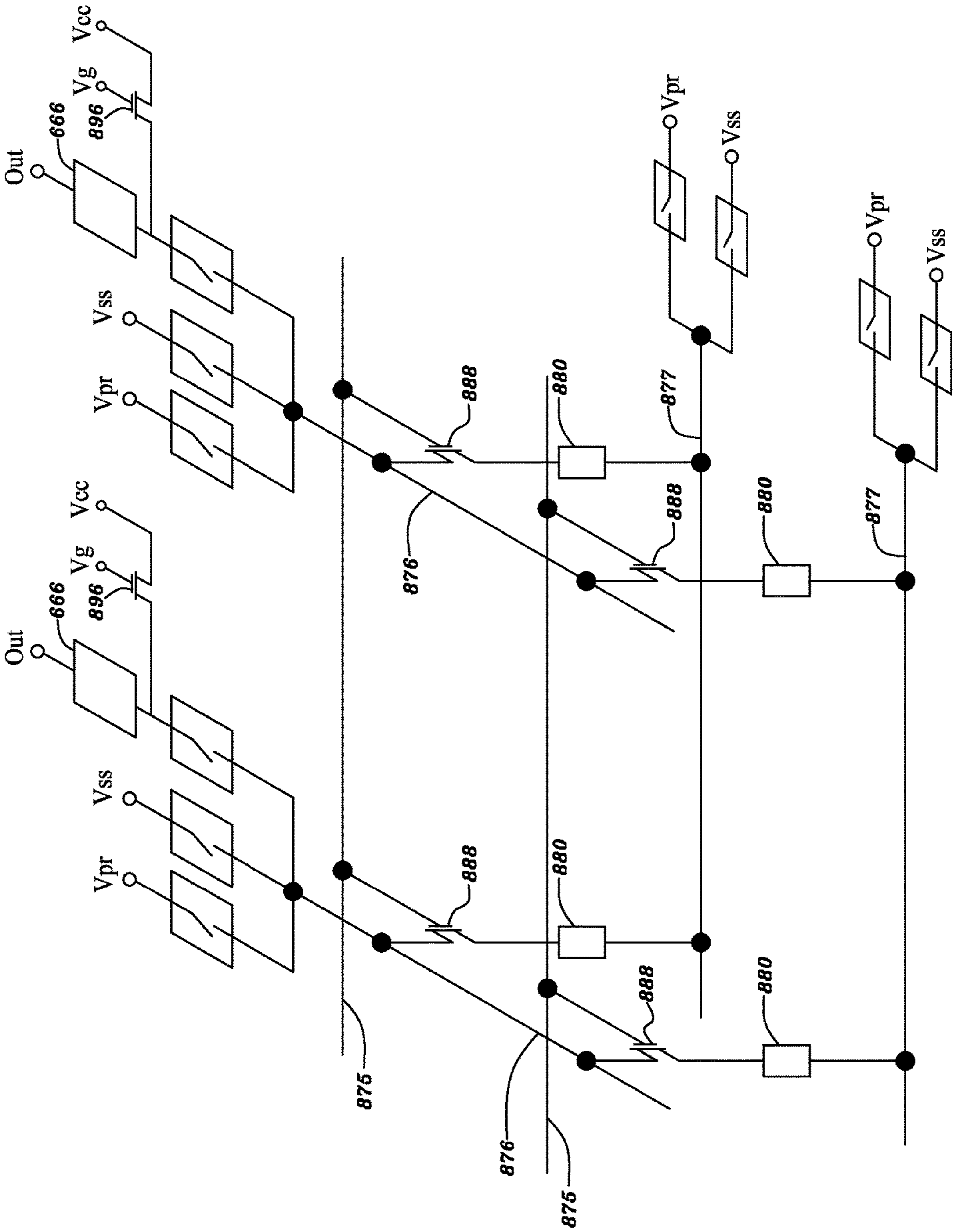
FIG. 11E is a circuit diagram showing a non-volatile memory array in accordance with an embodiment of the present application.

FIG. 11E is a circuit diagram showing a non-volatile memory array in accordance with an embodiment of the present application. Referring to FIG. 11E, multiple of the magnetoresistive random access memories 880 are formed in an array in the MRAM layer 879 as seen in FIG. 11A-11D. Multiple of the switches 888, e.g., N-type MOS transistors, are arranged in an array. Alternatively, each of the switches 888 may be a P-type MOS transistor.

(2.1) Second Type of Non-Volatile Memory Cell for the First Alternative

Referring to FIGS. 11A-11C and 11E, each of the N-type MOS transistors 888 is configured to form a channel with two opposite terminals, one of which couples in series to the top electrode 882 of one the magnetoresistive random access memories 880 for the first alternative and the other of which couples to one of bit lines 876, and has a gate terminal coupling to one of word lines 875. Each of reference lines 877 may couple to the bottom electrodes 881 of the magnetoresistive random access memories 880 for the first alternative arranged in a row. Each of the word lines 875 may couple to the gate terminals of the N-type or P-type MOS transistors 888 arranged in a row that couple in parallel to one another through said each of the word lines 875. Each of the bit lines 876 is configured to couple, one by one and in turn, to the top electrode 882 of each of the magnetoresistive random access memories 880 for the first alternative arranged in a column through one of the N-type or P-type MOS transistors 888 arranged in a column.

In an alternative example, each of the N-type MOS transistors 888 is configured to form a channel with two opposite terminals, one of which couples in series to one of the bottom and top electrodes 881 and 882 of one the magnetoresistive random access memories 880 for the first alternative and the other of which couples to one of reference lines 877, and has a gate terminal coupling to one of word lines 875. Each of the reference lines 877 is configured to couple to the bottom or top electrodes 881 and 882 of the magnetoresistive random access memories 880 for the first alternative in a row through the N-type MOS transistors 888 in a row.

Referring to FIG. 11E, for programming the magnetoresistive random access memories 880 for the first alternative as illustrated in FIGS. 11A-11C, a resetting step may be first performed to all of the magnetoresistive random access memories 880, in which (1) all of the bit lines 876 may be switched to couple to the voltage Vss of ground reference, (2) all of the word lines 875 may be switched to couple to a programming voltage $V_{Pr}$, between 0.25 and 3.3 volts, equal to or greater than the resetting voltage $V_E$ of the magnetoresistive random access memories 880, to turn on each of the N-type MOS transistors 888 to couple the top electrode 872 of one of the magnetoresistive random access memories 880 to one of the bit lines 876 and (3) all of the reference lines 877 may be switched to couple to the programming voltage $V_{Pr}$, between 0.25 and 3.3 volts, equal to or greater than the resetting voltage $V_{MRE}$ of the magnetoresistive random access memories 880. Alternatively, when each of the switches 888 is a P-type MOS transistor, all of the word lines 875 may be switched to couple to the voltage Vss of ground reference to turn on each of the P-type MOS transistors 888 to couple the top electrode 872 of one of the magnetoresistive random access memories 880 to one of the bit lines 876. Thereby, an electron current may pass from the top electrode 882 of each of the magnetoresistive random access memories 880 to the bottom electrode 881 of said each of the magnetoresistive random access memories 880 to set the direction of the magnetic field in each domain of the free magnetic layer 887 of said each of the magnetoresistive random access memories 880 to be opposite to that in each domain of the pinned magnetic layer 885 of said each of the magnetoresistive random access memories 880. Thus, said each of the magnetoresistive random access memories 880 may be reset with the high resistance between 15 and 500,000,000,000 ohms in the resetting step, and thus programmed to a logic level of "1".

Next, referring to FIG. 11E, a setting step may be performed to a first group of the magnetoresistive random access memories 880 for the first alternative as illustrated in FIGS. 11A-11C but not to a second group of the magnetoresistive random access memories 880 for the first alternative as illustrated in FIGS. 11A-11C, in which, (1) each of the word lines 875 corresponding to the magnetoresistive random access memories 880 in a row may be selected one by one and in turn to be switched to couple to the programming voltage $V_{Pr}$ to turn on the N-type MOS transistors 888 in a row to couple each of the magnetoresistive random access memories 880 in the row to one of the bit lines 876 or, in the alternative example, to couple all of the magnetoresistive random access memories 880 in the row to a same one of the reference lines 877, wherein the unselected word lines 875 corresponding to the magnetoresistive random access memories 880 in the other rows may be switched to couple to the voltage Vss of ground reference to turn off the N-type MOS transistors 888 in the other rows to decouple each of the magnetoresistive random access memories 880 in the other rows from any of the bit lines 876 or, in the alternative example, to decouple each of the magnetoresistive random access memories 880 in the other rows from any of the reference lines 877, wherein the programming voltage $V_{Pr}$ may be between 0.25 and 3.3 volts, equal to or greater than the setting voltage $V_{MSE}$ of the magnetoresistive random access memories 880, (2) the reference lines 877 may be switched to couple to the voltage Vss of ground reference, (3) the bit lines 876 in a first group each for one of the magnetoresistive random access memories 880 in the first group in the row may be switched to couple to the programming voltage $V_{Pr}$, between 0.25 and 3.3 volts, equal to or greater than the setting voltage $V_{MSE}$ of the magnetoresistive random access memories 880, and (4) the bit lines 876 in a second group each for one of the magnetoresistive random access memories 880 in the second group in the row may be switched to couple to the voltage Vss of ground reference.

Alternatively, when each of the switches 888 is a P-type MOS transistor, each of the word lines 875 corresponding to the magnetoresistive random access memories 880 in the row may be selected one by one and in turn to be switched to couple to the voltage Vss of ground reference to turn on the P-type MOS transistors 888 in the row to couple each of the magnetoresistive random access memories 880 in the row to one of the bit lines 876 or, in the alternative example, to couple all of the magnetoresistive random access memories 880 in the row to the same one of the reference lines 877, wherein the unselected word lines 875 corresponding to the magnetoresistive random access memories 880 in the other rows may be switched to couple to the programming voltage $V_{Pr}$ to turn off the P-type MOS transistors 888 in the other rows to decouple each of the magnetoresistive random access memories 880 in the other rows from any of the bit lines 876 or, in the alternative example, to decouple each of the magnetoresistive random access memories 880 in the other rows from any of the reference lines 877, wherein the programming voltage $V_{Pr}$ may be between 0.25 and 3.3 volts, equal to or greater than the setting voltage $V_{MSE}$ of the magnetoresistive random access memories 880. Thereby, an electron current may pass from the bottom electrode 881 of each of the magnetoresistive random access memories 880 in the first group in the row to the top electrode 882 of said each of the magnetoresistive random access memories 880 in the first group in the row to set the direction of the magnetic field in each domain of the free magnetic layer 887 of said each of the magnetoresistive random access memories 880 in the first group in the row to be the same as that in each domain of the pinned magnetic layer 885 of said each of the magnetoresistive random access memories 880 in the first group in the row. Thus, said each of the magnetoresistive random access memories 880 in the first group may be set to the low resistance between 10 and 100,000,000,000 ohms in the setting step, and thus programmed to a logic level of "0".

In operation, referring to FIGS. 8F and 11E, (1) each of the bit lines 876 may be switched to couple to the node N31 of the sense amplifier 666 as illustrated in FIG. 8F and to a source terminal of a N-type MOS transistor 896, (2) each of the reference lines 877 may be switched to couple to the voltage Vss of ground reference, and (3) each of the word lines 875 corresponding to the magnetoresistive random access memories 880 in a row may be selected one by one and in turn to be switched to couple to the voltage Vcc of power supply to turn on the N-type MOS transistors 888 in a row to couple each of the magnetoresistive random access memories 880 in the row to one of the bit lines 876 or, in the alternative example, to couple all of the magnetoresistive random access memories 880 in the row to a same one of the reference lines 877, wherein the unselected word lines 875 corresponding to the magnetoresistive random access memories 880 in the other rows may be switched to couple to the voltage Vss of ground reference to turn off the N-type MOS transistors 888 in the other rows to decouple each of the magnetoresistive random access memories 880 in the other rows from any of the bit lines 876 or, in the alternative example, to decouple each of the magnetoresistive random access memories 880 in the other rows from any of the reference lines 877. The N-type MOS transistor 896 may have a gate terminal coupling to a voltage Vg and a drain terminal coupling to the voltage Vcc of power supply. The N-type MOS transistor 896 may be considered as a current source. In operation, the voltage Vg may be applied to the gate of the N-type MOS transistor 896 to control an electric current at a substantially constant level passing through the N-type MOS transistor 896. Alternatively, when each of the switches 888 is a P-type MOS transistor, each of the word lines 875 corresponding to the magnetoresistive random access memories 880 in the row may be selected one by one and in turn to be switched to couple to the voltage Vss of ground reference to turn on the P-type MOS transistors 888 in the row to couple each of the magnetoresistive random access memories 880 in the row to one of the bit lines 876 or, in the alternative example, to couple all of the magnetoresistive random access memories 880 in the row to a same one of the reference lines 877, wherein the unselected word lines 875 corresponding to the magnetoresistive random access memories 880 in the other rows may be switched to couple to the voltage Vcc of power supply to turn off the P-type MOS transistors 888 in the other rows to decouple each of the magnetoresistive random access memories 880 in the other rows from any of the bit lines 876 or, in the alternative example, to decouple each of the magnetoresistive random access memories 880 in the other rows from any of the reference lines 877. Thereby, each of the sense amplifiers 666 may compare a voltage at one of the bit lines 876, i.e., at the node N31 as seen in FIG. 8F, and a comparison voltage at a comparison line, i.e., at the node N32 as seen in FIG. 8F, into a compared data and then generate an output "Out" of one of the magnetoresistive random access memories 880 coupling to said one of the bit lines 876 via one of the switches 888 based on the compared data. For example, when the voltage at the node N31 is compared by said each of the sense amplifiers 666 to be smaller than the voltage at the node N32, said each of the sense amplifiers 666 may generate the output "Out" at a logic level of "1" in the case that one of the magnetoresistive random access memories 880, which couples to said each of the sense amplifiers 666, has the low resistance. When the voltage at the node N31 is compared by said each of the sense amplifiers 666 to be greater than the voltage at the node N32, said each of the sense amplifiers 666 may generate the output "Out" at a logic level of "0" in the case that one of the magnetoresistive random access memories 880, which couples to said each of the sense amplifiers 666, has the high resistance.

Figure 11F:
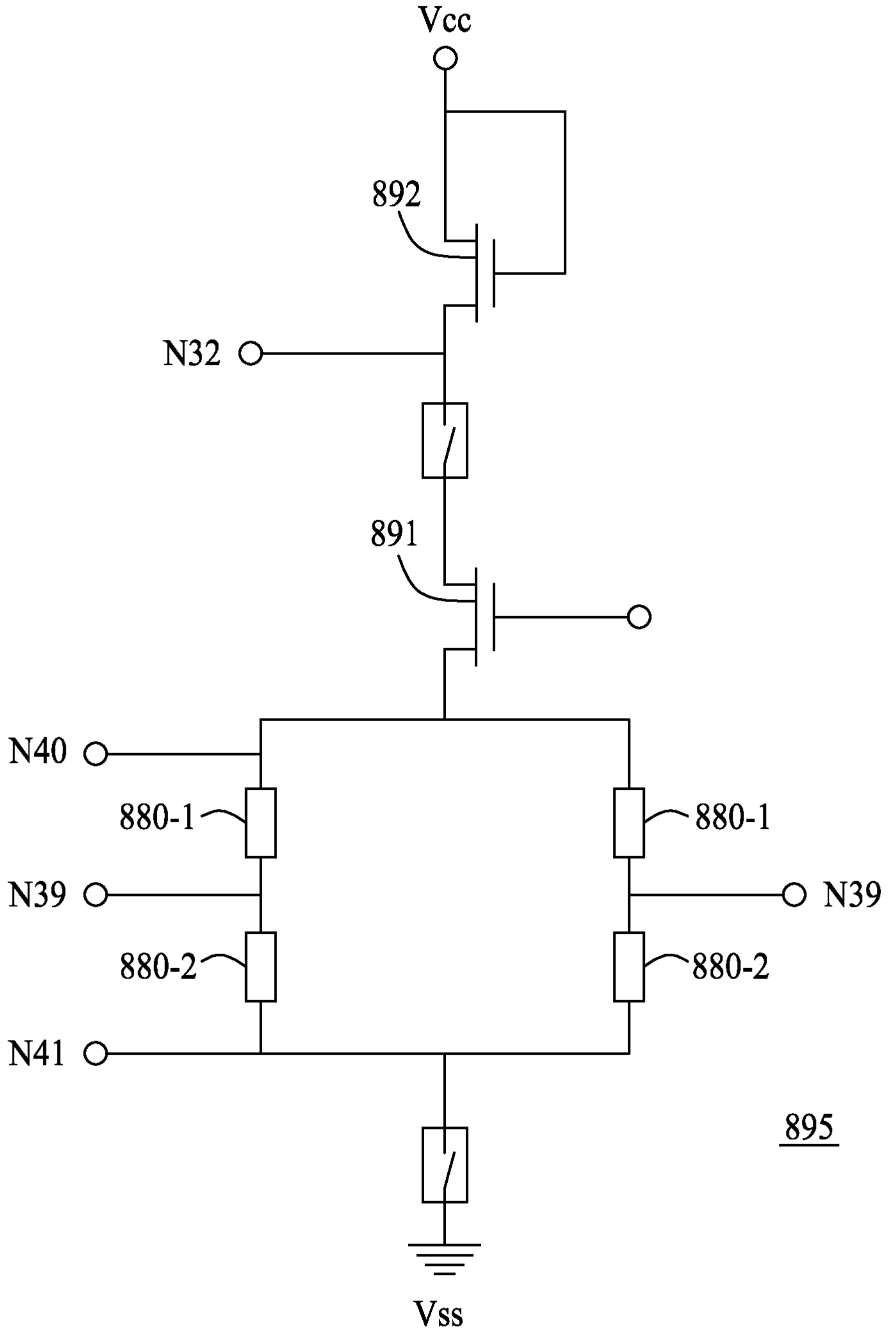
FIG. 11F is a circuit diagram showing a comparison-voltage generating circuit in accordance with an embodiment of the present application.

FIG. 11F is a circuit diagram showing a comparison-voltage generating circuit in accordance with an embodiment of the present application. Referring to FIGS. 11A-11C, 11E and 11F, a comparison-voltage generating circuit 895 includes two pairs of magnetoresistive random access memories 880-1 and 880-2 for the first alternative connected in serial to each other, wherein the pairs of magnetoresistive random access memories 880-1 and 880-2 for the first alternative are connected in parallel to each other. In each of the pairs of magnetoresistive random access memories 880-1 and 880-2 for the first alternative, the magnetoresistive random access memory 880-1 for the first alternative may have its top electrode 882 coupling to the top electrode 882 of the magnetoresistive random access memory 880-2 for the first alternative and to a node N39, and the magnetoresistive random access memory 880-1 for the first alternative may have its bottom electrode 881 coupling to a node N40. The comparison-voltage generating circuit 895 may further include a N-type MOS transistors 891 having a source terminal, in operation, coupling to the bottom electrodes 881 of the magnetoresistive random access memories 880-1 for the first alternative in the pairs and to the node N40. The comparison-voltage generating circuit 895 may further include a N-type MOS transistor 892 having a gate terminal coupling to a drain terminal of the N-type MOS transistor 892 and to the voltage Vcc of power supply and a source terminal coupling to the node N32 of the sense amplifier 666 as seen in FIG. 8F via the comparison line. The bottom electrodes 881 of the magnetoresistive random access memories 880-2 for the first alternative in the pairs may couple to a node N41.

Referring to FIGS. 11A-11C, 11E and 11F, the resetting step may be performed to the magnetoresistive random access memories 880-1 for the first alternative in the pairs. When the magnetoresistive random access memories 880-1 for the first alternative in the pairs are being reset in the resetting step, (1) the node N40 may be switched to couple to the programming voltage $V_{Pr}$, (2) the node N39 may be switched to couple to the voltage Vss of ground reference, (3) the node N41 may be switched to couple to the voltage Vss of ground reference, and (4) the node N32 may be switched not to couple to the bottom electrodes 881 of the magnetoresistive random access memories 880-1 for the first alternative in the pairs. Thereby, the magnetoresistive random access memories 880-1 for the first alternative in the pairs may be reset to the high resistance.

Referring to FIGS. 11A-11C, 11E and 11F, the setting step may be performed to the magnetoresistive random access memories 880-2 for the first alternative in the pairs. When the magnetoresistive random access memories 880-2 for the first alternative in the pairs are being set in the setting step, (1) the node N40 may be switched to couple to the programming voltage $V_{Pr}$, (2) the node N39 may be switched to couple to the programming voltage $V_{Pr}$, (3) the node N41 may be switched to couple to the voltage Vss of ground reference, and (4) the node N32 may be switched not to couple to the bottom electrodes 881 of the magnetoresistive random access memories 880-1 for the first alternative in the pairs. Thereby, the magnetoresistive random access memories 880-2 for the first alternative in the pairs may be set to the low resistance. Accordingly, the magnetoresistive random access memories 880-2 for the first alternative in the pairs may be programmed to the low resistance between 10 and 100,000,000,000 ohms, and the magnetoresistive random access memories 880-1 for the first alternative in the pairs may be programmed to the high resistance between 15 and 500,000,000,000 ohms, greater than the low resistance, for example.

Referring to FIGS. 11A-11C, 11E and 11F, in operation after the magnetoresistive random access memories 880-2 for the first alternative in the pairs may be programmed to the low resistance, and the magnetoresistive random access memories 880-1 for the first alternative in the pairs may be programmed to the high resistance, (1) the nodes N39, N40 and N41 may be switched to be floating, (2) the node N32 may be switched to couple to the bottom electrodes 881 of the magnetoresistive random access memories 880-1 for the first alternative in the pairs, and (3) the bottom electrodes 881 of the magnetoresistive random access memories 880-2 for the first alternative in the pairs may be switched to couple to the voltage Vss of ground reference. Thereby, the comparison line, i.e., node N32, of the sense amplifier 666 as seen in FIG. 8F may be at the comparison voltage between a voltage of the node N31 coupling to one of the magnetoresistive random access memories 880 for the first alternative programmed to the low resistance and selected by one of the word lines 875 and a voltage of the node N31 coupling to one of the magnetoresistive random access memories 880 for the first alternative programmed to the high resistance and selected by one of the word lines 875.

(2.2) Second Type of Non-Volatile Memory Cell for the Second Alternative

Referring to FIGS. 11D and 11E, each of the N-type MOS transistors 888 is configured to form a channel with two opposite terminals, one of which couples in series to the top electrode 882 of one the magnetoresistive random access memories 880 for the second alternative and the other of which couples to one of bit lines 876, and has a gate terminal coupling to one of word lines 875. Each of reference lines 877 may couple to the bottom electrodes 881 of the magnetoresistive random access memories 880 for the second alternative arranged in a row. Each of the word lines 875 may couple to the gate terminals of the N-type or P-type MOS transistors 888 arranged in a row that couple in parallel to one another through said each of the word lines 875. Each of the bit lines 876 is configured to couple, one by one and in turn, to the top electrode 882 of each of the magnetoresistive random access memories 880 for the second alternative arranged in a column through one of the N-type or P-type MOS transistors 888 arranged in a column.

In an alternative example, each of the N-type MOS transistors 888 is configured to form a channel with two opposite terminals, one of which couples in series to one of the bottom and top electrodes 881 and 882 of one the magnetoresistive random access memories 880 for the second alternative and the other of which couples to one of reference lines 877, and has a gate terminal coupling to one of word lines 875. Each of the reference lines 877 is configured to couple to the bottom or top electrodes 881 and 882 of the magnetoresistive random access memories 880 for the second alternative in a row through the N-type MOS transistors 888 in a row.

Referring to FIG. 11E, for programming the magnetoresistive random access memories 880 for the second alternative as illustrated in FIG. 11D, a resetting step may be first performed to all of the magnetoresistive random access memories 880, in which (1) all of the bit lines 876 may be switched to couple to a programming voltage $V_{Pr}$, between 0.25 and 3.3 volts, equal to or greater than the setting voltage $V_E$ of the magnetoresistive random access memories 880, (2) all of the word lines 875 may be switched to couple to the programming voltage $V_{Pr}$, between 0.25 and 3.3 volts, equal to or greater than the setting voltage $V_E$ of the magnetoresistive random access memories 880, to turn on each of the N-type MOS transistors 888 to couple the top electrode 872 of one of the magnetoresistive random access memories 880 to one of the bit lines 876 and (3) all of the reference lines 877 may be switched to couple to the voltage Vss of ground reference. Alternatively, when each of the switches 888 is a P-type MOS transistor, all of the word lines 875 may be switched to couple to the voltage Vss of ground reference to turn on each of the P-type MOS transistors 888 to couple the top electrode 872 of one of the magnetoresistive random access memories 880 to one of the bit lines 876. Thereby, an electron current may pass from the bottom electrode 881 of each of the magnetoresistive random access memories 880 to the top electrode 882 of said each of the magnetoresistive random access memories 880 to set the direction of the magnetic field in each domain of the free magnetic layer 887 of said each of the magnetoresistive random access memories 880 to be opposite to that in each domain of the pinned magnetic layer 885 of said each of the magnetoresistive random access memories 880. Thus, said each of the magnetoresistive random access memories 880 may be reset with the high resistance between 15 and 500,000,000,000 ohms in the resetting step, and thus programmed to a logic level of “1”.

Next, referring to FIG. 11E, a setting step may be performed to a first group of the magnetoresistive random access memories 880 for the second alternative as illustrated in FIG. 11D but not to a second group of the magnetoresistive random access memories 880 for the second alternative as illustrated in FIG. 11D, in which (1) each of the word lines 875 corresponding to the magnetoresistive random access memories 880 in a row may be selected one by one and in turn to be switched to couple to a programming voltage $V_{Pr}$ to turn on the N-type MOS transistors 888 in a row to couple each of the magnetoresistive random access memories 880 in the row to one of the bit lines 876 or, in the alternative example, to couple all of the magnetoresistive random access memories 880 in the row to a same one of the reference lines 877, wherein the unselected word lines 875 corresponding to the magnetoresistive random access memories 880 in the other rows may be switched to couple to the voltage Vss of ground reference to turn off the N-type MOS transistors 888 in the other rows to decouple each of the magnetoresistive random access memories 880 in the other rows from any of the bit lines 876 or, in the alternative example, to decouple each of the magnetoresistive random access memories 880 in the other rows from any of the reference lines 877, wherein the programming voltage $V_{Pr}$ may be between 0.25 and 3.3 volts, equal to or greater than the resetting voltage $V_{MSE}$ of the magnetoresistive random access memories 880, (2) the reference lines 877 may be switched to couple to the programming voltage $V_{Pr}$, between 0.25 and 3.3 volts, equal to or greater than the resetting voltage $V_{MSE}$ of the magnetoresistive random access memories 880, (3) the bit lines 876 in a first group each for one of the magnetoresistive random access memories 880 in the first group in the row may be switched to couple to the voltage Vss of ground reference, and (4) the bit lines 876 in a second group each for one of the magnetoresistive random access memories 880 in the second group in the row may be switched to couple to the programming voltage $V_{Pr}$, between 0.25 and 3.3 volts, equal to or greater than the resetting voltage $V_{MSE}$ of the magnetoresistive random access memories 880. Alternatively, when each of the switches 888 is a P-type MOS transistor, each of the word lines 875 corresponding to the magnetoresistive random access memories 880 in the row may be selected one by one and in turn to be switched to couple to the voltage Vss of ground reference to turn on the P-type MOS transistors 888 in the row to couple each of the magnetoresistive random access memories 880 in the row to one of the bit lines 876 or, in the alternative example, to couple all of the magnetoresistive random access memories 880 in the row to the same one of the reference lines 877, wherein the unselected word lines 875 corresponding to the magnetoresistive random access memories 880 in the other rows may be switched to couple to the programming voltage $V_{Pr}$ to turn off the P-type MOS transistors 888 in the other rows to decouple each of the magnetoresistive random access memories 880 in the other rows from any of the bit lines 876 or, in the alternative example, to decouple each of the magnetoresistive random access memories 880 in the other rows from any of the reference lines 877, wherein the programming voltage $V_{Pr}$ may be between 0.25 and 3.3 volts, equal to or greater than the setting voltage $V_{MSE}$ of the magnetoresistive random access memories 880. Thereby, an electron current may pass from the top electrode 882 of each of the magnetoresistive random access memories 880 in the first group in the row to the bottom electrode 881 of said each of the magnetoresistive random access memories 880 in the first group in the row to set the direction of the magnetic field in each domain of the free magnetic layer 887 of said each of the magnetoresistive random access memories 880 in the first group in the row to be the same as that in each domain of the pinned magnetic layer 885 of said each of the magnetoresistive random access memories 880 in the first group in the row. Thus, said each of the magnetoresistive random access memories 880 in the first group may be set to the low resistance between 10 and 100,000,000,000 ohms in the setting step, and thus programmed to a logic level of “0”.

In operation, referring to FIGS. 8F and 11E, (1) each of the bit lines 876 may be switched to couple to the node N31 of the sense amplifier 666 as illustrated in FIG. 8F and to the source terminal of the N-type MOS transistor 896, (2) each of the reference lines 877 may be switched to couple to the voltage Vss of ground reference, and (3) each of the word lines 875 corresponding to the magnetoresistive random access memories 880 in a row may be selected one by one and in turn to be switched to couple to the voltage Vcc of power supply to turn on the N-type MOS transistors 888 in a row to couple each of the magnetoresistive random access memories 880 in the row to one of the bit lines 876 or, in the alternative example, to couple all of the magnetoresistive random access memories 880 in the row to a same one of the reference lines 877, wherein the unselected word lines 875 corresponding to the magnetoresistive random access memories 880 in the other rows may be switched to couple to the voltage Vss of ground reference to turn off the N-type MOS transistors 888 in the other rows to decouple each of the magnetoresistive random access memories 880 in the other rows from any of the bit lines 876 or, in the alternative example, to decouple each of the magnetoresistive random access memories 880 in the other rows from any of the reference lines 877. The N-type MOS transistor 896 may have a gate terminal coupling to a voltage Vg and a drain terminal coupling to the voltage Vcc of power supply. The N-type MOS transistor 896 may be considered as a current source. In operation, the voltage Vg may be applied to the gate of the N-type MOS transistor 896 to control an electric current at a substantially constant level passing through the N-type MOS transistor 896. Alternatively, when each of the switches 888 is a P-type MOS transistor, each of the word lines 875 corresponding to the magnetoresistive random access memories 880 in the row may be selected one by one and in turn to be switched to couple to the voltage Vss of ground reference to turn on the P-type MOS transistors 888 in the row to couple each of the magnetoresistive random access memories 880 in the row to one of the bit lines 876 or, in the alternative example, to couple all of the magnetoresistive random access memories 880 in the row to a same one of the reference lines 877, wherein the unselected word lines 875 corresponding to the magnetoresistive random access memories 880 in the other rows may be switched to couple to the voltage Vcc of power supply to turn off the P-type MOS transistors 888 in the other rows to decouple each of the magnetoresistive random access memories 880 in the other rows from any of the bit lines 876 or, in the alternative example, to decouple each of the magnetoresistive random access memories 880 in the other rows from any of the reference lines 877. Thereby, each of the sense amplifiers 666 may compare a voltage at one of the bit lines 876, i.e., at the node N31 as seen in FIG. 8F, and a voltage at a comparison line, i.e., at the node N32 as seen in FIG. 8F, into a compared data and then generate an output “Out” of one of the magnetoresistive random access memories 880 coupling to said one of the bit lines 876 via one of the switches 888 based on the compared data. For example, when the voltage at the node N31 is compared by said each of the sense amplifiers 666 to be smaller than the voltage at the node N32, said each of the sense amplifiers 666 may generate the output "Out" at a logic level of "1" in the case that one of the magnetoresistive random access memories 880, which couples to said each of the sense amplifiers 666, has the low resistance. When the voltage at the node N31 is compared by said each of the sense amplifiers 666 to be greater than the voltage at the node N32, said each of the sense amplifiers 666 may generate the output "Out" at a logic level of "0" in the case that one of the magnetoresistive random access memories 880, which couples to said each of the sense amplifiers 666, has the high resistance.

The comparison-voltage generating circuit 895 as illustrated in FIG. 11F may be applied hereto, but the magnetoresistive random access memories 880-1 and 880-2 for the first alternative as illustrated in FIG. 11F are changed to ones for the second alternative. Referring to FIGS. 11D-11F, the comparison-voltage generating circuit 895 includes two pairs of magnetoresistive random access memories 880-1 and 880-2 for the second alternative connected in serial to each other, wherein the pairs of magnetoresistive random access memories 880-1 and 880-2 for the second alternative are connected in parallel to each other. In each of the pairs of magnetoresistive random access memories 880-1 and 880-2 for the second alternative, the magnetoresistive random access memory 880-1 for the second alternative may have its top electrode 882 coupling to the top electrode 882 of the magnetoresistive random access memory 880-2 for the second alternative and to a node N39, and the magnetoresistive random access memory 880-1 for the second alternative may have its bottom electrode 881 coupling to the node N40. The N-type MOS transistors 891 may have its source terminal, in operation, coupling to the bottom electrodes 881 of the magnetoresistive random access memories 880-1 for the second alternative in the pairs and to the node N40. The N-type MOS transistor 892 may have its gate terminal coupling to its drain terminal and to the voltage Vcc of power supply and its source terminal coupling to the node N32 of the sense amplifier 666 as seen in FIG. 8F via the comparison line. The bottom electrodes 881 of the magnetoresistive random access memories 880-2 for the second alternative in the pairs may couple to a node N41.

Referring to FIGS. 11D-11F, the resetting step may be performed to the magnetoresistive random access memories 880-1 for the second alternative in the pairs. When the magnetoresistive random access memories 880-1 for the second alternative in the pairs are being reset in the resetting step, (1) the node N40 may be switched to couple to the voltage Vss of ground reference, (2) the node N39 may be switched to couple to the programming voltage $V_{Pr}$, (3) the node N41 may be switched to couple to the programming voltage $V_{Pr}$, and (4) the node N32 may be switched not to couple to the bottom electrodes 881 of the magnetoresistive random access memories 880-1 for the second alternative in the pairs. Thereby, the magnetoresistive random access memories 880-1 for the second alternative in the pairs may be reset to the high resistance.

Referring to FIGS. 11D-11F, the setting step may be performed to the magnetoresistive random access memories 880-2 for the second alternative in the pairs. When the magnetoresistive random access memories 880-2 for the second alternative in the pairs are being set in the setting step, (1) the node N40 may be switched to couple to the voltage Vss of ground reference, (2) the node N39 may be switched to couple to the voltage Vss of ground reference, (3) the node N41 may be switched to couple to the programming voltage $V_{Pr}$, and (4) the node N32 may be switched not to couple to the bottom electrodes 881 of the magnetoresistive random access memories 880-1 for the second alternative in the pairs. Thereby, the magnetoresistive random access memories 880-2 for the second alternative in the pairs may be set to the low resistance. Accordingly, the magnetoresistive random access memories 880-2 for the second alternative in the pairs may be programmed to the low resistance between 10 and 100,000,000,000 ohms, and the magnetoresistive random access memories 880-1 for the second alternative in the pairs may be programmed to the high resistance between 15 and 500,000,000,000 ohms, greater than the low resistance, for example.

Referring to FIGS. 11D-11F, in operation after the magnetoresistive random access memories 880-2 for the second alternative in the pairs may be programmed to the low resistance, and the magnetoresistive random access memories 880-1 for the second alternative in the pairs may be programmed to the high resistance, (1) the nodes N39, N40 and N41 may be switched to be floating, (2) the node N32 may be switched to couple to the bottom electrodes 881 of the magnetoresistive random access memories 880-1 for the second alternative in the pairs, and (3) the bottom electrodes 881 of the magnetoresistive random access memories 880-2 for the second alternative in the pairs may be switched to couple to the voltage Vss of ground reference. Thereby, the comparison line, i.e., node N32, of the sense amplifier 666 as seen in FIG. 8F may be at the comparison voltage between a voltage of the node N31 coupling to one of the magnetoresistive random access memories 880 for the second alternative programmed to the low resistance and selected by one of the word lines 875 and a voltage of the node N31 coupling to one of the magnetoresistive random access memories 880 for the second alternative programmed to the high resistance and selected by one of the word lines 875.

Figure 12:
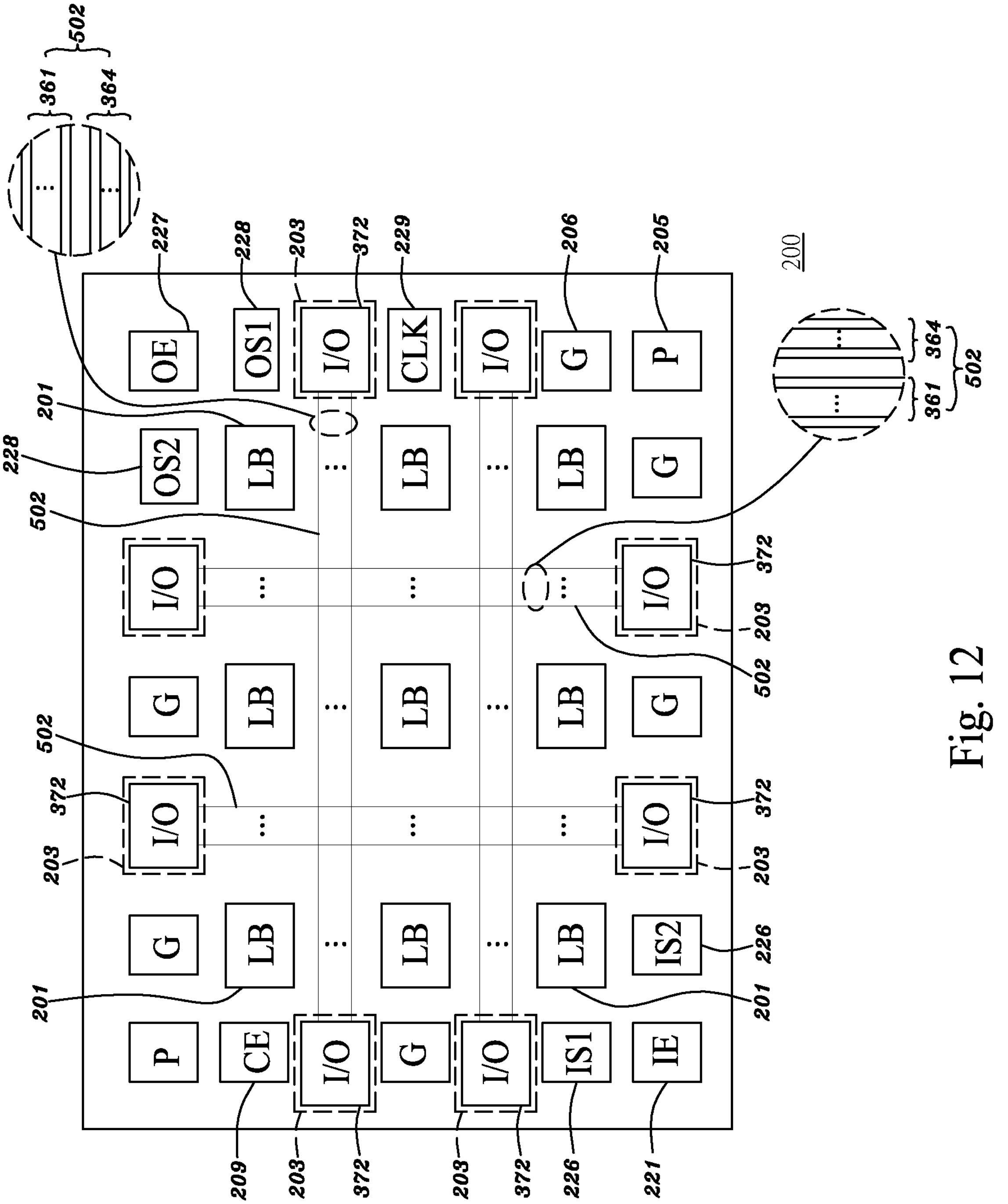
FIG. 12 is a schematically top view showing a standard commodity FPGA IC chip in accordance with an embodiment of the present application.

Specification for Standard Commodity Field-Programmable-Gate-Array (FPGA) Integrated-Circuit (IC) Chip FIG. 12 is a schematically top view showing a block diagram of a standard commodity FPGA IC chip in accordance with an embodiment of the present application. Referring to FIG. 12, the standard commodity FPGA IC chip 200 may include (1) multiple of the programmable logic blocks (LB) 201 as illustrated in FIG. 4 arranged in an array in a central region thereof, (2) multiple cross-point switches 379 as illustrated in FIG. 7 arranged around each of the programmable logic blocks (LB) 201, (3) multiple intra-chip interconnects 502 each extending over spaces between neighboring two of the programmable logic blocks 201, (4) multiple of the small input/output (I/O) circuits 203, as illustrated in FIG. 3B, each having the output S_Data_in coupling to one or more of the intra-chip interconnects 502 and the input S_Data_out, S_Enable or S_Inhibit coupling to another one or more of intra-chip interconnects 502 and (5) multiple of the non-volatile memory cells 870, 880 or 907 as illustrated in FIG. 8A-8F, 9A-9H, 10A-10I or 11A-11F. For the standard commodity FPGA IC chip 200, each of its sense amplifiers 666 as illustrated in FIG. 8A-8F, 9A-9H, 10A-10I or 11A-11F may have the output Out to couple to one or more of the bit lines 452 of the 6T or 5T SRAM cells 398 as seen in FIG. 1A or 1B employed for its memory cells 490 for the look-up tables (LUT) 210 of its programmable logic blocks (LB) 201 as illustrated in FIG. 4 or for its memory cells 362 for its cross-point switches 379 as illustrated in FIG. 7 through one or more of its fixed interconnects 364. Thereby, for the standard commodity FPGA IC chip 200, when its non-volatile memory cells 870, 880 or 907 as illustrated in FIG. 8A-8F, 9A-9H, 10A-10I or 11A-11F are in operation, the programming codes or resulting values stored in its non-volatile memory cells 870, 880 or 907 as illustrated in FIG. 8A-8F, 9A-9H, 10A-10I or 11A-11F may be downloaded via its sense amplifiers 666 to its memory cells 490 for the look-up tables (LUT) 210 of its programmable logic blocks (LB) 201 as illustrated in FIG. 4 or to its memory cells 362 for its cross-point switches 379 as illustrated in FIG. 7.

Referring to FIG. 12, the intra-chip interconnects 502 may be divided into the programmable interconnects 361 and fixed interconnects 364 as illustrated in FIG. 7. For the standard commodity FPGA IC chip 200, each of the small input/output (I/O) circuits 203, as illustrated in FIG. 3B, may have its output S_Data_in coupling to one or more of the programmable interconnects 361 and/or one or more of the fixed interconnects 364 and its input S_Data_out, S_Enable or S_Inhibit coupling to another one or more of the programmable interconnects 361 and/or another one or more of the fixed interconnects 364.

Referring to FIG. 12, each of the programmable logic blocks (LB) 201 as illustrated in FIG. 4 may have its inputs A0-A3 each coupling to one or more of the programmable interconnects 361 of the intra-chip interconnects 502 and/or one or more of the fixed interconnects 364 of the intra-chip interconnects 502 and may be configured to perform logic operation or computation operation on its inputs into its output Dout coupling to another one or more of the programmable interconnects 361 of the intra-chip interconnects 502 and/or another one or more of the fixed interconnects 364 of the intra-chip interconnects 502, wherein the computation operation may include an addition, subtraction, multiplication or division operation, and the logic operation may include a Boolean operation such as AND, NAND, OR or NOR operation.

Referring to FIG. 12, the standard commodity FPGA IC chip 200 may include multiple of the I/O pads 372 as seen in FIG. 3B, each vertically over one of its small input/output (I/O) circuits 203, coupling to the node 381 of said one of the small input/output (I/O) circuits 203. In a first clock, the output Dout of one of the programmable logic blocks 201 as illustrated in FIG. 4 may be transmitted to the input S_Data_out of the small driver 374 of one of the small input/output (I/O) circuits 203 through one or more of the programmable interconnects 361 and/or one or more of the cross-point switches 379 each between two of said one or more of the programmable interconnects 361 joining said each thereof, and then the small driver 374 of said one of the small input/output (I/O) circuits 203 may amplify its input S_Data_out to be transmitted to one of the I/O pads 372 vertically over said one of the small input/output (I/O) circuits 203 for external connection to circuits outside the standard commodity FPGA IC chip 200. In a second clock, a signal from circuits outside the standard commodity FPGA IC chip 200 may be transmitted to the small receiver 375 of said one of the small input/output (I/O) circuits 203 through said one of the I/O pads 372, and then the small receiver 375 of said one of the small input/output (I/O) circuits 203 may amplify the signal into its output S_Data_in to be transmitted to one of the inputs A0-A3 of another of the programmable logic blocks 201 as illustrated in FIG. 4 through another one or more of the programmable interconnects 361 and/or one or more of the cross-point switches 379 each between two of said another one or more of the programmable interconnects 361 joining said each thereof.

Referring to FIG. 12, the standard commodity FPGA IC chip 200 may further include a chip-enable (CE) pad 209 configured for enabling or disabling the standard commodity FPGA IC chip 200. For example, when a logic level of "0" couples to the chip-enable (CE) pad 209, the standard commodity FPGA IC chip 200 may be enabled to process data and/or operate with circuits outside of the standard commodity FPGA IC chip 200; when a logic level of "1" couples to the chip-enable (CE) pad 209, the standard commodity FPGA IC chip 200 may be disabled not to process data and/or operate with circuits outside of the standard commodity FPGA IC chip 200.

Referring to FIG. 12, for the standard commodity FPGA IC chip 200, it may further include (1) an input-enable (IE) pad 221 coupling to the first input of the small receiver 375 of each of its small input/output (I/O) circuits 203 as seen in FIG. 3B, configured for receiving the S_Inhibit signal from the circuits outside of it to activate or inhibit the small receiver 375 of each of its small input/output (I/O) circuits 203 for each of its I/O ports; and (2) multiple input selection (IS) pads 226 configured for selecting one from its I/O ports to receive data, i.e., S_Data_in illustrated in FIG. 3B, via the metal pads 372 of the selected one of its I/O ports from the circuits outside of it. For the example, for the standard commodity FPGA IC chip 200, its input selection (IS) pads 226 may have the number of two, e.g., IS1 and IS2 pads, for selecting one from its first, second, third and fourth I/O ports to receive data in the bit width of 64 bits, i.e., S_Data_in illustrated in FIG. 3B, via the 64 parallel metal pads 372 of the selected one of its first, second, third and fourth I/O ports from the circuits outside of it. Provided that (1) a logic level of "0" couples to the chip-enable (CE) pad 209, (2) a logic level of "1" couples to the input-enable (IE) pad 221, (3) a logic level of "0" couples to the IS1 pad 226 and (4) a logic level of "0" couples to the IS2 pad 226, the standard commodity FPGA IC chip 200 is enabled to activate the small receivers 375 of its small input/output (I/O) circuits 203 for its first, second, third and fourth I/O ports and to select its first one from its first, second, third and fourth I/O ports for receiving the data in the bit width of 64 bits via the 64 parallel metal pads 372 of its first I/O port from the circuits outside of the standard commodity FPGA IC chip 200, wherein its second, third and fourth I/O ports are not selected to receive the data from the circuits outside of the standard commodity FPGA IC chip 200. Provided that (1) a logic level of "0" couples to the chip-enable (CE) pad 209, (2) a logic level of "1" couples to the input-enable (IE) pad 221, (3) a logic level of "1" couples to the IS1 pad 226 and (4) a logic level of "0" couples to the IS2 pad 226, the standard commodity FPGA IC chip 200 is enabled to activate the small receivers 375 of its small input/output (I/O) circuits 203 for its first, second, third and fourth I/O ports and to select its second one from its first, second, third and fourth I/O ports for receiving the data in the bit width of 64 bits via the 64 parallel metal pads 372 of its second I/O port from the circuits outside of the standard commodity FPGA IC chip 200, wherein its first, third and fourth I/O ports are not selected to receive the data from the circuits outside of the standard commodity FPGA IC chip 200. Provided that (1) a logic level of "0" couples to the chip-enable (CE) pad 209, (2) a logic level of "1" couples to the input-enable (IE) pad 221, (3) a logic level of "0" couples to the IS1 pad 226 and (4) a logic level of "1" couples to the IS2 pad 226, the standard commodity FPGA IC chip 200 is enabled to activate the small receivers 375 of its small input/output (I/O) circuits 203 for its first, second, third and fourth I/O ports and to select its third one from its first, second, third and fourth I/O ports for receiving the data in the bit width of 64 bits via the 64 parallel metal pads 372 of its third I/O port from the circuits outside of the standard commodity FPGA IC chip 200, wherein its first, second and fourth I/O ports are not selected to receive the data from the circuits outside of the standard commodity FPGA IC chip 200. Provided that (1) a logic level of "0" couples to the chip-enable (CE) pad 209, (2) a logic level of "1" couples to the input-enable (IE) pad 221, (3) a logic level of "1" couples to the IS1 pad 226 and (4) a logic level of "1" couples to the IS2 pad 226, the standard commodity FPGA IC chip 200 is enabled to activate the small receivers 375 of its small input/output (I/O) circuits 203 for its first, second, third and fourth I/O ports and to select its fourth one from its first, second, third and fourth I/O ports for receiving the data in the bit width of 64 bits via the 64 parallel metal pads 372 of its fourth I/O port from the circuits outside of the standard commodity FPGA IC chip 200, wherein its first, second and third I/O ports are not selected to receive the data from the circuits outside of the standard commodity FPGA IC chip 200. Provided that (1) a logic level of "0" couples to the chip-enable (CE) pad 209, and (2) a logic level of "0" couples to the input-enable (IE) pad 221, the standard commodity FPGA IC chip 200 is enabled to inhibit the small receivers 375 of its small input/output (I/O) circuits 203 for its first, second, third and fourth I/O ports.

Referring to FIG. 12, for the standard commodity FPGA IC chip 200, it may further include (1) an output-enable (OE) pad 227 coupling to the second input of the small driver 374 of each of its small input/output (I/O) circuits 203 as seen in FIG. 3B, configured for receiving the S_Enable signal from the circuits outside of it to enable or disable the small driver 374 of each of its small input/output (I/O) circuits 203 for each of its I/O ports; and (2) multiple output selection (OS) pads 228 configured for selecting one from its I/O ports to drive or pass data, i.e., S_Data_out illustrated in FIG. 3B, via the metal pads 372 of the selected one of its I/O ports to the circuits outside of it. For the example, for the standard commodity FPGA IC chip 200, its output selection (OS) pads 226 may have the number of two, e.g., OS1 and OS2 pads, for selecting one from its first, second, third and fourth I/O ports to drive or pass data in the bit width of 64 bits, i.e., S_Data_out illustrated in FIG. 3B, via the 64 parallel metal pads 372 of the selected one of its first, second, third and fourth I/O ports to the circuits outside of it. Provided that (1) a logic level of "0" couples to the chip-enable (CE) pad 209, (2) a logic level of "0" couples to the output-enable (OE) pad 227, (3) a logic level of "0" couples to the OS1 pad 228 and (4) a logic level of "0" couples to the OS2 pad 228, the standard commodity FPGA IC chip 200 is enabled to enable the small drivers 374 of its small input/output (I/O) circuits 203 for its first, second, third and fourth I/O ports and to select its first one from its first, second, third and fourth I/O ports for driving or passing the data in the bit width of 64 bits via the 64 parallel metal pads 372 of its first I/O port to the circuits outside of the standard commodity FPGA IC chip 200, wherein its second, third and fourth I/O ports are not selected to drive or pass the data to the circuits outside of the standard commodity FPGA IC chip 200. Provided that (1) a logic level of "0" couples to the chip-enable (CE) pad 209, (2) a logic level of "0" couples to the output-enable (OE) pad 227, (3) a logic level of "1" couples to the OS1 pad 228 and (4) a logic level of "0" couples to the OS2 pad 228, the standard commodity FPGA IC chip 200 is enabled to enable the small drivers 374 of its small input/output (I/O) circuits 203 for its first, second, third and fourth I/O ports and to select its second one from its first, second, third and fourth I/O ports for driving or passing the data in the bit width of 64 bits via the 64 parallel metal pads 372 of its second I/O port to the circuits outside of the standard commodity FPGA IC chip 200, wherein its first, third and fourth I/O ports are not selected to drive or pass the data to the circuits outside of the standard commodity FPGA IC chip 200. Provided that (1) a logic level of "0" couples to the chip-enable (CE) pad 209, (2) a logic level of "0" couples to the output-enable (OE) pad 227, (3) a logic level of "0" couples to the OS1 pad 228 and (4) a logic level of "1" couples to the OS2 pad 228, the standard commodity FPGA IC chip 200 is enabled to enable the small drivers 374 of its small input/output (I/O) circuits 203 for its first, second, third and fourth I/O ports and to select its third one from its first, second, third and fourth I/O ports for driving or passing the data in the bit width of 64 bits via the 64 parallel metal pads 372 of its third I/O port to the circuits outside of the standard commodity FPGA IC chip 200, wherein its first, second and fourth I/O ports are not selected to drive or pass the data to the circuits outside of the standard commodity FPGA IC chip 200. Provided that (1) a logic level of "0" couples to the chip-enable (CE) pad 209, (2) a logic level of "0" couples to the output-enable (OE) pad 227, (3) a logic level of "1" couples to the OS1 pad 228 and (4) a logic level of "1" couples to the OS2 pad 228, the standard commodity FPGA IC chip 200 is enabled to enable the small drivers 374 of its small input/output (I/O) circuits 203 for its first, second, third and fourth I/O ports and to select its fourth one from its first, second, third and fourth I/O ports for driving or passing the data in the bit width of 64 bits via the 64 parallel metal pads 372 of its fourth I/O port to the circuits outside of the standard commodity FPGA IC chip 200, wherein its first, second and third I/O ports are not selected to drive or pass the data to the circuits outside of the standard commodity FPGA IC chip 200. Provided that (1) a logic level of "0" couples to the chip-enable (CE) pad 209 and (2) a logic level of "1" couples to the output-enable (OE) pad 227, the standard commodity FPGA IC chip 200 is enabled to disable the small drivers 374 of its small input/output (I/O) circuits 203 for its first, second, third and fourth I/O ports.

Referring to FIG. 12, the standard commodity FPGA IC chip 200 may further include (1) multiple power pads 205 configured for applying the voltage Vcc of power supply to the memory cells 490 for the look-up tables (LUT) 210 of the programmable logic blocks (LB) 201 as illustrated in FIG. 4, the memory cells 362 for the cross-point switches 379 as illustrated in FIG. 7 and/or the non-volatile memory cells 870, 880 or 907 as illustrated in FIG. 8A-8F, 9A-9H, 10A-10I or 11A-11F through one or more of the fixed interconnects 364, wherein the voltage Vcc of power supply may be between 0.2V and 2.5V, between 0.2V and 2V, between 0.2V and 1.5V, between 0.1V and 1V, or between 0.2V and 1V, or, smaller or lower than or equal to 2.5V, 2V, 1.8V, 1.5V or 1V, and (2) multiple ground pads 206 configured for providing the voltage Vss of ground reference to the memory cells 490 for the look-up tables (LUT) 210 of the programmable logic blocks (LB) 201 as illustrated in FIG. 4, the memory cells 362 for the cross-point switches 379 as illustrated in FIG. 7 and/or the non-volatile memory cells 870, 880 or 907 as illustrated in FIG. 8A-8F, 9A-9H, 10A-10I or 11A-11F through one or more of the fixed interconnects 364.

Referring to FIG. 12, the standard commodity FPGA IC chip 200 may further include a clock pad 229 configured for receiving a clock signal from circuits outside of the standard commodity FPGA IC chip 200.

Referring to FIG. 12, for the standard commodity FPGA IC chip 200, its programmable logic blocks 201 may be reconfigurable for artificial-intelligence (AI) application. For example, in a first clock, one of its programmable logic blocks 201 may have its look-up table (LUT) 201 to be programmed for OR operation; however, after one or more events happen, in a second clock said one of its programmable logic blocks 201 may have its look-up table (LUT) 201 to be programmed for NAND operation as illustrated in FIGS. 5 and 6 for better A1 performance.

Figure 13:
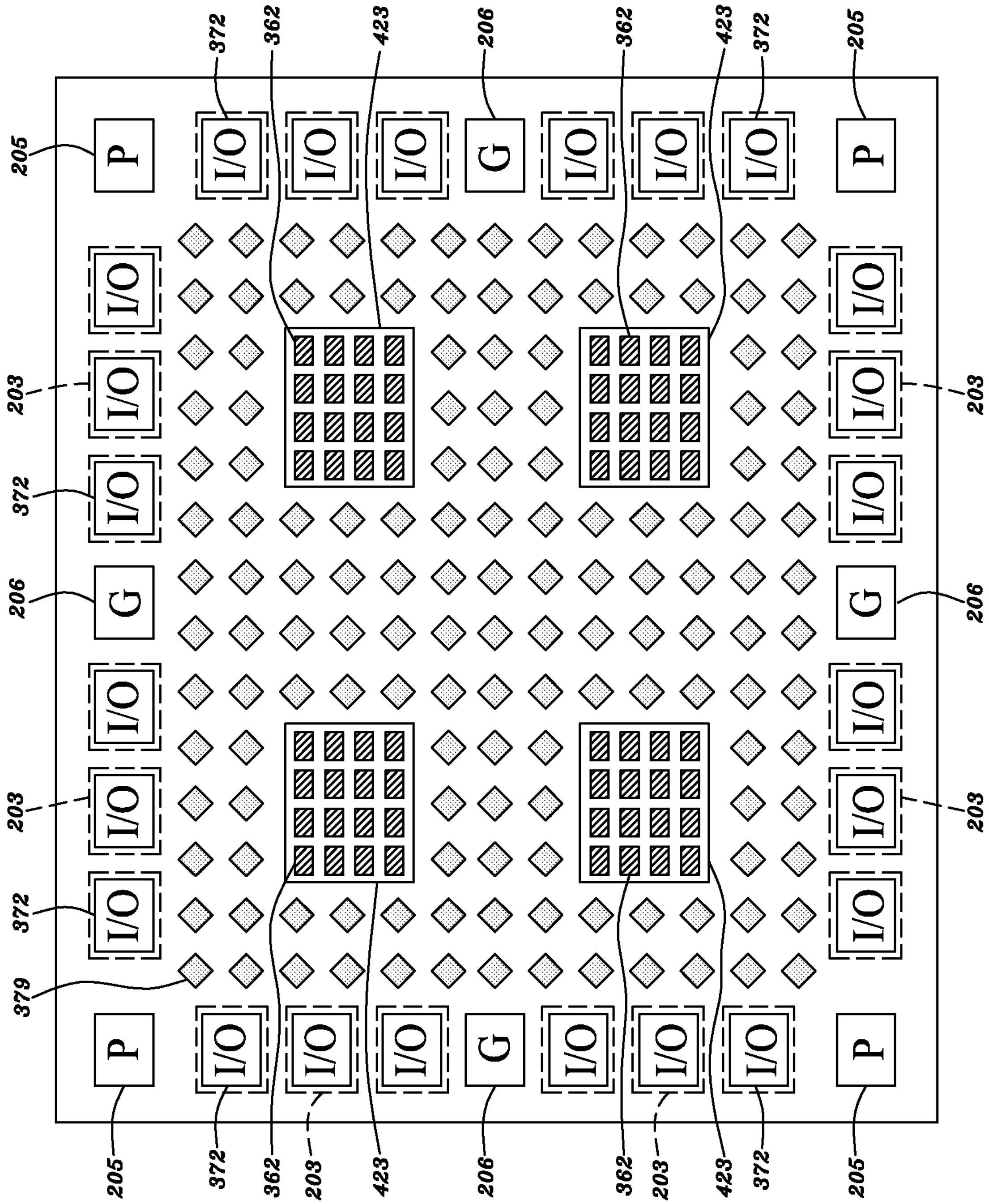
FIG. 13 is a schematically top view showing a block diagram of a dedicated programmable interconnection (DPI) integrated-circuit (IC) chip in accordance with an embodiment of the present application.

Specification for Dedicated Programmable Interconnection (DPI) Integrated-Circuit (IC) Chip FIG. 13 is a schematically top view showing a block diagram of a dedicated programmable interconnection (DPI) integrated-circuit (IC) chip in accordance with an embodiment of the present application.

Referring to FIG. 13, the DPIIC chip 410 may include (1) multiple memory-array blocks 423 arranged in an array in a central region thereof, (2) multiple groups of cross-point switches 379 as illustrated in FIG. 7, each group of which is arranged in one or more rings around one of the memory-array blocks 423, and (3) multiple small input/output (I/O) circuits 203, as illustrated in FIG. 3B, each having the output S_Data_in coupling to one of the nodes N23-N26 of one of its cross-point switches 379 as illustrated in FIG. 7 through one of the programmable interconnects and the input S_Data_out coupling to one of the nodes N23-N26 of another of its cross-point switches 379 as illustrated in FIG. 7 through another of the programmable interconnects. In each of the memory-array blocks 423 are multiple of memory cells 362, each of which may be referred to one as illustrated in FIG. 1A or 1B, each having an output Out1 or Out2 coupling to one of the inputs, e.g., A0 and A1, of the second set and input SC-4 of one of the multiplexers 211 of one of the cross-point switches 379 as illustrated in FIG. 7 close to said each of the memory-array blocks 423.

Referring to FIG. 13, the DPIIC chip 410 may include multiple intra-chip interconnects (not shown) each extending over spaces between neighboring two of the memory-array blocks 423, wherein said each of the intra-chip interconnects may be the programmable interconnect, coupling to one of the nodes N23-N26 of one of its cross-point switches 379 as illustrated in FIG. 7 for example, or fixed interconnect. For the DPIIC chip 410, each of its small input/output (I/O) circuits 203, as illustrated in FIGS. 3B, may have the output S_Data_in coupling to one or more of its programmable interconnects and/or one or more of its fixed interconnects and the input S_Data_out, S_Enable or S_Inhibit coupling to another one or more of its programmable interconnects and/or another one or more of its fixed interconnects.

Referring to FIG. 13, the DPIIC chip 410 may further include multiple of the non-volatile memory cells 870, 880 or 907 as illustrated in FIG. 8A-8F, 9A-9H, 10A-10I or 11A-11F therein. For the DPIIC chip 410, each of its sense amplifiers 666 as illustrated in FIG. 8A-8F, 9A-9H, 10A-10I or 11A-11F may have the output Out to couple to one or more of the bit lines 452 of the 6T or 5T SRAM cells 398 as seen in FIG. 1A or 1B employed for its memory cells 362 for its cross-point switches 379 as illustrated in FIG. 7 through one or more of the fixed interconnects 364. Thereby, for the DPIIC chip 410, when its non-volatile memory cells 870, 880 or 907 as illustrated in FIG. 8A-8F, 9A-9H, 10A-10I or 11A-11F are in operation, the programming codes stored in its non-volatile memory cells 870, 880 or 907 as illustrated in FIG. 8A-8F, 9A-9H, 10A-10I or 11A-11F may be downloaded via its sense amplifiers 666 to its memory cells 362 for its cross-point switches 379 as illustrated in FIG. 7.

Referring to FIG. 13, the DPIIC chip 410 may include multiple of the I/O pads 372 as seen in FIG. 3B, each vertically over one of its small input/output (I/O) circuits 203, coupling to the node 381 of said one of its small input/output (I/O) circuits 203. In a first clock, a signal from one of the nodes N23-N26 of one of the cross-point switches 379 as illustrated in FIG. 7 may be transmitted to the input S_Data_out of the small driver 374 of one of the small input/output (I/O) circuits 203 through one or more of the programmable interconnects 361, and then the small driver 374 of said one of the small input/output (I/O) circuits 203 may amplify its input S_Data_out to be transmitted to one of the I/O pads 372 vertically over said one of the small input/output (I/O) circuits 203 for external connection to circuits outside the DPIIC chip 410. In a second clock, a signal from circuits outside the DPIIC chip 410 may be transmitted to the small receiver 375 of said one of the small input/output (I/O) circuits 203 through said one of the I/O pads 372, and then the small receiver 375 of said one of the small input/output (I/O) circuits 203 may amplify the signal into its output S_Data_in to be transmitted to one of the nodes N23-N26 of another of the cross-point switches 379 as illustrated in FIG. 7 through another one or more of the programmable interconnects 361.

Referring to FIG. 13, the DPIIC chip 410 may further include (1) multiple power pads 205 for applying the voltage Vcc of power supply to the memory cells 362 for the cross-point switches 379 as illustrated in FIG. 7 and/or the non-volatile memory cells 870, 880 or 907 as illustrated in FIG. 8A-8F, 9A-9H, 10A-10I or 11A-11F through one or more of the fixed interconnects 364, wherein the voltage Vcc of power supply may be between 0.2V and 2.5V, between 0.2V and 2V, between 0.2V and 1.5V, between 0.1V and 1V, or between 0.2V and 1V, or, smaller or lower than or equal to 2.5V, 2V, 1.8V, 1.5V or 1V, and (2) multiple ground pads 206 for providing the voltage Vss of ground reference to the memory cells 362 for the cross-point switches 379 as illustrated in FIG. 7 and/or the non-volatile memory cells 870, 880 or 907 as illustrated in FIG. 8A-8F, 9A-9H, 10A-10I or 11A-11F through one or more of the fixed interconnects 364.

Referring to FIG. 13, the DPIIC chip 410 may further include multiple 6T SRAM cells 398 as illustrated in FIG. 1A used as cache memory for data latch or storage. Each of the 6T SRAM cells 398 may include two switches 449, such as N-type or P-type MOS transistors, for bit and bit-bar data transfer, and two pairs of P-type and N-type MOS transistors 447 and 448 for data latch or storage nodes. Each of the 6T SRAM cells 398 acting as the cache memory provides the two switches 449 for writing data into it and reading data stored in it. The DPIIC chip 410 may further include a sense amplifier for reading (amplifying or detecting) data from the 6T SRAM cells 398 acting as the cache memory. Accordingly, the 6T SRAM cells 398 of the DPIIC chip 410 may act as cache memory to store data from any of the semiconductor chips 200, 250, 251, 260, 265, 269*a* and 269*b* of one of the standard commodity logic drive 300 as seen in FIG. 14 during the processing or computing of the standard commodity logic drive 300.

Specification for Logic Drive

Figure 14:
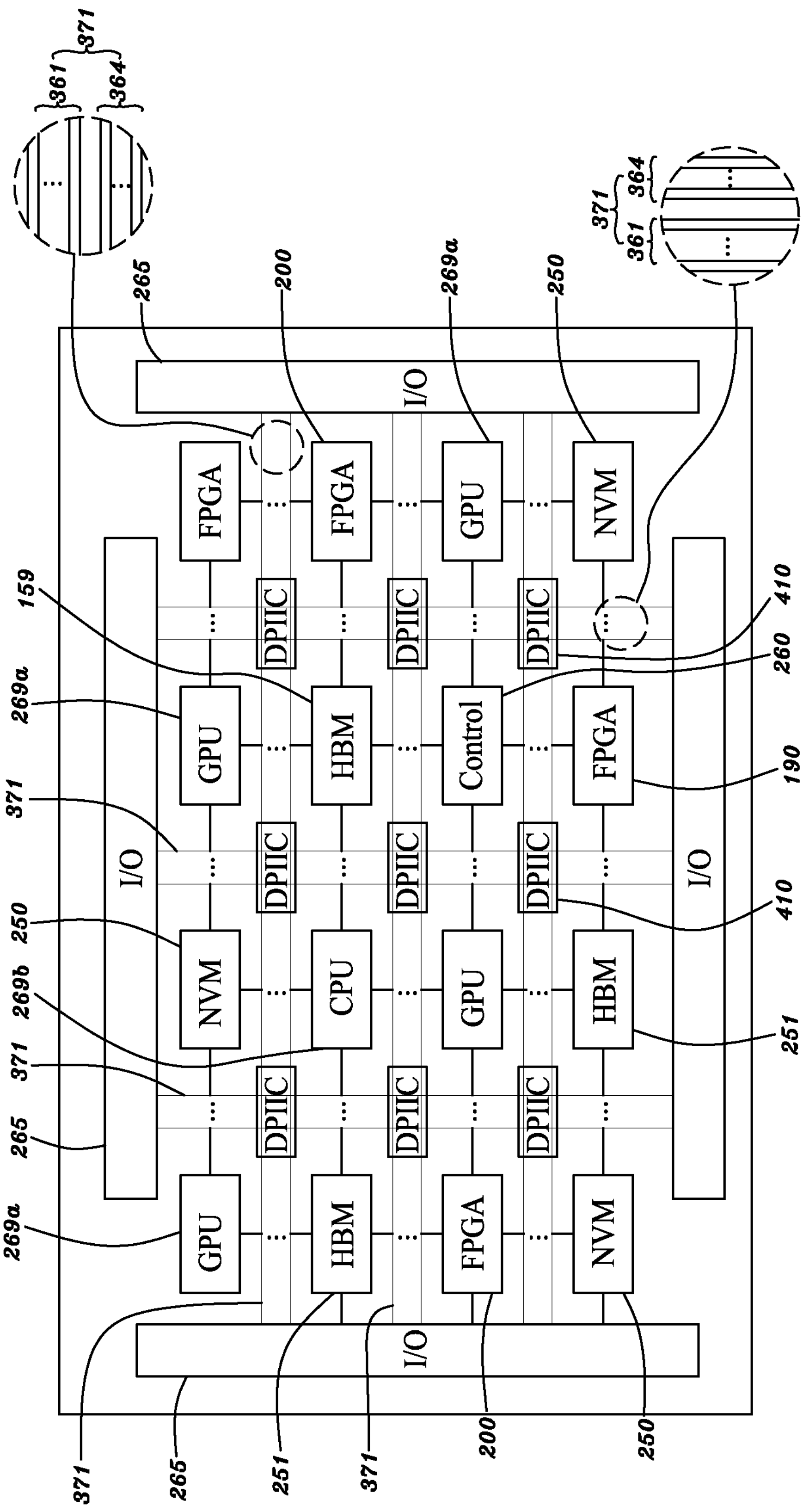
FIG. 14 is a schematically top view showing an arrangement for a logic drive in accordance with an embodiment of the present application.

FIG. 14 is a schematically top view showing arrangement for various chips packaged in a tenth type of standard commodity logic drive in accordance with an embodiment of the present application. Referring to FIG. 14, the logic drive 300 may be packaged with multiple graphic-processing unit (GPU) chips 269*a* and a central-processing-unit (CPU) chip 269*b*. Further, the logic drive 300 may be packaged with multiple high-bandwidth-memory (HBM) integrated-circuit (IC) chips 251 each arranged next to one of the GPU chips 269*a* for communication with said one of the GPU chips 269*a* in a high speed, high bandwidth and wide bitwidth. Each of the HBM IC chips 251 in the logic drive 300 may be a high speed, high bandwidth, wide bitwidth dynamic-random-access-memory (DRAM) IC chip, high speed, high bandwidth, wide bitwidth cache static-random-access-memory (SRAM) chip, high speed, high bandwidth, wide bitwidth magnetoresistive random-access-memory (MRAM) chip or high speed, high bandwidth, wide bitwidth resistive random-access-memory (RRAM) chip. The logic drive 300 may be further packaged with a plurality of the standard commodity FPGA IC chip 200 and one or more of the non-volatile memory (NVM) IC chips 250 configured to store data from data information memory (DIM) cells of the HBM IC chips 251. The CPU chip 269*b*, dedicated control chip 260, standard commodity FPGA IC chips 200, GPU chips 269*a*, NVM IC chips 250 and HBMIC chips 251 may be arranged in an array, wherein the CPU chip 269*b* and dedicated control chip 260 may be arranged in a center region surrounded by a periphery region having the standard commodity FPGA IC chips 200, GPU chips 269*a*, NVM IC chips 250 and HBMIC chips 251 mounted thereto.

Referring to FIG. 14, the logic drive 300 may include the inter-chip interconnects 371 each extending under spaces between neighboring two of the standard commodity FPGA IC chips 200, NVM IC chips 250, dedicated control chip 260, GPU chips 269*a*, CPU chip 269*b* and HBMIC chips 251. The logic drive 300 may include a plurality of the DPIIC chip 410 aligned with a cross of a vertical bundle of inter-chip interconnects 371 and a horizontal bundle of inter-chip interconnects 371. Each of the DPIIC chips 410 is at corners of four of the standard commodity FPGA IC chips 200, NVM IC chips 250, dedicated control chip 260, GPU chips 269*a*, CPU chip 269*b* and HBMIC chips 251 around said each of the DPIIC chips 410. Each of the inter-chip interconnects 371 may be the programmable or fixed interconnect 361 or 364 as mentioned above in the sections of "Specification for Programmable Interconnect" and "Specification for Fixed Interconnect". Signal transmission may be built (1) between one of the programmable interconnects 361 of the inter-chip interconnects 371 and one of the programmable interconnects 361 of the intra-chip interconnects 371 of one of the standard commodity FPGA IC chips 200 via one of the small input/output (I/O) circuits 203 of said one of the standard commodity FPGA IC chips 200, and (2) between one of the programmable interconnects 361 of the inter-chip interconnects 371 and one of the programmable interconnects 361 of the intra-chip interconnects of one of the DPIIC chips 410 via one of the small input/output (I/O) circuits 203 of said one of the DPIIC chips 410. Signal transmission may be built (1) between one of the fixed interconnects 364 of the inter-chip interconnects 371 and one of the fixed interconnects 364 of the intra-chip interconnects 502 of one of the standard commodity FPGA IC chips 200 via one of the small input/output (I/O) circuits 203 of said one of the standard commodity FPGA IC chips 200, and (2) between one of the fixed interconnects 364 of the inter-chip interconnects 371 and one of the fixed interconnects 364 of the intra-chip interconnects of one of the DPIIC chips 410 via one of the small input/output (I/O) circuits 203 of said one of the DPIIC chips 410.

Referring to FIG. 14, one or more of the programmable or fixed interconnects 361 or 364 of the inter-chip interconnects 371 may couple from each of the standard commodity FPGA IC chips 200 to all of the DPIIC chips 410. One or more of the programmable or fixed interconnects 361 or 364 of the inter-chip interconnects 371 may couple from each of the standard commodity FPGA IC chips 200 to the dedicated control chip 260. One or more of the programmable or fixed interconnects 361 or 364 of the inter-chip interconnects 371 may couple from each of the standard commodity FPGA IC chips 200 to both of the NVM IC chips 250. One or more of the programmable or fixed interconnects 361 or 364 of the inter-chip interconnects 371 may couple from each of the standard commodity FPGA IC chips 200 to all of the GPU chips 269*a*. One or more of the programmable or fixed interconnects 361 or 364 of the inter-chip interconnects 371 may couple from each of the standard commodity FPGA IC chips 200 to the CPU chip 269*b*. One or more of the programmable or fixed interconnects 361 or 364 of the inter-chip interconnects 371 may couple from one of the standard commodity FPGA IC chips 200 to one of the HBMIC chips 251 next to said one of the standard commodity FPGA IC chips 200 and the communication between said one of the standard commodity FPGA IC chips 200 and said one of the HBMIC chips 251 may have a data bit width of equal to or greater than 64, 128, 256, 512, 1024, 2048, 4096, 8K, or 16K. One or more of the programmable or fixed interconnects 361 or 364 of the inter-chip interconnects 371 may couple from each of the standard commodity FPGA IC chips 200 to the other of the standard commodity FPGA IC chips 200. One or more of the programmable or fixed interconnects 361 or 364 of the inter-chip interconnects 371 may couple from each of the DPIIC chips 410 to the dedicated control chip 260. One or more the programmable or fixed interconnects 361 or 364 of the inter-chip interconnects 371 may couple from each of the DPIIC chips 410 to both of the NVM IC chips 250. One or more of the programmable or fixed interconnects 361 or 364 of the inter-chip interconnects 371 may couple from each of the DPIIC chips 410 to all of the GPU chips 269*a*. One or more of the programmable or fixed interconnects 361 or 364 of the inter-chip interconnects 371 may couple from each of the DPIIC chips 410 to the CPU chip 269*b*. One or more of the programmable or fixed interconnects 361 or 364 of the inter-chip interconnects 371 may couple from each of the DPIIC chips 410 to all of the HBM IC chips 251. One or more of the programmable or fixed interconnects 361 or 364 of the inter-chip interconnects 371 may couple from each of the DPIIC chips 410 to the others of the DPIIC chips 410. One or more of the programmable or fixed interconnects 361 or 364 of the inter-chip interconnects 371 may couple from the CPU chip 269*b* to all of the GPU chips 269*a*. One or more of the programmable or fixed interconnects 361 or 364 of the inter-chip interconnects 371 may couple from the CPU chip 269*b* to both of the NVM IC chips 250. One or more of the programmable or fixed interconnects 361 or 364 of the inter-chip interconnects 371 may couple from the CPU chip 269*b* to one of the HBM IC chips 251 next to the CPU chip 269*b* and the communication between the CPU chip 269*b* and said one of the HBM IC chips 251 may have a data bit width of equal to or greater than 64, 128, 256, 512, 1024, 2048, 4096, 8K, or 16K. One or more of the programmable or fixed interconnects 361 or 364 of the inter-chip interconnects 371 may couple from one of the GPU chips 269*a* to one of the HBM IC chips 251 next to said one of the GPU chips 269*a* and the communication between said one of the GPU chips 269*a* and said one of the HBM IC chips 251 may have a data bit width of equal to or greater than 64, 128, 256, 512, 1024, 2048, 4096, 8K, or 16K. One or more of the programmable or fixed interconnects 361 or 364 of the inter-chip interconnects 371 may couple from each of the GPU chips 269*a* to both of the NVM IC chips 250. One or more of the programmable or fixed interconnects 361 or 364 of the inter-chip interconnects 371 may couple from each of the GPU chips 269*a* to the others of the GPU chips 269*a*. One or more of the programmable or fixed interconnects 361 or 364 of the inter-chip interconnects 371 may couple from each of the NVM IC chips 250 to the dedicated control chip 260. One or more of the programmable or fixed interconnects 361 or 364 of the inter-chip interconnects 371 may couple from each of the HBM IC chips 251 to the dedicated control chip 260. One or more of the programmable or fixed interconnects 361 or 364 of the inter-chip interconnects 371 may couple from each of the GPU chips 269*a* to the dedicated control chip 260. One or more of the programmable or fixed interconnects 361 or 364 of the inter-chip interconnects 371 may couple from the CPU chip 269*b* to the dedicated control chip 260. One or more of the programmable or fixed interconnects 361 or 364 of the inter-chip interconnects 371 may couple from each of the NVM IC chips 250 to all of the HBM IC chips 251. One or more of the programmable or fixed interconnects 361 or 364 of the inter-chip interconnects 371 may couple from each of the NVM IC chips 250 to the other of the NVM IC chips 250. One or more of the programmable or fixed interconnects 361 or 364 of the inter-chip interconnects 371 may couple from each of the HBM IC chips 251 to the others of the HBM IC chips 251.

Referring to FIG. 14, the logic drive 300 may include multiple dedicated input/output (I/O) chips 265 in a peripheral region thereof surrounding a central region thereof having the standard commodity FPGA IC chips 200, NVM IC chips 250, dedicated control chip 260, GPU chips 269*a*, CPU chip 269*b*, HBM IC chips 251 and DPIIC chips 410 located therein. One or more of the programmable or fixed interconnects 361 or 364 of the inter-chip interconnects 371 may couple from each of the standard commodity FPGA IC chips 200 to all of the dedicated input/output (I/O) chips 265. One or more of the programmable or fixed interconnects 361 or 364 of the inter-chip interconnects 371 may couple from each of the DPIIC chips 410 to all of the dedicated input/output (I/O) chips 265. One or more of the programmable or fixed interconnects 361 or 364 of the inter-chip interconnects 371 may couple from each of the NVM IC chips 250 to all of the dedicated input/output (I/O) chips 265. One or more of the programmable or fixed interconnects 361 or 364 of the inter-chip interconnects 371 may couple from the dedicated control chip 260 to all of the dedicated input/output (I/O) chips 265. One or more of the programmable or fixed interconnects 361 or 364 of the inter-chip interconnects 371 may couple from each of the GPU chips 269*a* to all of the dedicated input/output (I/O) chips 265. One or more of the programmable or fixed interconnects 361 or 364 of the inter-chip interconnects 371 may couple from the CPU chip 269*b* to all of the dedicated input/output (I/O) chips 265. One or more of the programmable or fixed interconnects 361 or 364 of the inter-chip interconnects 371 may couple from each of the HBM IC chips 251 to all of the dedicated input/output (I/O) chips 265.

Interconnection for Logic Drive

Referring to FIG. 14, one or more of the programmable interconnects 361 of the inter-chip interconnects 371 may couple one or more of the small I/O circuits 203 of each of the dedicated I/O chips 265 to one or more of the small I/O circuits 203 of all of the standard commodity FPGA IC chips 200. One or more of the programmable interconnects 361 of the inter-chip interconnects 371 may couple one or more of the small I/O circuits 203 of each of the dedicated I/O chips 265 to one or more of the small I/O circuits 203 of all of the DPIIC chips 410. One or more of the programmable interconnects 361 of the inter-chip interconnects 371 may couple one or more of the small I/O circuits 203 of each of the dedicated I/O chips 265 to one or more of the small I/O circuits 203 of all the others of the dedicated I/O chips 265. One or more of the fixed interconnects 364 of the inter-chip interconnects 371 may couple one or more of the small I/O circuits 203 of each of the dedicated I/O chips 265 to one or more of the small I/O circuits 203 of all of the standard commodity FPGA IC chips 200. One or more of the fixed interconnects 364 of the inter-chip interconnects 371 may couple one or more of the small I/O circuits 203 of each of the dedicated I/O chips 265 to one or more of the small I/O circuits 203 of all of the DPIIC chips 410. One or more of the fixed interconnects 364 of the inter-chip interconnects 371 may couple one or more of the small I/O circuits 203 of each of the dedicated I/O chips 265 to one or more of the small I/O circuits 203 of all the others of the dedicated I/O chips 265.

Referring to FIG. 14, one or more of the programmable interconnects 361 of the inter-chip interconnects 371 may couple one or more of the small I/O circuits 203 of each of the DPIIC chips 410 to one or more of the small I/O circuits 203 of all of the standard commodity FPGA IC chips 200. One or more of the programmable interconnects 361 of the inter-chip interconnects 371 may couple one or more of the small I/O circuits 203 of each of the DPIIC chips 410 to one or more of the small I/O circuits 203 of all the others of the DPIIC chips 410. One or more of the fixed interconnects 364 of the inter-chip interconnects 371 may couple one or more of the small I/O circuits 203 of each of the DPIIC chips 410 to one or more of the small I/O circuits 203 of all of the standard commodity FPGA IC chips 200. One or more of the fixed interconnects 364 of the inter-chip interconnects 371 may couple one or more of the small I/O circuits 203 of each of the DPIIC chips 410 to one or more of the small I/O circuits 203 of all the others of the DPIIC chips 410.

Referring to FIG. 14, one or more of the programmable interconnects 361 of the inter-chip interconnects 371 may couple one or more of the small I/O circuits 203 of each of the standard commodity FPGA IC chips 200 to one or more of the small I/O circuits 203 of all the others of the standard commodity FPGA IC chips 200. One or more of the fixed interconnects 364 of the inter-chip interconnects 371 may couple one or more of the small I/O circuits 203 of each of the standard commodity FPGA IC chips 200 to one or more of the small I/O circuits 203 of all the others of the standard commodity FPGA IC chips 200.

Referring to FIG. 14, one or more of the programmable interconnects 361 of the inter-chip interconnects 371 may couple one or more of the small I/O circuits 203 of the dedicated control chip 260 to one or more of the small I/O circuits 203 of all of the standard commodity FPGA IC chips 200. One more of the fixed interconnects 364 of the inter-chip interconnects 371 may couple one or more of the small I/O circuits 203 of the dedicated control chip 260 to one or more of the small I/O circuits 203 of all of the standard commodity FPGA IC chips 200. One or more of the programmable interconnects 361 of the inter-chip interconnects 371 may couple one or more of the small I/O circuits 203 of the dedicated control chip 260 to one or more of the small I/O circuits 203 of all of the DPIIC chips 410. One more of the fixed interconnects 364 of the inter-chip interconnects 371 may couple one or more of the small I/O circuits 203 of the dedicated control chip 260 to one or more of the small I/O circuits 203 of all of the DPIIC chips 410. One or more of the fixed interconnects 364 of the inter-chip interconnects 371 may couple one or more of the large I/O circuits 341 of the dedicated control chip 260 to one or more of the large I/O circuits 341 of all of the dedicated I/O chips 265. One or more of the large I/O circuits 341 of the dedicated control chip 260 may couple to the external circuitry 271 outside the logic drive 300.

Referring to FIG. 14, one or more of the fixed interconnects 364 of the inter-chip interconnects 371 may couple one or more of the large I/O circuits 341 of each of the dedicated I/O chips 265 to one or more of the large I/O circuits 341 of the others of the dedicated I/O chips 265. One or more of the large I/O circuits 341 of each of the dedicated I/O chips 265 may couple to the external circuitry 271 outside the logic drive 300.

(1) Interconnection for Reloading Resulting Values or Programming Codes to Non-Volatile Memory Cells of Standard Commodity FPGA IC Chips Before operation, referring to FIG. 14, each of the dedicated I/O chips 265 may have a first one of its large I/O circuits 341 to drive a resulting value or first programming code from the external circuitry 271 outside the standard commodity logic drive 300 to a first one of its small I/O circuits 203. For said each of the dedicated I/O chips 265, the first one of its small I/O circuits 203 may drive the resulting value or first programming code to a first one of the small I/O circuits 203 of one of the standard commodity FPGA IC chips 200 via one or more of the fixed interconnects 364 of the inter-chip interconnects 371. For said one of the standard commodity FPGA IC chips 200, the first one of its small I/O circuits 203 may drive the resulting value or first programming code to a first one of its non-volatile memory cells 870, 880 or 907, and thereby the resulting value or first programming code may be stored in the first one of its non-volatile memory cells 870, 880 or 907.

Furthermore, referring to FIG. 14, said each of the dedicated I/O chips 265 may have a second one of its large I/O circuits 341 to drive a second programming code from the external circuitry 271 outside the standard commodity logic drive 300 to a second one of its small I/O circuits 203. For said each of the dedicated I/O chips 265, the second one of its small I/O circuits 203 may drive the second programming code to a second one of the small I/O circuits 203 of said one of the standard commodity FPGA IC chips 200 via one or more of the fixed interconnects 364 of the inter-chip interconnects 371. For said one of the standard commodity FPGA IC chips 200, the second one of its small I/O circuits 203 may drive the second programming code to a second one of its non-volatile memory cells 870, 880 or 907, and thereby the second programming code may be stored in the second one of its non-volatile memory cells 870, 880 or 907.

Furthermore, referring to FIG. 14, said each of the dedicated I/O chips 265 may have a third one of its large I/O circuits 341 to drive a third programming codes from the external circuitry 271 outside the standard commodity logic drive 300 to a third one of its small I/O circuits 203. For said each of the dedicated I/O chips 265, the third one of its small I/O circuits 203 may drive the third programming code to one of the small I/O circuits 203 of one of the DPIIC chips 410 via one or more of the fixed interconnects 364 of the inter-chip interconnects 371. For said one of the DPIIC chips 410, said one of its small I/O circuits 203 may drive the third programming code to one of its non-volatile memory cells 870, 880 or 907, and thereby the third programming code may be stored in said one of its non-volatile memory cells 870, 880 or 907.

(2) Interconnection for Operation

Referring to FIG. 14, said each of the standard commodity FPGA IC chips 200 may reload the resulting value or first programming code from the first one of its non-volatile memory cells 870, 880 or 907 to one of its memory cells 490 via one or more of the fixed interconnects 364 of its intra-chip interconnects 502 as seen in FIG. 12, and thereby the resulting value or first programming code may be stored or latched in said one of its memory cells 490 for programing one of its programmable logic blocks 201 as illustrated in FIG. 4. Said each of the standard commodity FPGA IC chips 200 may reload the second programming code from the second one of its non-volatile memory cells 870, 880 or 907 to one of its memory cells 362 via one or more of the fixed interconnects 364 of its intra-chip interconnects 502 as seen in FIG. 12, and thereby the second programming code may be stored or latched in said one of its memory cells 362 for programing one of its cross-point switches 379 as illustrated in FIG. 7. Said each of the DPIIC chips 410 may reload the third programming code from said one of its non-volatile memory cells 870, 880 or 907 to one of its memory cells 362, and thereby the third programming code may be stored or latched in said one of its memory cells 362 for programing one of its cross-point switches 379 as illustrated in FIG. 7.

Thereby, referring to FIG. 14, one of the dedicated I/O chips 265 may have one of its large I/O circuits 341 to drive a signal from the external circuitry 271 outside the logic drive 300 to one of its small I/O circuits 203. For said one of the dedicated I/O chips 265, said one of its small I/O circuits 203 may drive the signal to a first one of the small I/O circuits 203 of one of the DPIIC chips 410 via one or more of the programmable interconnects 361 of the inter-chip interconnects 371. For said one of the dedicated DPIIC chips 410, the first one of its small I/O circuits 203 may drive the signal to one of its cross-point switches 379 via a first one of the programmable interconnects 361 of its intra-chip interconnects; said one of its cross-point switches 379 may switch the signal from the first one of the programmable interconnects 361 of its intra-chip interconnects to a second one of the programmable interconnects 361 of its intra-chip interconnects to be passed to a second one of its small I/O circuits 203; the second one of its small I/O circuits 203 may drive the signal to one of the small I/O circuits 203 of one of the standard commodity FPGA IC chips 200 via one or more of the programmable interconnects 361 of the inter-chip interconnects 371. For said one of the standard commodity FPGA IC chips 200, said one of its small I/O circuits 203 may drive the signal to one of its cross-point switches 379 through a first group of the programmable interconnects 361 of its intra-chip interconnects 502 as seen in FIG. 12; said one of its cross-point switches 379 may switch the signal to pass from the first group of the programmable interconnects 361 of its intra-chip interconnects 502 as seen in FIG. 12 to a second group of the programmable interconnects 361 of its intra-chip interconnects 502 as seen in FIG. 12 to be passed to one of the inputs A0-A3 of one of its programmable logic blocks (LB) 201 as seen in FIG. 4.

Referring to FIG. 14, in another aspect, for a first one of the standard commodity FPGA IC chips 200, one of its programmable logic blocks (LB) 201 as seen in FIG. 4 may generate an output Dout to be passed to one of its cross-point switches 379 via a first group of the programmable interconnects 361 of its intra-chip interconnects 502 as seen in FIG. 12; said one of its cross-point switches 379 may switch the output Dout to pass from the first group of the programmable interconnects 361 of its intra-chip interconnects 502 as seen in FIG. 12 to a second group of the programmable interconnects 361 of its intra-chip interconnects 502 as seen in FIG. 12 to be passed to one of its small I/O circuits 203; said one of its small I/O circuits 203 may drive the output Dout to a first one of the small I/O circuits 203 of one of the DPIIC chips 410 via one or more of the programmable interconnects 361 of the inter-chip interconnects 371. For said one of the DPIIC chips 410, the first one of its small I/O circuits 203 may drive the output Dout to one of its cross-point switches 379 via a first group of the programmable interconnects 361 of its intra-chip interconnects; said one of its cross-point switches 379 may switch the output Dout to pass from the first group of the programmable interconnects 361 of its intra-chip interconnects to a second group of the programmable interconnects 361 of its intra-chip interconnects to be passed to a second one of its small I/O circuits 203; the second one of its small I/O circuits 203 may drive the output Dout to one of the small I/O circuits 203 of a second one of the standard commodity FPGA IC chips 200 via one or more of the programmable interconnects 361 of the inter-chip interconnects 371. For the second one of the FPGA IC chips 200, said one of its small I/O circuits 203 may drive the output Dout to one of its cross-point switches 379 through a first group of the programmable interconnects 361 of its intra-chip interconnects 502 as seen in FIG. 12; said one of its cross-point switches 379 may switch the output Dout to pass from the first group of the programmable interconnects 361 of its intra-chip interconnects 502 as seen in FIG. 12 to a second group of the programmable interconnects 361 of its intra-chip interconnects 502 as seen in FIG. 12 to be passed to one of the inputs A0-A3 of one of its programmable logic blocks (LB) 201 as seen in FIG. 4.

Referring to FIG. 14, in the other aspect, for one of the standard commodity FPGA IC chips 200, one of its programmable logic blocks (LB) 201 as seen in FIG. 4 may generate an output Dout to be passed to one of its cross-point switches 379 via a first group of the programmable interconnects 361 of its intra-chip interconnects 502 as seen in FIG. 12; said one of its cross-point switches 379 may switch the output Dout to pass from the first group of the programmable interconnects 361 of its intra-chip interconnects 502 as seen in FIG. 12 to a second group of the programmable interconnects 361 of its intra-chip interconnects 502 as seen in FIG. 12 to be passed to one of its small I/O circuits 203; said one of its small I/O circuits 203 may drive the output Dout to a first one of the small I/O circuits 203 of one of the DPIIC chips 410 via one or more of the programmable interconnects 361 of the inter-chip interconnects 371. For said one of the DPIIC chips 410, the first one of its small I/O circuits 203 may drive the output Dout to one of its cross-point switches 379 via a first group of the programmable interconnects 361 of its intra-chip interconnects; said one of its cross-point switches 379 may switch the output Dout to pass from the first group of the programmable interconnects 361 of its intra-chip interconnects to a second group of the programmable interconnects 361 of its intra-chip interconnects to be passed to a second one of its small I/O circuits 203; the second one of its small I/O circuits 203 may drive the output Dout to one of the small I/O circuits 203 of one of the dedicated I/O chips 265 via one or more of the programmable interconnects 361 of the inter-chip interconnects 371. For said one of the dedicated I/O chips 265, said one of its small I/O circuits 203 may drive the output Dout to one of its large I/O circuits 341 to be passed to the external circuitry 271 outside the logic drive 300.

Figure 15:
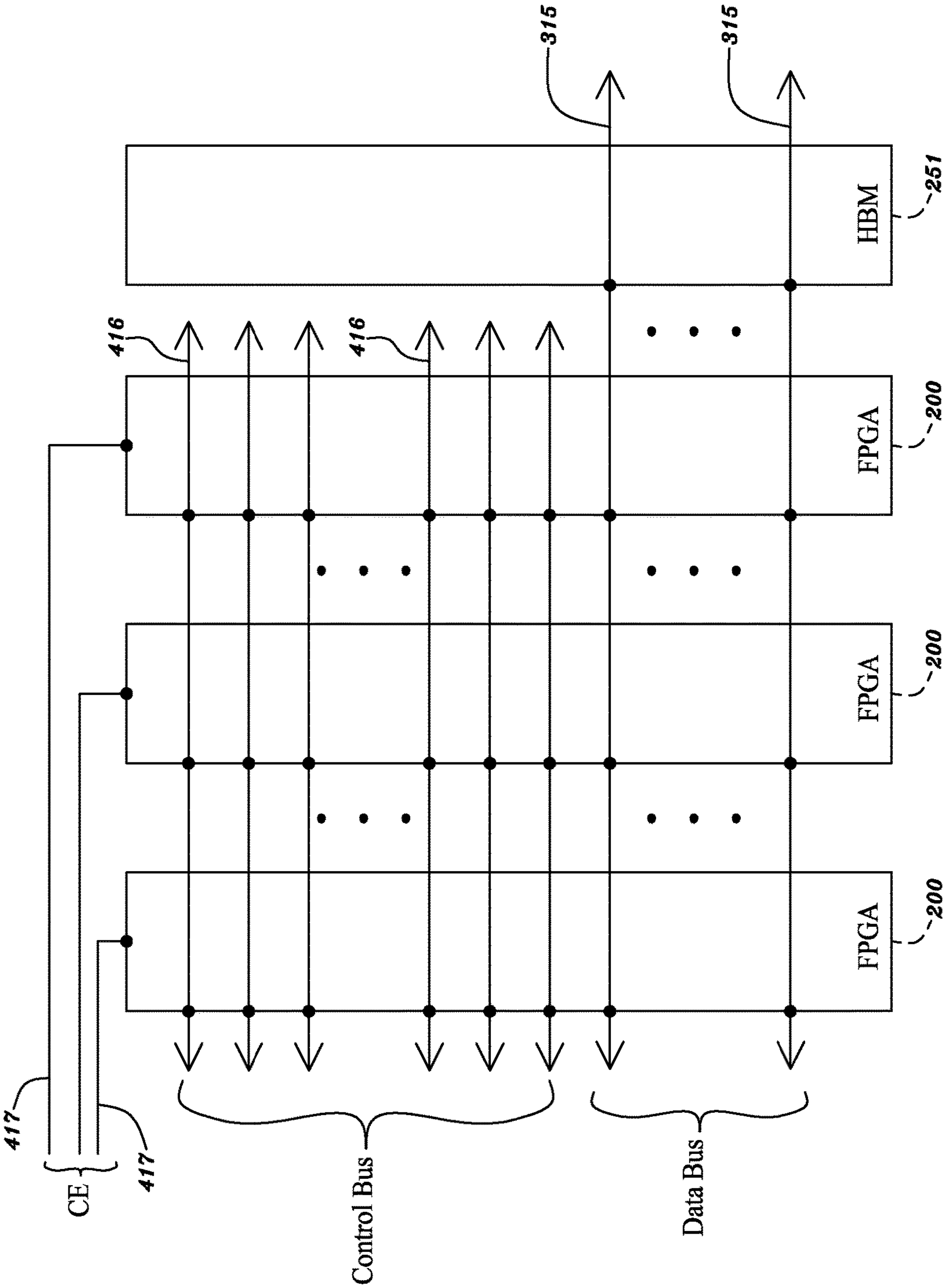
FIG. 15 is a block diagram illustrating multiple control buses for one or more standard commodity FPGA IC chips and multiple data buses for one or more standard commodity FPGA IC chips and high bandwidth memory (HBM) IC chips in accordance with the present application.

Data Buses for Standard Commodity FPGA IC Chips and High Bandwidth Memory (HBM) IC Chips FIG. 15 is a block diagram illustrating multiple control buses for one or more standard commodity FPGA IC chips and multiple data buses for one or more standard commodity FPGA IC chips and high bandwidth memory (HBM) IC chips in accordance with the present application. Referring to FIGS. 12, 14 and 15, the standard commodity logic drive 300 may be provided with multiple control buses 416 each constructed from multiple of the programmable interconnects 361 and/or multiple of the fixed interconnects 364. Alternatively, multiple of its programmable interconnects 361 may be programmed to be combined with multiple of its fixed interconnects 364 into one of its control buses 416. Alternatively, multiple of its fixed interconnects 364 may be combined into one of its control buses 416. For example, for the standard commodity logic drive 300, one of its control buses 416 may couple the input-enable (IE) pad 221, as seen in FIG. 12, of one of its standard commodity FPGA IC chips 200 to the input-enable (IE) pad(s) 221 of the other(s) of its standard commodity FPGA IC chips 200. Alternatively, one of its control buses 416 may couple one of the input-selection (IS) pads 226, such as IS1 pad as seen in FIG. 12, of one of its standard commodity FPGA IC chips 200 to one of the input-selection (IS) pads 226, such as IS1 pad as seen in FIG. 12, of the other or each of the others of its standard commodity FPGA IC chips 200. Alternatively, one of its control buses 416 may couple the out-enable (OE) pad 227, as seen in FIG. 12, of one of its standard commodity FPGA IC chips 200 to the output-enable (OE) pad(s) 221 of the other(s) of its standard commodity FPGA IC chips 200. Alternatively, one of its control buses 416 may couple one of the output-selection (OS) pads 228, such as OS1 pad as seen in FIG. 12, of one of its standard commodity FPGA IC chips 200 to one of the output-selection (OS) pads 226, such as OS1 pad as seen in FIG. 12, of the other or each of the others of its standard commodity FPGA IC chips 200. The standard commodity logic drive 300 may be provided with multiple chip-enable (CE) lines 417 each constructed from multiple of the programmable interconnects 361 and/or multiple of the fixed interconnects 364 to couple to the chip-enable (CE) pad 209 of one of its standard commodity FPGA IC chips 200. Alternatively, multiple of its programmable interconnects 361 may be programmed to be combined with multiple of its fixed interconnects 364 into one of its chip-enable (CE) lines 417 to couple to the chip-enable (CE) pad 209 of one of its standard commodity FPGA IC chips 200. Alternatively, multiple of its fixed interconnects 364 may be combined into one of its chip-enable (CE) lines 417 to couple to the chip-enable (CE) pad 209 of one of its standard commodity FPGA IC chips 200.

Furthermore, referring to FIGS. 14 and 15, the standard commodity logic drive 300 may be provided with multiple data buses 315 each constructed from multiple of the programmable interconnects 361 and/or multiple of the fixed interconnects 364. For example, for the standard commodity logic drive 300, multiple of its programmable interconnects 361 may be programmed into one of its data buses 315. Alternatively, multiple of its programmable interconnects 361 may be programmed to be combined with multiple of its fixed interconnects 364 into one of its data buses 315. Alternatively, multiple of its fixed interconnects 364 may be combined into one of its data buses 315.

Referring to FIG. 15, for the standard commodity logic drive 300, one of its data buses 315 may couple one or more of its standard commodity FPGA IC chips 200 and one or more of its high bandwidth memory (HBM) IC chips 251 (only one is shown). For example, in a first clock, said one of its data buses 315 may be switched to couple one of the I/O ports of a first one of its standard commodity FPGA IC chips 200 to one of the I/O ports of a second one of its standard commodity FPGA IC chips 200. Said one of the I/O ports of the first one of its standard commodity FPGA IC chips 200 is selected in accordance with the logic levels at the chip-enable pad 209, input-enable pad 221, input-selection pads 226 and output-enable pad 227 of the first one of its standard commodity FPGA IC chips 200 as illustrated in FIG. 12 to receive data from said one of its data buses 315; said one of the I/O ports of the second one of its standard commodity FPGA IC chips 200 is selected in accordance with the logic levels at the chip-enable pad 209, input-enable pad 221, output-enable pad 227 and output-selection pads 228 of the second one of its standard commodity FPGA IC chips 200 as illustrated in FIG. 12 to drive or pass data to said one of its data buses 315. Thereby, in the first clock, said one of the I/O ports of the second one of its standard commodity FPGA IC chips 200 may drive or pass data to said one of the I/O ports of the first one of its standard commodity FPGA IC chips 200 through said one of its data buses 315. In the first clock, said one of its data buses 315 is not used for data transmission by the other(s) of its standard commodity FPGA IC chips 200 coupling thereto or by its high bandwidth memory (HBM) IC chips 251 coupling thereto.

Further, referring to FIG. 15, in a second clock, said one of the data buses 315 may be switched to couple said one of the I/O ports of the first one of its standard commodity FPGA IC chips 200 to one of I/O ports of a first one of its high bandwidth memory (HBM) IC chips 251. Said one of the I/O ports of the first one of its standard commodity FPGA IC chips 200 is selected in accordance with the logic levels at the chip-enable pad 209, input-enable pad 221, input-selection pads 226 and output-enable pad 227 of the first one of its standard commodity FPGA IC chips 200 as illustrated in FIG. 12 to receive data from said one of the data buses 315; said one of the I/O ports of the first one of its high bandwidth memory (HBM) IC chips 251 is selected to drive or pass data to said one of its data buses 315. Thereby, in the second clock, said one of the I/O ports of the first one of its high bandwidth memory (HBM) IC chips 251 may drive or pass data to said one of the I/O ports of the first one of its standard commodity FPGA IC chips 200 through said one of its data buses 315. In the second clock, said one of its data buses 315 is not used for data transmission by the other(s) of its standard commodity FPGA IC chips 200 coupling thereto or by the other(s) of its high bandwidth memory (HBM) IC chips 251 coupling thereto.

Further, referring to FIG. 15, in a third clock said one of its data buses 315 may be switched to couple said one of the I/O ports of the first one of its standard commodity FPGA IC chips 200 to said one of the I/O ports of the first one of its high bandwidth memory (HBM) IC chips 251. Said one of the I/O ports of the first one of its standard commodity FPGA IC chips 200 is selected in accordance with the logic levels at the chip-enable pad 209, input-enable pad 221, output-enable pad 227 and output-selection pads 228 of the first one of its standard commodity FPGA IC chips 200 as illustrated in FIG. 12 to drive or pass data to said one of its data buses 315; said one of the I/O ports of the first one of its high bandwidth memory (HBM) IC chips 251 is selected to receive data from said one of its data buses 315. Thereby, in the third clock, said one of the I/O ports of the first one of its standard commodity FPGA IC chips 200 may drive or pass data to said one of the I/O ports of the first one of its high bandwidth memory (HBM) IC chips 251 through said one of its data buses 315. In the third clock, said one of its data buses 315 is not used for data transmission by the other(s) of its standard commodity FPGA IC chips 200 coupling thereto or by the other(s) of its high bandwidth memory (HBM) IC chips 251 coupling thereto.

Further, referring to FIG. 15, in a fourth clock said one of its data buses 315 may be switched to couple said one of the I/O ports of the first one of its high bandwidth memory (HBM) IC chips 251 to one of I/O ports of a second one of its high bandwidth memory (HBM) IC chips 251. Said one of the I/O ports of the second one of its high bandwidth memory (HBM) IC chips 251 is selected to drive or pass data to said one of its data buses 315; said one of the I/O ports of the first one of its high bandwidth memory (HBM) IC chips 251 is selected to receive data from said one of its data buses 315. Thereby, in the fourth clock, said one of the I/O ports of the second one of its high bandwidth memory (HBM) IC chips 251 may drive or pass data to said one of the I/O ports of the first one of its high bandwidth memory (HBM) IC chips 251 through said one of its data buses 315. In the fourth clock, said one of its data buses 315 is not used for data transmission by its standard commodity FPGA IC chips 200 coupling thereto or by the other(s) of its high bandwidth memory (HBM) IC chips 251 coupling thereto.

Architecture of Operation in standard commodity FPGA IC Chip

Figure 16:
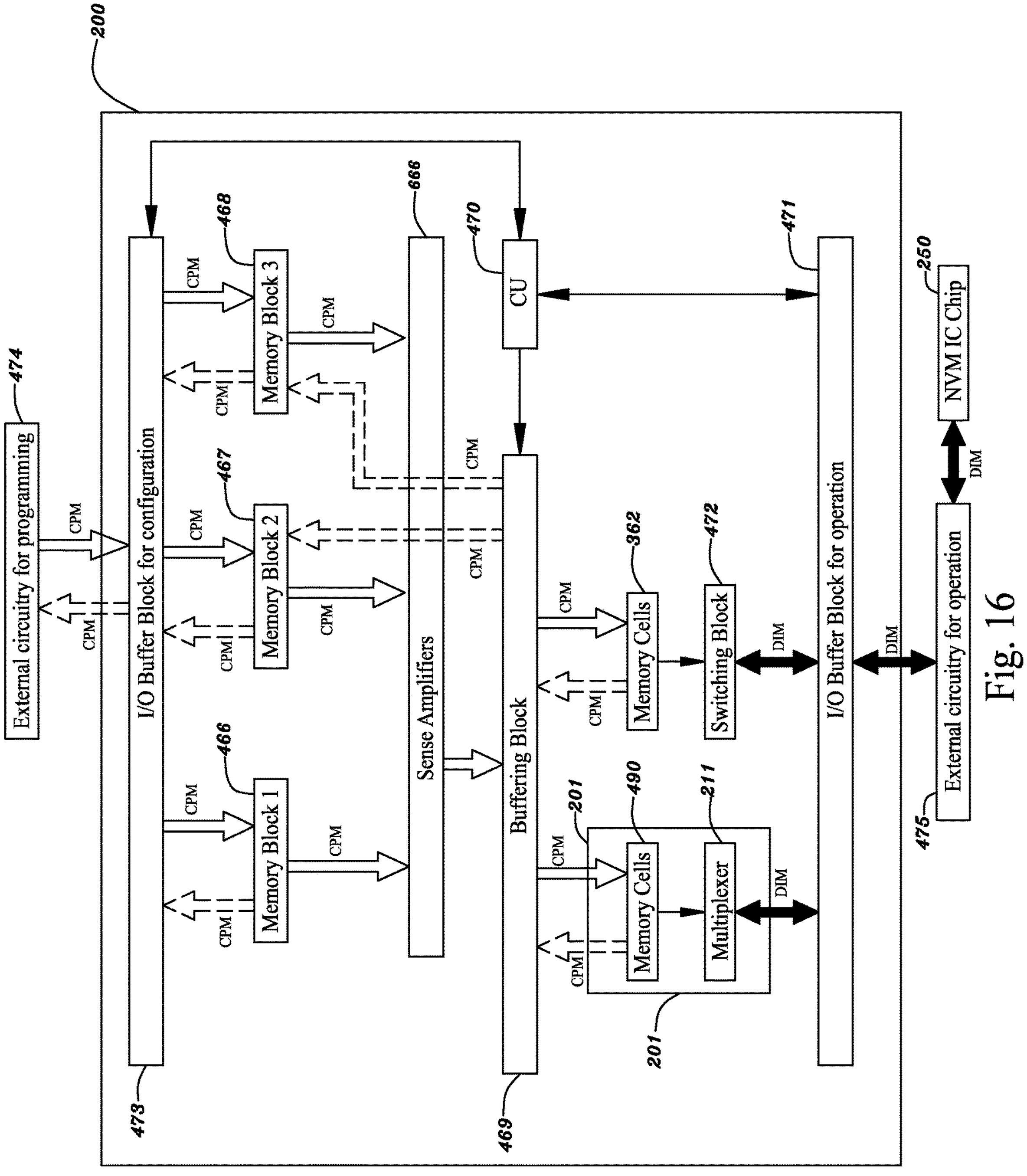
FIG. 16 is a block diagrams showing architecture of programming and operation in a standard commodity FPGA IC chip in accordance with the present application.

FIG. 16 is a block diagrams showing architecture of programming and operation in a standard commodity FPGA IC chip in accordance with the present application. Referring to FIG. 16, each of the standard commodity FPGA IC chips 200 in the standard commodity logic drive 300 as illustrated in FIG. 14 may include three non-volatile memory blocks 466, 467 and 468 each composed of the non-volatile memory cells 870, 880 or 907 as seen in FIG. 8A-8F, 9A-9H, 10A-10I or 11A-11F arranged in an array. The non-volatile memory cells 870, 880 or 907, i.e., configuration programming memory (CPM) cells, in the non-volatile memory block 466 are configured to save or store original resulting values or programming codes for the look-up tables (LUT) 210 as seen in FIG. 4 or programming codes for the cross-point switches 379 as seen in FIG. 7, i.e., configuration programming memory (CPM) data. The original resulting values or programming codes, i.e., configuration programming memory (CPM) data, may be passed from configuration programming memory (CPM) cells of circuits 474 external of said each of the standard commodity FPGA IC chips 200, such as configuration programming memory (CPM) cells of the NVM IC chips 250 in the standard commodity logic drive 300 as illustrated in FIG. 14 or configuration programming memory (CPM) cells of circuits outside the standard commodity logic drive 300 as illustrated in FIG. 14, to the non-volatile memory cells 870, 880 or 907, i.e., configuration programming memory (CPM) cells, in the non-volatile memory block 466 through a plurality of the small I/O circuit 203 as seen in FIG. 3B in an I/O buffering block 473 of said each of the standard commodity FPGA IC chips 200 to be stored or saved in the non-volatile memory cells 870, 880 or 907, i.e., configuration programming memory (CPM) cells, in the non-volatile memory block 466.

Referring to FIG. 16, the non-volatile memory cells 870, 880 or 907, i.e., configuration programming memory (CPM) cells, in the non-volatile memory block 467 are configured to save or store immediately-previously self-configured resulting values or programming codes for the look-up tables (LUT) 210 as seen in FIG. 4 or programming codes for the cross-point switches 379 as seen in FIG. 7, i.e., configuration programming memory (CPM) data. The non-volatile memory cells 870, 880 or 907, i.e., configuration programming memory (CPM) cells, in the non-volatile memory block 468 are configured to save or store currently self-configured resulting values or programming codes for the look-up tables (LUT) 210 of the programmable logic block (LB) 201 as seen in FIG. 4 or programming codes for the cross-point switches 379 as seen in FIG. 7, i.e., configuration programming memory (CPM) data.

Referring to FIG. 16, said each of the standard commodity FPGA IC chips 200 may include the sense amplifiers 666 as illustrated in FIG. 8A-8F, 9A-9H, 10A-10I or 11A-11F each configured to sense configuration programming memory (CPM) data saved or stored in one of the non-volatile memory cells 870, 880 or 907, i.e., configuration programming memory (CPM) cells, in one of the non-volatile memory blocks 466, 467 and 468 into the output "Out" of said each of the sense amplifiers 666 coupling to the buffering block 469. For an example, said each of the standard commodity FPGA IC chips 200 may include a a control block 470 configured (1) to send control commands to circuits external of said each of the standard commodity FPGA IC chips 200 through the small I/O circuits 203 as seen in FIG. 3B in the I/O buffering blocks 471 and/or 473 and/or (2) to receive control commands from circuits external of said each of the standard commodity FPGA IC chips 200 through the small I/O circuits 203 as seen in FIG. 3B in the I/O buffering blocks 471 and/or 473. Further, the control block 470 is configured to send control commands to the buffering block 469 (1) to store, save or register, in turn and one by one, the outputs "Out" of the sense amplifiers 666 and (2) to generate parallel outputs to a determined group of the memory cells 490, i.e., configuration programming memory (CPM) cells, for the look-up tables (LUT) 210 of the programmable logic block (LB) 201 as illustrated in FIG. 4 and/or the memory cells 362, i.e., configuration programming memory (CPM) cells, for the cross-point switches 379 as illustrated in FIG. 7 in a switching block 472. The configuration programming memory (CPM) data stored in a group of the memory cells 490 couple to the first set of inputs of the multiplexer 211 of the programmable logic block (LB) 201 to define a function of the programmable logic block (LB) 201 as illustrated in FIG. 4; the configuration programming memory (CPM) data stored in a group of the memory cells 362 couple to the cross-point switches 379 as seen in FIG. 7 in the switching block 472 to program the cross-point switches 379.

Referring to FIG. 16, a data information memory (DIM) stream may pass from data information memory (DIM) cells of circuits 475 external of said each of the standard commodity FPGA IC chips 200, such as SRAM or DRAM cells of the HBM IC chips 251 in the standard commodity logic drive 300 as illustrated in FIG. 14, to the second set of the multiplexer 211 of the programmable logic block (LB) 201 through the small I/O circuits 203 as seen in FIG. 3B in the I/O buffering block 471 of said each of the standard commodity FPGA IC chips 200. Alternatively, the multiplexer 211 of the programmable logic block (LB) 201 may generate its output to data information memory (DIM) cells of the circuits 475 external of said each of the standard commodity FPGA IC chips 200, such as SRAM or DRAM cells of the HBM IC chips 251 in the standard commodity logic drive 300 as illustrated in FIG. 14, through one of the small I/O circuits 203 as seen in FIG. 3B in the I/O buffering block 471. The cross-point switches 379 in the switching block 472 may pass a data information memory (DIM) stream to or from data information memory (DIM) cells of the circuits 475 external of said each of the standard commodity FPGA IC chips 200, such as SRAM or DRAM cells of the HBM IC chips 251 in the standard commodity logic drive 300 as illustrated in FIG. 14, through one of the small I/O circuits 203 as seen in FIG. 3B in the I/O buffering block 471.

Referring to FIG. 16, the data for the data information memory (DIM) stream saved or stored in the SRAM or DRAM cells, i.e., data information memory (DIM) cells, in the HBM IC chips may be backed up or stored in the NVM IC chips 250 in the standard commodity logic drive 300 as illustrated in FIG. 14 or circuits outside the standard commodity logic drive 300 as illustrated in FIG. 14. Thereby, when the power supply of the standard commodity logic drive 300 is turned off, the data for the data information memory (DIM) stream stored in the NVM IC chips 250 may be kept.

For reconfiguration for artificial intelligence (A1), machine learning or deep learning, the current operation, such as AND logic operation, of the programmable logic blocks (LB) 201 as illustrated in FIG. 4 may be self-reconfigured to another operation, such as NAND logic operation, by reconfiguring the resulting values or programming codes, i.e., configuration programming memory (CPM) data, in the memory cells 490 for the look-up table (LUT) 210 as seen in FIG. 4. The current switching state of the cross-point switches 379 as seen in FIG. 7 may be self-reconfigured to another switching state by reconfiguring the programming codes, i.e., configuration programming memory (CPM) data, in the memory cells 362. The currently self-reconfigured resulting values or programming codes, i.e., configuration programming memory (CPM) data, in the memory cells 490 and 362 may be passed to the non-volatile memory cells 870, 880 or 907, i.e., configuration programming memory (CPM) cells, in the non-volatile memory block 468 through the buffering block 469 and then saved or stored in the non-volatile memory cells 870, 880 or 907 in the non-volatile memory block 468. Also, the immediately-previously self-reconfigured resulting values or programming codes, i.e., configuration programming memory (CPM) data, in the memory cells 490 and 362 may be passed to the non-volatile memory cells 870, 880 or 907, i.e., configuration programming memory (CPM) cells, in the non-volatile memory block 467 through the buffering block 469 and then saved or stored in the non-volatile memory cells 870, 880 or 907 in the non-volatile memory block 467. Further, the original, immediately-previously self-reconfigured and currently self-reconfigured resulting values or programming codes may be passed from the non-volatile memory cells 870, 880 or 907 in the respective non-volatile memory blocks 466, 467 and 468 to configuration programming memory (CPM) cells of the circuits 474 external of said each of the standard commodity FPGA IC chips 200 through a plurality of the small I/O circuit 203 as seen in FIG. 3B in the I/O buffering block 473. The configuration programming memory (CPM) data, i.e., the resulting values or programming codes for the look-up tables (LUT) 210 as seen in FIG. 4 or programming codes for the cross-point switches 379 as seen in FIG. 7, may be passed from the configuration programming memory (CPM) cells of the circuits 474 external of said each of the standard commodity FPGA IC chips 200 to the non-volatile memory cells 870, 880 or 907 in either of the non-volatile memory blocks 467 and 468 through the small I/O circuits 203 as seen in FIG. 3B in the I/O buffering block 473 to be stored or saved in the non-volatile memory cells 870, 880 or 907 in said either of the memory blocks 467 and 468 to reconfigure the programmable logic blocks (LB) 201 and/or the cross-point switches 379.

Accordingly, referring to FIG. 16, for each of the standard commodity logic drives 300 as illustrated in FIG. 14, when it is powered on, each of its standard commodity FPGA IC chips 200 may reload the configuration programming memory (CPM) data stored or saved in the non-volatile memory cells 870, 880 or 907 in one of the three non-volatile memory blocks 466, 467 and 468 of said each of its standard commodity FPGA IC chips 200 to the memory cells 490 and 362 of said each of its standard commodity FPGA IC chips 200. During operation, said each of its standard commodity FPGA IC chips 200 may be reset to reload the configuration programming memory (CPM) data stored or saved in the non-volatile memory cells 870, 880 or 907 in the non-volatile memory block 466 or 467 of said each of its standard commodity FPGA IC chips 200 to the memory cells 490 and 362 of said each of its standard commodity FPGA IC chips 200.

Specification for Processes for Fabricating Semiconductor Chip

FIG. 17 is a schematically cross-sectional view showing a semiconductor chip in accordance with an embodiment of the present application. Referring to FIG. 17, the standard commodity FPGA IC chips 200, DPIIC chips 410, dedicated I/O chips 265, dedicated control chip 260, NVM IC chips 250, DRAM IC chips 321, HBM IC chips 251, GPU chips 269*a* and CPU chip 269*b* as seen in FIG. 14 may have a structure for a semiconductor chip 100 mentioned as below. The semiconductor chip 100 may include (1) a semiconductor substrate 2, such as silicon substrate, GaAs substrate, SiGe substrate or Silicon-On-Insulator (SOI) substrate; (2) multiple semiconductor devices 4 in or over a semiconductor-device area of the semiconductor substrate 2; (3) a first interconnection scheme 20 for a chip (FISC) over the semiconductor substrate 2, provided with one or more interconnection metal layers 6 coupling to the semiconductor devices 4 and one or more insulating dielectric layers 12 each between neighboring two of the interconnection metal layers 6; (4) a passivation layer 14 over the first interconnection scheme (FISC) 20, wherein the first interconnection scheme 20 has multiple first metal pads at bottoms of multiple openings 14*a* in the passivation layer 14; (5) a second interconnection scheme 29 for a chip (SISC) optionally provided over the passivation layer 14, provided with one or more interconnection metal layers 27 coupling to the first metal pads of the first interconnection scheme (FISC) 20 through the openings 14*a* and one or more polymer layers 42 each between neighboring two of the interconnection metal layers 27, under a bottommost one of the interconnection metal layers 27 or over a topmost one of the interconnection metal layers 27, wherein the second interconnection scheme 29 has multiple second metal pads at bottoms of multiple openings 42*a* in the topmost one of its polymer layers 42; and (6) multiple micro-bumps or micro-pillars 34 on the second metal pads of the second interconnection scheme 29 (SISC) or, if the SISC 29 is not provided, on the first metal pads of the first interconnection scheme 20 (FISC).

Referring to FIG. 17, the semiconductor devices 4 may include a memory cell, a logic circuit, a passive device, such as resistor, capacitor, inductor or filter, or an active device, such as p-channel and/or n-channel MOS devices. The semiconductor devices 4 may compose the multiplexer 211 of the programmable logic blocks (LB) 201, memory cells 490 for the look-up table 210 of the programmable logic blocks (LB) 201, memory cells 362 for the cross-point switches 379 and small I/O circuits 203, as illustrated in FIG. 12, for each of its standard commodity FPGA IC chips 200 as seen in FIG. 14. The semiconductor devices 4 may compose the memory cells 362 for the cross-point switches 379 and small I/O circuits 203, as illustrated in FIG. 13, for each of its DPIIC chips 410 as seen in FIG. 14. The semiconductor devices 4 may compose the large and small I/O circuits 341 and 203 for each of the dedicated I/O chips 265 as seen in FIG. 14. The semiconductor devices 4 may compose the control block 470 and I/O buffer blocks 417 and 473 as seen in FIG. 16.

Referring to FIG. 17, each of the interconnection metal layers 6 of the FISC 20 may include (1) a copper layer 24 having lower portions in openings in a lower one of the insulating dielectric layers 12, such as SiOC layers having a thickness between 3 nm and 500 nm, and upper portions having a thickness between 3 nm and 500 nm over the lower one of the insulating dielectric layers 12 and in openings in an upper one of the insulating dielectric layers 12, (2) an adhesion layer 18, such as titanium or titanium nitride having a thickness between 1 nm and 50 nm, at a bottom and sidewall of each of the lower portions of the copper layer 24 and at a bottom and sidewall of each of the upper portions of the copper layer 24, and (3) a seed layer 22, such as copper, between the copper layer 24 and the adhesion layer 18, wherein the copper layer 24 has a top surface substantially coplanar with a top surface of the upper one of the insulating dielectric layers 12.

Referring to FIG. 17, the passivation layer 14 containing a silicon-nitride, SiON or SiCN layer having a thickness greater than 0.3 μm for example may protect the semiconductor devices 4 and the interconnection metal layers 6 from being damaged by moisture foreign ion contamination, or from water moisture or contamination form external environment, for example sodium mobile ions. Each of the openings 14*a* in the passivation layer 14 may have a transverse dimension, from a top view, of between 0.5 and 20 μm.

Referring to FIG. 17, each of the interconnection metal layers 27 of the SISC 29 may include (1) a copper layer 40 having lower portions in openings in one of the polymer layers 42 having a thickness between 0.3 μm and 20 μm, and upper portions having a thickness 0.3 μm and 20 μm over said one of the polymer layers 42, (2) an adhesion layer 28*a*, such as titanium or titanium nitride having a thickness between 1 nm and 50 nm, at a bottom and sidewall of each of the lower portions of the copper layer 40 and at a bottom of each of the upper portions of the copper layer 40, and (3) a seed layer 28*b*, such as copper, between the copper layer 40 and the adhesion layer 28*a*, wherein said each of the upper portions of the copper layer 40 may have a sidewall not covered by the adhesion layer 28*a*.

Referring to FIG. 17, each of the micro-bumps or micro-pillars 34 may be of various types. A first type of micro-bumps or micro-pillars 34 may include (1) an adhesion layer 26*a*, such as titanium (Ti) or titanium nitride (TiN) layer having a thickness between 1 nm and 50 nm, on the second metal pads of the second interconnection scheme 29 (SISC) or, if the SISC 29 is not provided, on the first metal pads of the first interconnection scheme 20 (FISC), (2) a seed layer 26*b*, such as copper, on the adhesion layer 26*a* and (3) a copper layer 32 having a thickness between 1 μm and 60 μm on the seed layer 26*b*. Alternatively, a second type of micro-bumps or micro-pillars 34 may include the adhesion layer 26*a*, seed layer 26*b* and copper layer 32 as mentioned above, and may further include a tin-containing solder cap 33 shown in FIG. 19A such as tin or a tin-silver alloy having a thickness between 1 μm and 50 μm on the copper layer 32.

Embodiment for Fan-Out Interconnection Scheme of Logic Drive (FOISD)

One or more semiconductor chips 100 as seen in FIG. 17 may be packaged using a fan-out interconnection technology (FOIT). For achieving the fan-out interconnection technology (FOIT), the semiconductor chips 100 may be mounted on a fan-out interconnection scheme of a logic drive (FOISD). The fan-out interconnection scheme may be provided with high density interconnects for fan-out of the semiconductor chips 100 and interconnection between two of the semiconductor chips 100.

Figure 18A:
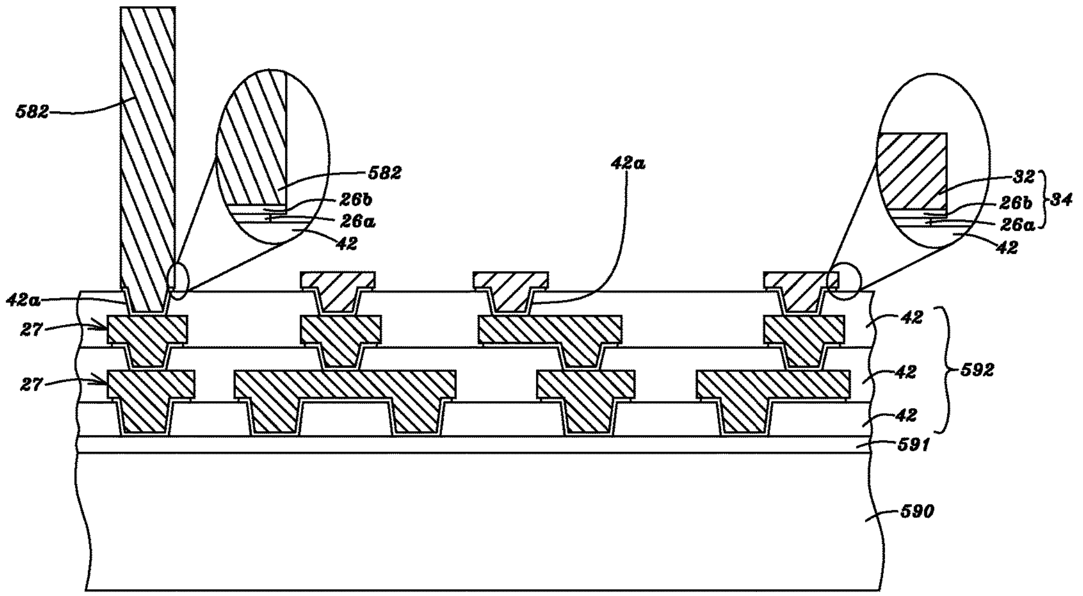
FIGS. 18A and 18B are schematically cross-sectional views showing a fan-out interconnection scheme of a logic drive (FOISD) in accordance with various embodiments of the present application.
Figure 18B:
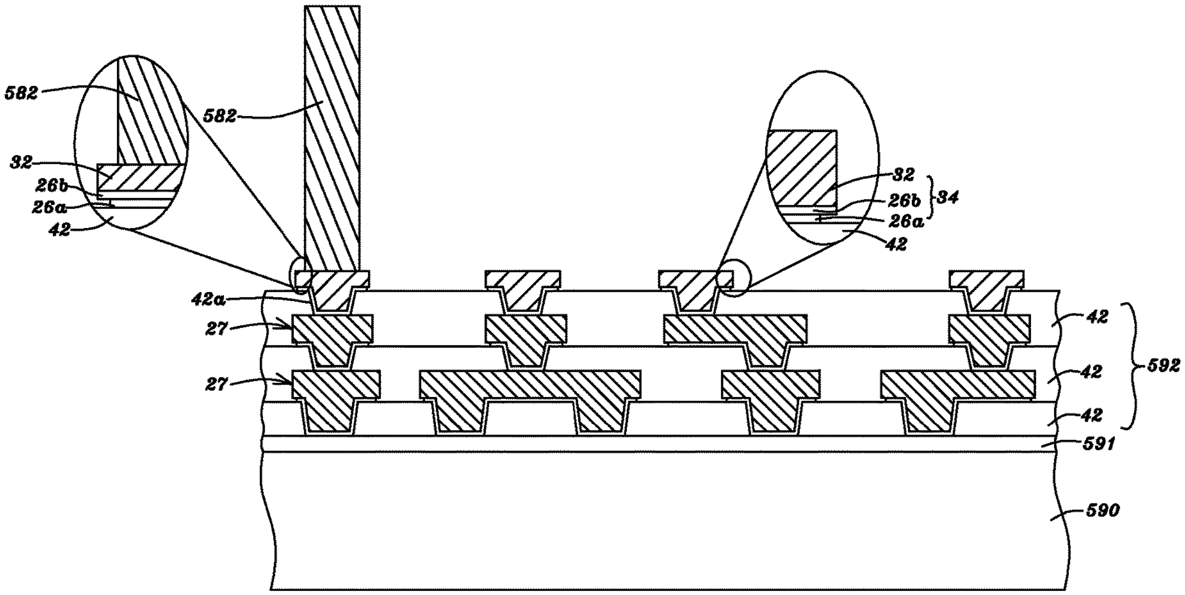

FIGS. 18A and 18B are schematically cross-sectional views showing a fan-out interconnection scheme of a logic drive (FOISD) in accordance with various embodiments of the present application. Referring to FIGS. 18A and 18B, a temporary substrate (T-Sub) 590, such as glass or silicon substrate, may be provided, and a sacrificial bonding layer 591 may be formed on the temporary substrate (T-sub) 590. The sacrificial bonding layer 591 may have the temporary substrate (T-sub) 590 to be easily debonded or released from the FOISD. For example, the sacrificial bonding layer 591 may be a material of light-to-heat conversion (LTHC) that may be deposited on the temporary substrate (T-sub) 590 by printing or spin-on coating and then cured or dried with a thickness of about 1 micrometer or between 0.5 and 2 micrometers. The LTHC material may be a liquid ink containing carbon black and binder in a mixture of solvents.

Referring to FIGS. 18A and 18B, a fan-out interconnection scheme 592 of a logic drive (FOISD) may be formed on the sacrificial bonding layer 591. The specification for the FOISD 592 may be referred to the specification for the SISC 29 in FIG. 17. The FOISD 592 may include one or more interconnection metal layers 27 as illustrated in FIG. 17 and one or more polymer layers 42 as illustrated in FIG. 17 each between neighboring two of the interconnection metal layers 27, under a bottommost one of the interconnection metal layers 27 or over a topmost one of the interconnection metal layers 27, wherein the fan-out interconnection scheme (FOISD) 592 may have multiple third metal pads at bottoms of multiple openings **42*a* in the topmost one of its polymer layers 42**.

Referring to FIG. 18A, multiple micro-bumps or micro-pillars 34 of the first type as illustrated in FIG. 17 may be formed on a first group of the third metal pads of the FOISD 592, and multiple through package vias (TPVs) 582 may be formed on a second group of the third metal pads of the FOISD 592. Each of the micro-bumps or micro-pillars 34 may have its adhesion layer **26*a* to be formed on the first group of third metal pads of the FOISD 592. Each of the through package vias (TPVs) 582 may include (1) an adhesion layer 26*a* as illustrated in FIG. 17 on the second group of third metal pads of the FOISD 592, (2) a seed layer 26*b* as illustrated in FIG. 17 on the adhesion layer 26*a* and (3) a copper layer having a thickness between 5 μm and 300 μm on the seed layer 26*b*. Each of the through package vias (TPVs) 582 on the second group of third metal pads of the FOISD 592 may have a height greater than that of the micro-bumps or micro-pillars 34 on the first group of third metal pads of the FOISD 592**.

Alternatively, referring to FIG. 18B, multiple micro-bumps or micro-pillars 34 of the first type as illustrated in FIG. 17 may be formed on all of the third metal pads of the FOISD 592, and multiple through package vias (TPVs) 582 may be formed on some of the micro-bumps or micro-pillars 34 on the third metal pads of the FOISD 592. Each of the micro-bumps or micro-pillars 34 may have its adhesion layer **26*a* to be formed on the third metal pads of the FOISD 592. Each of the through package vias (TPVs) 582 may include a copper layer having a thickness between 5 μm and 300 μm on the copper layer 32 of some of the micro-bumps or micro-pillars 34 on the third metal pads of the FOISD 592**.

Chip-to-FOISD Assembly

Figure 19A:
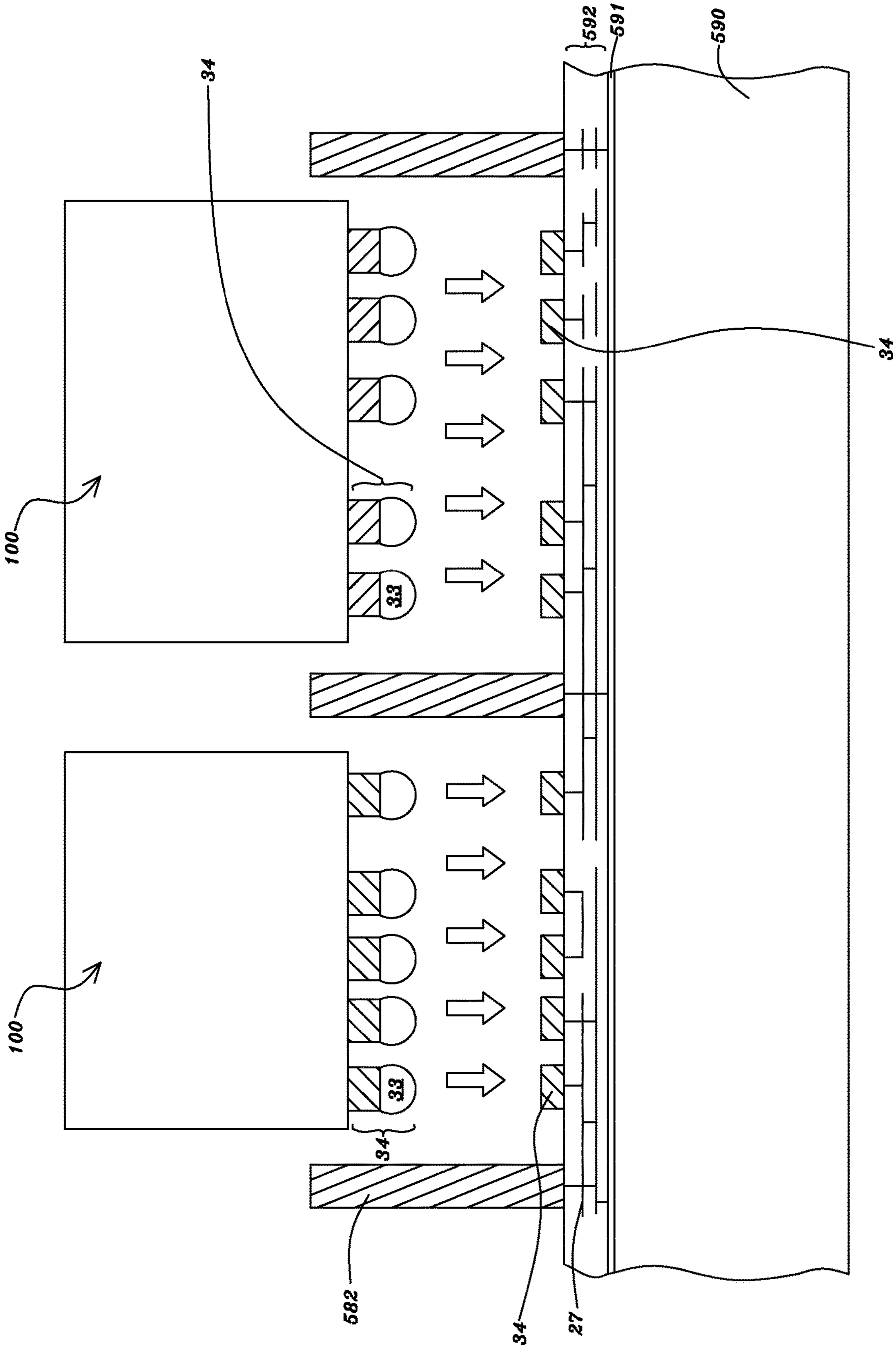
FIGS. 19A-19B are schematically cross-sectional views showing a process for fabricating a chip package for a logic drive in accordance with an embodiment of the present application.
Figure 19B:
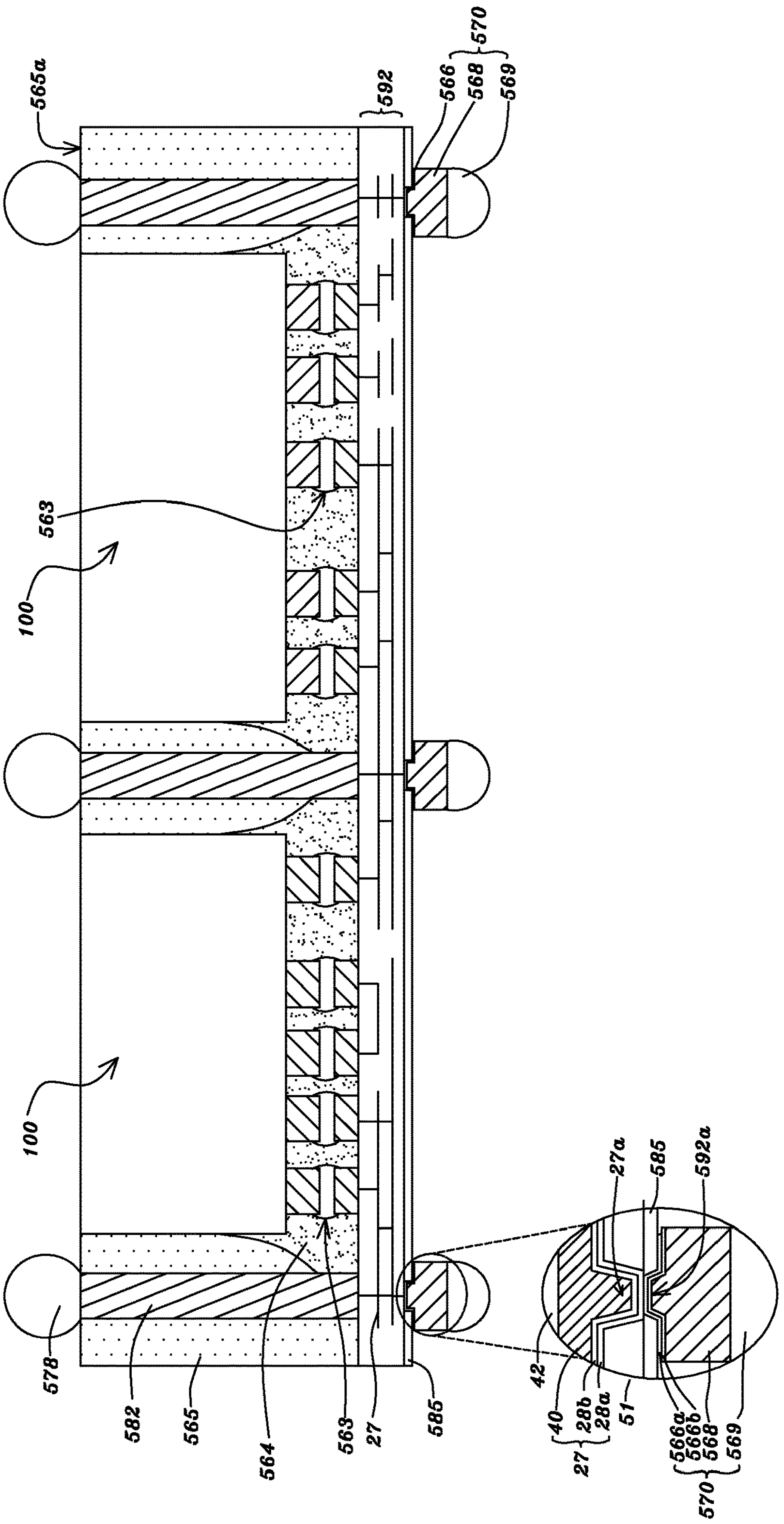

FIGS. 19A-19B are schematically cross-sectional views showing a process for fabricating a chip package for a logic drive in accordance with an embodiment of the present application. First, referring to FIG. 19A, each of the semiconductor chips 100 as seen in FIG. 17 may have its micro-pillars or micro-bumps 34 of the second type to be bonded to the first type of micro-pillars or micro-bumps 34 preformed on the FOISD 592.

Referring to FIG. 19A, each of the semiconductor chips 100 may have the micro-pillars or micro-bumps 34 of the second type to be bonded to the first type of micro-pillars or micro-bumps 34 of the FOISD 592. For example, the second type of micro-pillars or micro-bumps 34 of said each of the semiconductor chips 100 may have the tin-containing solder cap 33 to be bonded onto the copper layer 32 of the micro-pillars or micro-bumps 34 of the first type preformed on the FOISD 592 into multiple bonded contacts 563 as seen in FIG. 19B, wherein each of the micro-pillars or micro-bumps 34 of the second type of said each of the semiconductor chips 100 may have its copper layer 32 having a thickness greater than that of the copper layer 32 of the micro-pillars or micro-bumps 34 of the first type preformed on the FOISD 592. Next, an underfill 564, such as epoxy resins or compounds, may be filled into a gap between each of the semiconductor chips 100 and the FOISD 592, enclosing the bonded contacts 563. Next, a polymer layer 565, e.g., resin or compound, may be applied to fill a gap between each neighboring two of the semiconductor chips 100, to fill a gap between each neighboring two of the through package vias (TPVs) 582, and to cover a backside of said each of the semiconductor chips 100 and a top of each of the through package vias (TPVs) 582. Next, a polishing or grinding process may be applied to remove a top portion of the polymer layer 565 and a top portion of one or more of the semiconductor chips 100 until the top of said each of the through package vias (TPVs) 582 is exposed. Next, the temporary substrate (T-sub) 590 may be released from the FOISD 592. For example, in the case that the sacrificial bonding layer 591 is the material of light-to-heat conversion (LTHC) and the temporary substrate (T-sub) 590 is a glass substrate, a laser light, such as YAG laser having a wavelength of about 1064 nm, an output power between 20 and 50 W and a spot size of 0.3 mm in diameter at a focal point, may be generated to pass from the backside of the temporary substrate (T-sub) 590 to the sacrificial bonding layer 591 through the temporary substrate (T-sub) 590 to scan the sacrificial bonding layer 591 at a speed of 8.0 m/s, for example, such that the sacrificial bonding layer 591 may be decomposed and thus the temporary substrate 590 may be easily released from the sacrificial bonding layer 591. Next, an adhesive peeling tape (not shown) may be attached to a backside of the sacrificial bonding layer 591, opposite to a front side thereof having the FOISD 592 formed thereon. Next, the sacrificial bonding layer 591 may be released or peeled from the FOISD 592 by pulling the adhesive peeling tape. Thereby, for the FOISD 592, each of the metal vias **27*a* of its bottommost interconnection metal layer 27 in its bottommost polymer layer 51 is exposed as a fourth metal pad, that is, the adhesion layer 28***a* of its bottommost interconnection metal layer 27 is exposed at the surface of the contact. Next, a polymer layer 585 may be formed on a bottom surface of the FOISD 592, and multiple openings 585*a* in the polymer layer 585 may expose the fourth metal pads of the FOISD 592. Next, multiple metal bumps 570 may be formed on the fourth metal pads of the FOISD 592. Each of the metal bumps 570 may be of various types. A first type of metal bumps 570 may include (1) an adhesion layer 566*a*, such as titanium (Ti) or titanium nitride (TiN) layer having a thickness between 1 nm and 200 nm, on and under the adhesion layer 28*a* of the bottommost interconnection metal layer 27 of the FOISD 592, (2) a seed layer 566*b*, such as copper, on and under the adhesion layer 566*a* and (3) a copper layer 568 having a thickness between 1 μm and 50 μm on and under the seed layer 566*b*. Alternatively, a second type of metal bumps 570 may include the adhesion layer 566*a*, seed layer 566*b* and copper layer 568 as mentioned above, and may further include a tin-containing solder cap 569 such as tin or a tin-silver alloy having a thickness between 1 μm and 50 μm on and under the copper layer 568. Next, multiple metal bumps 578, such as tin-containing solder, may be optionally formed on the tops of the through package vias (TPVs) 582.

Figure 20:
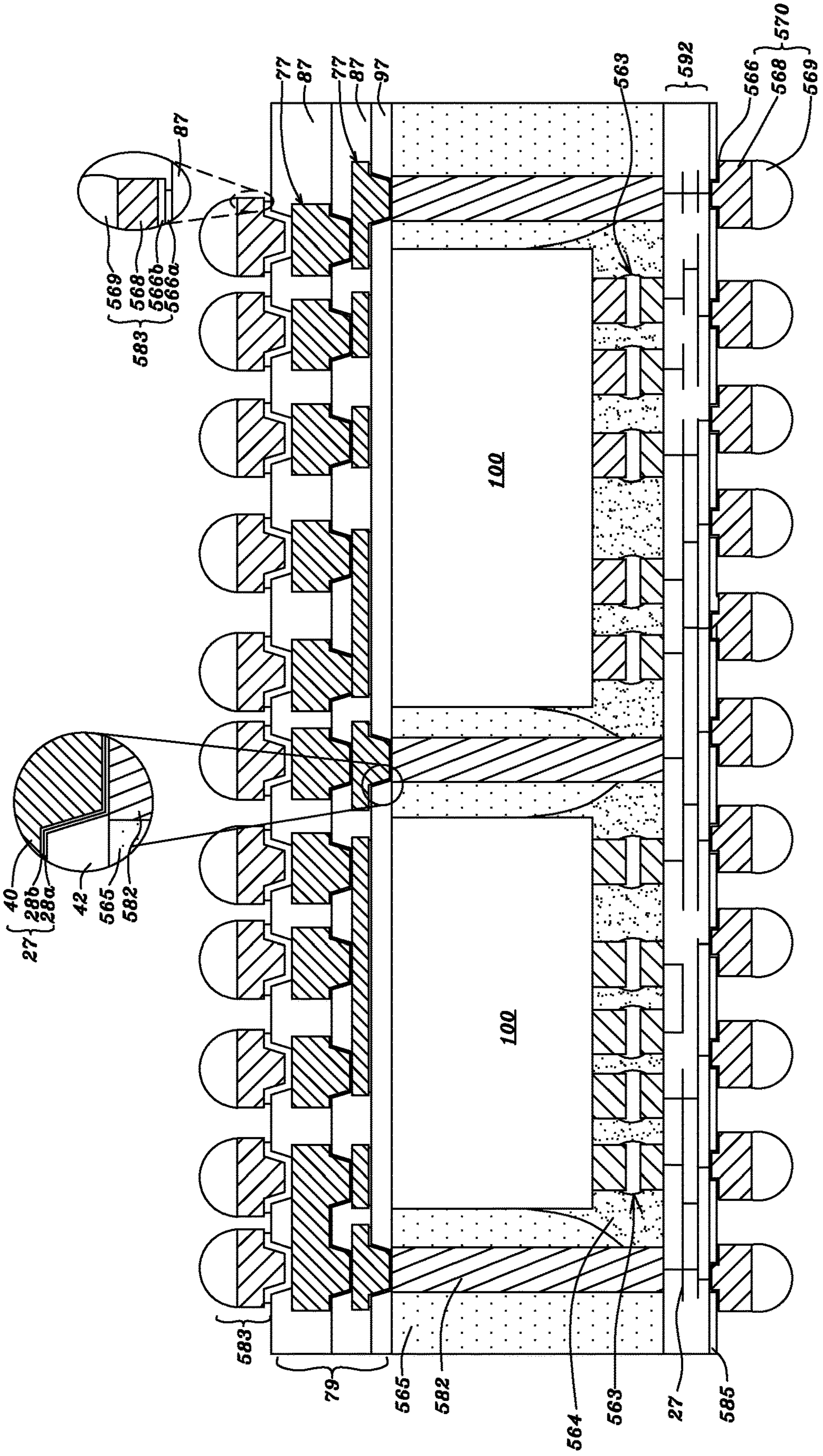
FIG. 20 is a schematically cross-sectional view showing a chip package for a logic drive in accordance with another embodiment of the present application.

Alternatively, FIG. 20 is a schematically cross-sectional view showing a chip package for a logic drive in accordance with another embodiment of the present application. Referring to FIGS. 18A, 18B, 19B and 20, after the polishing or grinding process is performed as illustrated in FIG. 19B and before the temporary substrate (T-sub) 590 is released from the FOISD 592 as illustrated in FIG. 19B, a backside metal interconnection scheme 79 for the FOIT logic drive 300 (BISD) as seen in FIG. 20 may be formed on and above the semiconductor chips 100, polymer layer 565 and through package vias (TPVs) 582. The specification for the backside metal interconnection scheme 79 may be referred to the specification for the SISC 29 in FIG. 17. The backside metal interconnection scheme (BISD) 79 may include one or more interconnection metal layers 27 coupling to the through package vias (TPVs) 582 and one or more polymer layers 42 each between neighboring two of the interconnection metal layers 77, under a bottommost one of the interconnection metal layers 77 or over a topmost one of the interconnection metal layers 77, wherein the backside metal interconnection scheme (BISD) 79 has multiple fifth metal pads at bottoms of multiple openings 42*a* in the topmost one of its polymer layers 42.

Figure 21:
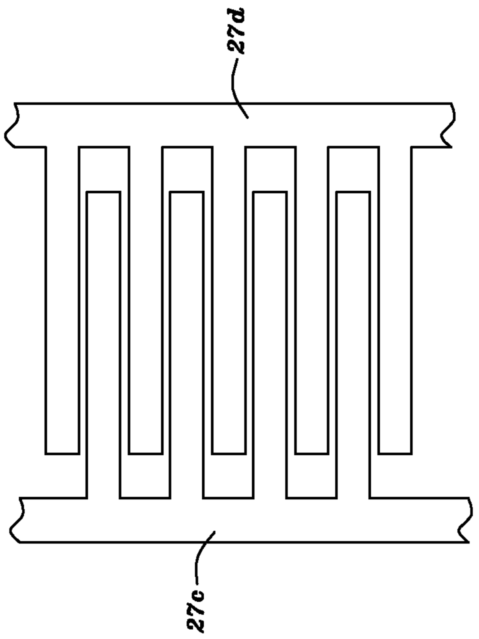
FIG. 21 is a top view showing a metal plane in accordance with an embodiment of the present application.

Next, referring to FIG. 20, multiple metal bumps 583 may be optionally formed on the fifth metal pads of the backside metal interconnection scheme (BISD) 79. The specification for the metal bumps 583 may be referred to the specification for the metal bumps 570 as illustrated in FIG. 19B. FIG. 21 is a top view showing a metal plane in accordance with an embodiment of the present application. Referring to FIG. 21, one of the interconnection metal layers 27 of the BISD 79 as seen in FIG. 20 may include two metal planes 27*c* and 27*d* used as a power plane and ground plane respectively, wherein the metal planes 27*c* and 27*d* may have a thickness, for example, between 5 μm and 50 μm. Each of the metal planes 77*c* and 77*d* may be layout as an interlaced or interleaved shaped structure or fork-shaped structure, that is, each of the metal planes 27*c* and 27*d* may have multiple parallel-extension sections and a transverse connection section coupling the parallel-extension sections. One of the metal planes 27*c* and 27*d* may have one of the parallel-extension sections arranged between neighboring two of the parallel-extension sections of the other of the metal planes 27*c* and 27*d*.

Next, referring to FIG. 20, the temporary substrate (T-sub) 590 and sacrificial bonding layer 591 as illustrated in FIG. 19B may be released from the FOISD 592. Next, the polymer layer 585 and metal bumps 570 as illustrated in FIG. 19B may be formed on the fourth metal pads of the FOISD 592.

Package-On-Package (POP) or Stack-Package Assembly for FOIT LOGIC Drives

Figure 22:
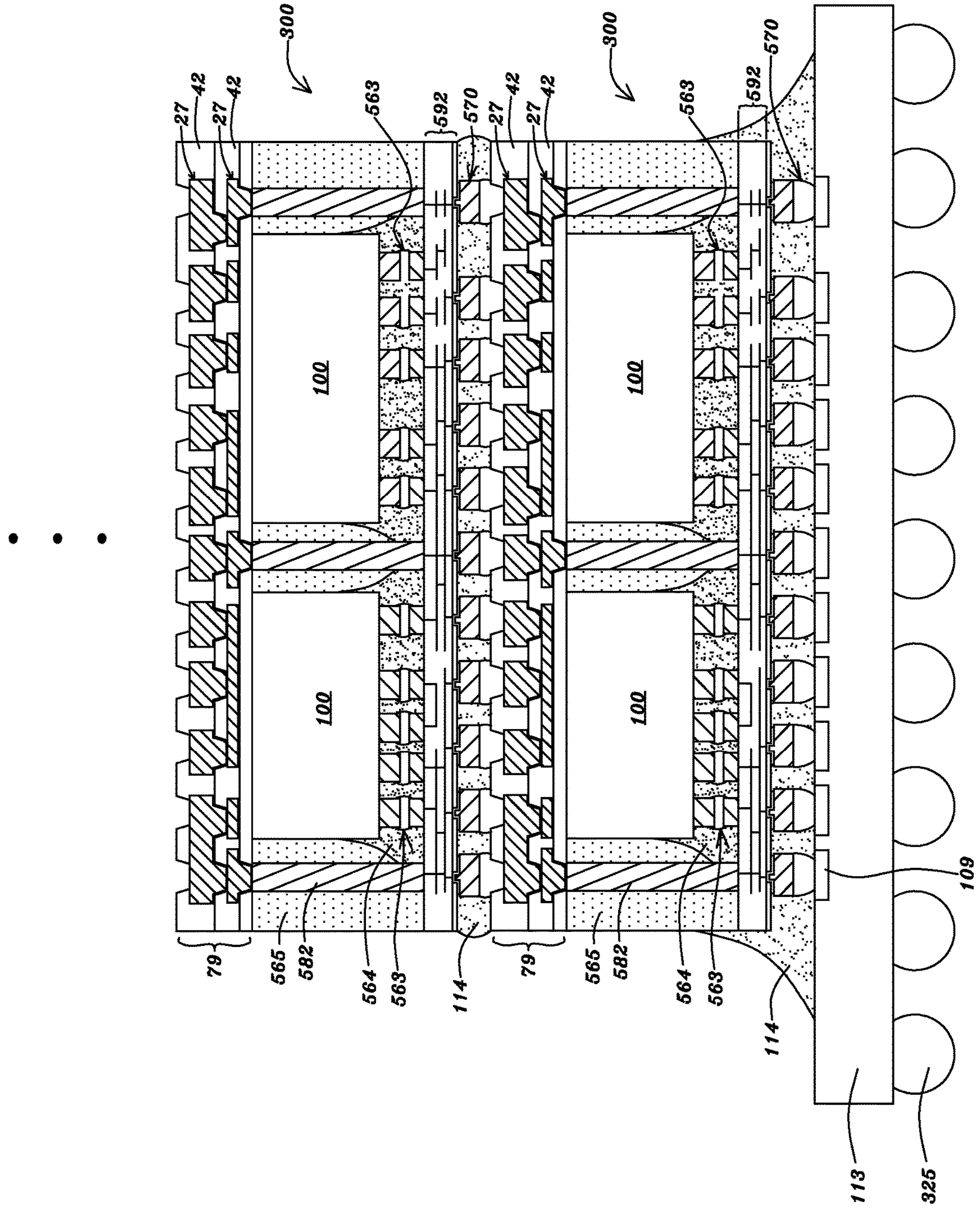
FIG. 22 is a schematically cross-sectional view showing a package-on-package assembly in accordance with an embodiment of the present application.

FIG. 22 is a schematically cross-sectional view showing a package-on-package assembly in accordance with an embodiment of the present application. Referring to FIG. 22, multiple logic drives 300 as seen in FIG. 20 may be stacked together. An upper one of the logic drives 300 may have its metal bumps 570 bonded to the fifth metal pads of the backside metal interconnection scheme (BISD) 79 of a lower one of the logic drives 300, and an underfill 114 may be filled between the upper and lower ones of the logic drives 300, enclosing the metal bumps 570 between the upper and lower ones of the logic drives 300. The bottommost one of the logic drives 300 may have its metal bumps 570 bonded to multiple metal pads 109 of a circuit board 113 at a top surface thereof, and an underfill 114 may be filled between the bottommost one of the logic drives 300 and the circuit board 113, enclosing the metal bumps 570 between the bottommost one of the logic drives 300 and the circuit board 113. Multiple solder balls 325 are formed on a bottom surface of the circuit board 113.

Evolution and Reconfiguration for Logic Drive

Figure 23:
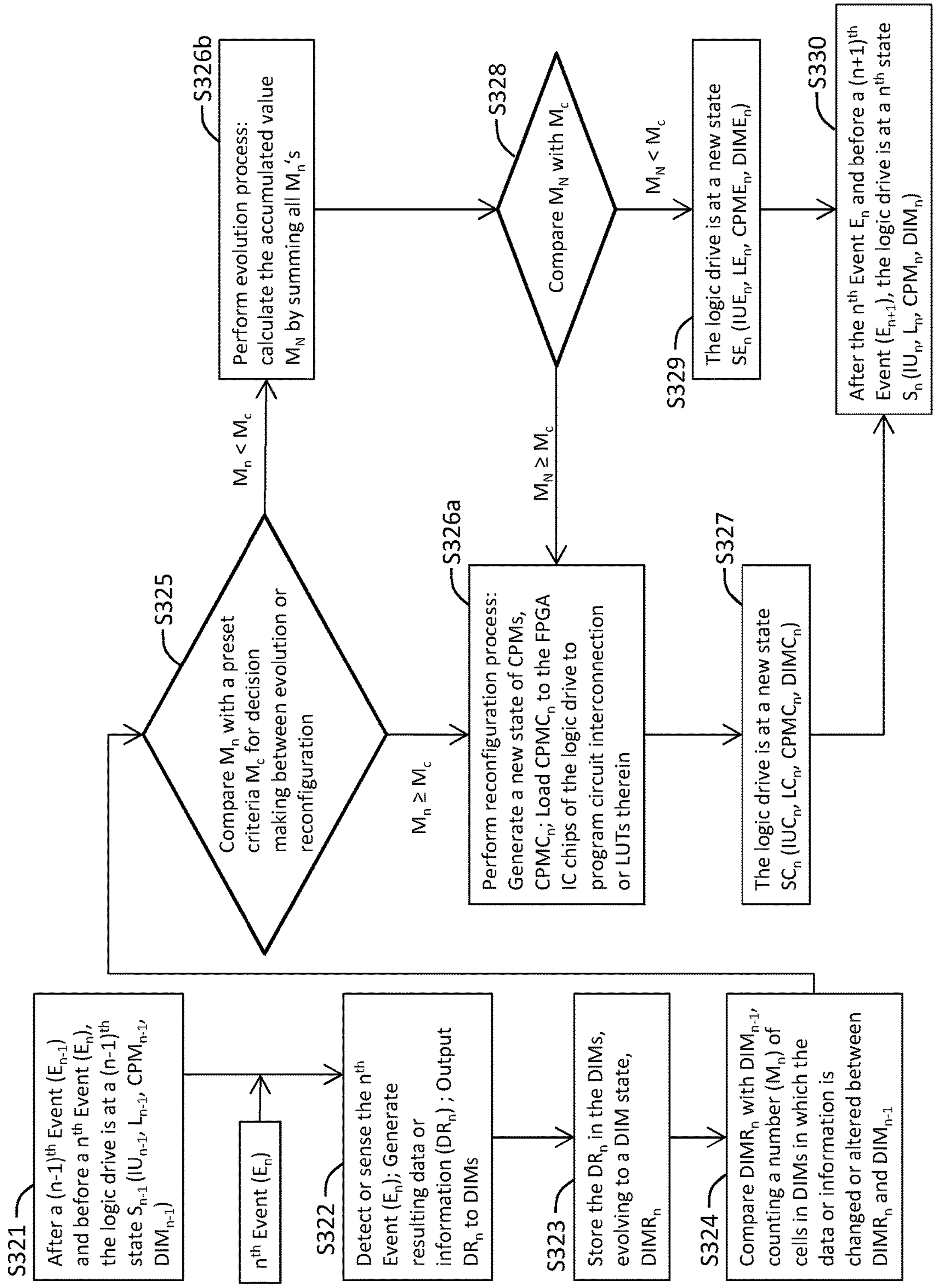
FIG. 23 is a block diagram illustrating an algorithm or flowchart for evolution and reconfiguration for a commodity standard logic drive in accordance with an embodiment of the present application.

FIG. 23 is a block diagram illustrating an algorithm or flowchart for evolution and reconfiguration for a commodity standard logic drive in accordance with an embodiment of the present application. Referring to FIG. 23, a state (S) of the standard commodity logic drive 300 comprises an integral unit (IU), a logic state (L), a CPM state and a DIM state, and can be described as S (IU, L, CPM, DIM). The evolution or reconfiguration of the state of the standard commodity logic drive 300 is performed as follows:

In a step S321, after a $(n-1)^{th}$ Event ($E_{n-1}$) and before a $n^{th}$ Event ($E_n$), the standard commodity logic drive 300 is at a $(n-1)^{th}$ state $S_{n-1}$ ($IU_{n-1}$, $L_{n-1}$, $CPM_{n-1}$, $DIM_{n-1}$), wherein n is a positive integer, i.e., 1, 2, 3, . . . or N.

In a step S322, when the standard commodity logic drive 300, or a machine, system or device external of the standard commodity logic drive 300, is subject to the $n^{th}$ Event ($E_n$), it detects or senses the $n^{th}$ Event ($E_n$) and generate a $n^{th}$ signal ($F_n$); the detected or sensed signal ($F_n$) is input to the standard commodity logic drive 300. The standard commodity FPGA IC chips 200 of the standard commodity logic drive 300 perform processing and computing based on the $n^{th}$ signal ($F_n$), generate a $n^{th}$ resulting data or information ($DR_n$) and output the $n^{th}$ resulting data or information ($DR_n$) to be stored in the data information memory (DIM) cells, such as in the HBM IC chips 251, of the standard commodity logic drive 300.

In a step S323, the data information memory (DIM) cells store the $n^{th}$ resulting data or information ($DR_n$) and are evolved to a data infirmary memory (DIM) state for the $n^{th}$ resulting data or information ($DR_n$), i.e., $DIMR_n$.

In a step S324, the standard commodity FPGA IC chips 200, or other control, processing or computing IC chips, such as dedicated control chip 260, GPU chips 269*a* and/or CPU chips 269*b* as seen in FIG. 14, of the standard commodity logic drive 300 may perform comparison between the $n^{th}$ resulting data or information ($DR_n$) for DIMR, and the $(n-1)^{th}$ resulting data or information for data information memory cells, i.e., $DIM_{n-1}$, by detecting the changes between them, for example, and then may count a number ($M_n$) of the data information memory (DIM) cells in which the data information memory (DIM) is changed or altered between $DIMR_n$ and $DIM_{n-1}$.

In a step S325, the standard commodity FPGA IC chips 200 or the other control, processing or computing IC chips of the standard commodity logic drive 300 compare the number ($M_n$) to preset criteria ($M_c$) for decision making between evolution or reconfiguration of the standard commodity logic drive 200.

Referring to FIG. 23, if the number ($M_n$) is equal to or larger than the preset criteria ($M_c$), the event $E_n$ is a grand event, and a step S326*a* continues for the reconfiguration route. If the bumber ($M_n$) is smaller than the preset criteria ($M_c$), the event $E_n$ is not a grand event, and a step S326*b* continues for the evolution route.

In the step 316*a*, the standard commodity logic drive 300 may perform the reconfiguration process to generate a new state of configuration programming memory (CPMs) (data or information), i.e., $CPMC_n$. For example, based on the $n^{th}$ resulting data or information (DR) for $DIMR_n$, new truth tables may be generated and then may be transformed into the new state of configuration programming memory ($CPMC_n$). The configuration programming memory ($CPMC_n$) (data or information) is loaded to the standard commodity FPGA IC chips 200 of the standard commodity logic drive 300 to program the programmable interconnects 361 as illustrated in FIG. 7 and/or look-up tables 210 (LUTs) as illustrated in FIG. 4 therein. After the reconfiguration, in a step S327, the standard commodity logic drive 300 is at a new state $SC_n$ ($IUC_n$, $LC_n$, $CPMC_n$, $DIMC_n$), comprising the new states of $IUC_n$, $LC_n$, $CPMC_n$, and $DIMC_n$. The new state $SC_n$ ($IUC_n$, $LC_n$, $CPMC_n$, $DIMC_n$) will be defined, in a step S330, as a final state $S_n$ ($IU_n$, $L_n$, $CPM_n$, $DIM_n$) of the standard commodity logic drive 300 after the grand event $E_n$.

In the step S326*b*, the standard commodity logic drive 300 may perform the evolution process. The standard commodity FPGA IC chips 200, or the other control, processing or computing IC chips of the standard commodity logic drive 300, may calculate the accumulated value ($M_N$) by summing all of the numbers ($M_n$'s), wherein n is: (A) from 1 to n if no grand event happened; or (B) from (R+1) to n if a last grand event happened at the $R^{th}$ event $E_R$, wherein R is a positive integer. In a step S328, the standard commodity FPGA IC chips 200, or the other control, processing or computing IC chips, of the standard commodity logic drive 300 may compare the number $M_N$ to $M_c$. If the number $M_N$ is equal to or larger than the preset criteria $M_c$, the reconfiguration process in the step S326*a* as described and specified above continues. If the number $M_N$ is smaller than the preset criteria $M_c$, a step S329 for evolution continues. In the step S329, the standard commodity logic drive 300 is at an evolution state $SE_n$($IUE_n$, $LE_n$, $CPME_n$, $DIME_n$), wherein the states of L, CPM do not change from that after the event $E_{n-1}$, that means, $LE_n$ is the same as $L_{n-1}$, $CPME_n$ is the same as $CPM_{n-1}$; while $DIME_n$ is $DIMR_n$. The evolution state $SE_n$ ($IUE_n$, $LE_n$, $CPME_n$, $DIME_n$) may be defined, in the step S330, as a final state $S_n$ ($IU_n$, $L_n$, $CPM_n$, $DIM_{n-1}$) of the logic drive after the evolution event $E_n$.

Referring to FIG. 23E, the steps S321 through S330 may be repeated for the $(n+1)^{th}$ Event $E_{n+1}$.

The reconfiguration in the step S326*a* of generating the new states of $IUC_n$, $DIMC_n$ comprises (i) Reorganization of the integral unit (IU) and/or (ii) condense or concise processes as follows:

I. Reorganization of the Integral Unit (IU):

The FPGA IC chip 200 may perform the reconfiguration by reorganizing the integral units (IU) in an integral unit (IU) state. Each integral unit (IU) state may comprise several integral units (IU). Each integral unit (IU) is related to a certain logic function and may comprise several CPMs and DIMs. The reorganization may change (1) the number of integral units (IU) in the integral unit (IU) state, (2) the number and content (the data or information therein) in CPM and DIM in each of the integral units (IU). The reconfiguration may further comprise (1) relocating original CPM or DIM data in different locations or addresses, or (2) storing new CPM or DIM data in some locations or addresses originally storing original CPM or DIM data or in new locations or addresses. If data in CPM or DIM are identical or similar, they may be removed from CPM or DIM memory cells after reconfiguration and may be stored in remote storage memory cells in devices external of the logic drive 300 (and/or stored in NAND flash memory cells of the NVM IC chips 250 in the logic drive 300 as seen in FIG. 14).

Criteria are established for the identical or similar cells in CPM or DIM: (1) A machine/system external of the logic drive 300 (and/or the FPGA IC chips 200 or other control, processing or computing IC chips of the logic drive 300, such as dedicated control chip 260, GPU chips 269*a* and/or CPU chips 269*b* as seen in FIG. 14) checks the $DIM_n$ to find identical memories, and then keeping only one memory of all identical memories in the CPM or DIM of SRAM or DRAM cells in the HBM IC chips 251 in the logic drive 300 and NAND flash memory cells in the NVM IC chips 250 in the logic drive 300, removing all other identical memories from CPM or DIM memory cells after reconfiguration, wherein the identical memories may be stored in remote storage memory cells in devices external of the logic drive (and/or stored in NAND flash memory cells of the NVM IC chips 250 in the logic drive 300); and/or (2) A machine/system external of the logic drive 300 (and/or the FPGA IC chips 200 or other control, processing or computing IC chips of the logic drive 300, such as dedicated control chip 260, GPU chips 269*a* and/or CPU chips 269*b* as seen in FIG. 14) checks the $DIM_n$ to find similar memories (similarity within a given percentage x %, for example, is equal to or smaller than 2%, 3%, 5% or 10% in difference), and keeping only one or two memories of all similar memories in the CPM or DIM of SRAM or DRAM cells in the HBM IC chips 251 in the logic drive 300 and NAND flash memory cells in the NVM IC chips 250 in the logic drive 300, removing all other identical memories from CPM or DIM memory cells after reconfiguration, wherein the similar memories may be stored in remote storage memory cells in devices external of the logic drive 300 (and/or stored in NAND flash memory cells of the NVM IC chips 250 in the logic drive); alternatively, a representative memory (data or information) of all similar memories may be generated and kept in the CPM or DIM of SRAM or DRAM cells in the HBM IC chips 251 in the logic drive 300 and NAND flash memory cells in the NVM IC chips 250 in the logic drive 300, removing all other similar memories from CPM or DIM memory cells after reconfiguration, wherein the similar memories may be stored in remote storage memory cells in devices external of the logic drive 300 (and/or stored in NAND flash memory cells of the NVM IC chips 250 in the logic drive 300).

II. Learning Processes:

The logic drive 300 may further provide capability of a learning process. Based on $S_n$ ($IU_n$, $L_n$, $CPM_n$, $DIM_n$), performing an algorithm to select or screen (memorize) useful, significant and important integral units IUs, logics Ls, CPMs and DIMs, and forget non-useful, non-significant or non-important integral units IUs, logics Ls, CPMs or DIMs by storing the useful, significant and important integral units IUs, logics Ls, CPMs and DIMs in the CPM or DIM of SRAM or DRAM cells in the HBM IC chips 251 in the logic drive 300 and NAND flash memory cells in NVM IC chips 250 in the logic drive 300, removing all other identical memories from CPM or DIM memory cells after reconfiguration, wherein the identical memories may be stored in remote storage memory cells in devices external of the logic drive 300 (and/or stored in NAND flash memory cells of the NVM IC chips 250 in the logic drive 300). The selection or screening algorithm may be based on a given statistical method, for example, based on the frequency of use of integral units IUs, logics Ls, CPMs and or DIMs in the previous n events. For example, if a logic function of a logic gate is not used frequently, the logic gate may be used for another different function. Another example, the Bayesian inference may be used for generating a new state of the logic drive after learning $SL_n$ ($IUL_n$, $LL_n$, $CPML_n$, $DIML_n$).

FIG. 24 shows two tables illustrating reconfiguration for a commodity standard logic drive in accordance with an embodiment of the present application. For a configuration programming memory state $CPM_{(i,j,k)}$, the subscript of "i" means a set "i" of configuration programming memory, and the subscripts of "j" and "k" mean an address "j" for storing data "k" for configuration programming memory. For a data information memory state $DIM_{(n,b,c)}$, the subscript of "a" means a set "a" of data information memory, and the subscripts of "b" and "c" mean an address "b" for storing data "c" for data information memory. Referring to FIG. 24, before reconfiguration, the standard commodity logic drive 300 may include three integral units $IU_{(n-1)a}$, $IU_{(n-1)b}$ and $IU_{(n-1)c}$ in the event $E_{(n-1)}$, wherein the integral unit $IU_{(n-1)a}$ may perform a logic state $L_{(n-1)a}$ based on a configuration programming memory state $CPM_{(a,1,1)}$ and store data information memory states $DIM_{(a,1,1')}$ and $DIM_{(a,2,2')}$, the integral unit $IUT_{(n-1)b}$ may perform a logic state $L_{(n-1)b}$ based on configuration programming memory states $CPM_{(b,2,2)}$ and $CPM_{(b,3,3)}$ and store data information memory states $DIM_{(b,3,3')}$ and $DIM_{(b,4,4')}$ and the integral unit $IU_{(n-1)c}$ may perform a logic state $L_{(n-1)c}$ based on a configuration programming memory state $CPM_{(c,4,4)}$ and store data information memory states $DIM_{(c,5,5')}$, $DIM_{(c,6,6')}$ and $DIM_{(c,7,6')}$. During reconfiguration, the standard commodity logic drive 300 may include four integral units $IUC_{ne}$, $IUC_{nf}$, $IUC_{ng}$ and $IUC_{nh}$ in the event $E_n$, wherein the integral unit $IUC_{ne}$ may perform a logic state $LC_{ne}$ based on a configuration programming memory state $CPMC_{(e,1,1)}$ and store data information memory states $DIMC_{(e,1,1')}$ and $DIMC_{(e,2,2')}$, the integral unit $IUC_{nf}$ may perform a logic state $LC_{nf}$ based on configuration programming memory states $CPMC_{(f,2,4)}$ and $CPMC_{(f,3,5)}$ and store data information memory states $DIMC_{(f,3,8')}$, $DIMC_{(f,4,9')}$ and $DIMC_{(f,5,10')}$, the integral unit $IUC_{ng}$ may perform a logic state $LC_{ng}$ based on configuration programming memory states $CPMC_{(g,4,2)}$ and $CPMC_{(g,5,5)}$ and store data information memory states $DIMC_{(g,6,11')}$ and $DIMC_{(g,8,5')}$, and the integral unit $IUC_{nh}$ may perform a logic state $LC_{nh}$ based on a configuration programming memory state $CPMC_{(h,6,6)}$ and store data information memory states $DIMC_{(h,7,7')}$ and $DIMC_{(g,9,9')}$.

In comparison between the states before reconfiguration and during reconfiguration, the CPM data "4" originally stored in the CPM address "4" is kept to be stored in the CPM address "2" during reconfiguration; the CPM data "2" originally stored in the CPM address "2" is kept to be stored in the CPM address "4" during reconfiguration; the CPM data "3" is different from the CPM data "2" by less than 5% in difference and is removed from the CPM cells during reconfiguration and may be stored in remote storage memory cells in devices external of the logic drive 100 and/or stored in NAND flash memory cells of the NVM IC chips 250 in the logic drive 300 as seen in FIG. 14. The DIM data "5'" originally stored in the DIM address "5" is kept during reconfiguration to be stored in the DIM address "8"; the DIM data "6'" originally stored in both DIM addresses "6" and "7" is kept during reconfiguration with only one copy to be stored in the DIM address "9"; the DIM data "3'" and "4'" are removed from the DIM cells during reconfiguration and may be stored in remote storage memory cells in devices external of the logic drive 300 and/or stored in NAND flash memory cells of the NVM IC chips 250 in the logic drive 300; the DIM addresses "3", "4", "5", "6" and "7" store new DIM data "8'", "9'", "10'", "11'" and "7'" respectively, during reconfiguration; new DIM addresses "8" and "9" store original DIM data "5'" and "6'" respectively, during reconfiguration.

FOISD-to-FOISD Assembly for Logic and Memory Drives

Figure 25:
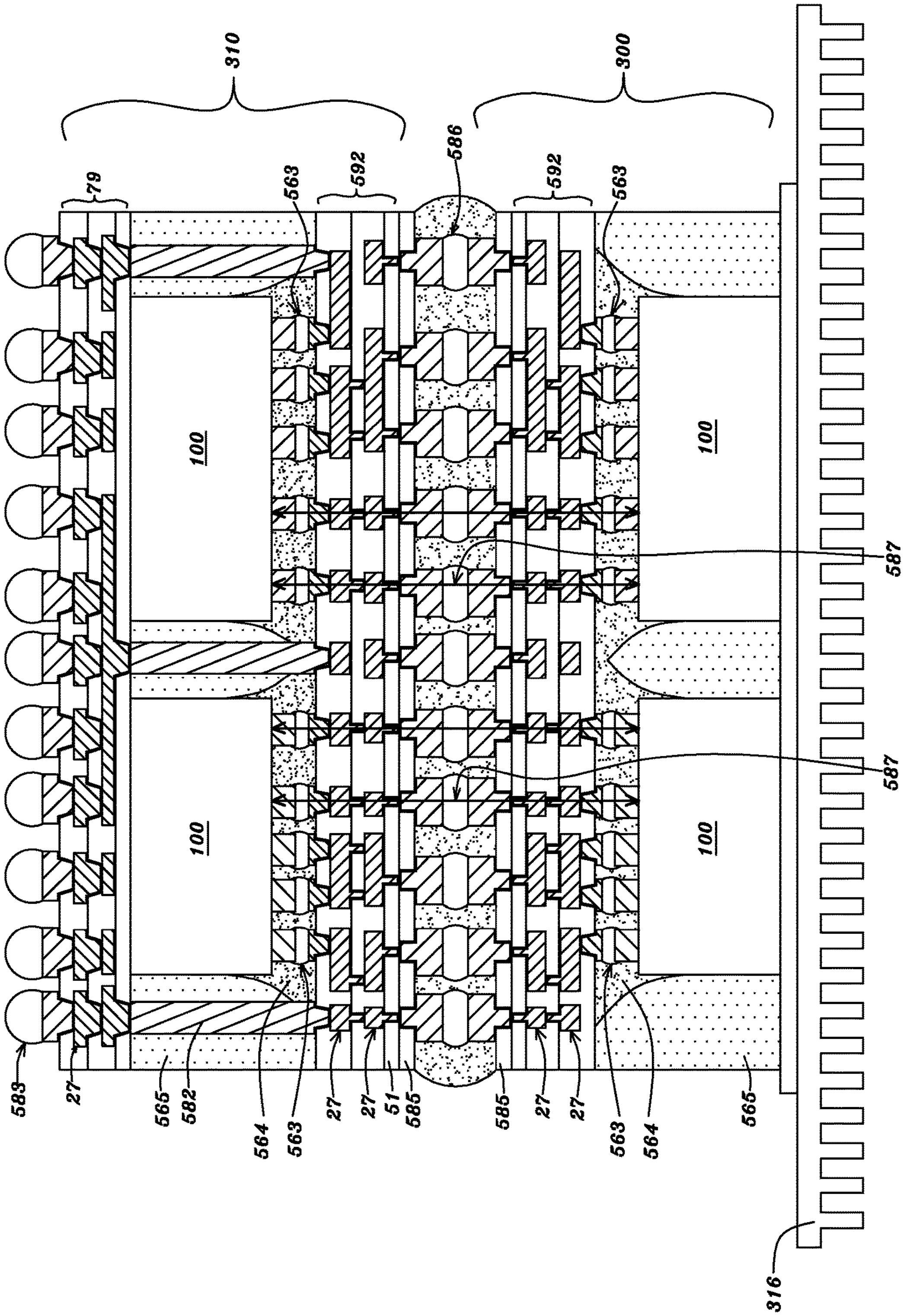
FIG. 25 is a schematically cross-sectional view showing an assembly for FOIT logic and memory drives in accordance with an embodiment of the present application.

FIG. 25 is a schematically cross-sectional view showing an assembly for FOIT logic and memory drives in accordance with an embodiment of the present application. Referring to FIG. 25, all of the FPGA IC chips 200, GPU chips 269*a*, CPU chips 269*b* and dedicated programmable interconnection IC chips 410 in the logic drives 300 as seen in FIG. 14 may not be provided but multiple memory chips, e.g., HBM IC chips, cache SRAM chips, DRAM IC chips, or NVMIC chips for MRAM or RRAM, may be provided for a memory drive 310 that also include the FOISD 592, through package vias (TPVs) 582, backside metal interconnection scheme (BISD) 79 and metal bumps 570 and 583 as illustrated in FIG. 20. The memory drive 310 may have its metal bumps 570 to be bonded to the metal bumps 570 of the logic drive 300 to form multiple bonded contacts 586 between the memory drive 310 and logic drive 300. Multiple stacked vias 587 may be composed of the bonded contacts 586, multiple stacked portions of the interconnection metal layers 27 of the FOISDs 592 of the logic and memory drives 300 and 310 and the bonded contacts 563 of the logic and memory drives 300 and 310 aligned in a vertical direction to form vertical signal paths between one of the semiconductor chips 100 of the logic drive 300, such as FPGA IC chip 200, GPU chip 269*a* or CPU chip 269*c* as seen in FIG. 14, and one of the semiconductor chips 100 of the memory drive 310, such as HBM IC chip or DRAM IC chip. A plurality of the vertical stacked path 587 having the number equal to or greater than 64, 128, 256, 512, 1024, 2048, 4096, 8K, or 16K, for example, may be connected between said one of the semiconductor chips 100 of the logic drive 300 and said one of the semiconductor chips 100 of the memory drive 310 for parallel signal transmission or power or ground delivery. Further, a heat sink 316 made of copper or aluminum for example may be mounted to backsides of the semiconductor chips 100 of the logic drive 300.

Internet or Network Between Data Centers and Users

Figure 26:
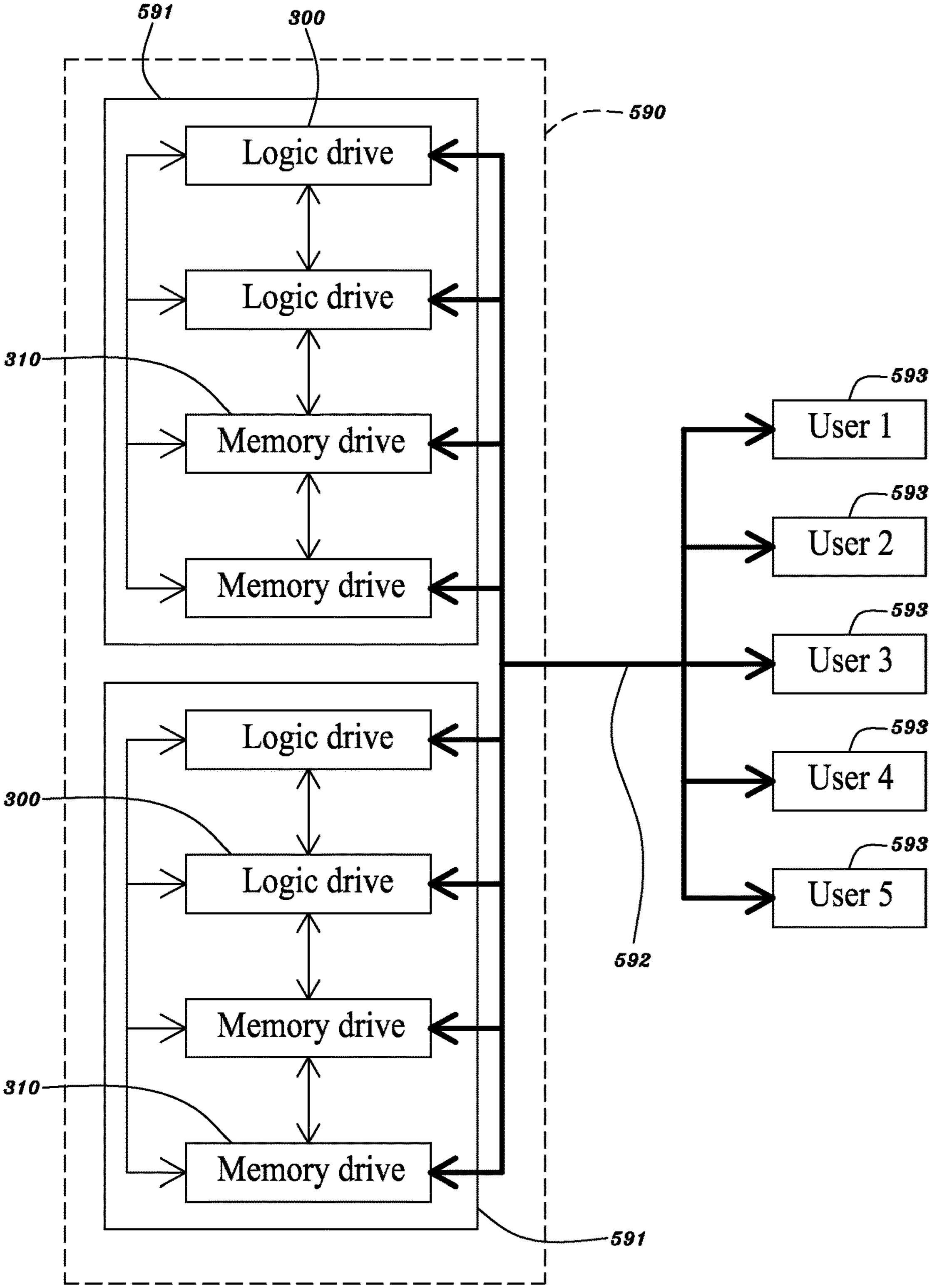
FIG. 26 is a block diagram illustrating networks between multiple data centers and multiple users in accordance with an embodiment of the present application.
Figure 27:
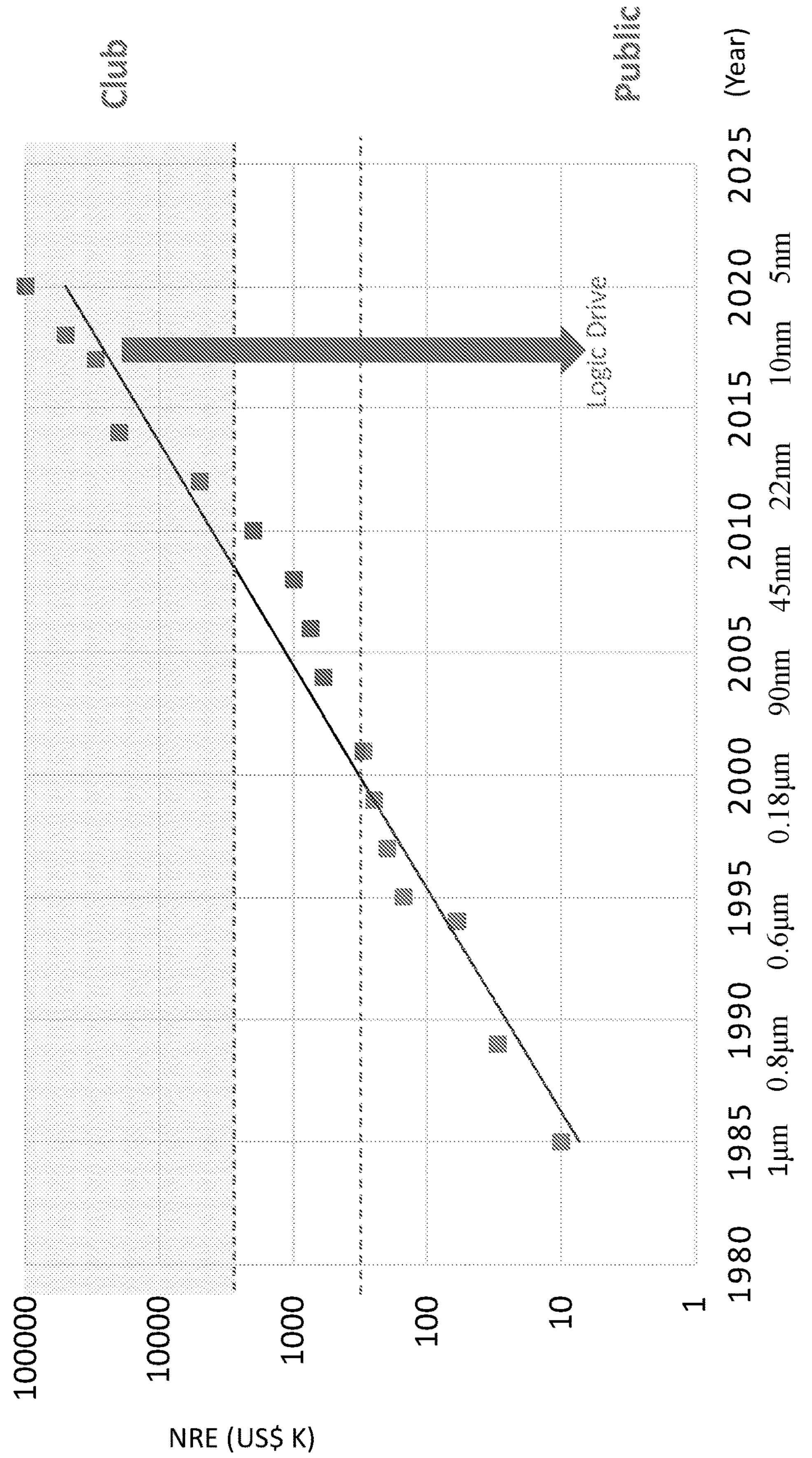
FIG. 27 is a chart showing a trend of relationship between non-recurring engineering (NRE) costs and technology nodes.

FIG. 26 is a block diagram illustrating networks between multiple data centers and multiple users in accordance with an embodiment of the present application. Referring to FIG. 26, in the cloud 590 are multiple data centers 591 connected to each other or one another via the internet or networks 592.

In each of the data centers 591 may be a plurality of one of the standard commodity logic drives 300 and/or a plurality of one of the memory drives 310, as illustrated in FIG. 25, allowed for one or more of user devices 593, such as computers, smart phones or laptops, to offload and/or accelerate service-oriented functions of all or any combinations of functions of artificial intelligence (AI), machine learning, deep learning, big data, internet of things (IOT), industry computing, virtual reality (VR), augmented reality (AR), car electronics, graphic processing (GP), video streaming, digital signal processing (DSP), micro controlling (MC), and/or central processing (CP) when said one or more of the user devices 593 is connected via the internet or networks to the standard commodity logic drives 300 and/or memory drives 310 in one of the data centers 591 in the cloud 590. In each of the data centers 591, the standard commodity logic drives 300 may couple to each other or one another via local circuits of said each of the data centers 591 and/or the internet or networks 592 and to the memory drives 310 via local circuits of said each of the data centers 591 and/or the internet or networks 592, wherein the memory drives 310 may couple to each other or one another via local circuits of said each of the data centers 591 and/or the internet or networks 592. Accordingly, the standard commodity logic drives 300 and memory drives 310 in the data centers 591 in the cloud 590 may be used as an infrastructure-as-a-service (IaaS) resource for the user devices 593. Similarly to renting virtual memories (VMs) in a cloud, the field programmable gate arrays (FPGAs), which may be considered as virtual logics (VL), may be rented by users. In a case, each of the standard commodity logic drives 300 in one or more of the data centers 591 may include the FPGA IC chips 200 fabricated using a semiconductor IC process technology node more advanced than 28 nm technology node. A software program may be written on the user devices 593 in a common programing language, such as Java, C++, C #, Scala, Swift, Matlab, Assembly Language, Pascal, Python, Visual Basic, PL/SQL or JavaScript language. The software program may be uploaded by one of the user devices 590 via the internet or networks 592 to the cloud 590 to program the standard commodity logic drives 300 in the data centers 591 or cloud 590. The programmed logic drives 300 in the cloud 590 may be used by said one or another of the user devices 593 for an application via the internet or networks 592.

The scope of protection is limited solely by the claims, and such scope is intended and should be interpreted to be as broad as is consistent with the ordinary meaning of the language that is used in the claims when interpreted in light of this specification and the prosecution history that follows, and to encompass all structural and functional equivalents thereof.

What is claimed is:

1. A multi-chip package comprising:

an interconnection scheme comprising:

a first interconnection metal layer, a first polymer layer over the first interconnection metal layer, a second interconnection metal layer extending horizontally on a top surface of the first polymer layer and further extending downwards into a first opening in the first polymer layer, wherein the second interconnection metal layer comprises a first copper layer extending horizontally over the top surface of the first polymer layer and further extending downwards into the first opening in the first polymer layer, wherein the first copper layer has a sidewall over the top surface of the first polymer layer, wherein the second interconnection metal layer further comprises a first adhesion metal layer at a bottom of the first copper layer and not at the sidewall of the first copper layer, a second polymer layer on the second interconnection metal layer and first polymer layer and at a top of the interconnection scheme, and a plurality of first metal bumps each at the top of the interconnection scheme, extending horizontally on a top surface of the second polymer layer, further extending downwards into a second opening in the second polymer layer and in contact with a top surface of the second interconnection metal layer, wherein each of the plurality of first metal bumps comprises a second copper layer extending horizontally over the top surface of the second polymer layer and further extending downwards into the second opening in the second polymer layer, wherein the second copper layer has a sidewall over the top surface of the second polymer layer, wherein said each of the plurality of first metal bumps further comprises a second adhesion metal layer at a bottom of the second copper layer, on the top surface of the second polymer layer and the top surface of the second interconnection metal layer and not at the sidewall of the second copper layer;

a third polymer layer under the first interconnection scheme and at a bottom of the multi-chip package;

a second metal bump at the bottom of the multi-chip package, extending on a bottom surface of the third polymer layer, further extending upwards into a third opening in the third polymer layer and in contact with a bottom surface of the first interconnection metal layer, wherein the second metal bump comprises a third copper layer extending under the bottom surface of the third polymer layer and further extending upwards into the third opening in the third polymer layer, wherein the third copper layer has a sidewall under the bottom surface of the third polymer layer, wherein the second metal bump further comprises a third adhesion metal layer at a top of the third copper layer and not at the sidewall of the third copper layer, wherein the third adhesion metal layer is between the third copper layer and the bottom surface of third polymer layer, between the third copper layer and the bottom surface of first interconnection metal layer and on the bottom surface of the third polymer layer and the bottom surface of the first interconnection metal layer, wherein the second metal bump further comprises a first tin-containing cap under the third copper layer;

a plurality of semiconductor integrated-circuit (IC) chips over the interconnection scheme and at a same horizontal level as each other or one another, wherein each of the plurality of semiconductor integrated-circuit (IC) chips comprises a third metal bump at a bottom of said each of the plurality of semiconductor integrated-circuit (IC) chips and protruding from a bottom surface of said each of the plurality of semiconductor integrated-circuit (IC) chips, wherein the third metal bump is bonded to one of the plurality of first metal bumps as a bonded contact, wherein the third metal bump comprises a fourth copper layer and a second tin- containing cap under the fourth copper layer and bonded to said one of the plurality of first metal bumps; and a fourth polymer layer on the interconnection scheme and at the same horizontal level as the plurality of semiconductor integrated-circuit (IC) chips.

2. The multi-chip package of claim 1 further comprising a metal interconnect extending vertically in the fourth polymer layer for vertical interconnection, wherein the metal interconnect is on the interconnection scheme and at the same horizontal level as the plurality of semiconductor integrated-circuit (IC) chips and the fourth polymer layer.

3. The multi-chip package of claim 2 is configured for a package-on-package assembly, wherein the package-on-package assembly comprises a chip package bonded to a top of the multi-chip package of the package-on-package assembly, wherein the chip package comprises another semiconductor integrated-circuit (IC) chip therein.

4. The multi-chip package of claim 2, wherein the metal interconnect is on a top surface of one of the plurality of first metal bumps.

5. The multi-chip package of claim 1, wherein the second copper layer has a thickness between 1 and 60 micrometers.

6. The multi-chip package of claim 1, wherein the first second adhesion metal layer comprises titanium.

7. The multi-chip package of claim 1, wherein the fourth polymer layer has a sidewall vertically coplanar with a sidewall of the interconnection scheme.

8. The multi-chip package of claim 1, wherein the interconnection scheme further comprises a fifth polymer layer under the first polymer layer, wherein the first interconnection metal layer extends horizontally on a top surface of the fifth polymer layer and further extends downwards into a fourth opening in the fifth polymer layer, wherein the third polymer layer is under and on a bottom surface of the fifth polymer layer and the third opening in the third polymer layer is vertically under the fourth opening in the fifth polymer layer, and wherein the second metal bump is under the fourth opening in the fifth polymer layer and in contact with the bottom surface of the first interconnection metal layer at a bottom of the fourth opening in the fifth polymer layer.

9. The multi-chip package of claim 8, wherein the first interconnection metal layer comprises a fifth copper layer extending horizontally over the top surface of the fifth polymer layer and further extending downwards into the fourth opening in the fifth polymer layer, wherein the fifth copper layer has a sidewall over the top surface of the fifth polymer layer, and wherein the first interconnection metal layer further comprises a fourth adhesion metal layer between the fifth copper layer and fifth polymer layer, on the top surface of the fifth polymer layer and not at the sidewall of the fifth copper layer.

10. The multi-chip package of claim 9, wherein the fourth adhesion metal layer of the first interconnection metal layer is further between the fifth copper layer of the first interconnection metal layer and the third adhesion metal layer of the second metal bump and on a top surface of the third adhesion metal layer of the second metal bump.

11. The multi-chip package of claim 1, wherein the first copper layer has a thickness between 0.3 and 20 micrometers.

12. The multi-chip package of claim 1, wherein the third adhesion metal layer comprises titanium.

13. The multi-chip package of claim 1, wherein said each of the plurality of semiconductor integrated-circuit (IC) chips has a top surface coplanar with a top surface of the fourth polymer layer.

14. The multi-chip package of claim 1 further comprising an underfill between the interconnection scheme and said each of the plurality of semiconductor integrated-circuit (IC) chips and in contact with a sidewall of the bonded contact.

15. The multi-chip package of claim 1, wherein the plurality of semiconductor integrated-circuit (IC) chips comprise a first semiconductor integrated-circuit (IC) chip and a first logic chip coupling to the first semiconductor integrated-circuit (IC) chip.

16. The multi-chip package of claim 15, wherein the first semiconductor integrated-circuit (IC) chip is a control chip.

17. The multi-chip package of claim 15, wherein the first logic chip is a graphic processing unit (GPU) chip.

18. The multi-chip package of claim 15, wherein the first semiconductor integrated-circuit (IC) chip is a memory chip.

19. The multi-chip package of claim 15, wherein the first semiconductor integrated-circuit (IC) chip is an input/output (I/O) chip.

20. The multi-chip package of claim 15, wherein the first logic chip is a central processing unit (CPU) chip.

21. The multi-chip package of claim 15, wherein the first logic chip is a graphic processing unit (GPU) chip and the first semiconductor integrated-circuit (IC) chip is a control chip.

22. The multi-chip package of claim 15, wherein the first logic chip is a graphic processing unit (GPU) chip and the first semiconductor integrated-circuit (IC) chip is a memory chip.

23. The multi-chip package of claim 15, wherein communication between the first logic chip and first semiconductor integrated-circuit (IC) chip has a data bit width equal to or greater than 1,024.

24. The multi-chip package of claim 15, wherein the plurality of semiconductor integrated-circuit (IC) chips further comprises a second semiconductor integrated-circuit (IC) chip and a second logic chip coupling to the second semiconductor integrated-circuit (IC) chip.

* * * * *